US007462558B2

(12) United States Patent
Lin et al.

(10) Patent No.: US 7,462,558 B2
(45) Date of Patent: Dec. 9, 2008

(54) METHOD FOR FABRICATING A CIRCUIT COMPONENT

(75) Inventors: Mou-Shiung Lin, Hsin-Chu (TW); Chiu-Ming Chou, Kao-hsiung (TW); Chien-Kang Chou, Tainan Hsien (TW); Hsin-Jung Lo, Taipei County (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 12/025,002

(22) Filed: Feb. 2, 2008

(65) Prior Publication Data

US 2008/0146018 A1 Jun. 19, 2008

Related U.S. Application Data

(63) Continuation of application No. 11/202,730, filed on Aug. 12, 2005, and a continuation-in-part of application No. 11/178,753, filed on Jul. 11, 2005, and a continuation-in-part of application No. 11/178,541, filed on Jul. 11, 2005.

(60) Provisional application No. 60/701,849, filed on Jul. 22, 2005.

(30) Foreign Application Priority Data

Aug. 12, 2004 (TW) ............................. 93124492 A
Dec. 10, 2004 (TW) ............................. 93138329 A

(51) Int. Cl.
*H01L 21/4763* (2006.01)

(52) U.S. Cl. ....................... 438/624; 438/618; 438/622; 438/E23.021; 438/E23.069; 257/734; 257/758; 257/778

(58) Field of Classification Search ......... 438/618–626, 438/637–639, 672–673
See application file for complete search history.

(56) References Cited

U.S. PATENT DOCUMENTS 6,362,087 B1 3/2002 Wang et al.
6,642,136 B1 11/2003 Lee et al.
6,841,872 B1 1/2005 Ha et al.
6,959,856 B2 11/2005 Oh et al.
7,078,331 B2 7/2006 Kwon et al.
2003/0127734 A1 7/2003 Lee et al.
2003/0219966 A1* 11/2003 Jin et al. ..................... 438/612
2004/0253801 A1* 12/2004 Lin ............................ 438/612

* cited by examiner

*Primary Examiner*—Dung A. Le

(57) ABSTRACT

A method for fabricating a metallization structure comprises depositing a first metal layer; depositing a first pattern-defining layer over said first metal layer, a first opening in said first pattern-defining layer exposes said first metal layer; depositing a second metal layer over said first metal layer exposed by said first opening; depositing a second pattern-defining layer over said second metal layer, a second opening in said second pattern-defining layer exposes said second metal layer; depositing a third metal layer over said second metal layer exposed by said second opening; removing said second pattern-defining layer; removing said first pattern-defining layer; and removing said first metal layer not under said second metal layer.

21 Claims, 90 Drawing Sheets

METHOD FOR FABRICATING A CIRCUIT COMPONENT

This application is a continuation of application Ser. No. 11/202,730, which is a continuation-in-part of application Ser. No. 11/178,753, filed on Jul. 11, 2005, and a continuation-in-part of application Ser. No. 11/178,541, filed on Jul. 11, 2005, which are herein incorporated by reference in their entirety. This application claims priority to U.S. provisional application No. 60/701,849, filed on Jul. 22, 2005, which is herein incorporated by reference in its entirety.

This application also claims foreign priority of two Taiwan applications, which are application No. 93138329 filed on Dec. 10, 2004 and application No. 93124492 filed on Jun. 12, 2004. The certified copy of said Taiwan applications have been placed of record in the file of application Ser. No. 11/202,730.

BACKGROUND OF THE INVENTION

1. Field of the Invention

This invention relates to a semiconductor chip and the methods for fabricating the same. More particularly, this invention relates to a semiconductor chip fabricated by a simplified process.

2. Description of the Related Art

Due to the advancement that the information technology industry has made in recent decades, fast access to information far away is no longer impractical. To reach an advantageous position of business competition, various electronic products have been installed in components. With the evolution of the information industry, the latest generation of IC chips has, overall, much more abundance on functions than before. Attributed to the improvements in the semi-conductor technology, the improvements in the production capability of the innovative IC chips becomes a continual trend in the past few decades.

Also affiliated with the development of copper interconnection technology, today's IC design becomes ever sophisticated, with a far more number of transistors being placed in a single IC chip through each generations of development. Putting more circuitry in a scaled down IC chip has another important merit other than adding multiple functions to the chip. That is, the length of data paths among the transistors also becomes shorter, which is beneficial to distributing signals readily.

In order to package the highly integrated IC chip, metal traces and bumps can be formed over the passivation layer of the IC chip in a bumping fab after the chip is manufactured by a conventional IC fab. The procedure and steps of forming the metal traces and bumps over the IC passivation layer are described as below.

FIGS. 1-12 are schematic cross-sectional illustrations of the conventional process which forms the circuits/metal traces and bumps on a semiconductor wafer. Referring now to FIG. 1, a semiconductor wafer 100 comprising a semiconductor substrate 110 multiple thin-film dielectric layers 122, 124 and 126, multiple thin-film circuit layers 132, 134 and 136 and a passivation layer 140 is shown.

Multiple electronic devices 112 are deposited in or on the semiconductor substrate 110. The semiconductor substrate 110, for example, is a silicon substrate. The electronic devices 112 is formed in or on the semiconductor substrate 110 through doping penta-valence ions (5A group in periodic table), such as phosphorus ions, or doping tri-valence ions (3A group in periodic table), such as boron ions. The electronic devices 112 formed by this process can be metal oxide semiconductor (MOS) devices, or transistors.

Multiple thin-film dielectric layers 122, 124, and 126, made of materials such as silicon oxide, silicon nitride, or silicon oxynitride, are deposited over the active surface 114 of semiconductor substrate 110. The multiple thin-film circuit layers 132, 134, and 136 are deposited respectively on the multiple thin-film dielectric layers 122, 124, and 126, with the multiple thin-film circuit layers 132, 134, and 136 being composed of materials such as aluminum, copper or silicon. A plurality of via holes 121, 123, and 125 are respectively in the multiple thin-film dielectric layers 122, 124, and 126. The multiple thin-film circuit layers 132, 134, and 136 are connected to each other or to the electronic devices 112 through via holes 121, 123, and 125.

A passivation layer 140 is formed over the multiple thin-film dielectric layers 122, 124, and 126 and over the multiple thin-film circuit layers 132, 134, and 136. The passivation layer 140 is composed of either silicon nitride, silicon oxide, phosphosilicate glass, or a composite having at least one of the above listed materials. Multiple openings 142 in the passivation layer 140 expose the uppermost thin-film circuit layer 136.

In FIG. 2-6, a schematic cross-sectional view of the conventional method for forming circuit/metal traces on the passivation layer of a semiconductor wafer is shown. Referring now to FIG. 2, a sputtering process is used to form an bottom metal layer 152 over passivation layer 140 of the semiconductor wafer 100 and on the multiple thin-film circuit layer 136, which is exposed through the opening 142 in the passivation layer 142. Next, a photoresist layer 160 is formed over the bottom metal layer 152, as shown in FIG. 3. An opening 162 in the photoresist layer 160 exposes the bottom metal layer 152. Subsequently, an electroplating method is used to form the patterned circuit layer 154 on the bottom metal layer 152 exposed by the opening 162 in the photoresist layer 160, as illustrated in FIG. 4. Then, the photoresist layer 160 is removed, as demonstrated in FIG. 5. Afterwards, as shown in FIG. 6, the bottom metal layer 152 not covered by the patterned circuit layer 154 is etched away by a wet etching process, using the patterned circuit layer 154 as the etching mask. So far a patterned metal trace 150 combining the bottom metal layer 152 and the patterned circuit layer 154 is created.

Referring now to FIG. 7, a polymer layer 170 is formed over the circuit/metal trace 150 and over the passivation layer 140, with an opening 172 in the polymer layer 170 exposing the circuit/metal trace 150.

In FIGS. 8-12, a schematic cross-sectional view of the conventional process for forming a bump over a passivation layer of a semiconductor wafer is shown. Referring now to FIG. 8, a sputtering method is used to form an adhesion/barrier layer 182 over the polymer layer 170 and on the circuit/metal trace 150 exposed by the opening 172 in the polymer layer 170. Next, a photoresist layer 190 is formed on the adhesion/barrier layer 182, as shown in FIG. 9. An opening 192 in the photoresist layer 190 exposes the adhesion/barrier layer 182. Then, an electroplating method is used to form the patterned metal layer 184 on the adhesion/barrier layer 182 exposed by the opening 192 in the photoresist layer 190, as shown in FIG. 10. Subsequently, as illustrated in FIG. 11, the photoresist layer 190 is removed. Then, as shown in FIG. 12, the uncovered section of the adhesion/barrier layer 182 is etched away, with the patterned metal layer 184 serving as an etching mask. So far, the bump 180 combining the adhesion/barrier layer 182 and the patterned metal layer 184 can be created.

Referring now to FIG. 1-12, both of the procedures for creating the circuit/metal trace 150 and the bump 180 comprise a sputtering process to create the bottom metal layers 152 and 182 and an etching technique to remove the uncovered portion of bottom metal layer 152 and 182 after forming the patterned metal layers 154 and 184. Thereby, the conventional process for forming the circuit/metal trace 150 and the bump 180 is inefficient in that it performs two etching processes and two sputtering processes to achieve the goal.

SUMMARY OF THE INVENTION

Therefore, one objective of the present invention is to provide a semiconductor chip and process for fabricating the same. The process for forming traces or plane and for forming pads or bumps are integrated, and thus is simplified.

In order to reach the above objective, the present invention provides a method for fabricating a metallization structure comprising depositing a first metal layer; depositing a first pattern-defining layer over said first metal layer, a first opening in said first pattern-defining layer exposes said first metal layer; depositing a second metal layer over said first metal layer exposed by said first opening; depositing a second pattern-defining layer over said second metal layer, a second opening in said second pattern-defining layer exposes said second metal layer; depositing a third metal layer over said second metal layer exposed by said second opening; removing said second pattern-defining layer; removing said first pattern-defining layer; and removing said first metal layer not under said second metal layer.

In order to reach the above objective, the present invention provides a method for fabricating a metallization structure comprising depositing a first metal layer; depositing a first pattern-defining layer over said first metal layer, a first opening in said first pattern-defining layer exposes said first metal layer; depositing a second metal layer over said first metal layer exposed by said first opening; removing said first pattern-defining layer; depositing a second pattern-defining layer over said first metal layer, a second opening in said second pattern-defining layer exposes said first metal layer; depositing a third metal layer over said first metal layer exposed by said second opening; removing said second pattern-defining layer; and removing said first metal layer not under said second metal layer and not under said third metal layer.

In order to reach the above objective, the present invention provides a method for fabricating a metallization structure comprising depositing a first metal layer; depositing a pattern-defining layer over said first metal layer, a first opening in said pattern-defining layer exposing said first metal layer and having a largest transverse dimension less than 300 μm, and a second opening in said pattern-defining layer exposing said first metal layer and having a largest transverse dimension greater than 300 μm; depositing a second metal layer over said first metal layer exposed by said first and second openings; removing said pattern-defining layer; and removing said first metal layer not under said second metal layer.

Both the foregoing general description and the following detailed description are exemplary and explanatory only and are not restrictive to the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated as a part of this specification. The drawings illustrate embodiments of the invention and, together with the description, serve to explain the principles of the invention.

DESCRIPTION OF THE PREFERRED EMBODIMENTS

First Embodiment

1. First Method for Manufacturing Circuit/Metal Traces and Bumps

Figure 1:
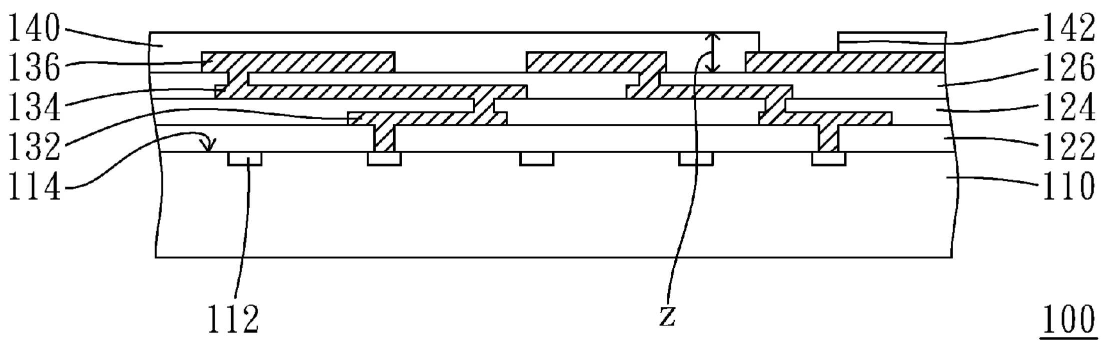
FIGS. 1-12 are schematic cross-sectional illustrations of the conventional process which forms the circuits/metal traces and bumps on a semiconductor wafer.
Figure 2:
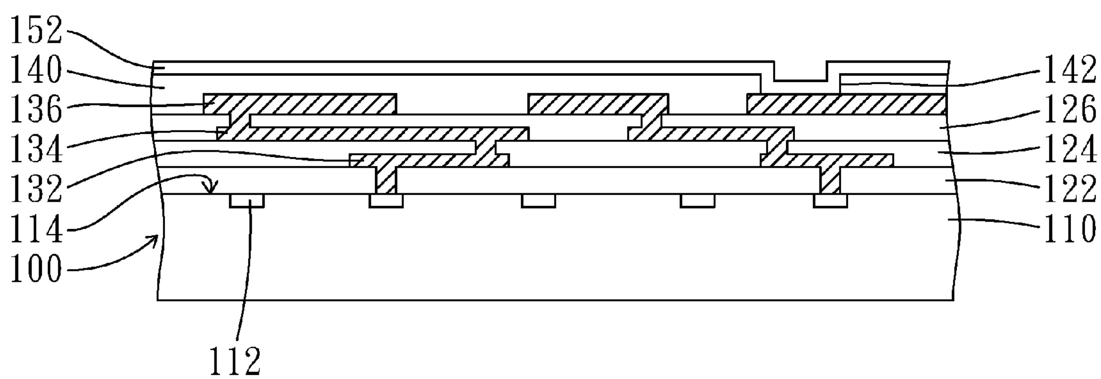
Figure 3:
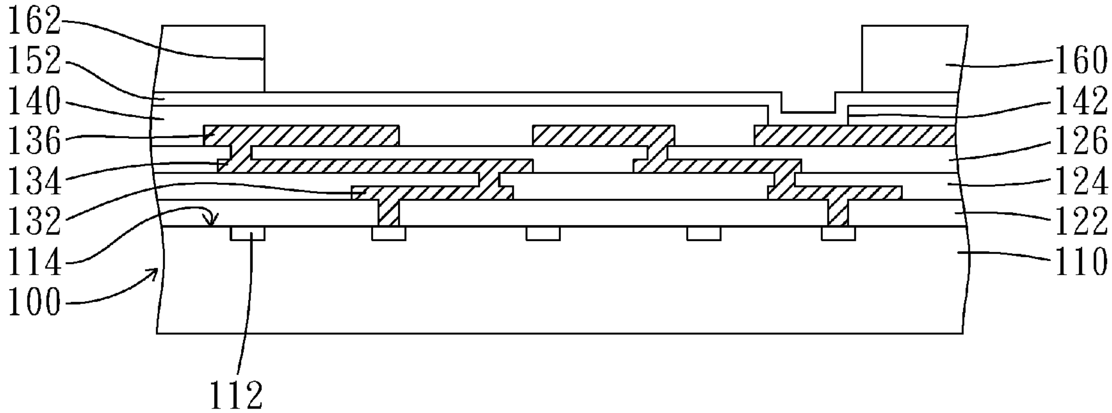
Figure 4:
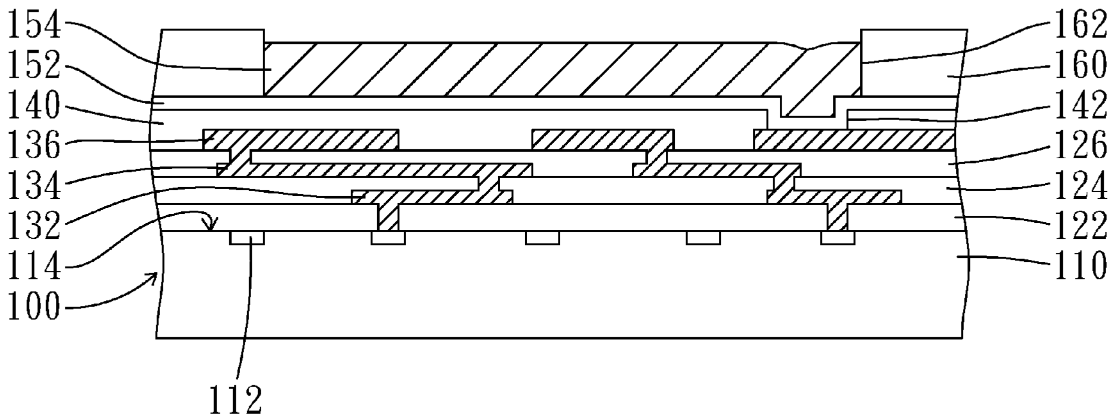
Figure 5:
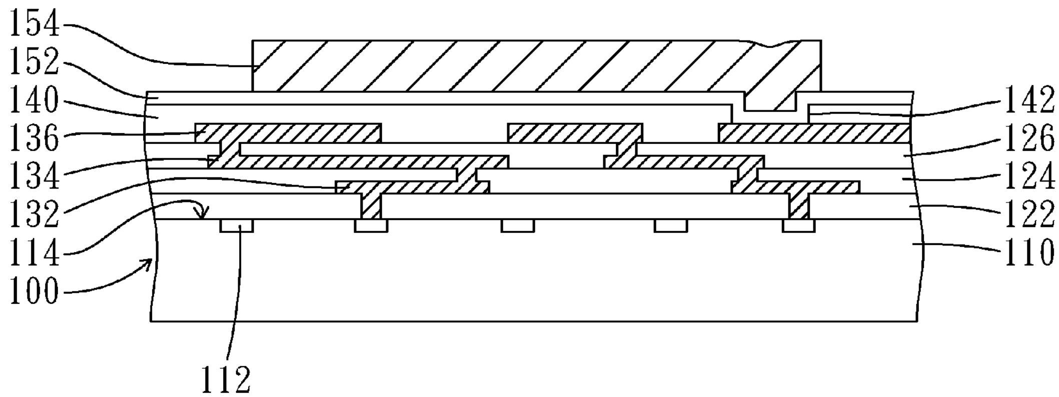
Figure 6:
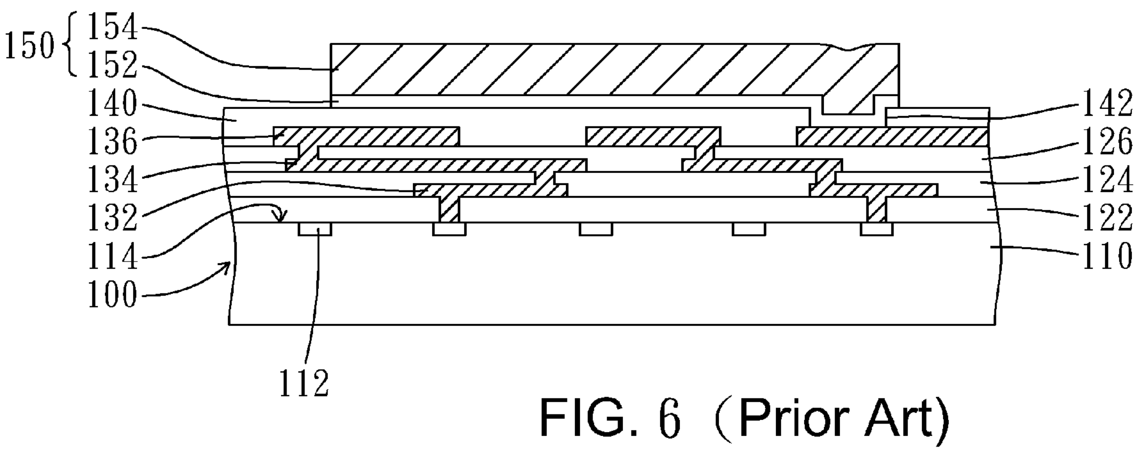
Figure 7:
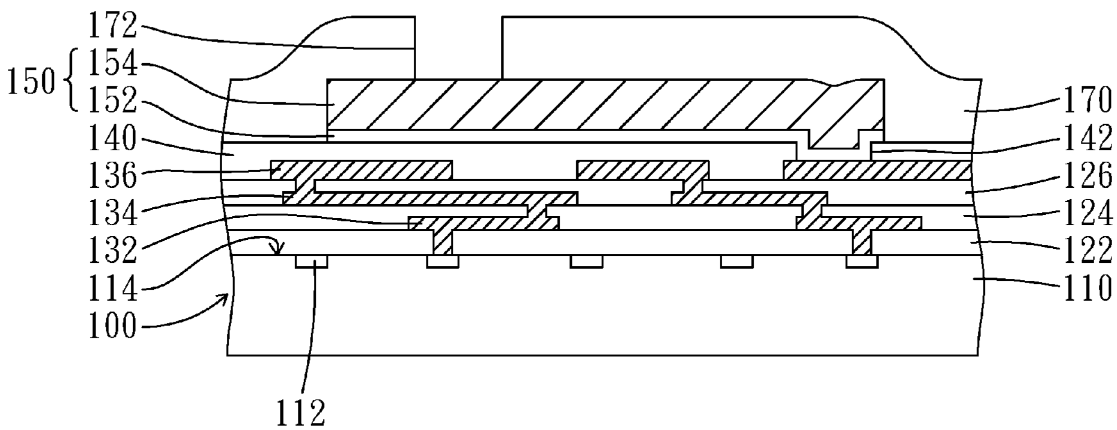
Figure 8:
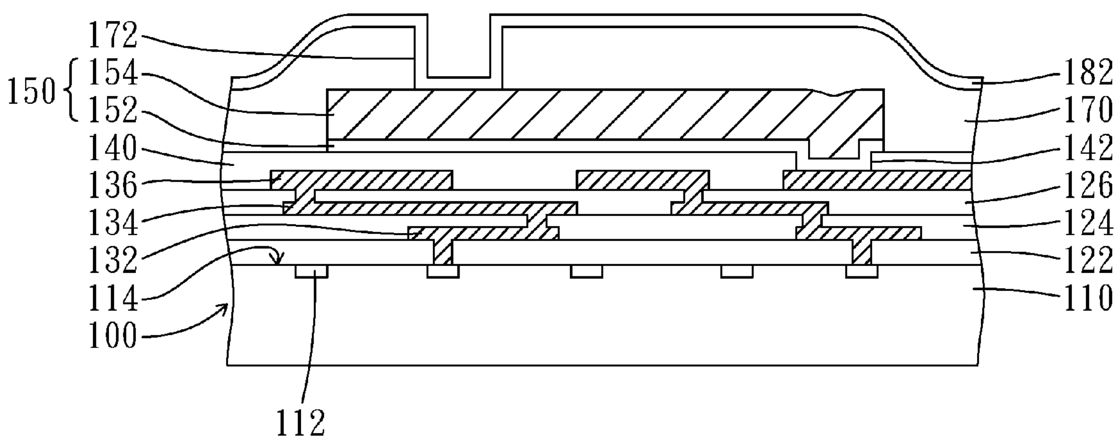
Figure 9:
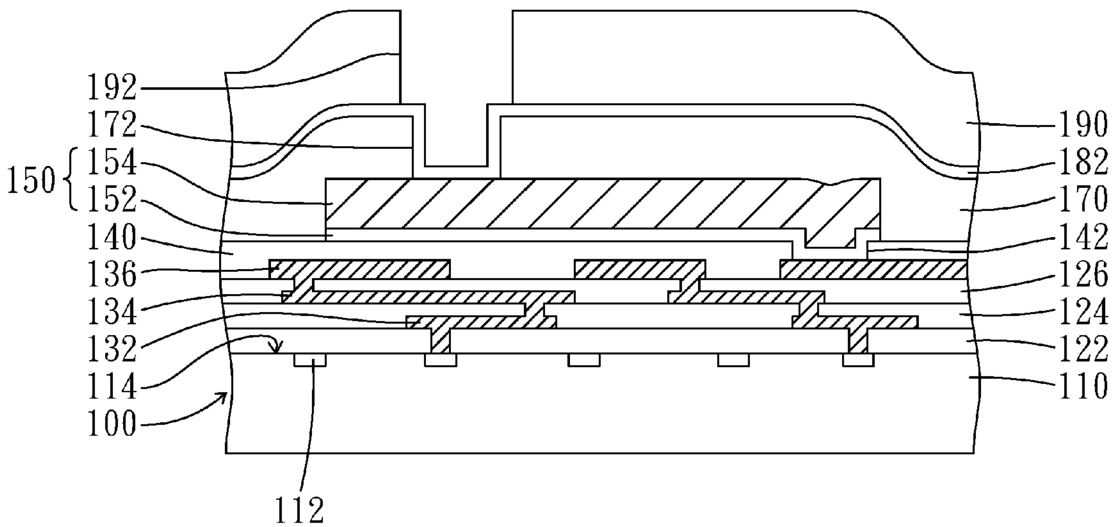
Figure 10:
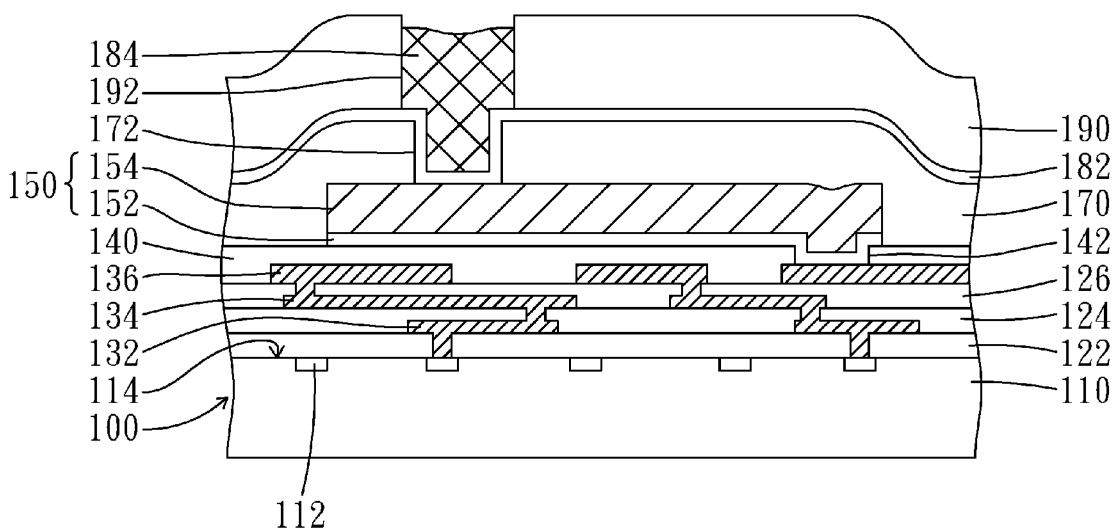
Figure 11:
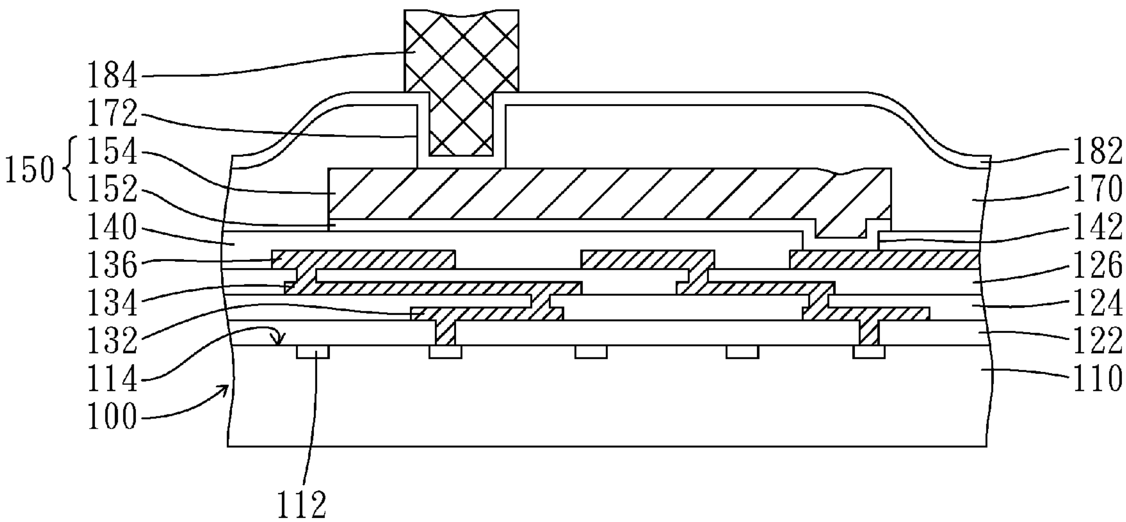
Figure 12:
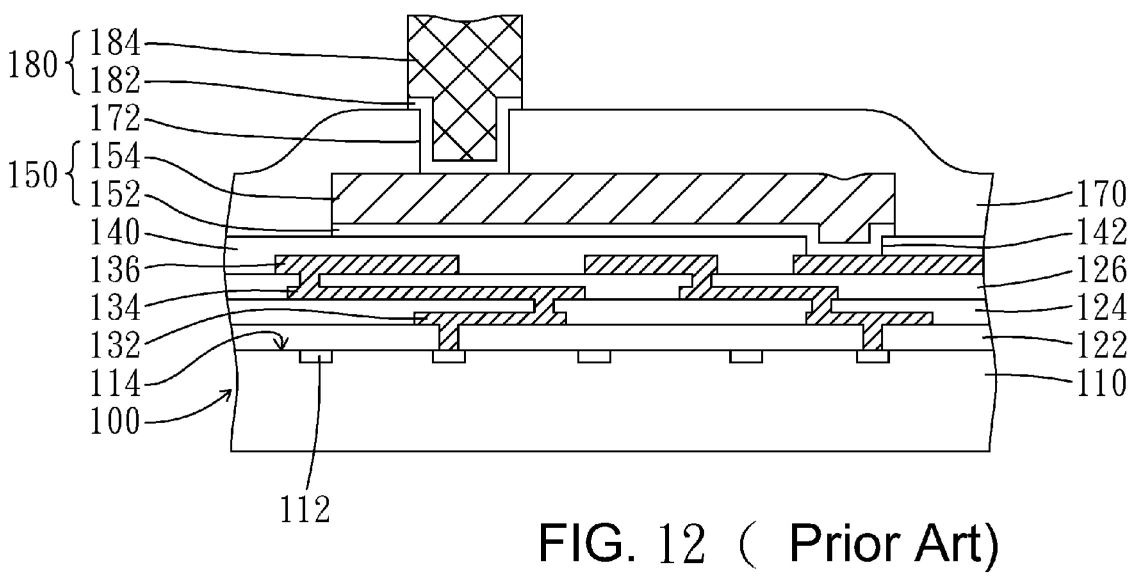
Figure 13:
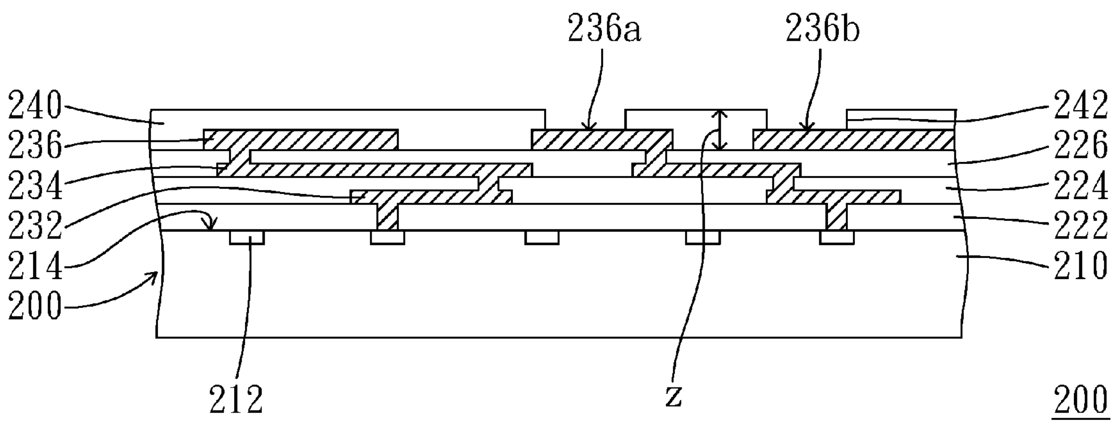
FIGS. 13-21 are schematic cross-sectional views illustrating a preferred embodiment of the first method for forming circuits/metal traces and bumps or pads according to the present invention.

FIGS. 13-21 are schematic cross-sectional views illustrating the preferred embodiment of the first method for forming circuits/metal traces and bumps according to the present invention. Referring now to FIG. 13, a semiconductor wafer 200 comprising a semiconductor substrate 210, multiple thin-film dielectric layers 222, 224, and 226, multiple thin-film circuit layers 232, 234, and 236 and a passivation layer 240 is shown.

Multiple electronic devices 212 are deposited in or on the semiconductor substrate 210. The semiconductor substrate 210, for example, is a silicon substrate or a GaAs substrate. For example, if substrate 210 is a silicon substrate, then the electronic devices 212 will be formed in or on the semiconductor substrate 210 through doping penta-valence ions (5A group in periodic table), such as phosphorus ions, or doping tri-valence ions (3A group in periodic table), such as boron ions. The electronic devices 212 formed in or on the silicon substrate 210 can be, for example, bipolar transistors, MOS transistors or passive devices. The electronic devices 212 are the sub-micron devices, such as 0.18 micron, 0.13 micron or 0.11 micron CMOS devices, or sub-hundred-nanometer devices, such as 90 nanometer, 65 nanometer or 35 nanometer devices.

Multiple thin-film dielectric layers 222, 224, and 226, made of materials such as silicon oxide, silicon nitride, silicon oxynitride or a low-k dielectric material (k<3), are deposited over the active surface 214 of semiconductor substrate 210. The multiple thin-film circuit layers 232, 234, and 236 are deposited respectively on the multiple thin-film dielectric layers 222, 224, and 226, with the multiple thin-film circuit layers 232, 234, and 236 being composed of materials such as sputtered aluminum, electroplated copper, sputtered copper, CVD copper or silicon. A plurality of via holes 221, 223, and 225 are respectively in the multiple thin-film dielectric layers 222, 224, and 226. The multiple thin-film circuit layers 232, 234, and 236 are connected to each other or to the electronic devices 212 through via holes 221, 223, and 225.

The passivation layer 240 is formed over the thin film dielectric layers 222, 224 and 226 and the thin film fine line metal layers 232, 234 and 236. The passivation layer 240 has a preferred thickness z greater than about 0.3 um. The passivation layer 240 is composed of the material such as, a silicon-oxide layer, a silicon-nitride layer, a phosphosilicate glass (PSG) layer, or a composite structure comprising the above-mentioned layers. The passivation layer 240 comprises one or more insulating layers, such as silicon-nitride layer or silicon-oxide layer, formed by CVD processes. In a case, a silicon-nitride layer with a thickness of between 0.2 and 1.2 μm is formed over a silicon-oxide layer with a thickness of between 0.1 and 0.8 μm. Generally, the passivation layer 140 comprises a topmost silicon-nitride layer or a topmost silicon-nitride layer in the finished chip or wafer structure. The passivation layer 240 comprises a topmost CVD insulating layer in the finished chip or wafer structure. A plurality of openings 242 in the passivation layer 240 expose the topmost thin film fine line metal layer 236 comprising sputtered aluminum, electroplated copper, sputtered copper, or CVD copper, for example.

Figure 14:
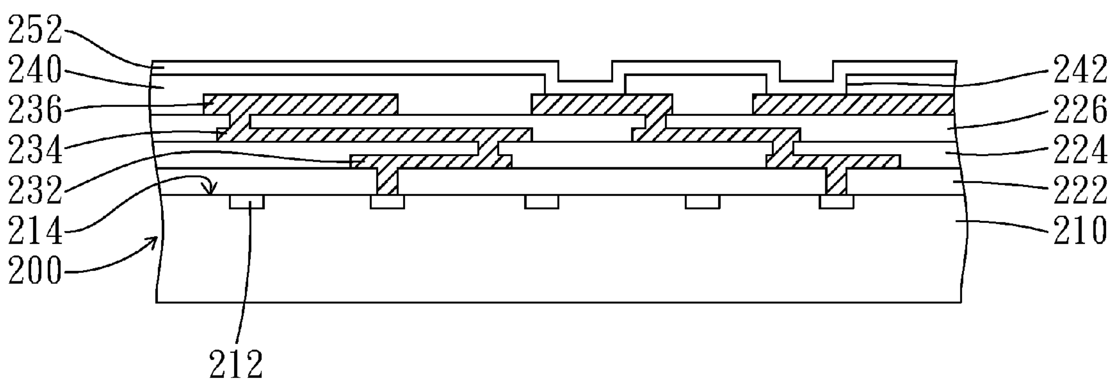

Referring now to FIG. 14, after the semiconductor wafer 200 is produced, a sputtering process may be used to form a bottom metal layer 252 over passivation layer 240 and the connection point of the thin-film circuit layer 236 exposed by the opening 242 in the passivation layer 240.

The bottom metal layer 252 may be formed by first sputtering an adhesive/barrier layer on the passivation layer 240 and on the connection point of thin-film circuit layer 236 exposed by the opening 242 in the passivation layer 240 and next sputtering, electroless plating or electroplating a seed layer on the adhesive/barrier layer. The detailed cross-sectional structure of the adhesive/barrier layer and the seed layer can refer to the illustrations in FIGS. 22-25.

Figure 15:
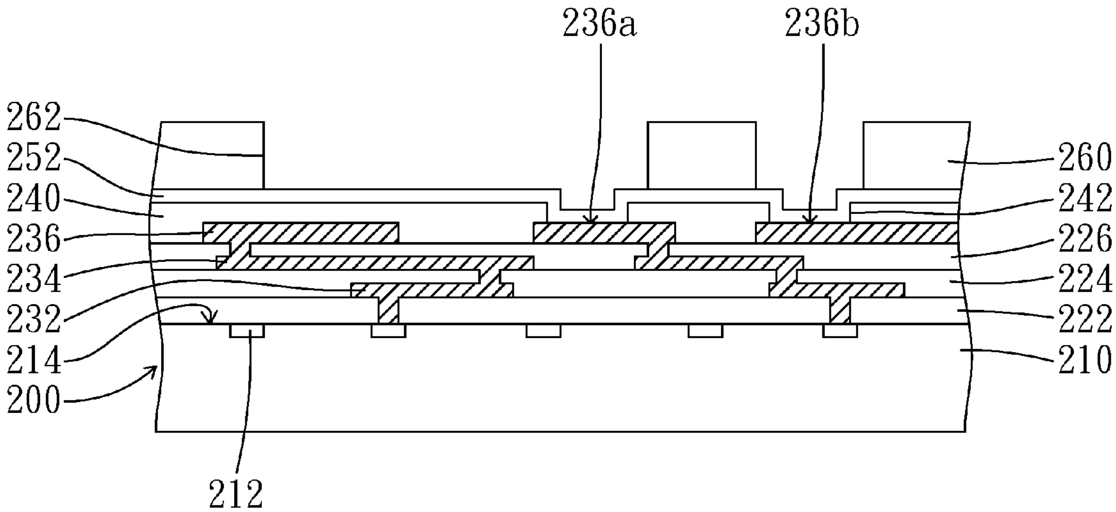
Figure 16:
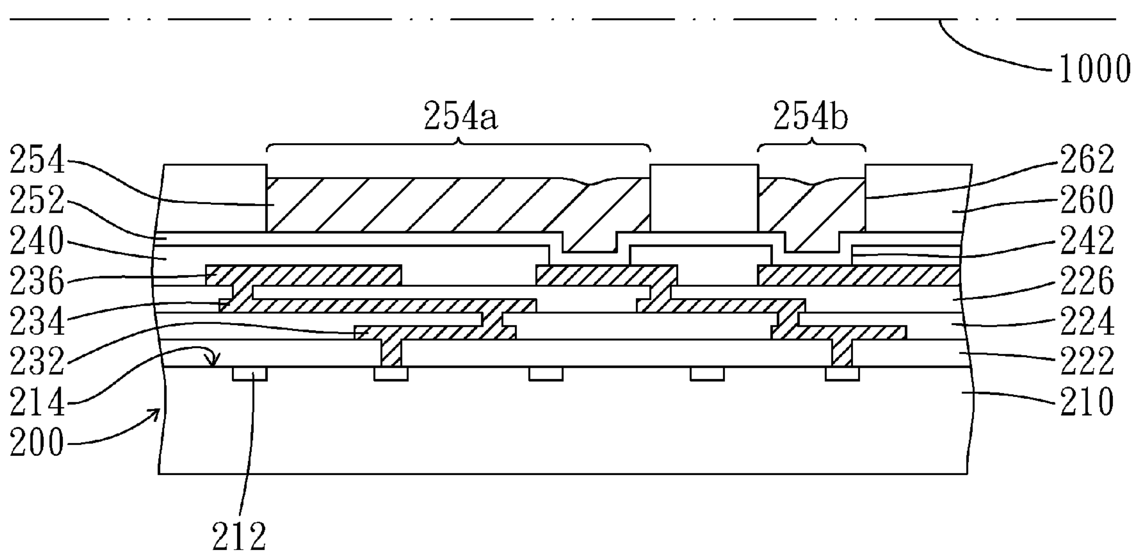

Next, as shown in FIG. 15, a photoresist layer 260 is formed on the bottom metal layer 252. An opening 262 in the photoresist layer 260 exposes the bottom metal layer 252. Subsequently, an electroplating method or electroless plating is used to form a metal layer 254 on the bottom metal layer 252 exposed by the opening 262 in the photoresist layer 260, as shown in FIG. 16. The metal layer 254 comprises a patterned circuit 254*a* and a patterned pad 254*b*. The patterned circuit 254*a* may be trace-shaped or plane-shaped. The patterned circuit 254*a* extending on the passivation layer 240 is electronically connected to the contact point 236*a* of the thin-film circuit layer 236. The patterned pad 254*b* deposited on the connection point 236*b* is electrically connected to the contact point 236*b* of the thin-film circuit layer 236. The detailed cross-sectional metallization structure of the electroplated metal layer 254 can refer to the illustrations in FIGS. 22-25.

Figure 16A:
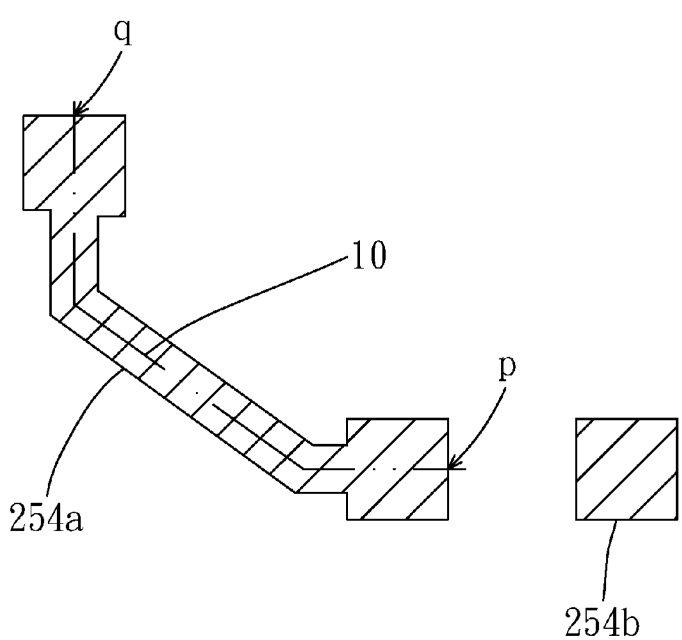

Defining a plane 1000, the plane 1000 is parallel to the active surface 214 of the semiconductor substrate 210. FIG. 16A is a schematic top view showing the projection profile of the patterned circuit 254*a* and patterned pad 254*b* shown in FIG. 16 projecting to the plane 100. Referring now to FIG. 16A, the patterned circuit 254*a* can extend in a path 10 from the point p of the path 10 to the point q of the path 10. The projection profile of the patterned circuit 254*a* projecting to the plane 1000 has an extension length of larger than 500 μm, 800 μm, or 1200 μm, for example. The projection profile of the patterned circuit 254*a* projecting to the plane 1000 has an area of larger than 30,000 $\mu m^2$, 80,000 $\mu m^2$, or 150,000 $\mu m^2$, for example.

Figure 17:
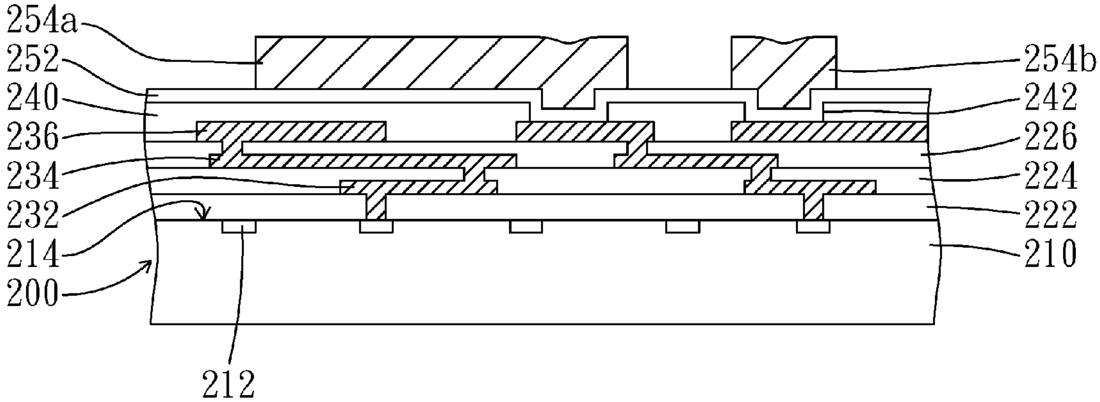
Figure 18:
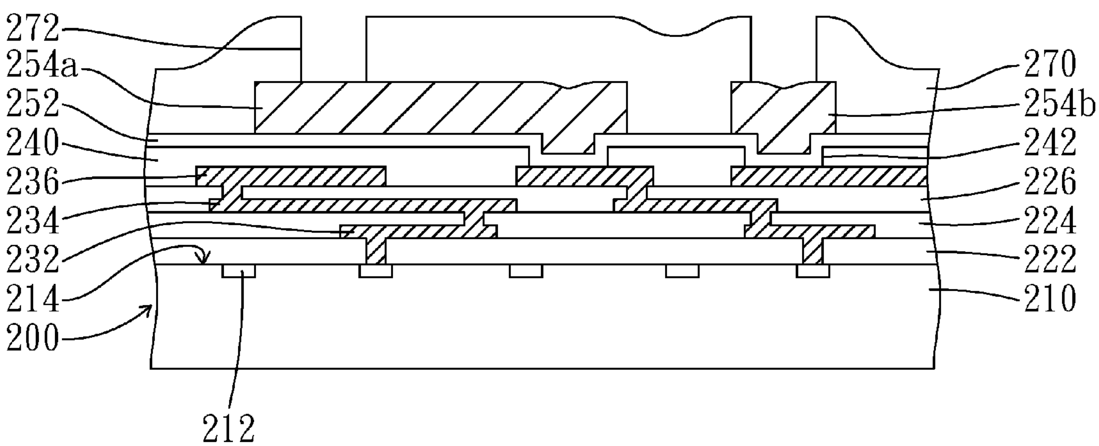

Next, the photoresist layer 260 is removed and the bottom metal layer 252 is sequentially exposed, as shown in FIG. 17. Subsequently, another photoresist layer 270 is formed on the bottom metal layer 252 and on the metal layer 254. An opening 272 in the photoresist layer 270 exposes the patterned circuit 254*a* and the patterned pad 254*b*, as demonstrated in FIG. 18.

Figure 19:
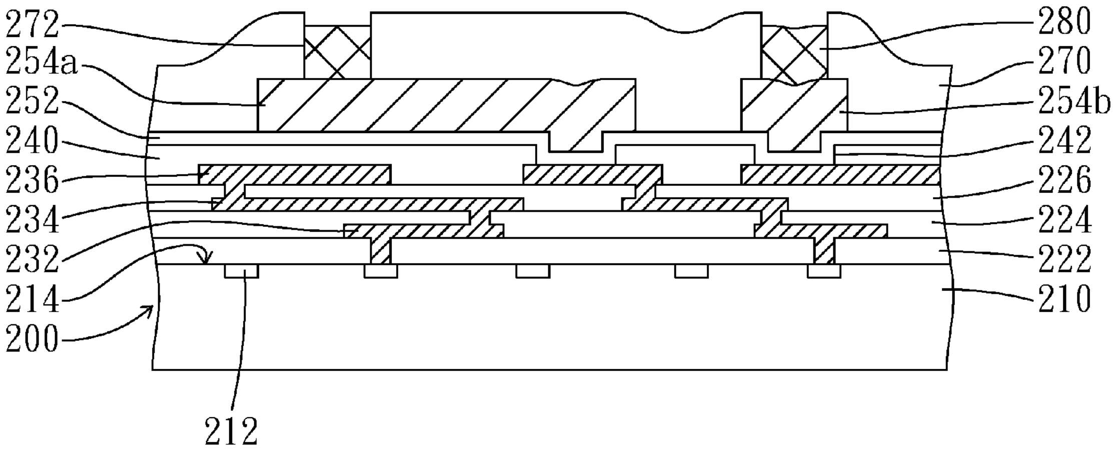

Then, multiple bumps are formed by electroplating or electroless plating a metal layer 280 on the patterned circuit 254*a* and the patterned pad 254*b* exposed by the opening 272 in the photoresist layer 270, as shown in FIG. 19. The detailed cross-sectional structure of the electroplated metal layer 280 can refer to the illustrations in FIGS. 26-29.

Figure 20:
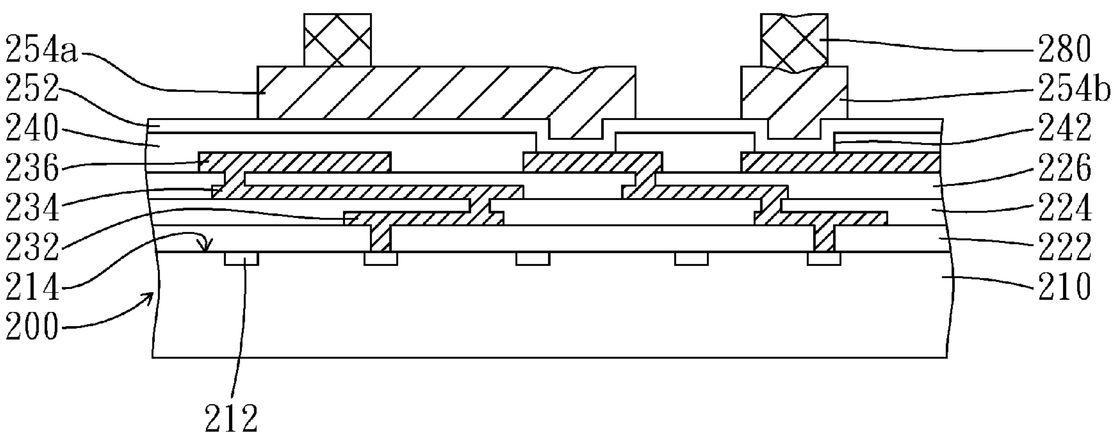

Next, the photoresist layer 270 is removed, and the bottom metal layer 252 is sequentially exposed, as shown in FIG. 20. Then, an etching process is performed to remove the bottom metal layers 252 not covered by the metal layer 254. The bottom metal layer 252 under the metal layer 254 is left, as shown FIG. 21. When a topmost metal layer of the bump 280 comprises solder, such as a tin-lead alloy, a tin-silver alloy, a tin-silver-copper alloy or tin, a reflowing process can be performed to round the upper surface of the bump 280. So far, forming a metal trace or plane 250 and a pad or bump 280 are completed. The metal trace or plane 250 is composed of the bottom metal layer 252 and the trace-shaped or plane-shaped metal layer 254*a*. The projection profile of each bump 280 projecting to the plane 1000 has an area of smaller than 30,000 $\mu m^2$, 20,000 $\mu m^2$, or 15,000 $\mu m^2$, for example.

The bump 280 may be used to connect the individual IC chip 205 to an external circuitry, such as another semiconductor chip or wafer, printed circuitry board, flexible substrate or glass substrate. The bump 280 may be connected to a pad of a glass substrate through multiple metal particles in an anisotropic conductive film (ACF) or anisotropic conductive paste (ACP). The bump 280 may be connected to a solder material preformed on another semiconductor chip or wafer, a printed circuitry board or a flexible substrate. The bump 280 may be connected to a bump preformed on another semiconductor chip or wafer.

Alternatively, the metal layer 280 may serve as a pad used to be wirebonded thereto. As shown in FIG. 21A, wirebonding wires 500 can be deposited on the pads 280. Alternatively, the metal layer 280 may serve as a pad used to be bonded with a solder material deposited on another circuitry component. The projection profile of each pad 280 projecting to the plane 1000 has an area of smaller than 30,000 $\mu m^2$, 20,000 $\mu m^2$, or 15,000 $\mu m^2$, for example.

2. Metallization Structure of Circuit/Metal Trace

Figure 21:
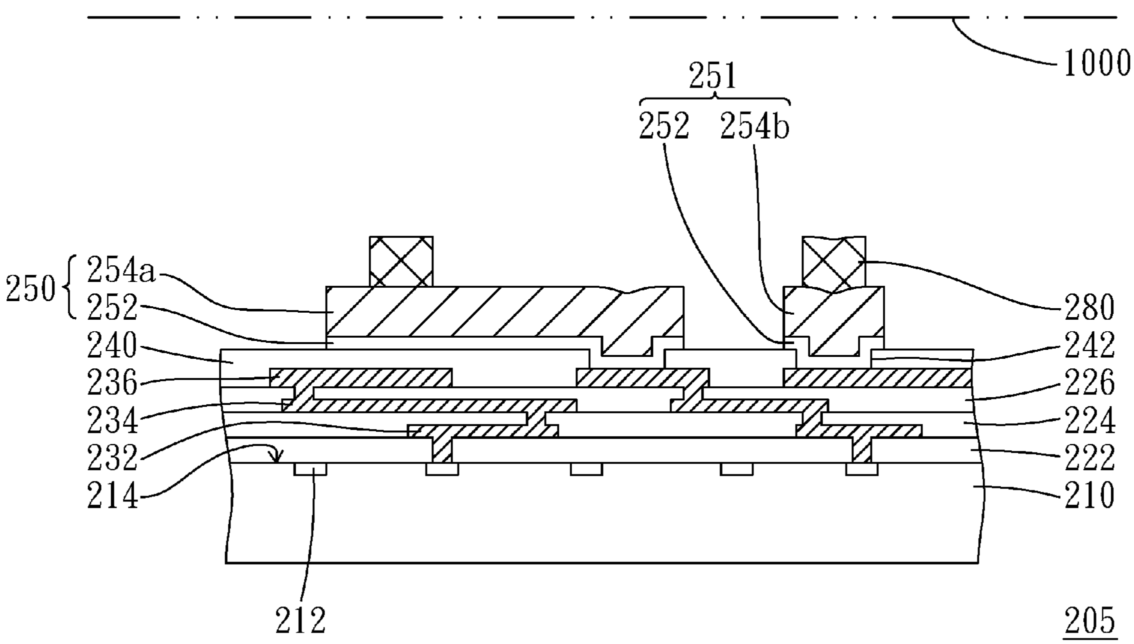
Figure 21A:
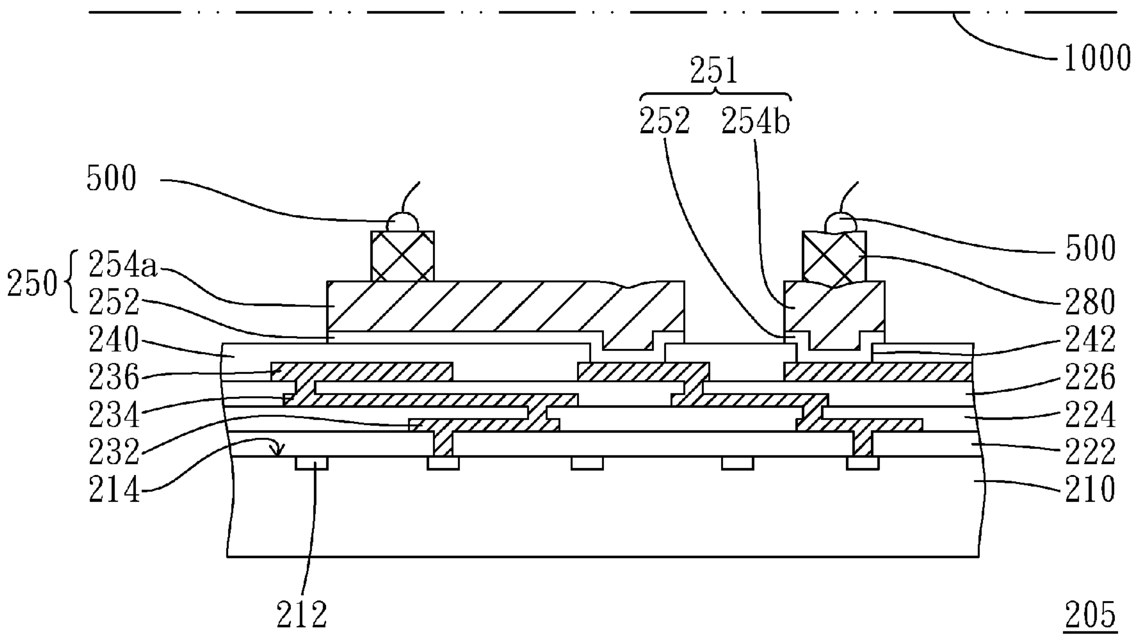

Referring now to FIG. 21, the pad 251 has the same metallization structure as the circuit/metal trace 250, depicted as follows.

A. First Type of Metallization Structure in Circuits/Metal Traces and Pads

Figure 22:
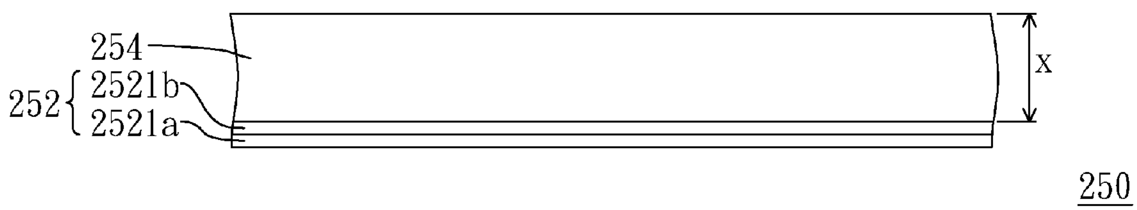
FIGS. 22-25 are schematic cross-sectional views illustrating the metallization structure of a trace according to the present invention.

Referring now to FIG. 22, a schematic cross-sectional view of the first type of metallization structure in the circuit/metal trace 250 and pad 251 according to the first embodiment is shown. For this embodiment, during the formation of bottom metal layer 252, a sputtering process can be first used to form an adhesive/barrier layer 2521*a*. Then, another sputtering process or an electroless plating process is used to form a seed layer 2521*b* on the adhesive/barrier layer 2521*a*. An electroplating or electroless plating process may be used to form a bulk metal layer 254 on the seed layer 2521*b*. The adhesion/barrier layer 2521*a* may comprise chromium, a chromium-copper alloy, titanium, a titanium-tungsten alloy, titanium nitride, tantalum or tantalum nitride, for example. The seed layer 2521*b*, such as gold, can be sputtered, electroless plated or electroplated on the adhesion/barrier layer 2521*a*, preferably comprising a titanium-tungsten alloy, and then the bulk metal layer 254 comprising gold is electroplated or electroless plated on the seed layer. The bulk metal layer 254 may be a single metal layer and may comprise gold with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers).

B. Second Type of Metallization Structure in Circuits/Metal Traces and Pads

Figure 23:
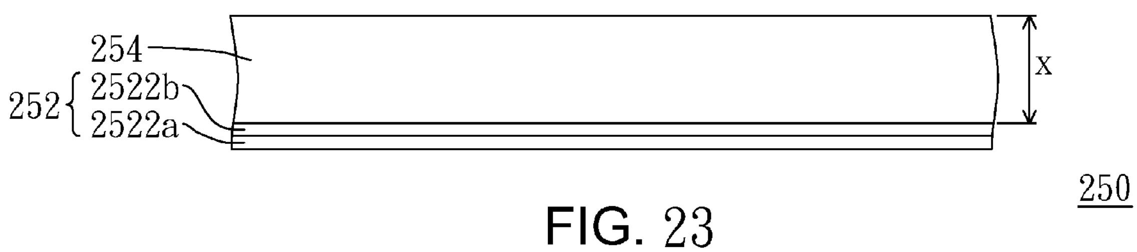

Referring now to FIG. 23, a schematic cross-sectional view of the second type of metallization structure in the circuit/metal trace 250 and pad 251 according to the second embodiment is shown. For this embodiment, during the formation of bottom metal layer 252, a sputtering process can be first used to form an adhesive/barrier layer 2522*a*. Then, another sputtering process or an electroless plating or electroplating process may be used to form a seed layer 2522*b* on the adhesive/barrier layer 2522*a*. An electroplating process or electroless plating process may be used to form a bulk metal layer 254 on the seed layer 2522*b*. The adhesion/barrier layer 2522*a* may comprise chromium, a chromium-copper alloy, titanium, a titanium-tungsten alloy, titanium nitride, tantalum or tantalum nitride, for example. The seed layer 2522*b*, such as copper, can be sputtered, electroless plated or electroplated on the adhesion/barrier layer 2522*a*, preferably comprising titanium, next the bulk metal layer 254 is electroplated or electroless plated on the seed layer 2522*b*. Alternatively, the seed layer 2522*b*, such as copper, can be sputtered, electroless plated or electroplated on the adhesion/barrier layer 2522*a* formed by first sputtering a chromium layer and then sputtering a chromium-copper-alloy layer on the chromium layer and then the bulk metal layer 254 comprising copper is electroplated or electroless plated on the seed layer. The bulk metal layer 254 may be a single metal layer and may comprise copper with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2522*a* may comprise chromium, a chromium-copper alloy, titanium, a titanium-tungsten alloy, titanium nitride, tantalum or tantalum nitride, for example. The seed layer 2522*b*, such as silver, can be sputtered, electroless plated or electroplated on the adhesion/barrier layer 2522*a* and then the bulk metal layer 254 comprising silver is electroplated or electroless plated on the seed layer. The bulk metal layer 254 may be a single metal layer and may comprise silver with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers).

Alternatively, the adhesion/barrier layer 2522*a* may comprise chromium, a chromium-copper alloy, titanium, a titanium-tungsten alloy, titanium nitride, tantalum or tantalum nitride, for example. The seed layer 2522*b*, such as platinum, can be sputtered, electroless plated or electroplated on the adhesion/barrier layer 2522*a* and then the bulk metal layer 254 comprising platinum is electroplated or electroless plated on the seed layer. The bulk metal layer 254 may be a single metal layer and may comprise platinum with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2522*a* may comprise chromium, a chromium-copper alloy, titanium, a titanium-tungsten alloy, titanium nitride, tantalum or tantalum nitride, for example. The seed layer 2522*b*, such as palladium, can be sputtered, electroless plated or electroplated on the adhesion/barrier layer 2522*a* and then the bulk metal layer 254 comprising palladium is electroplated or electroless plated on the seed layer. The bulk metal layer 254 may be a single metal layer and may comprise palladium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2522*a* may comprise chromium, a chromium-copper alloy, titanium, a titanium-tungsten alloy, titanium nitride, tantalum or tantalum nitride, for example. The seed layer 2522*b*, such as rhodium, can be sputtered, electroless plated or electroplated on the adhesion/barrier layer 2522*a* and then the bulk metal layer 254 comprising rhodium is electroplated or electroless plated on the seed layer. The bulk metal layer 254 may be a single metal layer and may comprise rhodium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2522*a* may comprise chromium, a chromium-copper alloy, titanium, a titanium-tungsten alloy, titanium nitride, tantalum or tantalum nitride, for example. The seed layer 2522*b*, such as ruthenium, can be sputtered, electroless plated or electroplated on the adhesion/barrier layer 2522*a* and then the bulk metal layer 254 comprising ruthenium is electroplated or electroless plated on the seed layer. The bulk metal layer 254 may be a single metal layer and may comprise ruthenium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2522*a* may comprise chromium, a chromium-copper alloy, titanium, a titanium-tungsten alloy, titanium nitride, tantalum or tantalum nitride, for example. The seed layer 2522*b*, such as nickel, can be sputtered, electroless plated or electroplated on the adhesion/barrier layer 2522*a* and then the bulk metal layer 254 comprising nickel is electroplated or electroless plated on the seed layer. The bulk metal layer 254 may be a single metal layer and may comprise nickel with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

C. Third Type of Metallization Structure in Circuits/Metal Traces and Pads

Figure 24:
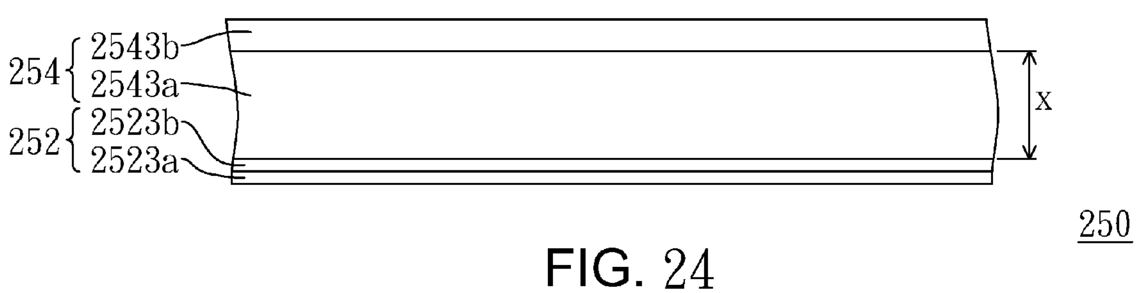

Referring now to FIG. 24, a schematic cross-sectional view of the third type of metallization structure in the circuit/metal trace 250 and pad 251 according to the first embodiment is shown. For this embodiment, during the formation of bottom metal layer 252, a sputtering process can be first used to form an adhesive/barrier layer 2523*a*. Then, another sputtering process or an electroless plating process may be used to form a seed layer 2523*b* on the adhesive/barrier layer 2523*a*. An electroplating or electroless plating process is used to form a bulk metal layer 254 on the seed layer 2523*b*. The adhesion/barrier layer 2523*a* may comprise chromium, a chromium-copper alloy, titanium, a titanium-tungsten alloy, titanium nitride, tantalum or tantalum nitride, for example. The seed layer 2523*b*, such as copper, is sputtered, electroless plated or electroplated on the adhesion/barrier layer 2523*a*, preferably comprising titanium, and next the bulk metal layer 254 is electroplated or electroless plated on the seed layer 2523*b*.

Alternatively, the seed layer 2523*b*, such as copper, is sputtered, electroless plated or electroplated on the adhesion/barrier layer 2523*a* formed by first sputtering a chromium layer and then sputtering a chromium-copper-alloy layer on the chromium, and then the bulk metal layer 254 is electroplated or electroless plated on the seed layer 2523*b*. The bulk metal layer 254 is formed by electroplating or electroless plating a first metal layer 2543*a* on the seed layer 2523*b* and then electroplating or electroless plating a second metal layer 2543*b* on the first metal layer 2543*a*. The first metal layer 2543*a* may comprise copper with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than lam, an electroplating process is preferably used to form the first metal layer 2543*a* or the second metal layer 2543*b*.

Alternatively, the adhesion/barrier layer 2523*a* may comprise chromium, a chromium-copper alloy, titanium, a titanium-tungsten alloy, titanium nitride, tantalum or tantalum nitride, for example. The seed layer 2523*b*, such as gold, is sputtered, electroless plated or electroplated on the adhesion/barrier layer 2523*a*, preferably comprising a titanium-tungsten alloy, and next the bulk metal layer 254 is electroplated or electroless plated on the seed layer 2523*b*. The bulk metal layer 254 is formed by electroplating or electroless plating a first metal layer 2543*a* on the seed layer 2523*b* and then electroplating or electroless plating a second metal layer 2543*b* on the first metal layer 2543*a*. The first metal layer 2543*a* may comprise gold with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 2523*a* may comprise chromium, a chromium-copper alloy, titanium, a titanium-tungsten alloy, titanium nitride, tantalum or tantalum nitride, for example. The seed layer 2523*b*, such as silver, is sputtered, electroless plated or electroplated on the adhesion/barrier layer 2523*a*, and next the bulk metal layer 254 is electroplated or electroless plated on the seed layer 2523*b*. The bulk metal layer 254 is formed by electroplating or electroless plating a first metal layer 2543*a* on the seed layer 2523*b* and then electroplating or electroless plating a second metal layer 2543*b* on the first metal layer 2543*a*. The first metal layer 2543*a* may comprise silver with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 2523*a* may comprise chromium, a chromium-copper alloy, titanium, a titanium-tungsten alloy, titanium nitride, tantalum or tantalum nitride, for example. The seed layer 2523*b*, such as platinum, is sputtered, electroless plated or electroplated on the adhesion/barrier layer 2523*a*, and next the bulk metal layer 254 is electroplated or electroless plated on the seed layer 2523*b*. The bulk metal layer 254 is formed by electroplating or electroless plating a first metal layer 2543*a* on the seed layer 2523*b* and then electroplating or electroless plating a second metal layer 2543*b* on the first metal layer 2543*a*. The first metal layer 2543*a* may comprise platinum with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 2523*a* may comprise chromium, a chromium-copper alloy, titanium, a titanium-tungsten alloy, titanium nitride, tantalum or tantalum nitride, for example. The seed layer 2523*b*, such as palladium, is sputtered, electroless plated or electroplated on the adhesion/barrier layer 2523*a*, and next the bulk metal layer 254 is electroplated or electroless plated on the seed layer 2523*b*. The bulk metal layer 254 is formed by electroplating or electroless plating a first metal layer 2543*a* on the seed layer 2523*b* and then electroplating or electroless plating a second metal layer 2543*b* on the first metal layer 2543*a*. The first metal layer 2543*a* may comprise palladium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 2523*a* may comprise chromium, a chromium-copper alloy, titanium, a titanium-tungsten alloy, titanium nitride, tantalum or tantalum nitride, for example. The seed layer 2523*b*, such as rhodium, is sputtered, electroless plated or electroplated on the adhesion/barrier layer 2523*a*, and next the bulk metal layer 254 is electroplated or electroless plated on the seed layer 2523*b*. The bulk metal layer 254 is formed by electroplating or electroless plating a first metal layer 2543*a* on the seed layer 2523*b* and then electroplating or electroless plating a second metal layer 2543*b* on the first metal layer 2543*a*. The first metal layer 2543*a* may comprise rhodium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 2523*a* may comprise chromium, a chromium-copper alloy, titanium, a titanium-tungsten alloy, titanium nitride, tantalum or tantalum nitride, for example. The seed layer 2523*b*, such as ruthenium, is sputtered, electroless plated or electroplated on the adhesion/barrier layer 2523*a*, and next the bulk metal layer 254 is electroplated or electroless plated on the seed layer 2523*b*. The bulk metal layer 254 is formed by electroplating or electroless plating a first metal layer 2543*a* on the seed layer 2523*b* and then electroplating or electroless plating a second metal layer 2543*b* on the first metal layer 2543*a*. The first metal layer 2543*a* may comprise ruthenium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

D. Fourth Type of Metallization Structure in Circuits/Metal Traces and Pads

Figure 25:
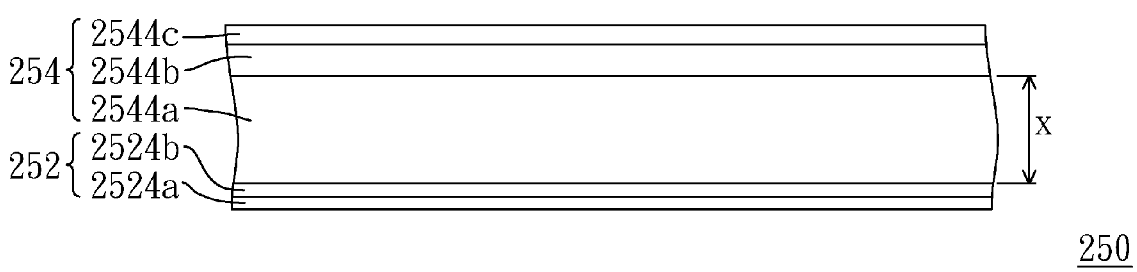

Referring now to FIG. 25, a schematic cross-sectional view of the fourth type of metallization structure in the circuit/metal trace 250 and pad 251 according to the first embodiment is shown. For this embodiment, during the formation of the bottom metal layer 252, a sputtering process can be first used to form an adhesive/barrier layer 2524*a*. Then, another sputtering process or an electroless plating is used to form a seed layer 2524*b* on the adhesive/barrier layer 2524*a*. An electroplating or electroless plating process is used to form a bulk metal layer 254 on the seed layer 2524*b*. The adhesion/barrier layer 2524*a* may comprise chromium, a chromium-copper alloy, titanium, a titanium-tungsten alloy, titanium nitride, tantalum or tantalum nitride, for example. The seed layer 2524*b*, such as copper, can be sputtered, electroless plated or electroplated on the adhesion/barrier layer 2524*a*, preferably comprising titanium, and next the bulk metal layer 254 is electroplated or electroless plated on the seed layer 2524*b*. Alternatively, the seed layer 2524*b*, such as copper, can be sputtered, electroless plated or electroplated on the adhesion/barrier layer 2524*a* formed by first sputtering a chromium layer and then sputtering a chromium-copper-alloy layer on the chromium, and then the bulk metal layer 254 is electroplated or electroless plated on the seed layer 2524*b*. The bulk metal layer 254 is formed by electroplating or electroless plating a first metal layer 2544*a* on the seed layer 2524*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise copper with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 2524*a* may comprise chromium, a chromium-copper alloy, titanium, a titanium-tungsten alloy, titanium nitride, tantalum or tantalum nitride, for example. The seed layer 2524*b*, such as gold, can be sputtered, electroless plated or electroplated on the adhesion/barrier layer 2524*a*, preferably comprising a titanium-tungsten alloy, and next the bulk metal layer 254 is electroplated or electroless plated on the seed layer 2524*b*. The bulk metal layer 254 is formed by electroplating or electroless plating a first metal layer 2544*a* on the seed layer 2524*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise gold with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 2524*a* may comprise chromium, a chromium-copper alloy, titanium, a titanium-tungsten alloy, titanium nitride, tantalum or tantalum nitride, for example. The seed layer 2524*b*, such as silver, can be sputtered, electroless plated or electroplated on the adhesion/barrier layer 2524*a* and next the bulk metal layer 254 is electroplated or electroless plated on the seed layer 2524*b*. The bulk metal layer 254 is formed by electroplating or electroless plating a first metal layer 2544*a* on the seed layer 2524*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise silver with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 2524*a* may comprise chromium, a chromium-copper alloy, titanium, a titanium-tungsten alloy, titanium nitride, tantalum or tantalum nitride, for example. The seed layer 2524*b*, such as platinum, can be sputtered, electroless plated or electroplated on the adhesion/barrier layer 2524*a* and next the bulk metal layer 254 is electroplated or electroless plated on the seed layer 2524*b*. The bulk metal layer 254 is formed by electroplating or electroless plating a first metal layer 2544*a* on the seed layer 2524*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise platinum with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 2524*a* may comprise chromium, a chromium-copper alloy, titanium, a titanium-tungsten alloy, titanium nitride, tantalum or tantalum nitride, for example. The seed layer 2524*b*, such as palladium, can be sputtered, electroless plated or electroplated on the adhesion/barrier layer 2524*a* and next the bulk metal layer 254 is electroplated or electroless plated on the seed layer 2524*b*. The bulk metal layer 254 is formed by electroplating or electroless plating a first metal layer 2544*a* on the seed layer 2524*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise palladium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 2524*a* may comprise chromium, a chromium-copper alloy, titanium, a titanium-tungsten alloy, titanium nitride, tantalum or tantalum nitride, for example. The seed layer 2524*b*, such as rhodium, can be sputtered, electroless plated or electroplated on the adhesion/barrier layer 2524*a* and next the bulk metal layer 254 is electroplated or electroless plated on the seed layer 2524*b*. The bulk metal layer 254 is formed by electroplating or electroless plating a first metal layer 2544*a* on the seed layer 2524*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise rhodium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 2524*a* may comprise chromium, a chromium-copper alloy, titanium, a titanium-tungsten alloy, titanium nitride, tantalum or tantalum nitride, for example. The seed layer 2524*b*, such as ruthenium, can be sputtered, electroless plated or electroplated on the adhesion/barrier layer 2524*a* and next the bulk metal layer 254 is electroplated or electroless plated on the seed layer 2524*b*. The bulk metal layer 254 is formed by electroplating or electroless plating a first metal layer 2544*a* on the seed layer 2524*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise ruthenium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

3. Metallization Structure in Bumps or Pads on Circuit/Metal Traces

In the first embodiment of the present invention, the bump or pad 280 is electroplated or electroless plated on the metal layer 254. A detailed description of the metallization structure of the bumps or pads 280 is as follows.

The bump or pad 280 electroplated or electroless plated on the metal layer 250 or 251 may be divided into two groups. One group is the bump or pad 280 comprising a reflowable or solderable material that is usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The soldable bump or pad 280 starts to reflow when temperature reaches the melting temperature of solder, or reflowable metal, or reflowable metal alloys (i.e. is roughly the peak temperature) for over 20 seconds. The peak-temperature period of the whole temperature profile takes over 2 minutes and typically 5 to 45 minutes. In summary, the soldable bump or pad 280 is reflowed at the temperature of between 150 and 350 centigrade degrees for more than 20 seconds or for more than 2 minutes. The solderable bump or pad 280 comprises solder or other metals or alloys with melting point between 150 and 350 centigrade degrees. The solderable bump or pad 280 comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 centigrade degrees, or greater than 200 centigrade degrees, or greater than 250 centigrade degrees.

The other group is that the bump or pad 280 is non-reflowable or non-solderable and can not be reflowed at the temperature of greater than 350 centigrade degrees for more than 20 seconds or for more than 2 minutes. Each component of the non-reflowable or the non-solder bump or pad 280 may not reflow at the temperature of more than 350 centigrade degrees for more than 20 seconds or for more than 2 minutes. The non-reflowable bump or pad 280 comprises metals or metal alloys with a melting point greater than 350 centigrade degrees or greater than 400 centigrade degrees, or greater than 600 centigrade degrees. Moreover, the non-reflowable bump or pad 280 does not comprise any metals or metal alloys with melting temperature lower than 350 centigrade degrees.

The non-reflowable bump or pad 280 may have a topmost metal layer comprising gold with greater than 90 weight percent and, preferably, greater than 97 weight percent. Alternatively, the non-reflowable bump or pad 280 may have a topmost metal layer with gold ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising copper with greater than 90 weight percent and, preferably, greater than 97 weight percent. Alternatively, the non-reflowable bump or pad 280 may have a topmost metal layer with copper ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising nickel with greater than 90 weight percent and, preferably, greater than 97 weight percent. Alternatively, the non-reflowable bump or pad 280 may have a topmost metal layer with nickel ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising silver with greater than 90 weight percent and, preferably, greater than 97 weight percent. Alternatively, the non-reflowable bump or pad 280 may have a topmost metal layer with silver ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising platinum with greater than 90 weight percent and, preferably, greater than 97 weight percent. Alternatively, the non-reflowable bump or pad 280 may have a topmost metal layer with platinum ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising palladium with greater than 90 weight percent and, preferably, greater than 97 weight percent. Alternatively, the non-reflowable bump or pad 280 may have a topmost metal layer with palladium ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising rhodium with greater than 90 weight percent and, preferably, greater than 97 weight percent. Alternatively, the non-reflowable bump or pad 280 may have a topmost metal layer with rhodium ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising ruthenium with greater than 90 weight percent and, preferably, greater than 97 weight percent. Alternatively, the non-reflowable bump or pad 280 may have a topmost metal layer with ruthenium ranging from 0 weight percent to 90 weight percent, or ranging from 0 weight percent to 50 weight percent, or ranging from 0 weight percent to 10 weight percent.

A. First Type of Metallization Structure in Bumps or Pads

Figure 26:
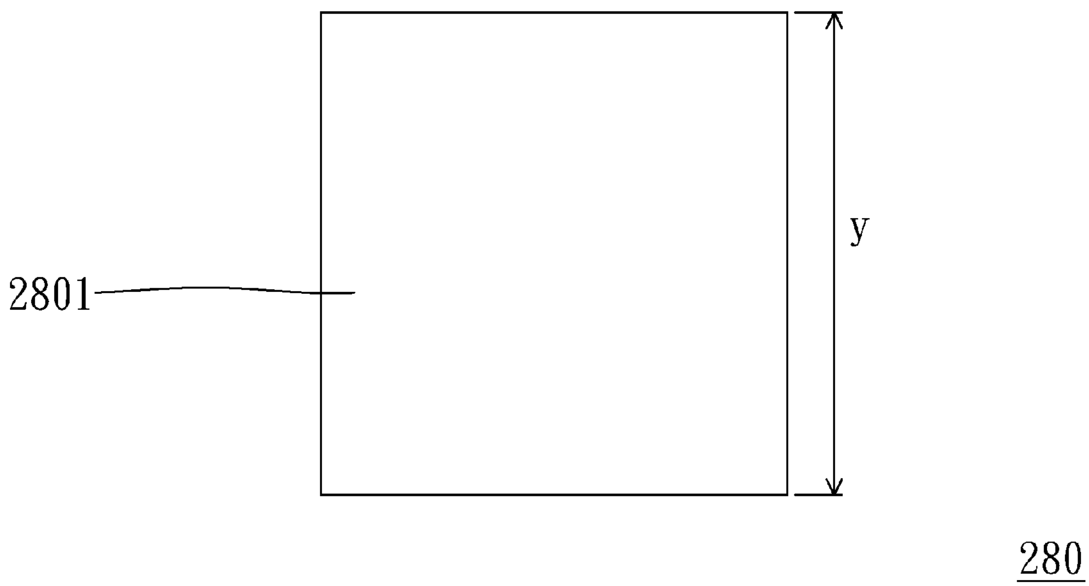
FIGS. 26-29 are schematic cross-sectional views illustrating the metallization structure of a bump or pad according to the present invention.

Referring now to FIG. 26, a schematic cross-sectional view of the first type of metallization structure in the bump or pad according to the present invention is shown. The bump or pad 280 may be a single layer. The metal layer 280 used for a bump may be a single metal layer having a thickness y greater than 5 μm, and preferably between 7 μm and 300 μm, for example, and formed by an electroplating process or an electroless plating process, for example. The metal layer 280 used for a pad may be a single metal layer having a thickness y greater than 0.01 μm, and preferably between 1 μm and 30 μm, for example, and formed by an electroplating process or an electroless plating process, for example. If the bump or pad 280 has a thickness greater than 1 μm, an electroplating process is preferably used to form the bump or pad 280. The single metal layer 280 may comprise gold with greater than 90 weight percent, and, preferably, greater than 97 weight percent and may have a thickness between 7 μm and 30 μm, for example. Alternatively, the single metal layer 280 may comprise copper with greater than 90 weight percent, and, preferably, greater than 97 weight percent and may have a thickness between 7 μm and 30 μm, for example. Alternatively, the single metal layer 280 may comprise platinum with greater than 90 weight percent, and, preferably, greater than 97 weight percent and may have a thickness between 7 μm and 30 μm, for example. Alternatively, the single metal layer 280 may comprise silver with greater than 90 weight percent, and, preferably, greater than 97 weight percent and may have a thickness between 7 μm and 30 μm, for example. Alternatively, the single metal layer 280 may comprise palladium with greater than 90 weight percent, and, preferably, greater than 97 weight percent. Alternatively, the single metal layer 280 may comprise rhodium with greater than 90 weight percent, and, preferably, greater than 97 weight percent and may have a thickness between 7 μm and 30 μm, for example. Alternatively, the single metal layer 280 may comprise ruthenium with greater than 90 weight percent, and, preferably, greater than 97 weight percent and may have a thickness between 7 μm and 30 μm, for example. Alternatively, the single metal layer 280 may comprise nickel with greater than 90 weight percent, and, preferably, greater than 97 weight percent and may have a thickness between 7 μm and 30 μm, for example. Alternatively, the single metal layer 280 may be a lead-containing solder material, such as a tin-lead alloy, or a lead-free solder material, such as a tin-silver alloy or a tin-silver-copper alloy and may have a thickness between 25 μm and 300 μm, for example. The bump or pad 280 having any one of the above-mentioned metallization structures can be formed on the metal layer 250 having any one of the above-mentioned metallization structures. Preferably, the bump or pad 280 may have the same metal material as the topmost metal layer of the patterned circuit layer 250.

A wirebonding wire can be bonded on the pad 280 having any one of the above-mentioned metallization structure. Alternatively, the bump or pad 280 having any one of the above-mentioned metallization structure may be bonded to a bump or pad preformed on another semiconductor chip or wafer. Alternatively, the bump 280 having any one of the above-mentioned metallization structure may be bonded to a pad of a printed circuit board or a flexible substrate. Alternatively, the bump 280 having any one of the above-mentioned metallization structure may be connected to a pad of a glass substrate through multiple metal particles in ACF or ACP.

B. Second Type of Metallization Structure in Bumps or Pads

Figure 27:
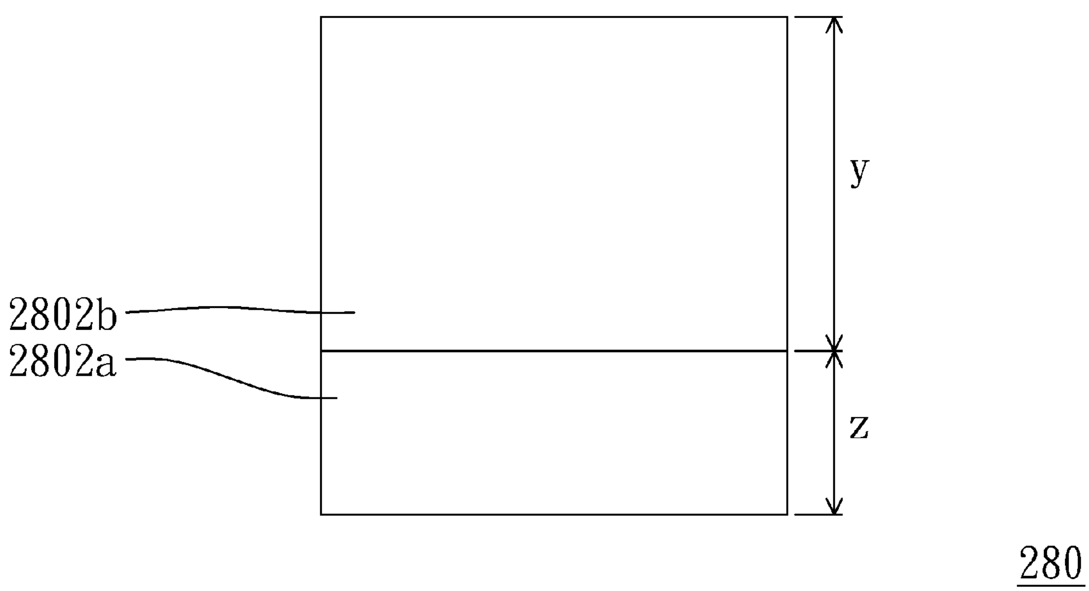

Referring now to FIG. 27, a schematic cross-sectional view of the second type of metallization structure in the bump or pad according to the present invention is shown. The bump or pad 280 may be formed by electroplating or electroless plating a first metal layer 2802*a* on the metal layer 250 and then electroplating or electroless plating a second metal layer 2802*b* on the first metal layer 2802*a*. The metal layer 280 used for a bump may have a thickness y+z greater than 5 μm, and preferably between 7 μm and 300 μm, for example. The metal layer 280 used for a pad may have a thickness y+z greater than 0.01 μm, and preferably between 1 μm and 30 μm When the first metal layer 2802*a* comprises copper with greater than 90 weight percent, and, preferably, greater than 97 weight percent, the second metal layer 2802*b* comprises nickel with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises gold with greater than 90 weight percent, and, preferably, greater than 97 weight percent, the second metal layer 2802*b* comprises nickel with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises silver with greater than 90 weight percent, and, preferably, greater than 97 weight percent, the second metal layer 2802*b* comprises nickel with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises platinum with greater than 90 weight percent, and, preferably, greater than 97 weight percent, the second metal layer 2802*b* comprises nickel with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises palladium with greater than 90 weight percent, and, preferably, greater than 97 weight percent, the second metal layer 2802*b* comprises nickel with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises rhodium with greater than 90 weight percent, and, preferably, greater than 97 weight percent, the second metal layer 2802*b* comprises nickel with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises ruthenium with greater than 90 weight percent, and, preferably, greater than 97 weight percent, the second metal layer 2802*b* comprises nickel with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises nickel with greater than 90 weight percent, and, preferably, greater than 97 weight percent, the second metal layer 2802*b* comprises gold with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises nickel with greater than 90 weight percent, and, preferably, greater than 97 weight percent, the second metal layer 2802*b* comprises silver with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises nickel with greater than 90 weight percent, and, preferably, greater than 97 weight percent, the second metal layer 2802*b* comprises copper with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises nickel with greater than 90 weight percent, and, preferably, greater than 97 weight percent, the second metal layer 2802*b* comprises platinum with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises nickel with greater than 90 weight percent, and, preferably, greater than 97 weight percent, the second metal layer 2802*b* comprises palladium with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises nickel with greater than 90 weight percent, and, preferably, greater than 97 weight percent, the second metal layer 2802*b* comprises rhodium with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

When the first metal layer 2802*a* comprises nickel with greater than 90 weight percent, and, preferably, greater than 97 weight percent, the second metal layer 2802*b* comprises ruthenium with greater than 90 weight percent, and, preferably, greater than 97 weight percent. Based on the metal layer 280 for a bump having the metallization structure, the first metal layer 2802*a* may have a thickness z greater than 1 μm, and preferably between 2 μm and 30 μm, for example, and the second metal layer 2802*b* may have a thickness y greater than 1 μm, and preferably between 2 μm and 30 μm, for example. Based on the metal layer 280 for a pad having the metallization structure, the first metal layer 2802*a* may have a thickness z greater than 0.01 μm, and preferably between 1 μm and 10 μm, for example, and the second metal layer 2802*b* may have a thickness y greater than 0.01 μm, and preferably between 1 μm and 10 μm, for example.

The bump or pad 280 having any one of the above-mentioned metallization structures can be formed on the metal layer 250 having any one of the above-mentioned metallization structures. Preferably, the bottommost metal layer of the bump or pad 280 may have the same metal material as the topmost metal layer of the patterned circuit layer 250.

A wirebonding wire can be bonded on the pad 280 having any one of the above-mentioned metallization structure. Alternatively, the bump or pad 280 having any one of the above-mentioned metallization structure may be bonded to a bump or pad preformed on another semiconductor chip or wafer. Alternatively, the bump 280 having any one of the above-mentioned metallization structure may be bonded to a pad of a printed circuit board or a flexible substrate. Alternatively, the bump 280 having any one of the above-mentioned metallization structure may be connected to a pad of a glass substrate through multiple metal particles in ACF or ACP.

C. Third Type of Metallization Structure in Bumps or Pads

Figure 28:
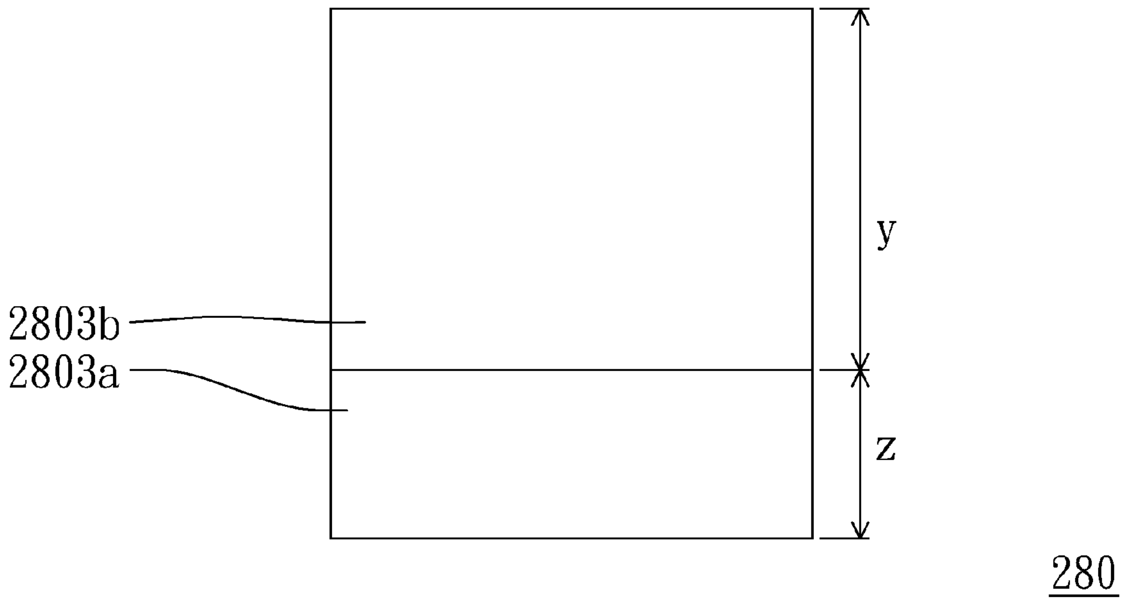

Referring now to FIG. 28, a schematic cross-sectional view of the third type of metallization structure in the bump or pad according to the present invention is shown. The bump or pad 280 may be formed by electroplating or electroless plating a first metal layer 2803*a* on the metal layer 250 and then electroplating or electroless plating a second metal layer 2803*b* on the first metal layer 2803*a*. The metal layer 280 used for a bump may have a thickness y+z greater than 5 μm, and preferably between 7 μm and 300 μm, for example. The metal layer 280 used for a pad may have a thickness y+z greater than 0.01 μm, and preferably between 1 μm and 30 μm.

The first metal layer 2803*a* comprises nickel with greater than 90 weight percent, and, preferably, greater than 97 weight percent, and the second metal layer 2803*b* comprises a lead-containing solder material, such as tin-lead alloy, or a lead-free solder material, such as tin-silver alloy or tin-silver-copper alloy. Based on the metal layer 280 for a bump having the metallization structure, the first metal layer 2803*a* may have a thickness z greater than 1 μm, and preferably between 2 μm and 30 μm, for example, and the second metal layer 2803*b* may have a thickness y greater than 25 μm, and preferably between 50 μm and 300 μm, for example. Based on the metal layer 280 for a pad having the metallization structure, the first metal layer 2803*a* may have a thickness z greater than 0.01 μm, and preferably between 1 μm and 30 μm, for example, and the second metal layer 2803*b* may have a thickness y greater than 1 μm, and preferably between 1 μm and 50 μm, for example.

The bump or pad 280 having any one of the above-mentioned metallization structures can be formed on the metal layer 250 having any one of the above-mentioned metallization structures. Preferably, the bottommost metal layer of the bump or pad 280 may have the same metal material as the topmost metal layer of the patterned circuit layer 250.

A wirebonding wire can be bonded on the pad 280 having any one of the above-mentioned metallization structure. Alternatively, the bump or pad 280 having any one of the above-mentioned metallization structure may be bonded to a bump or pad preformed on another semiconductor chip or wafer. Alternatively, the bump 280 having any one of the above-mentioned metallization structure may be bonded to a pad of a printed circuit board or a flexible substrate. Alternatively, the bump 280 having any one of the above-mentioned metallization structure may be connected to a pad of a glass substrate through multiple metal particles in ACF or ACP.

D. Fourth Type of Metallization Structure in Bumps or Pads

Figure 29:
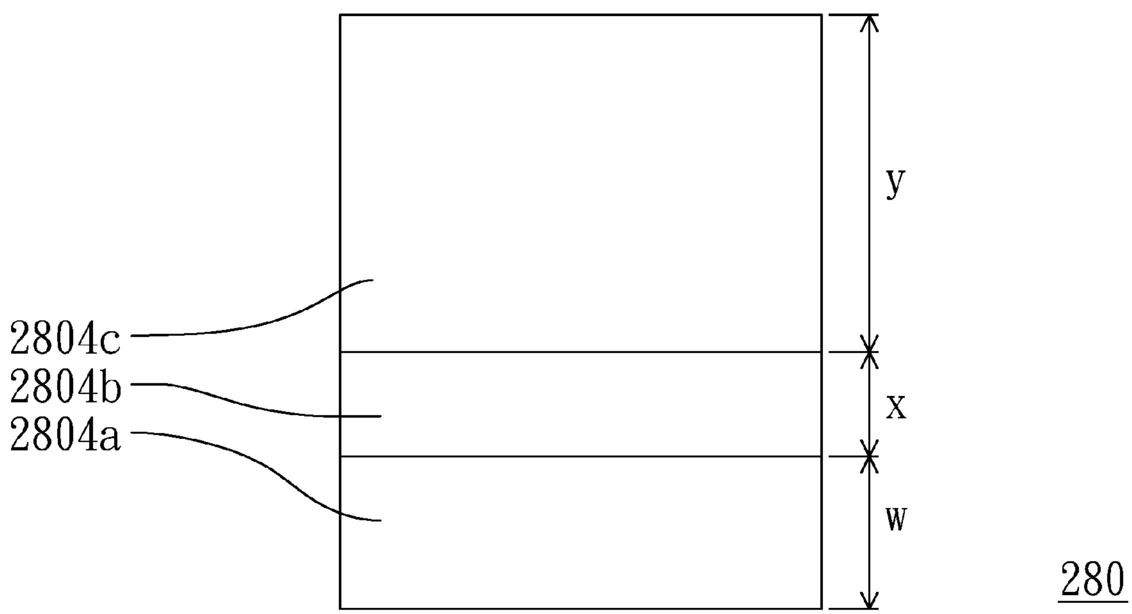
Figure 30:
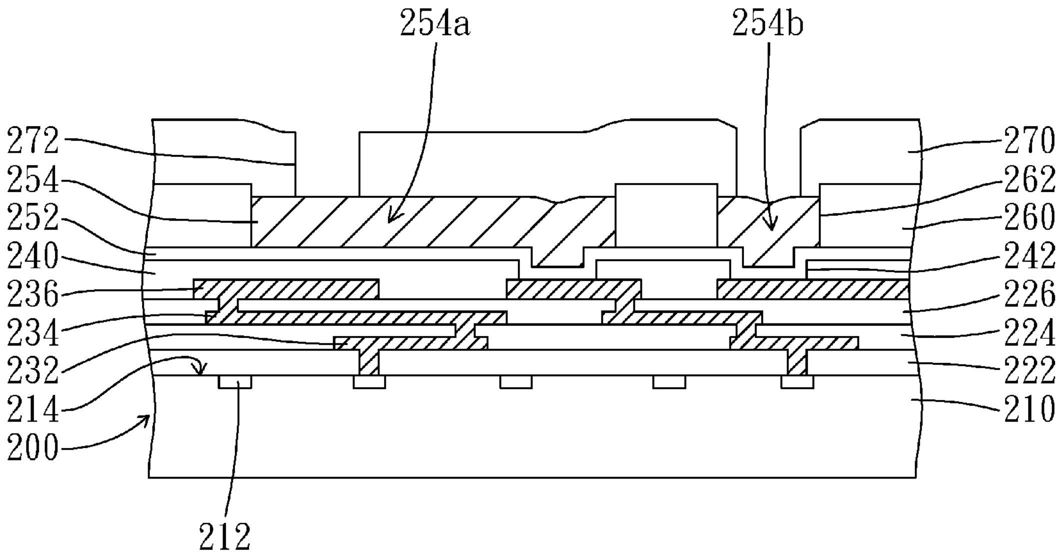
FIGS. 30-33 are schematic cross-sectional views illustrating another preferred embodiment of the first method for forming circuits/metal traces and bumps or pads according to the present invention.

Referring now to FIG. 29, a schematic cross-sectional view of the fourth type of metallization structure in the bump or pad according to the present invention is shown. The bump or pad 280 may be formed by electroplating or electroless plating a first metal layer 2804*a* on the metal layer 250, next electroplating or electroless plating a second metal layer 2804*b* on the first metal layer 2804*a*, and then electroplating or electroless plating a third metal layer 2804*c* on the second metal layer 2804*b*. The metal layer 280 used for a bump may have a thickness w+x+y greater than 5 μm, and preferably between 7 μm and 300 μm, for example. The metal layer 280 used for a pad may have a thickness w+x+y greater than 0.01 μm, and preferably between 1 μm and 30 μm.

The first metal layer 2804*a* for a bump may have a thickness w greater than 1 μm, and preferably between 1 μm and 10 μm, for example, while the first metal layer 2804*a* for a pad may have a thickness w greater than 0.01 μm, and preferably between 1 μm and 10 μm. The first metal layer 2804*a* may comprise copper with greater than 90 weight percent, and, preferably, greater than 97 weight percent. Alternatively, the first metal layer 2804*a* may comprise gold with greater than 90 weight percent, and, preferably, greater than 97 weight percent. Alternatively, the first metal layer 2804*a* may comprise silver with greater than 90 weight percent, and, preferably, greater than 97 weight percent. Alternatively, the first metal layer 2804*a* may comprise platinum with greater than 90 weight percent, and, preferably, greater than 97 weight percent. Alternatively, the first metal layer 2804*a* may comprise palladium with greater than 90 weight percent, and, preferably, greater than 97 weight percent. Alternatively, the first metal layer 2804*a* may comprise rhodium with greater than 90 weight percent, and, preferably, greater than 97 weight percent. Alternatively, the first metal layer 2804*a* may comprise ruthenium with greater than 90 weight percent, and, preferably, greater than 97 weight percent.

The second metal layer 2804*b* for a bump may have a thickness x greater than 1 μm, and preferably between 1 μm and 10 μm, for example, while the first metal layer 2804*b* for a pad may have a thickness x greater than 0.01 μm, and preferably between 1 μm and 10 μm. The first metal layer 2804*b* may comprise nickel with greater than 90 weight percent, and, preferably, greater than 97 weight percent.

The third metal layer 2804*c* may comprise gold with greater than 90 weight percent, and, preferably, greater than 97 weight percent and may have a thickness y between 7 μm and 30 μm for a bump or between 1 μm and 10 μm for a pad. Alternatively, the third metal layer 2804*c* may comprise silver with greater than 90 weight percent, and, preferably, greater than 97 weight percent and may have a thickness y between 7 μm and 30 μm for a bump or between 1 μm and 10 μm for a pad. Alternatively, the third metal layer 2804*c* may comprise copper with greater than 90 weight percent, and, preferably, greater than 97 weight percent and may have a thickness y between 7 μm and 30 μm for a bump or between 1 μm and 10 μm for a pad. Alternatively, the third metal layer 2804*c* may comprise platinum with greater than 90 weight percent, and, preferably, greater than 97 weight percent and may have a thickness y between 7 μm and 30 μm for a bump or between 1 μm and 10 μm for a pad. Alternatively, the third metal layer 2804*c* may comprise palladium with greater than 90 weight percent, and, preferably, greater than 97 weight percent and may have a thickness y between 7 μm and 30 μm for a bump or between 1 μm and 10 μm for a pad. Alternatively, the third metal layer 2804*c* may comprise rhodium with greater than 90 weight percent, and, preferably, greater than 97 weight percent and may have a thickness y between 7 μm and 30 μm for a bump or between 1 μm and 10 μm for a pad. Alternatively, the third metal layer 2804*c* may comprise ruthenium with greater than 90 weight percent, and, preferably, greater than 97 weight percent and may have a thickness y between 7 μm and 30 μm for a bump or between 1 μm and 10 μm for a pad. Alternatively, the third metal layer 2804*c* may comprise a lead-containing solder material, such as tin-lead alloy, or a lead-free solder material, such as tin-silver alloy or tin-silver-copper alloy and may have a thickness y between 25 μm and 300 μm for a bump or between 1 μm and 50 μm for a pad.

The metal layer 280 may comprise the first metal layer 2804*a* having any one of the above-mentioned metallization structure, and the second metal layer 2804*b*, and the third metal layer 2804*c* having any one of the above-mentioned metallization structure. The bump or pad 280 having any one of the above-mentioned metallization structures can be formed on the metal layer 250 having any one of the above-mentioned metallization structures. Preferably, the bottom-most metal layer of the bump or pad 280 may have the same metal material as the topmost metal layer of the patterned circuit layer 250.

A wirebonding wire can be bonded on the pad 280 having any one of the above-mentioned metallization structure. Alternatively, the bump or pad 280 having any one of the above-mentioned metallization structure may be bonded to a bump or pad preformed on another semiconductor chip or wafer. Alternatively, the bump 280 having any one of the above-mentioned metallization structure may be bonded to a pad of a printed circuit board or a flexible substrate. Alternatively, the bump 280 having any one of the above-mentioned metallization structure may be connected to a pad of a glass substrate through multiple metal particles in ACF or ACP.

4. Second Method for Forming Circuit/Metal Traces and Bumps

The difference between the first and second methods lies in the steps involving the formation and removal of the photoresist layer. In the first method, the photoresist layer for defining the circuit/metal traces is removed before the photoresist layer for defining the bump is formed. The second method for forming circuit/metal traces and bumps is described as below.

FIGS. 30-33 show schematic cross-sectional views of the second method for forming circuit/metal traces and bumps. The steps in FIGS. 30-33 follows the step in FIG. 16.

Figure 31:
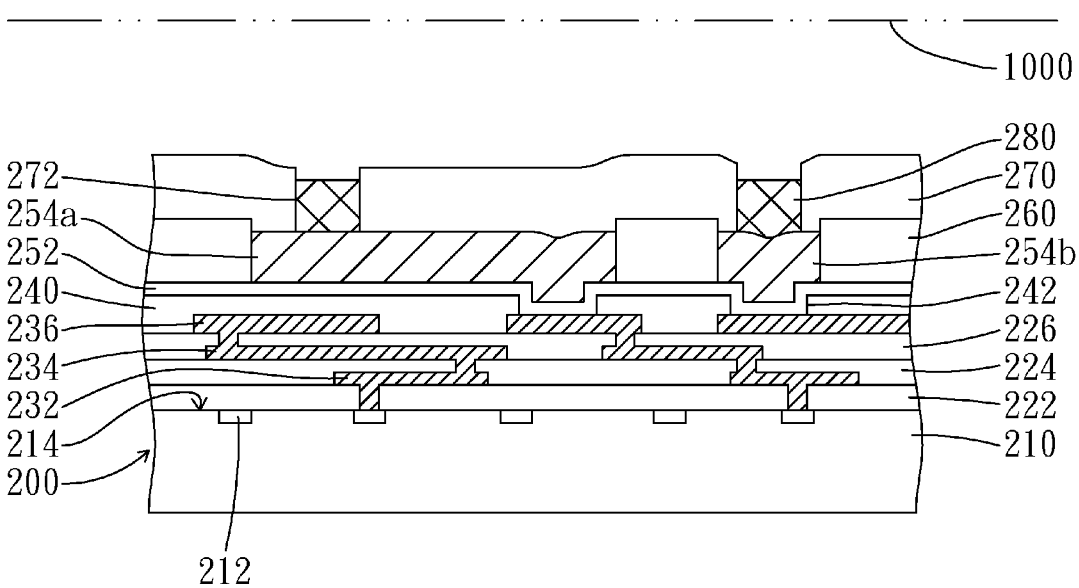
Figure 33:
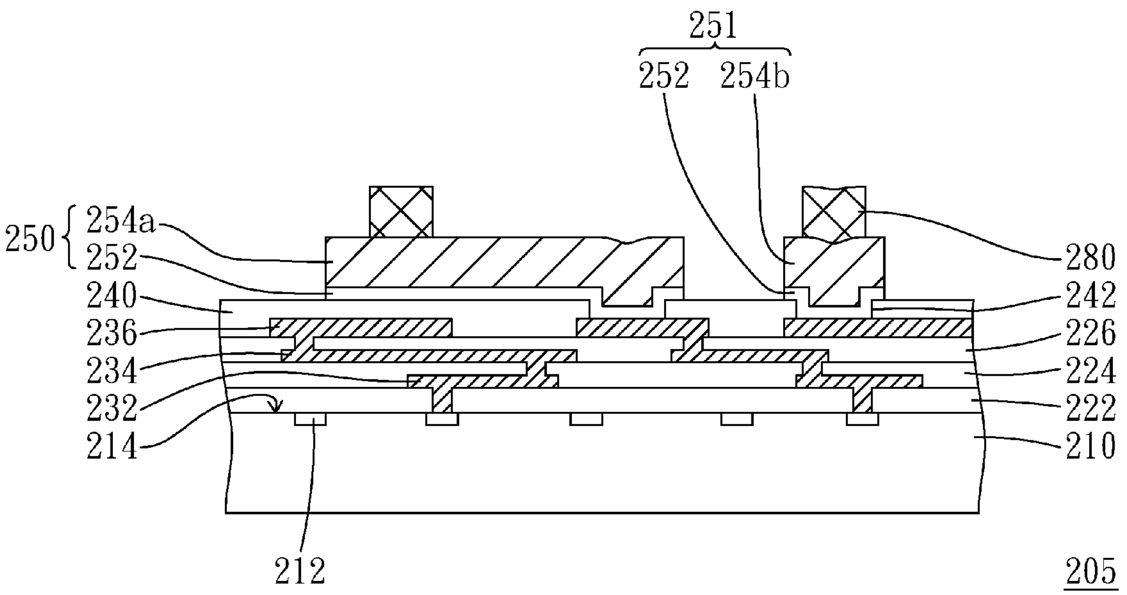

After the metal layer 254 is formed, as shown in FIG. 16, a photoresist layer 270 is formed on the metal layer 254 and photoresist layer 260, as shown in FIG. 33. An opening 272 in the photoresist layer 270 exposes the metal layer 254. An electroplating or electroless plating method can be used to form the metal layer 280 used for a pad or a bump on the metal layer 254 exposed by the opening 272 in the photoresist layer 270, as shown in FIG. 31.

Figure 32:
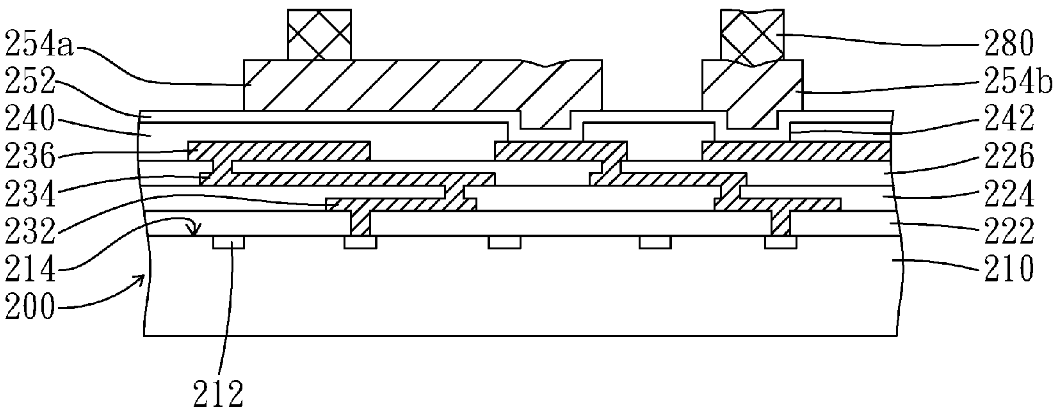

Next, the photoresist layers 270 and 260 are removed and the bottom metal layer 252 is exposed, as shown in FIG. 32. With the metal layer 254 serving as an etching mask, an etching process is then utilized to sequentially remove the seed layer and the adhesive/barrier layer of the bottom metal layer 252 not covered by the metal layer 254. As a result, the bottom metal layer 252, located under the metal layer 254, can be preserved, as shown FIG. 33. When a topmost metal layer of the bump or pad 280 comprises solder, such as a tin-lead alloy, a tin-silver alloy, a tin-silver-copper alloy or tin, a reflowing process can be performed to round the upper surface of the bump or pad 280 (not shown). The projection profile of each bump or pad 280 projecting to the plane 1000 has an area of smaller than 30,000 $\mu m^2$, 20,000 $\mu m^2$, or 15,000 $\mu m^2$, for example.

Next, the die sawing process is performed. In the die sawing process, a cutting blade cuts along the scribe-line of semiconductor wafer 200 to split the wafer into many individual IC chips 205.

The metallization structures of the circuits/metal traces 250, pads 251, and bumps or pads 280 may refer to those above illustrated in points 2 and 3.

5. First Type for Forming Circuit/Metal Traces and Pillar-Shaped Bumps

Additionally, the above process may be performed to deposit pillar-shaped bumps on metal traces or pads. FIGS. 34-38 are schematic cross-sectional views of the first type for forming circuit/metal traces and pillar-shaped bumps. The steps in FIGS. 34-38 follows the step in FIG. 17.

Figure 34:
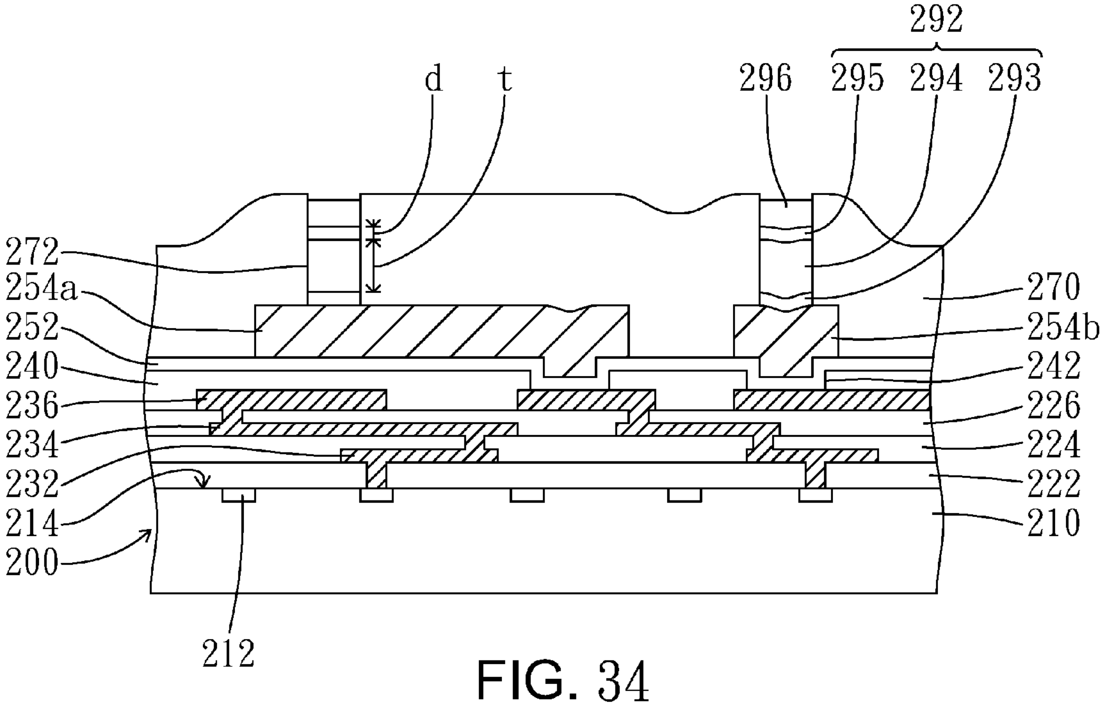
FIGS. 34-41 are schematic cross-sectional views illustrating another preferred embodiment of the first method for forming circuits/metal traces and pillar-shaped bumps according to the present invention.

After the metal layer 254 is formed, as shown in FIG. 17, a photoresist layer 270 is formed on the metal layer 254*a* and 254*b* and bottom metal layer 252, as shown in FIG. 34. An opening 272 in the photoresist layer 270 exposes the metal layer 254*a* and 254*b*.

Referring to FIG. 34, an electroplating method or an electroless plating method can be used to form metal pillars 292 on the metal layer 254*a* and 254*b* exposed by the opening 272 and then to form a solder layer 296 on the metal pillars 292. To form the metal pillars 292, an electroplating or electroless plating method is utilized to form, in the following order, an adhesion/barrier layer 293, a pillar-shaped metal layer 294, and an anti-collapse metal layer 295.

The adhesion/barrier layer 293 may comprise nickel with greater than 90 weight percent, and, preferably, greater than 97 weight percent and may have a thickness greater than 100 angstroms, and preferably between 1000 angstroms and 10 μm. The adhesion/barrier layer 293 may be formed using an electroplating or an electroless plating process. If the adhesion/barrier layer 293 has a thickness greater than 1 μm, an electroplating process is preferably used to form the adhesion/barrier layer 293.

The pillar-shaped metal layer 294 may comprise gold with greater than 90 weight percent, and, preferably, greater than 97 weight percent and may have a thickness t greater than 8 μm, and preferably between 50 μm and 200 μm. Alternatively, the pillar-shaped metal layer 294 may comprise silver with greater than 90 weight percent, and, preferably, greater than 97 weight percent and may have a thickness t greater than 8 μm, and preferably between 50 μm and 200 μm. Alternatively, the pillar-shaped metal layer 294 may comprise copper with greater than 90 weight percent, and, preferably, greater than 97 weight percent and may have a thickness t greater than 8 μm, and preferably between 50 μm and 200 μm. Alternatively, the pillar-shaped metal layer 294 may comprise platinum with greater than 90 weight percent, and, preferably, greater than 97 weight percent and may have a thickness t greater than 8 μm, and preferably between 50 μm and 200 μm. Alternatively, the pillar-shaped metal layer 294 may comprise palladium with greater than 90 weight percent, and, preferably, greater than 97 weight percent and may have a thickness t greater than 8 μm, and preferably between 50 μm and 200 μm. Alternatively, the pillar-shaped metal layer 294 may comprise rhodium with greater than 90 weight percent, and, preferably, greater than 97 weight percent and may have a thickness t greater than 8 μm, and preferably between 50 μm and 200 μm. Alternatively, the pillar-shaped metal layer 294 may comprise ruthenium with greater than 90 weight percent, and, preferably, greater than 97 weight percent and may have a thickness t greater than 8 μm, and preferably between 50 μm and 200 μm. Alternatively, the pillar-shaped metal layer 294 may comprise a lead-containing solder material, such as tin-lead alloy with Pb greater than 90 weight percent, or a lead-free solder material, such as tin-silver alloy or tin-silver-copper alloy and may have a thickness t greater than 8 μm, and preferably between 50 μm and 200 μm. The pillar-shaped metal layer 294 having any one of the above-mentioned metallization structures can be formed using an electroplating process, for example.

The anti-collapse metal layer 295 may comprise nickel with greater than 90 weight percent, and, preferably, greater than 97 weight percent and may have a thickness d greater than 5000 angstroms, and preferably between 1 μm and 30 μm. The anti-collapse metal layer 295 may be formed using an electroplating or an electroless plating process. If the anti-collapse metal layer 295 has a thickness greater than 1 μm, an electroplating process is preferably used to form the anti-collapse metal layer 295.

After forming the metal pillars 292, a solder layer 296 is formed on the anti-collapse metal layer 295 and in the opening 272. The solder layer 296 may comprises a lead-containing solder material, such as tin-lead alloy with Pb greater than 90 weight percent, or a lead-free solder material, such as tin-silver alloy or tin-silver-copper alloy. The solder layer 296 has a melting point less than that of any metal layer in the metal pillars 292. The solder layer 296 may have a thickness greater than 5 μm, and preferably between 20 μm and 200 μm.

The bump may comprise the adhesion/barrier layer 293, the pillar-shaped metal layer 294 having any one of the above-mentioned metallization structure, the anti-collapse metal layer 295 and the solder layer 296 having any one of the above-mentioned metallization structure. Any one of the above-mentioned metallization structures for the pillar-shaped metal layer 294 can be arranged for any one of the above-mentioned metallization structures for the solder layer 296 due to the anti-collapse metal layer 295 located between the pillar-shaped metal layer 294 and the solder layer 296. Alternatively, the anti-collapse metal layer 295 can be saved, that is, the solder layer 296 can be formed on and in touch with the pillar-shaped metal layer 294.

Preferably, the adhesion/barrier layer 293 of the bump may have the same metal material as the topmost metal layer of the patterned circuit layer 254*a* and 254*b*.

Figure 35:
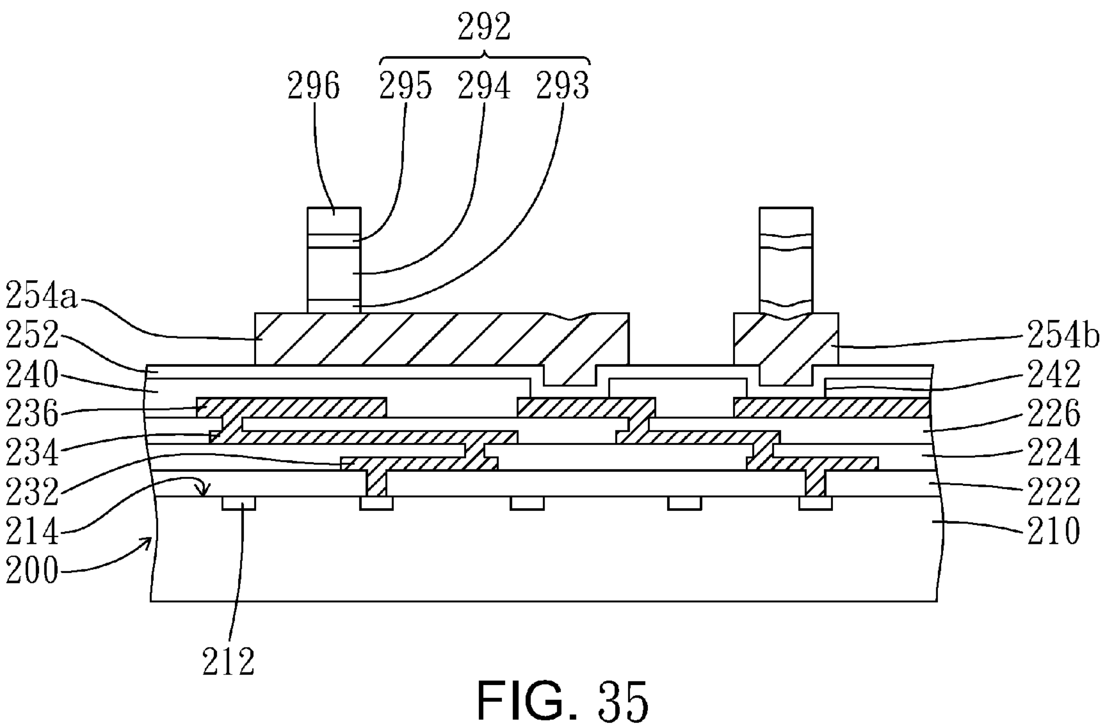
Figure 36:
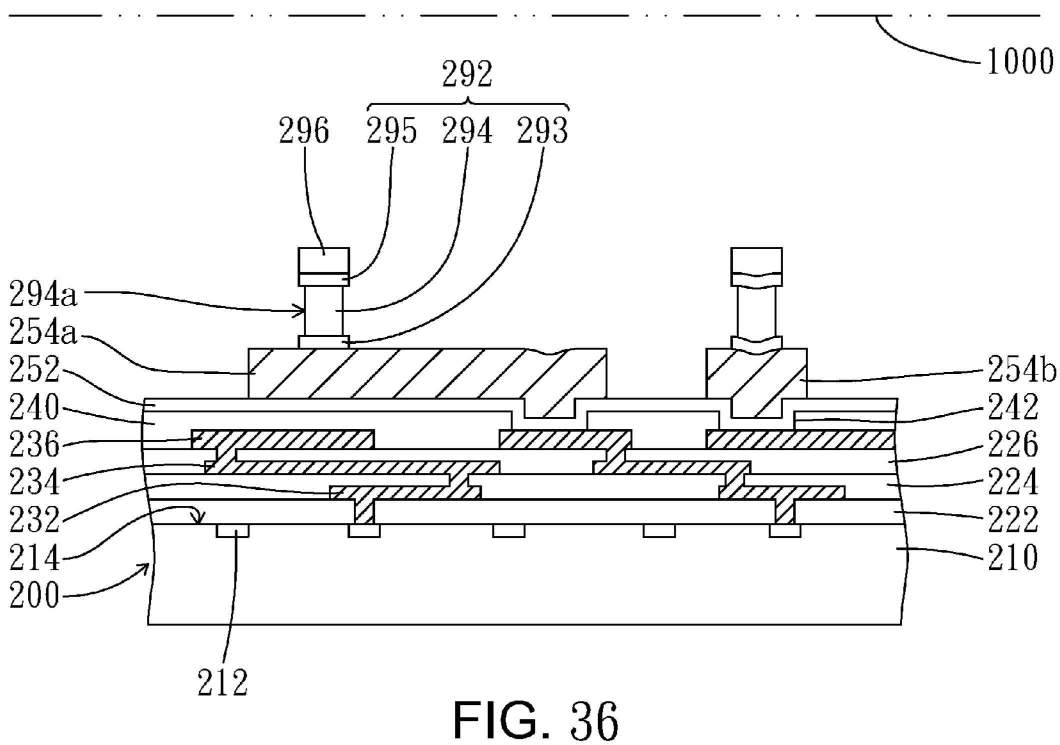
Figure 37:
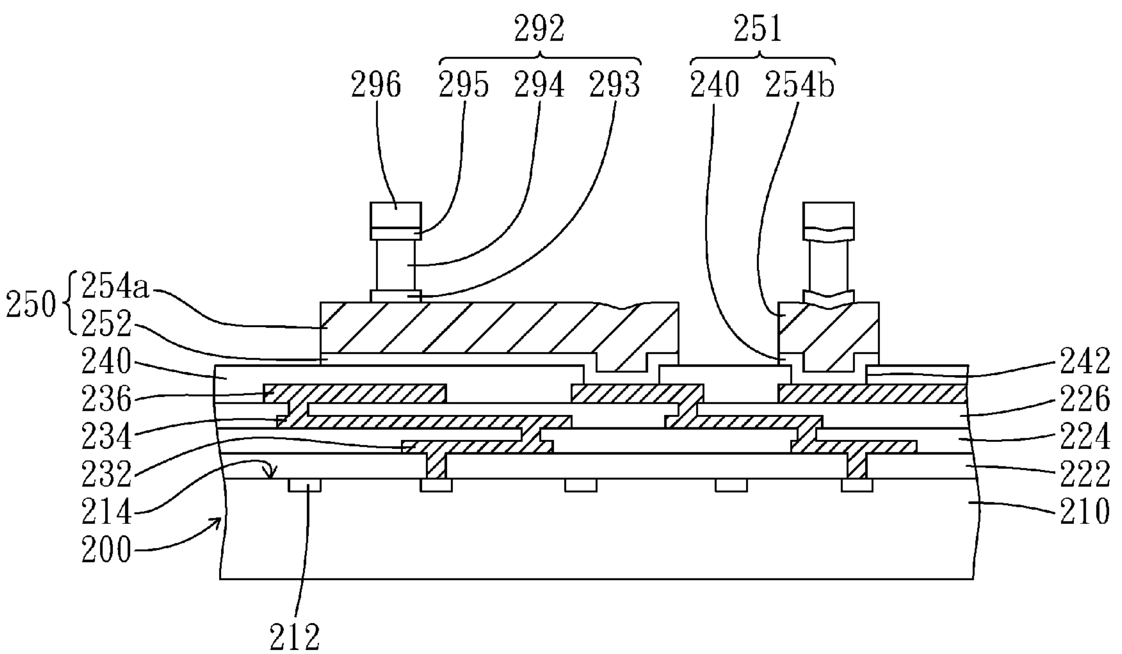
Figure 38:
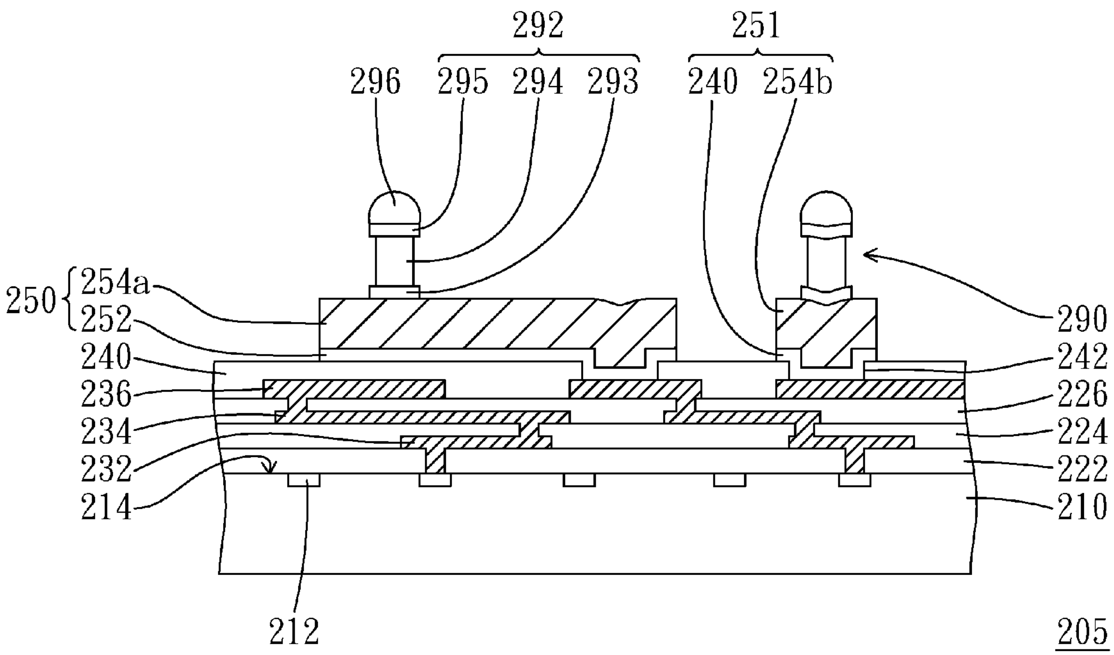

Next, the photoresist layer 270 is removed and the bottom metal layer 252 is exposed, as shown in FIG. 35. Subsequently, the pillar-shaped metal layer 294 can be etched from the side wall 294*a* thereof such that the projection profile of the pillar-shaped metal layer 294 projecting to the plane 1000 can be smaller than that of the anti-collapse metal layer 295 projecting to the plane 1000 or smaller than that of the solder layer 296 projecting to the plane 1000, as shown in FIG. 36. The bottom surface of the anti-collapse metal layer 295 has an exposed peripheral region. With the patterned metal layer 254*a* and 254*b* as an etching mask, the seed layer and the adhesive/barrier layers of the bottom metal layer 252 not covered by the patterned metal layer 254*a* and 254*b* are removed using an etching process, shown in FIG. 37. Thereafter, a reflowing process may be used to round the upper surface of solder layer 296, as shown in FIG. 38. In this case, the bumps 290 comprise the adhesion/barrier layer 293, pillar-shaped metal layer 294, anti-collapse metal layer 295 and solder layer 296.

Referring now to FIG. 38, it can be seen that the bottom surface of the anti-collapse metal layer 295 has an exposed peripheral region. As a result, the melting solder layer 296 does not flow down the side wall 294*a* of the pillar-shaped metal layer 294 during the reflowing process. This provision thus prevents the solder layer 296 from being collapsed.

Next, die sawing process is performed. In the die sawing process, a cutting blade cuts along the scribe-line of semiconductor wafer 200 to split the wafer into many individual IC chips 205. The bump 290 may be used to connect the individual IC chip 205 to an external circuitry, such as another semiconductor chip or wafer, printed circuitry board, flexible substrate or glass substrate. The bump 290 may be connected to a pad of a glass substrate through multiple metal particles in an anisotropic conductive film (ACF) or anisotropic conductive paste (ACP). The bump 290 may be connected to a solder material preformed on another semiconductor chip or wafer, a printed circuitry board or a flexible substrate. The bump 290 may be connected to a bump preformed on another semiconductor chip or wafer.

Figure 39:
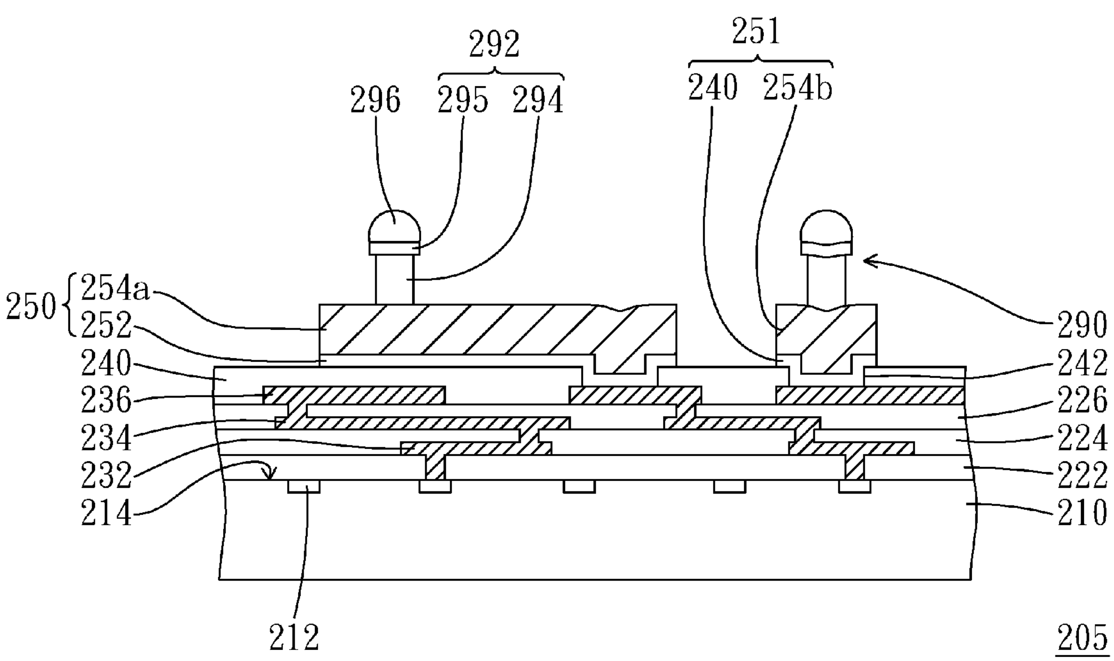

Alternatively, the adhesion/barrier layer 293 can be saved, as shown in FIG. 39. The pillar-shaped metal layer 294 having any one of the above-mentioned metallization structures can be formed on and in contact with the topmost metal layer of the patterned circuit layer 254*a* and 254*b* if the adhesion between the pillar-shaped metal layer 294 and the topmost metal layer of the patterned circuit layer 254*a* and 254*b* is satisfied, wherein the patterned circuit layer 254*a* and 254*b* may have the similar metallization structures as above illustrated in FIGS. 22-25. Preferably, the pillar-shaped metal layer 294 made of substantially pure copper mentioned above can be formed on the topmost metal layer, made of substantially pure copper, gold or nickel, of the patterned circuit layer 254*a* and 254*b*. The pillar-shaped metal layer 294 made of substantially pure gold mentioned above can be formed on the topmost metal layer, made of substantially pure copper, gold or nickel, of the patterned circuit layer 254*a* and 254*b*. The pillar-shaped metal layer 294 of the bump may have the same metal material as the topmost metal layer of the patterned circuit layer 254*a* and 254*b*.

6. Second Type for Forming Circuit/Metal Traces and Pillar-Shaped Bumps

Figure 40:
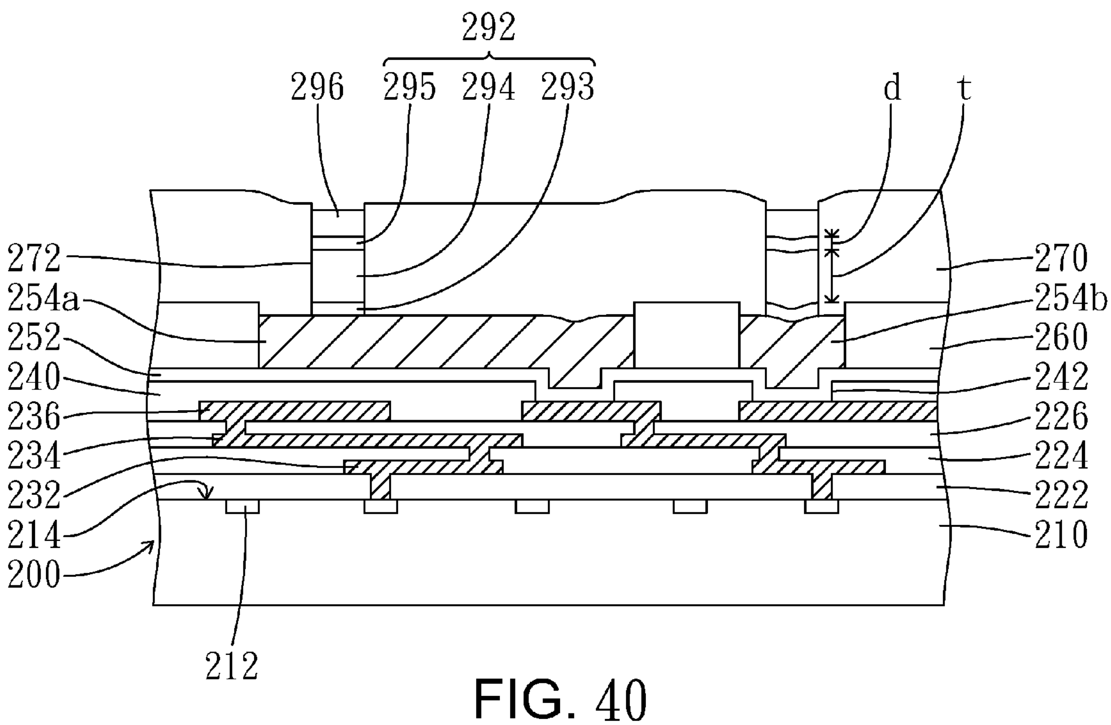
Figure 41:
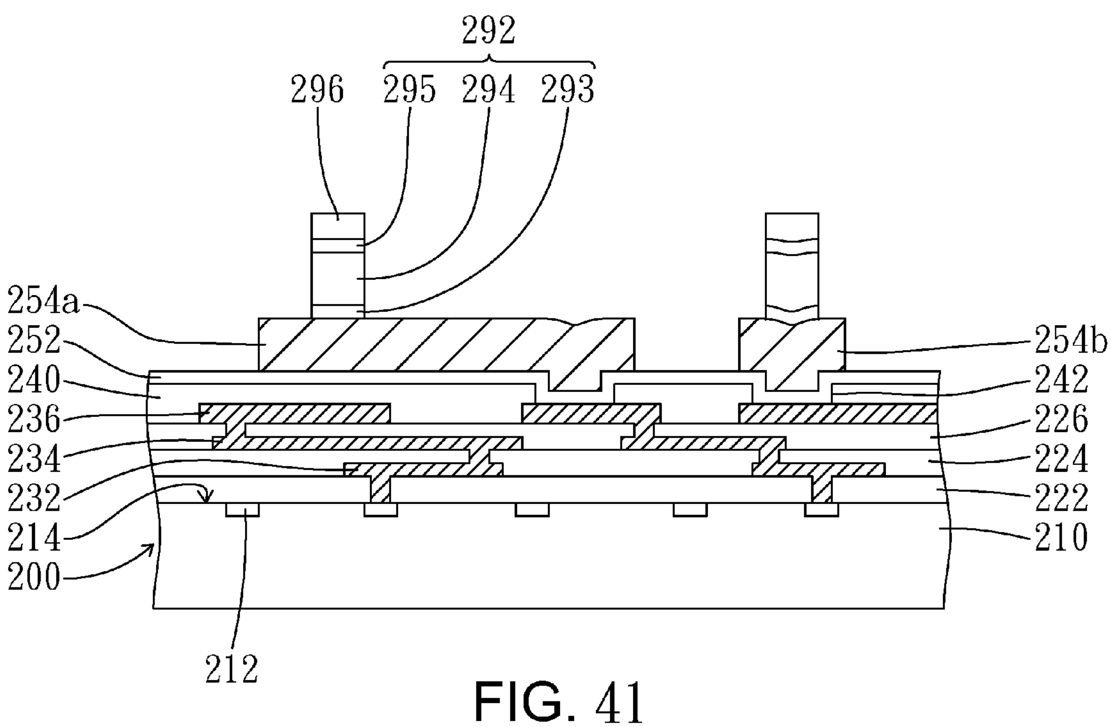

Additionally, the above process may be performed to deposit another kind of pillar-shaped bumps on metal traces or pads. FIGS. 40 and 41 are schematic cross-sectional views of the second type for forming circuit/metal traces and pillar-shaped bumps. The steps in FIGS. 40 and 41 follows the step in FIG. 16.

After the patterned metal layer 254*a* and 254*b* is formed, as shown in FIG. 16, a photoresist layer 270 is formed on the patterned metal layer 254*a* and 254*b* and photoresist layer 260, as shown in FIG. 40. An opening 272 in the photoresist layer 270 exposes the metal layer 254*a* and 254*b*.

Referring to FIG. 40, an electroplating method or an electroless plating method can be used to form the metal pillars 292 on the metal layer 254*a* and 254*b* exposed by the opening 272 and then form a solder layer on the metal pillars 292. To form the metal pillars 292, an electroplating or electroless plating method is utilized to form an adhesion/barrier layer 293 on the metal layer 254*a* and 254*b* exposed by the opening 272, form a pillar-shaped metal layer 294 on the adhesion/barrier layer 293, and then form an anti-collapse metal layer 295 on the pillar-shaped metal layer 294. The metallization structures of the adhesion/barrier layer 293, pillar-shaped metal layer 294 and anti-collapse metal layer 295 can refer to those above illustrated in FIGS. 34-39. The solder layer 296 can be formed on the anti-collapse metal layer 295. The metallization structure of the solder layer 296 can refer to those above illustrated in FIGS. 34-39.

Next, the photoresist layers 270 and 260 are removed and the bottom metal layer 252 is exposed, as shown in FIG. 41. The subsequent steps can refer to the illustrations in FIGS. 36-38. Alternatively, the adhesion/barrier layer 293 can be saved, which can refer to the illustration in FIG. 39.

7. Third Type for Forming Circuit/Metal Traces and Pillar-Shaped Bumps

FIGS. 42-46 are schematic cross-sectional views of the third type for forming circuit/metal traces and pillar-shaped bumps. The steps in FIGS. 42-46 follows the step in FIG. 17.

After the metal layer 254 is formed, as shown in FIG. 17, a photoresist layer 270 is formed on the metal layer 254*a* and

Figure 42:
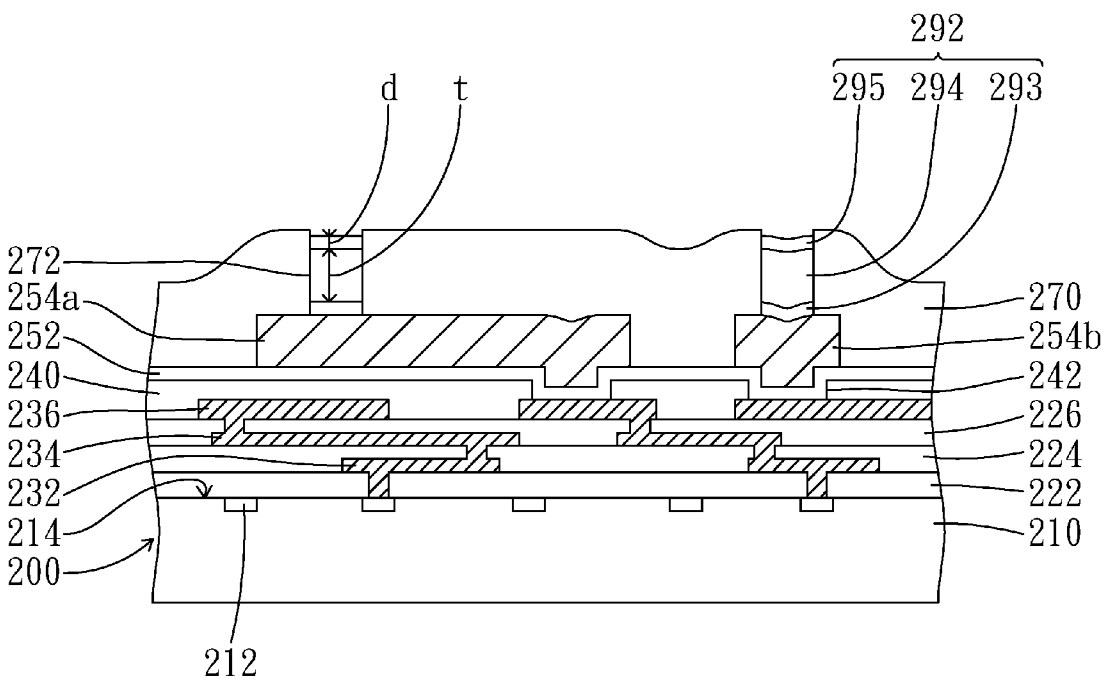
FIGS. 42-52 are schematic cross-sectional views illustrating another preferred embodiment of the first method for forming circuits/metal traces and pillar-shaped bumps according to the present invention.

254*b* and bottom metal layer 252, as shown in FIG. 42. An opening 272 in the photoresist layer 270 exposes the metal layer 254*a* and 254*b*.

Referring to FIG. 42, an electroplating method or an electroless plating method can be used to form an adhesion/barrier layer 293 on the metal layer 254*a* and 254*b* exposed by the opening 272, to form a pillar-shaped metal layer 294 on the adhesion/barrier layer 293, and then to form an anti-collapse metal layer 295 on the pillar-shaped metal layer 294. The metallization structure of the adhesion/barrier layer 293, pillar-shaped metal layer 294 and anti-collapse metal layer 295 can refer to those above illustrated in FIGS. 34-39.

Figure 43:
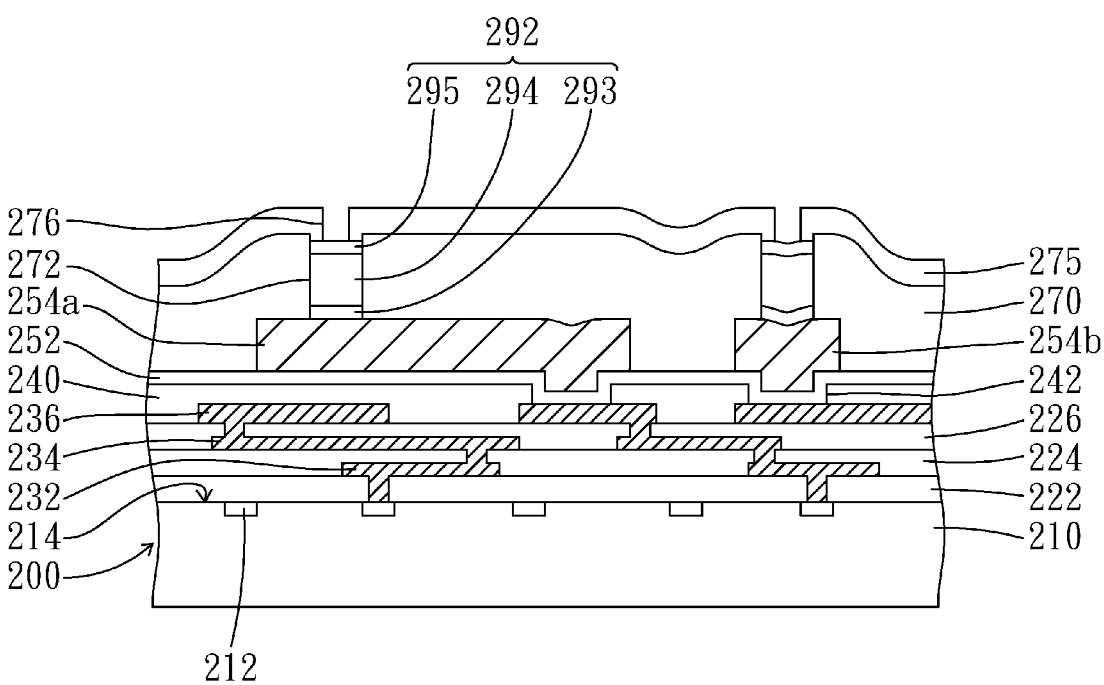
Figure 44:
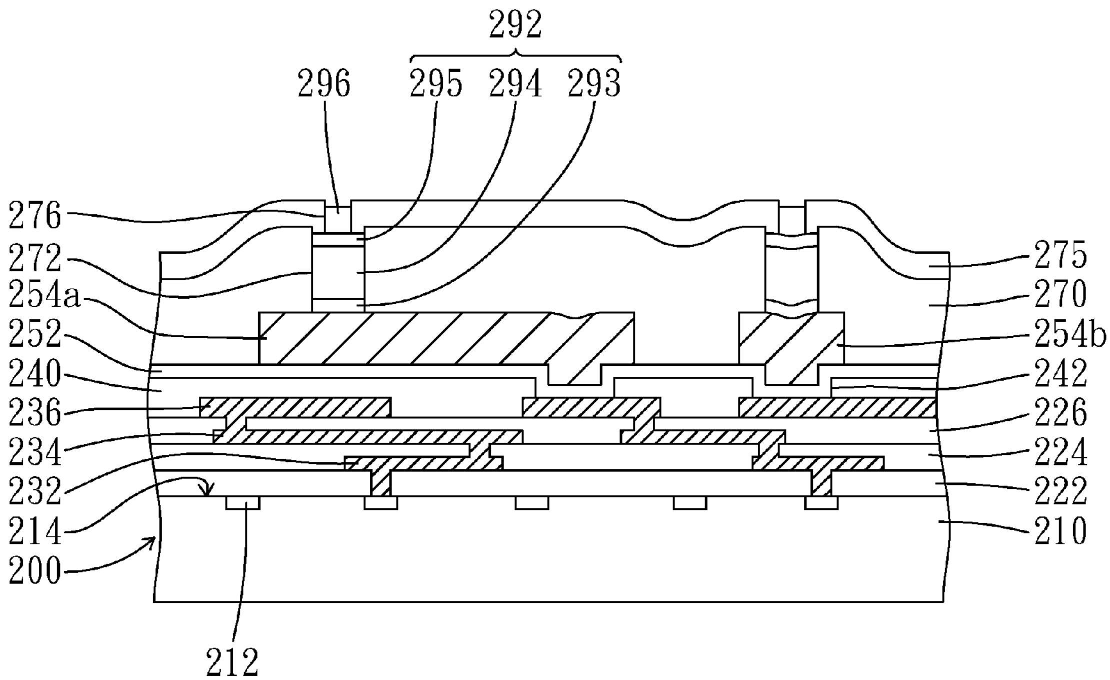

Next, a photoresist layer 275 is formed on the photoresist layer 270 and on the anti-collapse layer 295 of the metal pillar 292, as shown in FIG. 43. An opening 276 in the photoresist layer 275 exposes the anti-collapse metal layer 295. The opening 276 has a largest transverse dimension smaller than that of the metal pillar 292. Subsequently, a solder layer 296 is formed on the anti-collapse metal layer 295 exposed by the opening 276 in the photoresist layer 275, as shown in FIG. 44. The metallization structure of the solder layer 296 can refer to those above illustrated in FIGS. 34-39.

Figure 45:
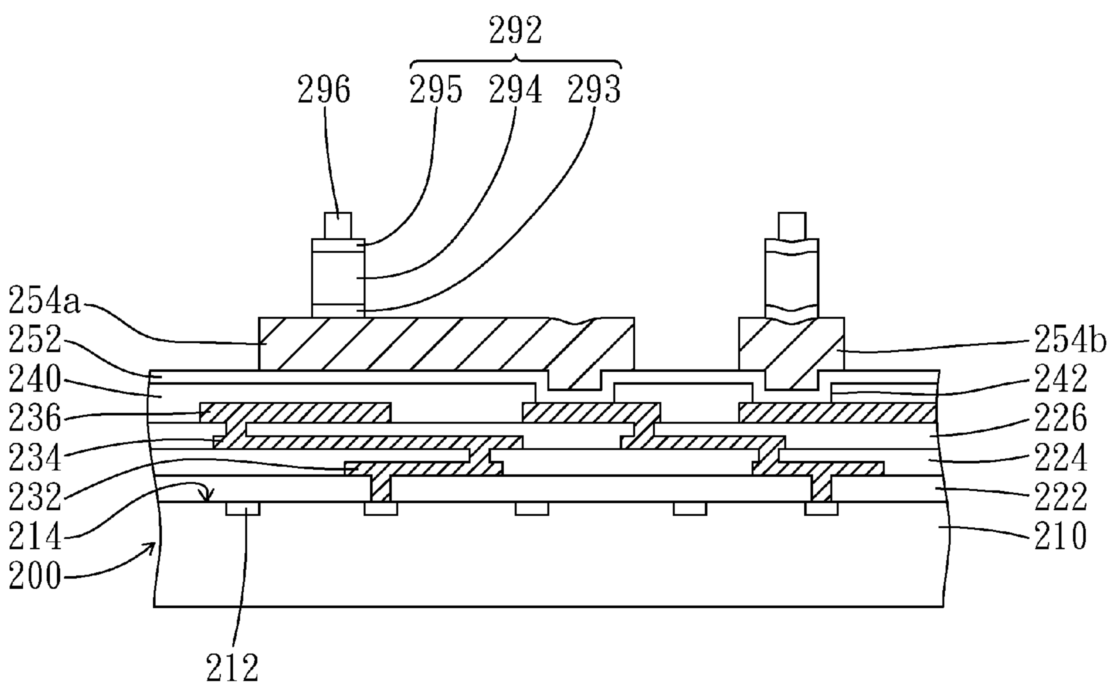

Next, the photoresist layers 275 and 270 are sequentially removed and the bottom metal layer 252 is exposed, as shown in FIG. 45. With the patterned metal layer 254*a* and 254*b* as an etching mask, the seed layer and the adhesive/barrier layer of the bottom metal layer 252 not covered by the metal layer 254*a* and 254*b* are removed using an etching process, shown in FIG. 46. In this case, the bumps 291 comprise the adhesion/barrier layer 293, pillar-shaped metal layer 294, anti-collapse metal layer 295 and solder layer 296.

Next, die sawing process is performed. In the die sawing process, a cutting blade cuts along the scribe-line of semiconductor wafer 200 to split the wafer into many individual IC chips 205. The bump 291 may be used to connect the individual IC chip 205 to an external circuitry, such as another semiconductor chip or wafer, printed circuitry board, flexible substrate or glass substrate. The bump 291 may be connected to a pad of a glass substrate through multiple metal particles in an anisotropic conductive film (ACF) or anisotropic conductive paste (ACP). The bump 291 may be connected to a solder material preformed on another semiconductor chip or wafer, a printed circuitry board or a flexible substrate. The bump 291 may be connected to a bump preformed on another semiconductor chip or wafer.

Figure 46:
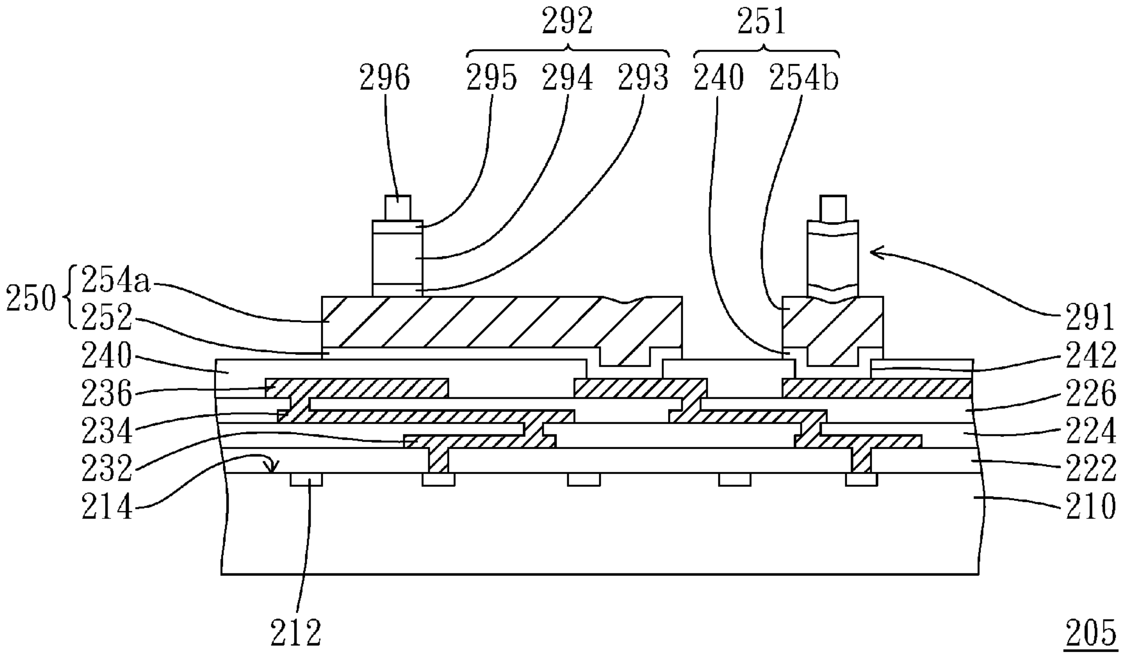

Referring now to FIG. 46, the transverse dimension of the solder layer 296 is relatively small. Even though a small opening in a polymer layer is formed exposing a pad for a circuitry substrate, such as chip or printed circuit board, the bump 291 can be easily inserted into the small opening in the polymer layer and bonded to the pad exposed by the small opening in the polymer layer. Moreover, even though a small opening in a passivation layer made of CVD nitride and CVD oxide is formed exposing a pad for a chip or wafer, the bump 291 can be easily inserted into the small opening in the passivation layer and bonded to the pad exposed by the small opening in the passivation layer.

Figure 47:
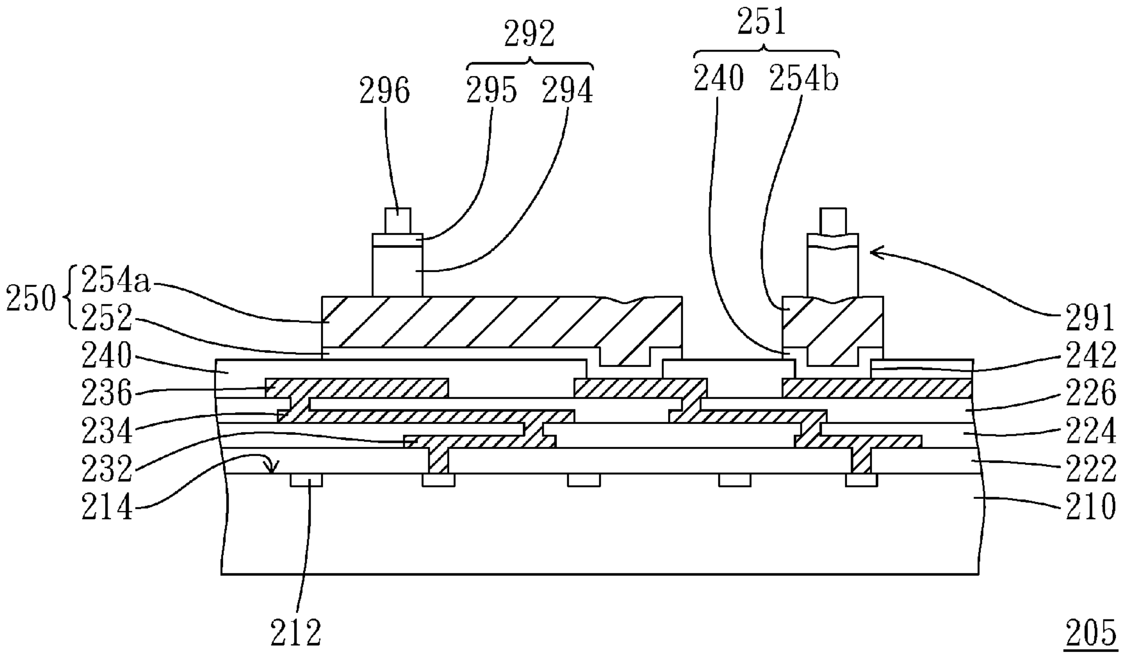

Alternatively, the adhesion/barrier layer 293 can be saved, as shown in FIG. 47. The pillar-shaped metal layer 294 having any one of the above-mentioned metallization structures can be formed on and in contact with the topmost metal layer of the patterned circuit layer 254*a* and 254*b* if the adhesion between the pillar-shaped metal layer 294 and the topmost metal layer of the patterned circuit layer 254*a* and 254*b* is satisfied, wherein the metallization structures of the pillar-shaped metal layer 294 can refer to those above illustrated in FIGS. 34-39 and the patterned circuit layer 254*a* and 254*b* may have the similar metallization structures as above illustrated in FIGS. 22-25. Preferably, the pillar-shaped metal layer 294 made of substantially pure copper mentioned above can be formed on the topmost metal layer, made of substantially pure copper, gold or nickel, of the patterned circuit layer 254*a* and 254*b*. The pillar-shaped metal layer 294 made of substantially pure gold mentioned above can be formed on the topmost metal layer, made of substantially pure copper, gold or nickel, of the patterned circuit layer 254*a* and 254*b*. The pillar-shaped metal layer 294 of the bump may have the same metal material as the topmost metal layer of the patterned circuit layer 254*a* and 254*b*.

8. Fourth Type for Forming Circuit/Metal Traces and Pillar-Shaped Bumps

FIGS. 42-46 are schematic cross-sectional views of the fourth type for forming circuit/metal traces and pillar-shaped bumps. The steps in FIGS. 42-46 follows the step in FIG. 16.

Figure 48:
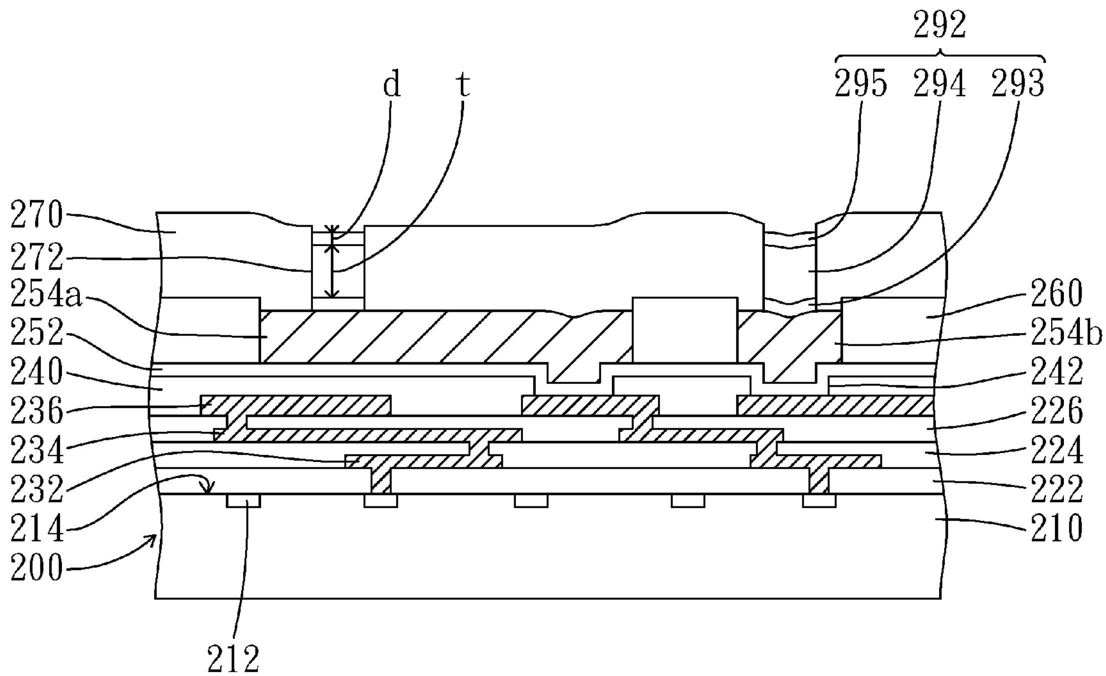

After the patterned metal layer 254*a* and 254*b* is formed, as shown in FIG. 16, a photoresist layer 270 is formed on the patterned metal layer 254*a* and 254*b* and the photoresist layer 260, as shown in FIG. 48. An opening 272 in the photoresist layer 270 exposes the patterned metal layer 254*a* and 254*b*.

Referring to FIG. 48, an electroplating method or an electroless plating method can be used to form the metal pillars 292 on the metal layer 254*a* and 254*b* exposed by the opening 272 and then form a solder layer on the metal pillars 292. To form the metal pillars 292, an electroplating or electroless plating method is utilized to form an adhesion/barrier layer 293 on the metal layer 254*a* and 254*b* exposed by the opening 272, form a pillar-shaped metal layer 294 on the adhesion/barrier layer 293, and then form an anti-collapse metal layer 295 on the pillar-shaped metal layer 294. The metallization structures of the adhesion/barrier layer 293, pillar-shaped metal layer 294 and anti-collapse metal layer 295 can refer to those above illustrated in FIGS. 34-39. The solder layer 296 can be formed on the anti-collapse metal layer 295. The metallization structure of the solder layer 296 can refer to those above illustrated in FIGS. 34-39.

Figure 49:
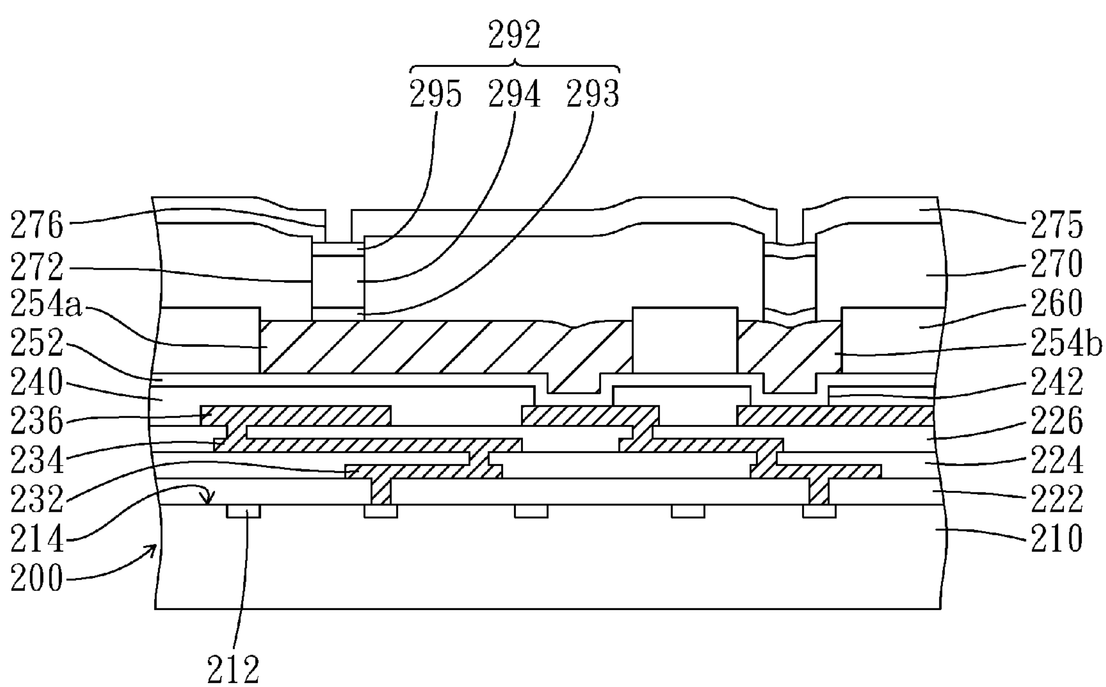
Figure 50:
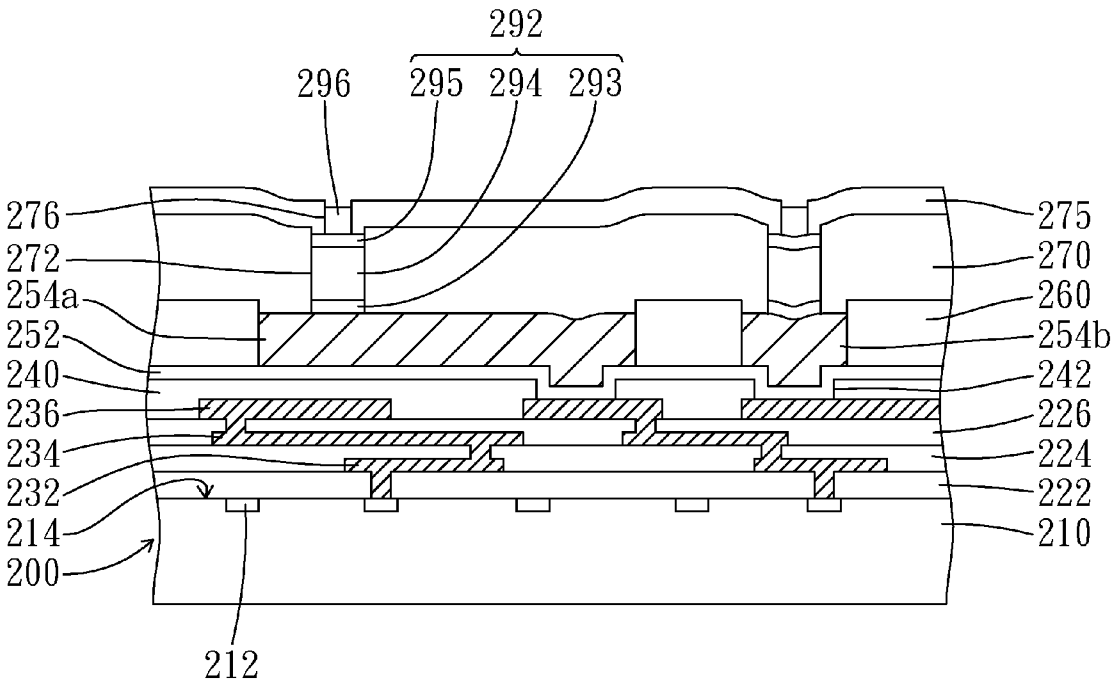

Next, an photoresist layer 275 is formed on the photoresist layer 270 and on the anti-collapse metal layer 295 of the metal pillars 292, as shown in FIG. 49. An opening 276 in the photoresist layer 275 exposes the anti-collapse metal layer 295. The opening 276 has a largest transverse dimension smaller than that of the metal pillar 292. Subsequently, a solder layer 296 is formed on the anti-collapse metal layer 295 exposed by the opening 276 in the photoresist layer 275, as shown in FIG. 50. The metallization structure of the solder layer 296 can refer to those above illustrated in FIGS. 34-39.

Figure 51:
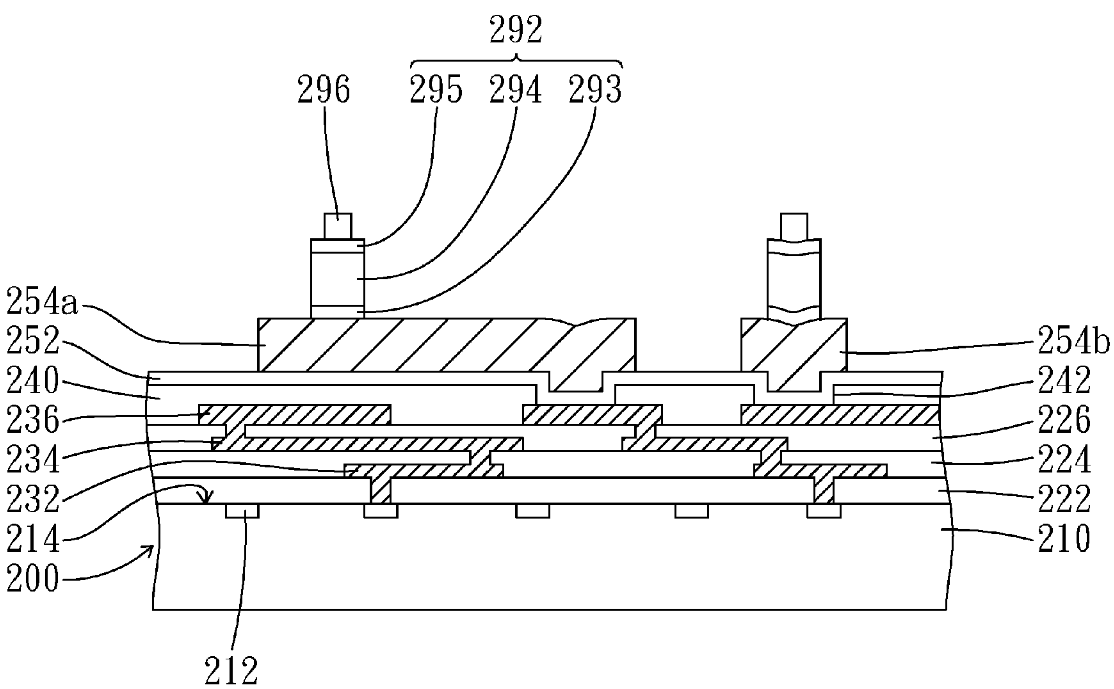

Next, the photoresist layers 275, 270 and 260 are sequentially removed and the bottom metal layer 252 is exposed, as shown in FIG. 51. With the patterned metal layer 254*a* and 254*b* as an etching mask, the seed layer and the adhesive/barrier layers of the bottom metal layer 252 not covered by the metal layer 254 are removed using an etching process, shown in FIG. 52. In this case, the bumps 291 comprise the adhesion/barrier layer 293, pillar-shaped metal layer 294, anti-collapse metal layer 295 and solder layer 296.

Next, die sawing process is performed. In the die sawing process, a cutting blade cuts along the scribe-line of semiconductor wafer 200 to split the wafer into many individual IC chips 205. The bump 291 may be used to connect the individual IC chip 205 to an external circuitry, such as another semiconductor chip or wafer, printed circuitry board, flexible substrate or glass substrate. The bump 291 may be connected to a pad of a glass substrate through multiple metal particles in an anisotropic conductive film (ACF) or anisotropic conductive paste (ACP). The bump 291 may be connected to a solder material preformed on another semiconductor chip or wafer, a printed circuitry board or a flexible substrate. The bump 291 may be connected to a bump preformed on another semiconductor chip or wafer.

Figure 52:
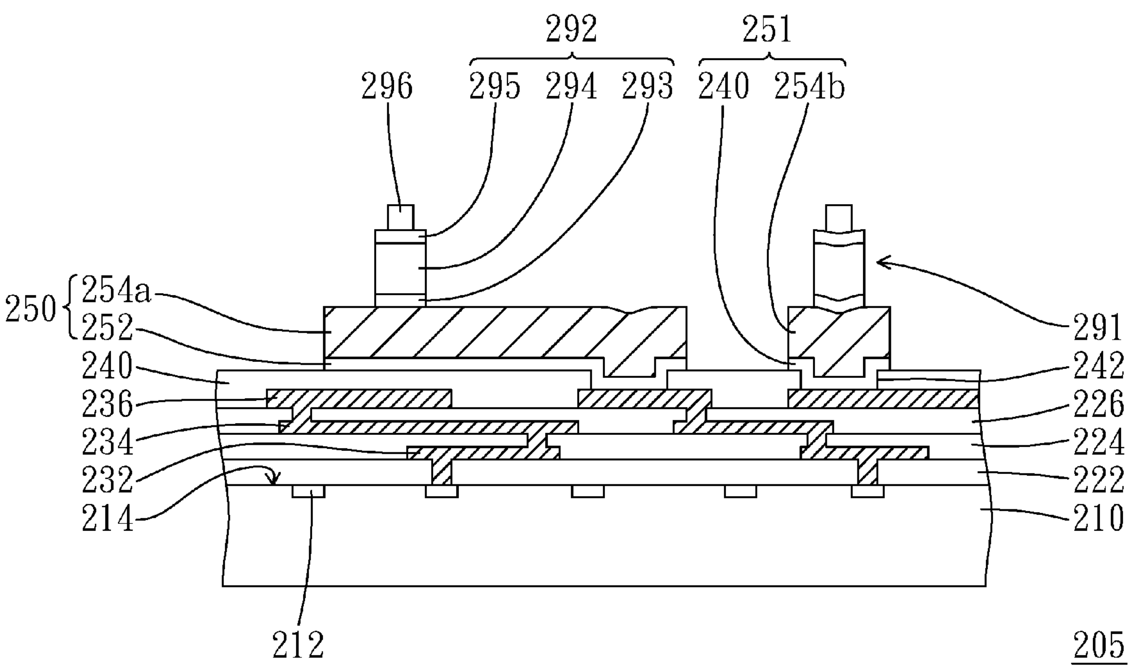

Referring now to FIG. 52, the transverse dimension of the solder layer 296 is relatively small. Even though a small opening in a polymer layer is formed exposing a pad for a circuitry substrate, such as chip or printed circuit board, the bump 291 can be easily inserted into the small opening in the polymer layer and bonded to the pad exposed by the small opening in the polymer layer. Moreover, even though a small opening in a passivation layer made of CVD nitride and CVD oxide is formed exposing a pad for a chip or wafer, the bump 291 can be easily inserted into the small opening in the passivation layer and bonded to the pad exposed by the small opening in the passivation layer.

Alternatively, the adhesion/barrier layer 293 can be saved. The pillar-shaped metal layer 294 having any one of the above-mentioned metallization structures can be formed on and in contact with the topmost metal layer of the patterned circuit layer 254*a* and 254*b* if the adhesion between the pillar-shaped metal layer 294 and the topmost metal layer of the patterned circuit layer 254*a* and 254*b* is satisfied, wherein the metallization structures of the pillar-shaped metal layer 294 can refer to those above illustrated in FIGS. 34-39 and the patterned circuit layer 254*a* and 254*b* may have the similar metallization structures as above illustrated in FIGS. 22-25. Preferably, the pillar-shaped metal layer 294 made of substantially pure copper mentioned above can be formed on the topmost metal layer, made of substantially pure copper, gold or nickel, of the patterned circuit layer 254*a* and 254*b*. The pillar-shaped metal layer 294 made of substantially pure gold mentioned above can be formed on the topmost metal layer, made of substantially pure copper, gold or nickel, of the patterned circuit layer 254*a* and 254*b*. The pillar-shaped metal layer 294 of the bump may have the same metal material as the topmost metal layer of the patterned circuit layer 254*a* and 254*b*.

9. Deposition of Polymer Layer

Figure 53:
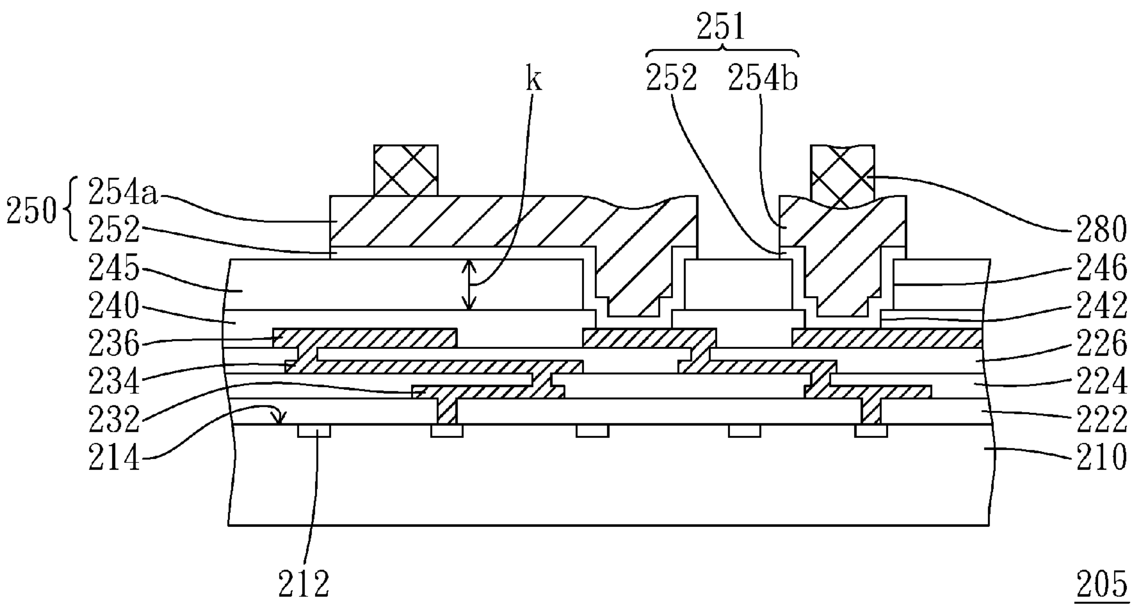
FIGS. 53-59 are schematic cross-sectional views illustrating various semiconductor chips according to the present invention.

The metal traces 250 can be formed on and in touch with the passivation layer 240, as above illustrated or can be formed on and in touch with a polymer layer formed on the passivation layer 240, as shown in FIG. 53. FIG. 53 is a schematic cross-sectional view showing a circuits/metal trace formed on a polymer layers on the passivation layer.

Referring now to FIG. 53, a polymer layer 245 is formed on the passivation layer 240 of a semiconductor wafer 200. Multiple openings 246 in the polymer layer 245 expose the thin-film circuit layer 236. Through the opening 246 in the polymer layer 245 and the opening 242 in the passivation layer 240, the circuit/metal trace 250 and the pad 251 can be connected to the thin-film circuit layer 236. The polymer layer 245 has a thickness k greater than 1 μm, and preferably between 2 μm and 50 μm. The polymer layer 245 can be formed by spin-on-coating a precursor polymer layer and curing the precursor layer. When the polymer layer 245 is formed with a high thickness, the step of spin-on-coating a precursor polymer layer and curing the precursor layer is performed multiple times. The polymer layer 245 may comprise polyimide (PI), benzocyclobutene (BCB), parylene, a porous dielectric material or an elastomers.

10. Functions of Circuits/Metal Traces

A. Circuit/Metal Traces Used for Redistributing Bumps or Pads

Referring now to FIG. 21, 39, 46, 47, 52, or 53, the circuits/metal trace 250 can be utilized to redistribute the layout of the bump or pad 280, 290, or 291. In FIG. 21, 39, 46, 47, 52, or 53, the circuit/metal trace 250 may connect the bump or pad 280, 290, or 291 to a original pad of the thin-film circuit layer 246. The positions of the original pad of the thin-film circuit layer 246 and the bump or pad 280, 290, or 291 from a top view are different. Thus, the circuit/metal trace 250 can act to redistribute the output layout. The locations or pin assignment of the bump or pad 280 can be adjusted via the circuit/metal trace 250.

In consideration of signal transmission, a signal can be transmitted from an electronic device 212 to an external circuitry component, such as circuitry board or semiconductor chip, sequentially through the thin-film circuit layers 232, 234 and 236, metal trace 242 and bump 280, 290 or 291. Alternatively, a signal can be transmitted from an external circuitry component, such as circuitry board or semiconductor chip, to an electronic device 212 sequentially through the bump 280, 290 or 291, metal trace 242 and thin-film circuit layers 236, 234 and 232.

B. Circuit/Metal Traces Used for Intra-Chip Signal Transmission

Figure 54:
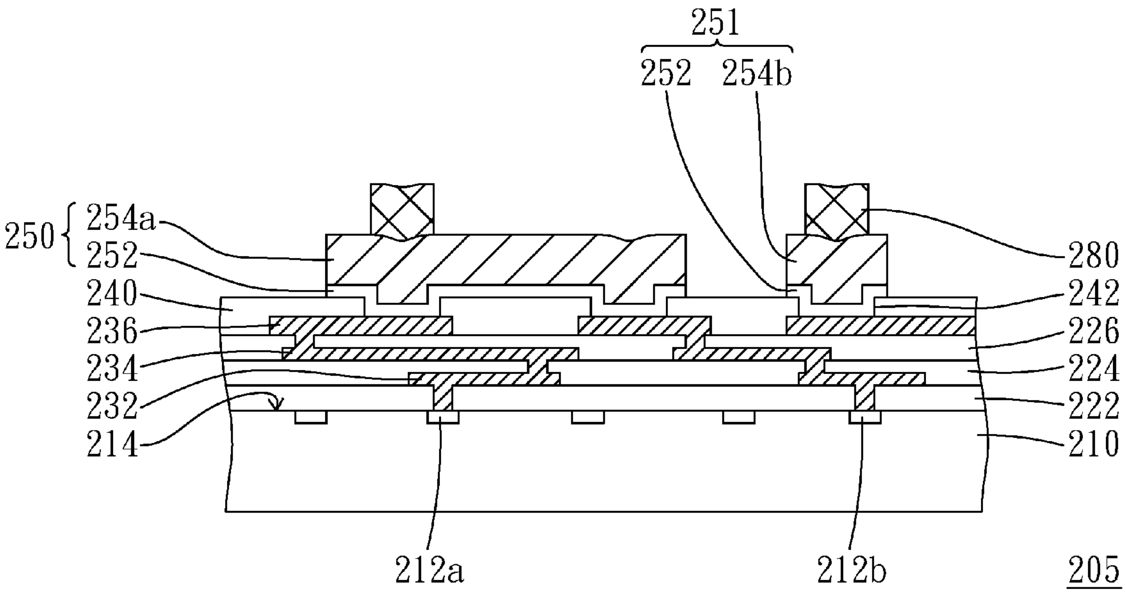
Figure 55:
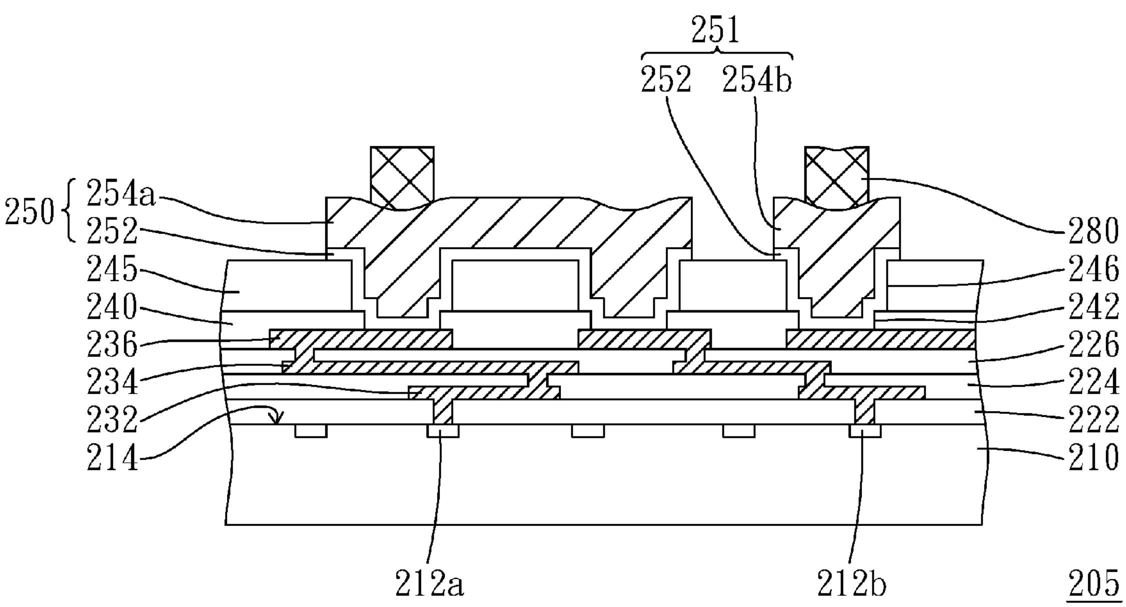

FIGS. 54 and 55 illustrate a schematic cross-sectional view showing circuit/metal traces used for intra-chip signal transmission. Referring now to FIGS. 54 and 55, a signal can be transmitted from one of the electronic devices, such as 212*a*, to the circuit/metal trace 250 through the thin-film circuit layers 232, 234 and 236 and then through the opening 242 in the passivation layer 240. Thereafter, the signal can be transmitted from the circuit/metal trace 250 to one of the electronic devices, such as 212*b*, through the opening 242 in the passivation layer 240 and then through the thin-film circuit layers 236, 234 and 232. At the same time, the signal can be transmitted to an external circuit component, such as printed circuit board, glass substrate or another chip, through the bump or pad 280 on the circuit/metal trace 250.

The circuit/metal trace 250 acting as signal transmission can be formed on and in contact with the passivation layer 240, as shown in FIG. 54. Alternatively, the circuit/metal trace 250 acting as signal transmission can be formed on a polymer layer 245 previously formed on the passivation layer 240, as shown in FIG. 55, wherein the detail of the polymer layer 245 can refer to the illustration in FIG. 53. The above-mentioned pillar-shaped bump 291 as shown in FIGS. 38, 39, 46, 47 and 52, can also be formed on the circuit/metal trace 250 acting as signal transmission.

C. Circuit/Metal Traces Used for Power Bus or Plane or Ground Bus or Plane

Figure 56:
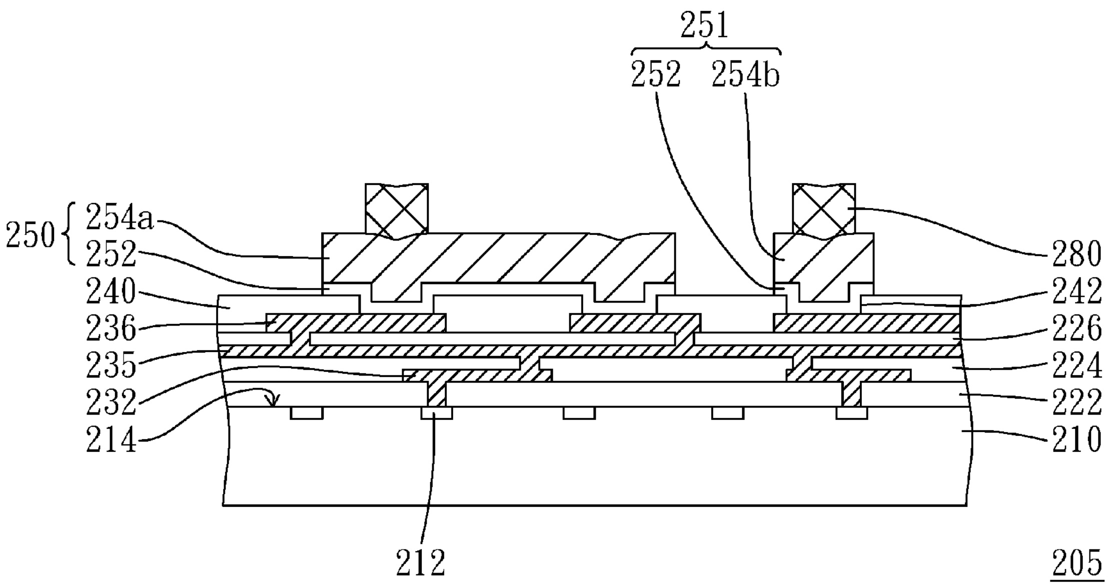
Figure 57:
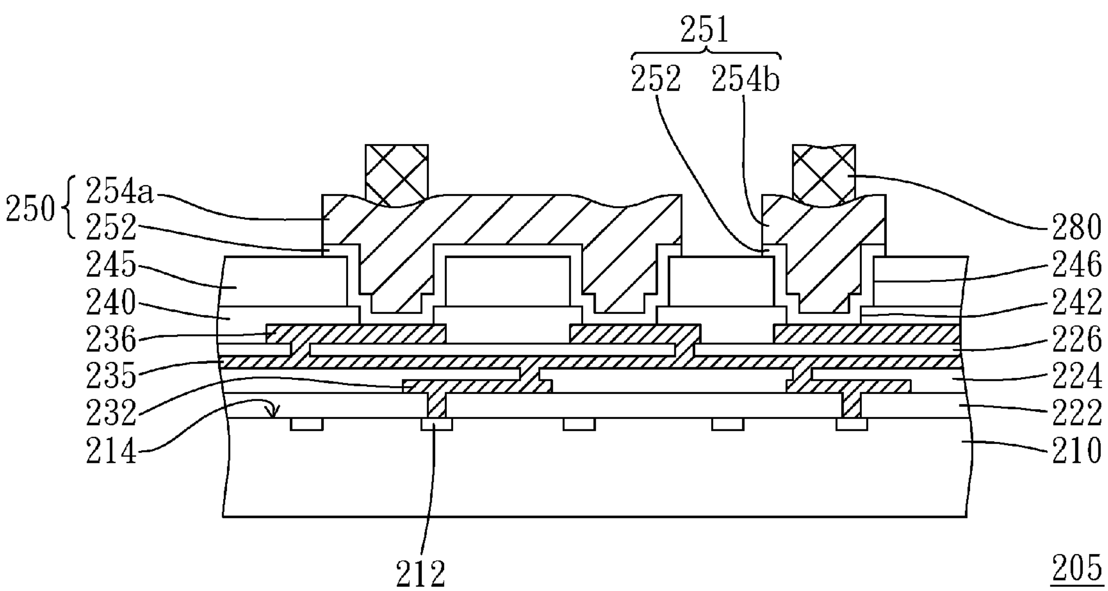

FIGS. 56 and 57 are schematic cross-sectional views showing a circuit/metal trace used for a power bus or plane or ground bus or plane. In FIGS. 56 and 57, the circuit/metal trace 250 serving as a power bus or plane can be electrically connected to the thin-film power bus or plane 235 under the passivation layer 240 and can be electrically connected to a power source. The circuit/metal trace 250 can be electrically connected to the power bus in an external circuit component, such as printed circuit board, glass substrate or another chip, through the bump or pad 280. Alternatively, the circuit/metal trace 250 serving as a ground bus or plane can be electrically connected to the thin-film ground bus or plane 235 under the passivation layer 240 and can be electrically connected to a ground reference. The circuit/metal trace 250 can be electrically connected to the ground bus in an external circuit component, such as printed circuit board, glass substrate or another chip, through the bump or pad 280.

The circuit/metal trace 250 acting as a power bus or plane or ground bus or plane can be formed on and in contact with the passivation layer 240, as shown in FIG. 56. Alternatively, the circuit/metal trace 250 acting as a power bus or plane or ground bus or plane can be formed on a polymer layer 245 previously formed on the passivation layer 240, as shown in FIG. 57, wherein the detail of the polymer layer 245 can refer to the illustration in FIG. 53. The above-mentioned pillar-shaped bump 291 as shown in FIGS. 38, 39, 46, 47 and 52, can also be formed on the circuit/metal trace 250 acting as a power bus or plane or ground bus or plane.

Figure 58:
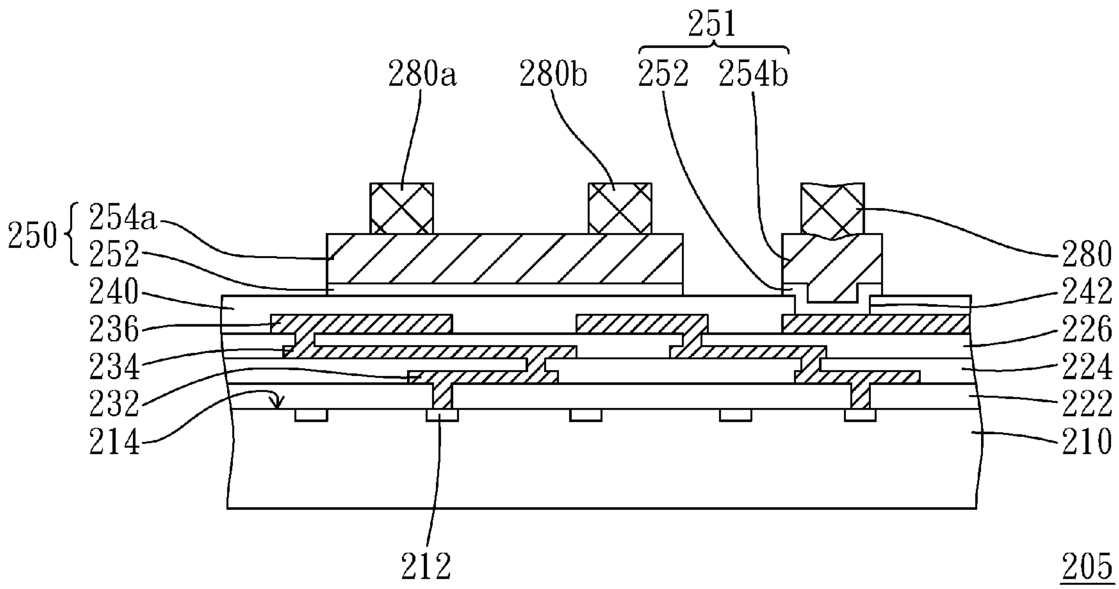
Figure 59:
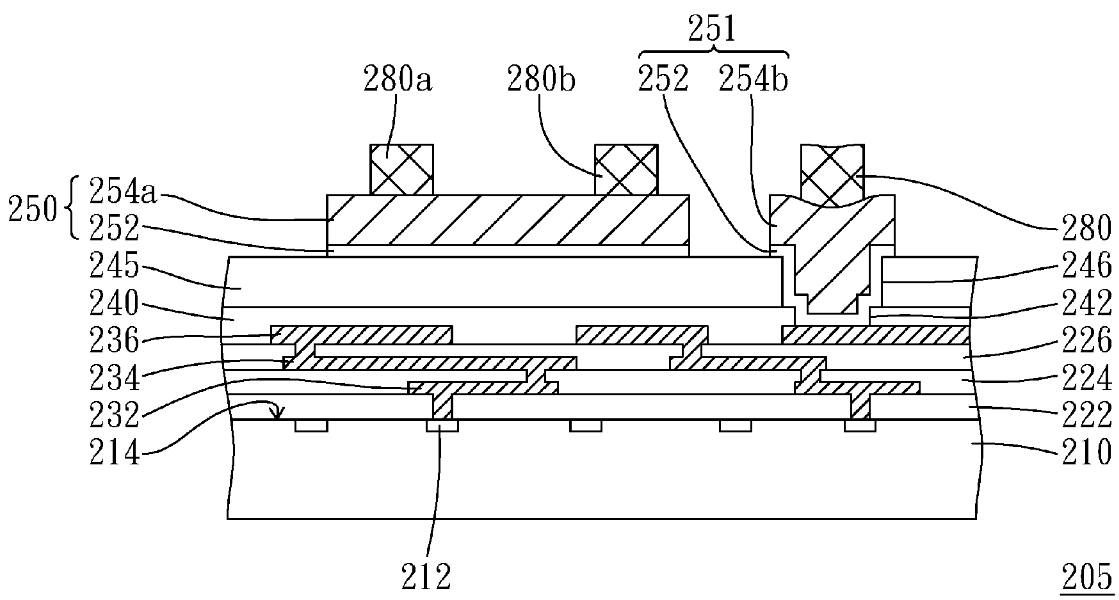

D. Circuit/Metal Traces Used for Signal Transmission or Acting as a Power Bus or Plane or a Ground Bus or Plane for External Circuitry Component FIGS. 58 and 59 are schematic cross-sectional views showing a circuit/metal trace used for signal transmission or acting as a power bus or plane or a ground bus or plane for an external circuitry component. In FIGS. 58 and 59, the circuit/metal trace 250 is electrically disconnected from the thin-film circuit layers 236, 234 and 232 under the passivation layer 240. An external circuit component, such as circuitry board, glass substrate, or another semiconductor chip or wafer, can be connected to the circuit/metal trace 250 through the bump or pad 280. When the circuit/metal trace 250 is used for signal transmission for the external circuit component, a signal can be transmitted from the external circuitry component to the circuit/metal trace 250 via the bump 280*a*. Thereafter, the signal can be transmitted from the circuit/metal trace 250 to the external circuitry component via the bump 280*b*. Alternatively, the circuit/metal trace 250 can function as a power bus or plane, connected to another power bus or plane in the external circuitry component. Alternatively, the circuit/metal trace 250 can function as a ground bus or plane, connected to another power bus or plane in the external circuitry component.

The circuit/metal trace 250 used for signal transmission or acting as a power bus or plane or ground bus or plane can be formed on and in contact with the passivation layer 240, as shown in FIG. 58. Alternatively, the circuit/metal trace 250 used for signal transmission or acting as a power bus or plane or ground bus or plane can be formed on a polymer layer 245 previously formed on the passivation layer 240, as shown in FIG. 59, wherein the detail of the polymer layer 245 can refer to the illustration in FIG. 53. The above-mentioned pillar-shaped bump 291 as shown in FIGS. 38, 39, 46, 47 and 52, can also be formed on the circuit/metal trace 250 used for signal transmission or acting as a power bus or plane or ground bus or plane and disconnected from the thin-film circuit layers 232, 234, and 236 under the passivation layer 240.

Second Embodiment

1. Method for Manufacturing Circuit/Metal Traces and Bumps

Figure 60:
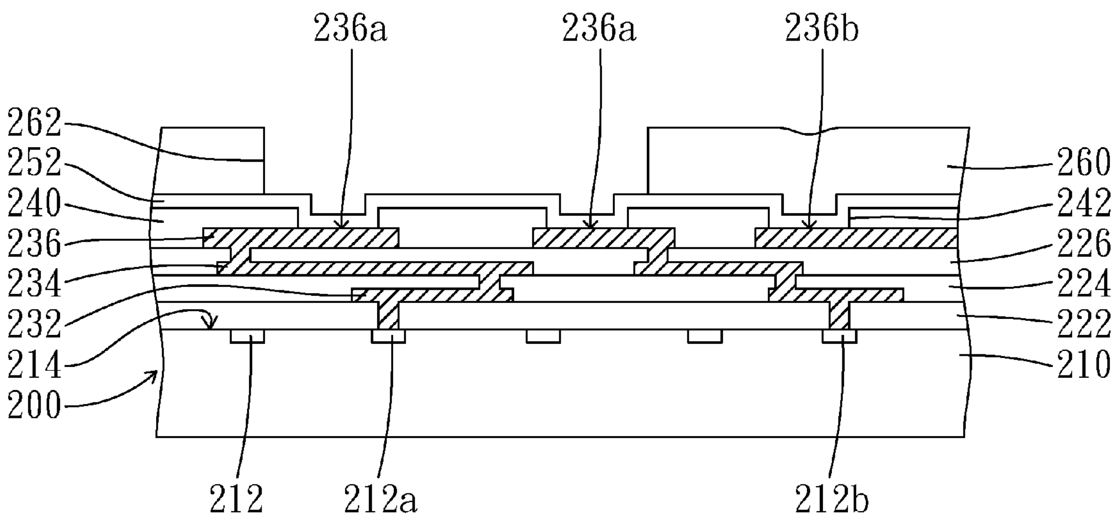
FIGS. 60-66 are schematic cross-sectional views illustrating a preferred embodiment of the second method for forming circuits/metal traces and bumps or pads according to the present invention.

FIGS. 60-66 are schematic cross-sectional views illustrating the preferred embodiment of the method for forming circuits/metal traces and bumps according to the present invention. Referring now to FIG. 60, a semiconductor wafer 200 comprising a semiconductor substrate 210 multiple thin-film dielectric layers 222, 224 and 226, multiple thin-film circuit layers 232, 234 and 236 and a passivation layer 240 is shown. These elements of the semiconductor wafer 200 having the same reference numbers as those in the first embodiment can refer to the illustration in FIG. 13 in the first embodiment.

Referring now to FIG. 60, after the semiconductor wafer 200 is produced, a sputtering process may be used to form a bottom metal layer 252 on the passivation layer 240 and the thin-film circuit layer 236 exposed by the opening 242 in the passivation layer 240.

The bottom metal layer 252 may be formed by first sputtering an adhesive/barrier layer on the passivation layer 240 and on the connection point of thin-film circuit layer 236 exposed by the opening 242 in the passivation layer 240 and next sputtering, electroless plating or electroplating a seed layer on the adhesive/barrier layer. The detailed cross-sectional structure of the adhesive/barrier layer and the seed layer can refer to the illustrations in FIGS. 67-70.

Figure 61:
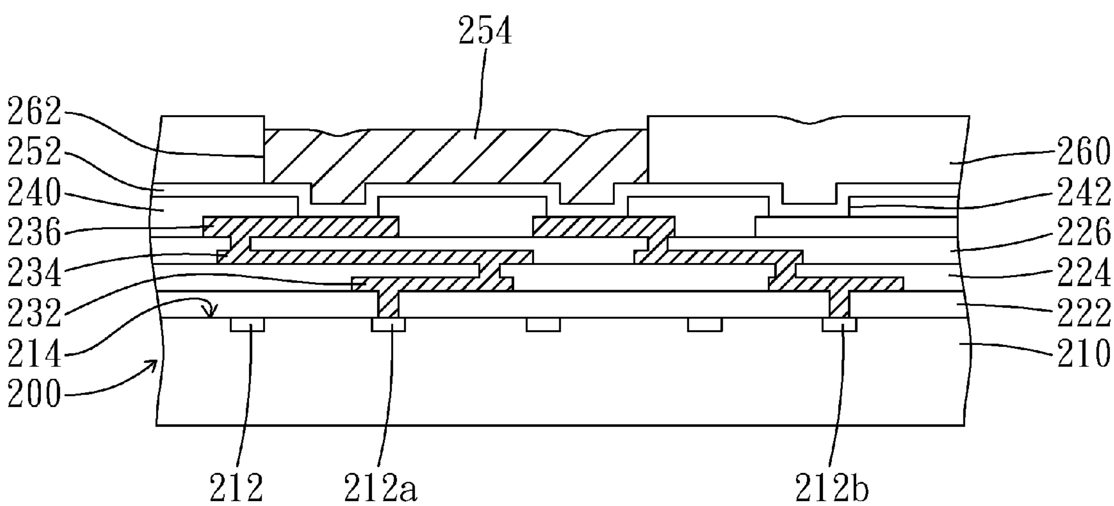

Next, as shown in FIG. 60, a photoresist layer 260 is formed on the bottom metal layer 252. An opening 262 in the photoresist layer 260 exposes the bottom metal layer 252. Subsequently, an electroplating method or electroless plating is used to form a metal layer 254 on the bottom metal layer 252 exposed by the opening 262 in the photoresist layer 260, as shown in FIG. 61. The metal layer 254 may be trace-shaped or plane-shaped and electronically connected to the contact point 236*a* of the thin-film circuit layer 236. The detailed cross-sectional metallization structure of the metal layer 254 can refer to the illustrations in FIGS. 67-70.

Figure 62:
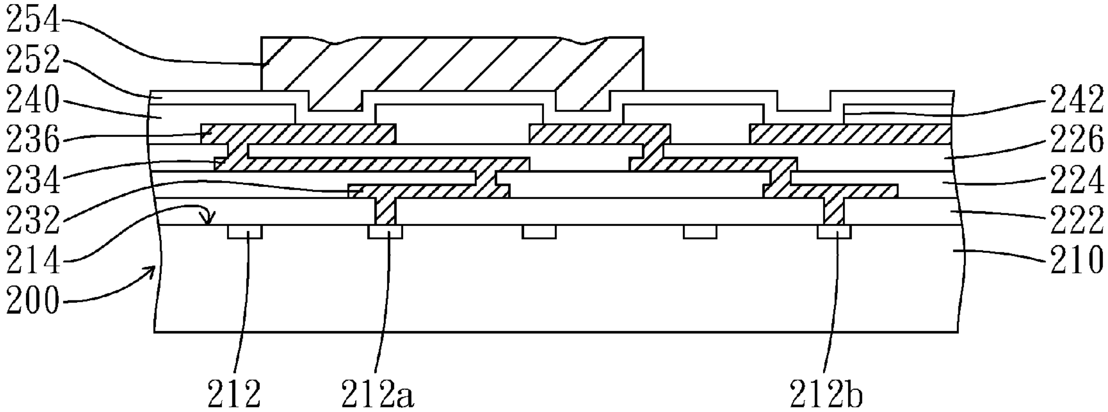
Figure 63:
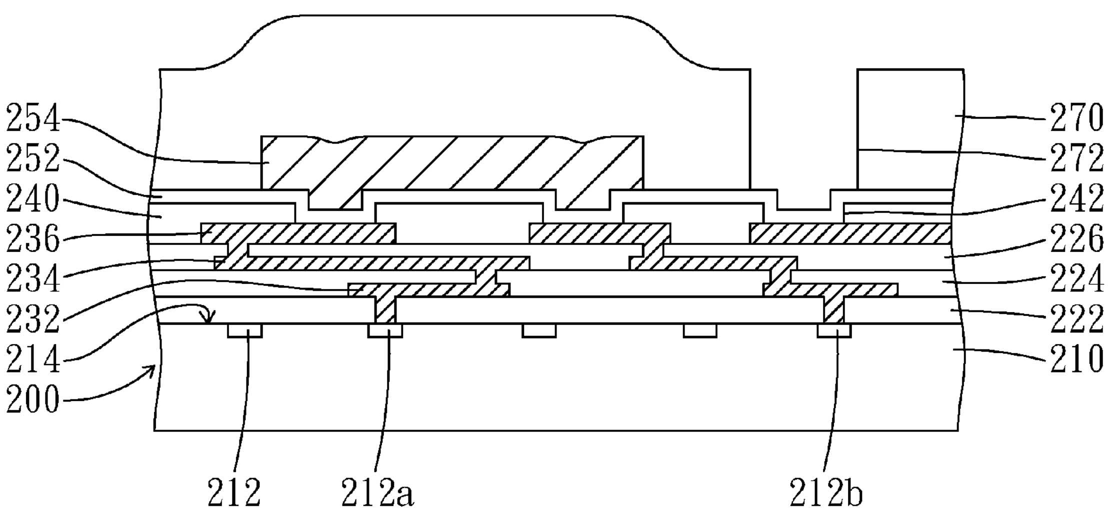

Next, the photoresist layer 260 is removed and the bottom layer 252 is exposed, as shown in FIG. 62. Subsequently, a photoresist layer 270 is formed on the bottom metal layer 252 and on the metal layer 254. An opening 272 in the photoresist layer 270 exposes the bottom metal layer 252 on the thin-film circuit layer 236 exposed by the opening 242 in the passivation layer 240, as shown in FIG. 63.

Figure 64:
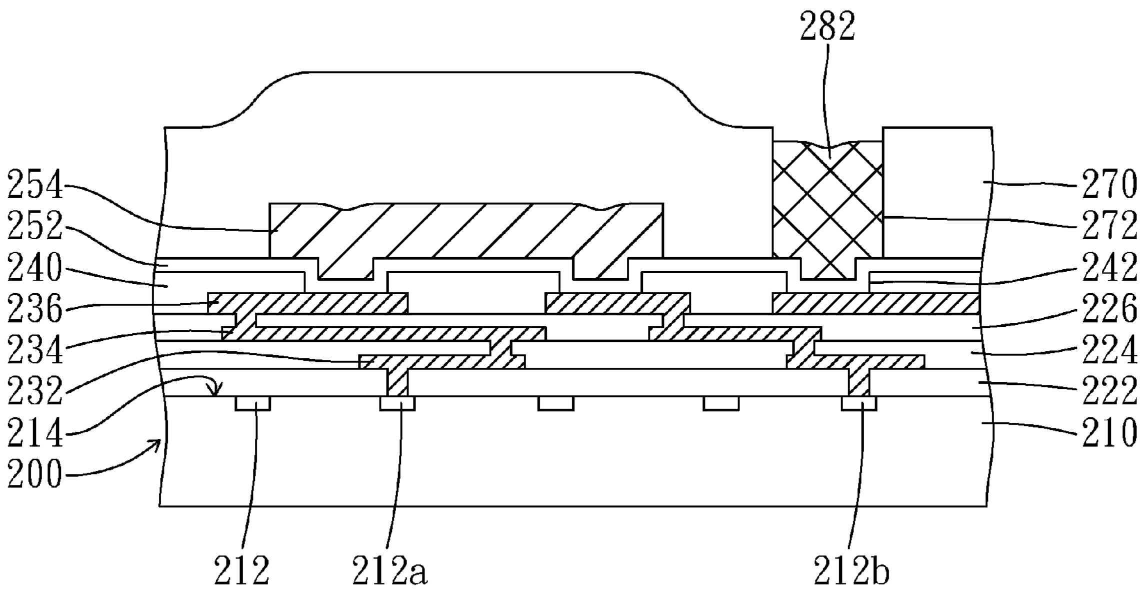

Next, an electroplating method or an electroless plating method is used to form a metal layer 282 acting as bumps or pads on the bottom metal layer 252 exposed by the opening 272 in the photoresist layer 270, as shown in FIG. 64. The detailed cross-sectional structure of the electroplated metal layer 282 can refer to the illustrations in FIGS. 71 and 72.

Figure 65:
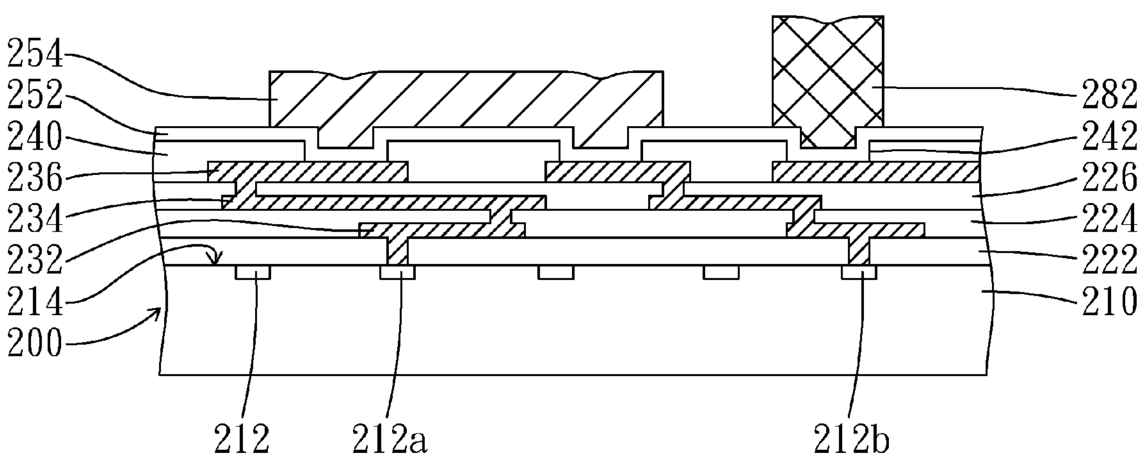

Next, the photoresist layer 260 is removed and the bottom metal layer 252 is exposed, as shown in FIG. 65. Subsequently, an etching process is performed to remove the bottom metal layers 252 not covered by the metal layers 254 and 282. The bottom metal layer 252 under the metal layers 254 and 282 is left, as shown FIG. 66. So far, forming a metal trace or plane 250 and a pad or bump 280 are completed. The metal trace or plane 250 is composed of the bottom metal layer 252 and the trace-shaped or plane-shaped metal layer 254*a*. The bump or pad 280 is composed of the bottom metal layer 252 and the bump-shaped or pad-shaped metal layer 254*c*. When a topmost metal layer of the bump or pad 280 comprises solder, such as a tin-lead alloy, a tin-silver alloy, a tin-silver-copper alloy or tin, a reflowing process can be performed to round the upper surface of the bump 280. The projection profile of the patterned circuit 250 projecting to the plane 1000 has an area of larger than 30,000 $\mu m^2$, 80,000 $\mu m^2$, or 150,000 $\mu m^2$, for example. The projection profile of the bump or pad 280 projecting to the plane 1000 has an area of less than 30,000 $\mu m^2$, 20,000 $\mu m^2$, or 15,000 $\mu m^2$, for example.

Next, die sawing process is performed. In the die sawing process, a cutting blade cuts along the scribe-line of semiconductor wafer 200 to split the wafer into many individual IC chips 205.

The metal structure 280 may act as a bump used to connect the individual IC chip 205 to an external circuitry, such as another semiconductor chip or wafer, printed circuitry board, flexible substrate or glass substrate. The bump 280 may be connected to a pad of a glass substrate through multiple metal particles in an anisotropic conductive film (ACF) or anisotropic conductive paste (ACP). The bump 280 may be connected to a solder material preformed on another semiconductor chip or wafer, a printed circuitry board or a flexible substrate. The bump 280 may be connected to a bump preformed on another semiconductor chip or wafer. The projection profile of each bump 280 projecting to the plane 1000 has an area of smaller than 30,000 $\mu m^2$, 20,000 $\mu m^2$, or 15,000 $\mu m^2$, for example.

Alternatively, the metal structure 280 may serve as a pad used to be wirebonded thereto. As shown in FIG. 66A, wirebonding wires 500 can be deposited on the pads 280. Alternatively, the metal layer 280 may serve as a pad used to be bonded with a solder material deposited on another circuitry component. The projection profile of each pad 280 projecting to the plane 1000 has an area of smaller than 30,000 $\mu m^2$, 20,000 $\mu m^2$, or 15,000 $\mu m^2$, for example.

2. Metallization Structure of Circuit/Metal Traces

A. First Type of Metallization Structure in Circuit/Metal Traces

Figure 67:
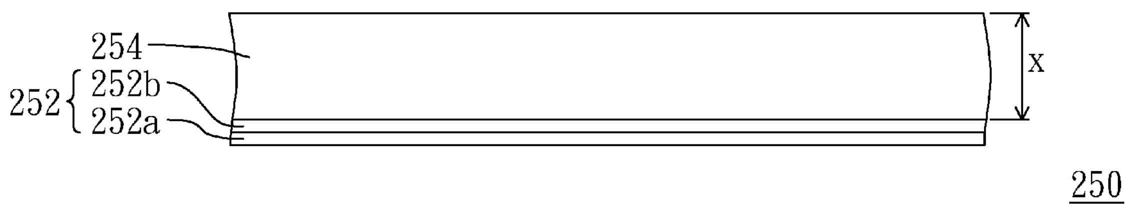
FIGS. 67-70 are schematic cross-sectional views illustrating the metallization structure of a trace according to the present invention.

Referring now to FIG. 67, a schematic cross-sectional view of the first type of metallization structure in the circuit/metal trace 250 according to the second embodiment is shown. For this embodiment, during the formation of bottom metal layer 252, a sputtering process can be first used to form an adhesive/barrier layer 252*a*. Then, another sputtering process or an electroless plating or electroplating process may be used to form a seed layer 252*b* on the adhesive/barrier layer 252*a*. An electroplating process or electroless plating process may be used to form a bulk metal layer 254 on the seed layer 252*b*. The adhesion/barrier layer 252*a* may comprise chromium, a chromium-copper alloy, titanium, a titanium-tungsten alloy, titanium nitride, tantalum or tantalum nitride, for example. The seed layer 252*b*, such as gold, can be sputtered, electroless plated or electroplated on the adhesion/barrier layer 252*a*, preferably comprising a titanium-tungsten alloy, and then the bulk metal layer 254 comprising gold is electroplated or electroless plated on the seed layer 252*b*. The bulk metal layer 254 may be a single metal layer and may comprise gold with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

B. Second Type of Metallization Structure in Circuit/Metal Traces

Figure 68:
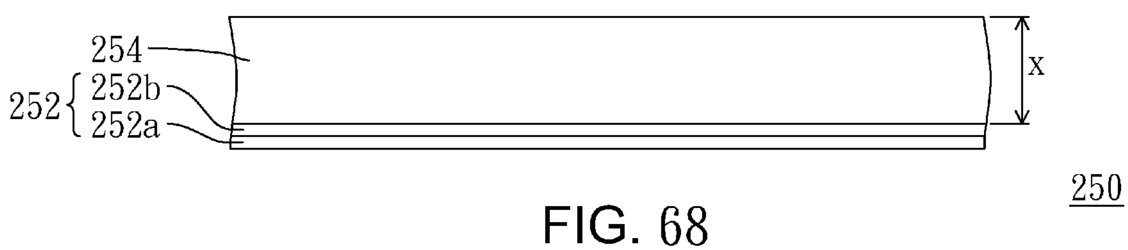

Referring now to FIG. 68, a schematic cross-sectional view of the second type of metallization structure in the circuit/metal trace 250 and pad 251 according to the present invention is shown. For this embodiment, during the formation of bottom metal layer 252, a sputtering process can be first used to form an adhesive/barrier layer 252*a*. Then, another sputtering process or an electroless plating or electroplating process may be used to form a seed layer 252*b* on the adhesive/barrier layer 252*a*. An electroplating process or electroless plating process may be used to form a bulk metal layer 254 on the seed layer 252*b*. The adhesion/barrier layer 252*a* may comprise chromium, a chromium-copper alloy, titanium, a titanium-tungsten alloy, titanium nitride, tantalum or tantalum nitride, for example. The seed layer 252*b*, such as copper, can be sputtered, electroless plated or electroplated on the adhesion/barrier layer 252*a*, preferably comprising titanium, and next the bulk metal layer 254 is electroplated or electroless plated on the seed layer 252*b*. Alternatively, the seed layer 252*b*, such as copper, can be sputtered, electroless plated or electroplated on the adhesion/barrier layer 252*a* formed by first sputtering a chromium layer and then sputtering a chromium-copper-alloy layer on the chromium layer, and then the bulk metal layer 254 comprising copper is electroplated or electroless plated on the seed layer 252*b*. The bulk metal layer 254 may be a single metal layer and may comprise copper with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as silver, can be sputtered, electroless plated or electroplated on the adhesion/barrier layer 252*a* and then the bulk metal layer 254 comprising silver is electroplated or electroless plated on the seed layer. The bulk metal layer 254 may be a single metal layer and may comprise silver with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as platinum, can be sputtered, electroless plated or electroplated on the adhesion/barrier layer 252*a* and then the bulk metal layer 254 comprising platinum is electroplated or electroless plated on the seed layer. The bulk metal layer 254 may be a single metal layer and may comprise platinum with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as palladium, can be sputtered, electroless plated or electroplated on the adhesion/barrier layer 252*a* and then the bulk metal layer 254 comprising palladium is electroplated or electroless plated on the seed layer. The bulk metal layer 254 may be a single metal layer and may comprise palladium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as rhodium, can be sputtered, electroless plated or electroplated on the adhesion/barrier layer 252*a* and then the bulk metal layer 254 comprising rhodium is electroplated or electroless plated on the seed layer. The bulk metal layer 254 may be a single metal layer and may comprise rhodium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as ruthenium, can be sputtered, electroless plated or electroplated on the adhesion/barrier layer 252*a* and then the bulk metal layer 254 comprising ruthenium is electroplated or electroless plated on the seed layer. The bulk metal layer 254 may be a single metal layer and may comprise ruthenium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as nickel, can be sputtered, electroless plated or electroplated on the adhesion/barrier layer 252*a* and then the bulk metal layer 254 comprising nickel is electroplated or electroless plated on the seed layer. The bulk metal layer 254 may be a single metal layer and may comprise nickel with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

C. Third Type of Metallization Structure in Circuits/Metal Traces

Figure 69:
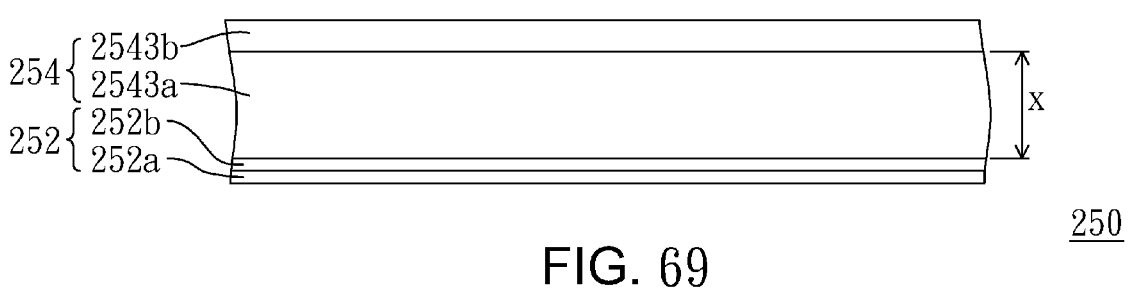

Referring now to FIG. 69, a schematic cross-sectional view of the third type of metallization structure in the circuit/metal trace 250 according to the second embodiment. For this embodiment, during the formation of bottom metal layer 252, a sputtering process can be first used to form an adhesive/barrier layer 252*a*. Then, another sputtering process or an electroless plating or electroplating process may be used to form a seed layer 252*b* on the adhesive/barrier layer 252*a*. An electroplating or electroless plating process may be used to form a bulk metal layer 254 on the seed layer 252*b*. The adhesion/barrier layer 252*a* may comprise chromium, a chromium-copper alloy, titanium, a titanium-tungsten alloy, titanium nitride, tantalum or tantalum nitride, for example. The seed layer 252*b*, such as copper, can be sputtered, electroless plated or electroplated on the adhesion/barrier layer 252*a*, preferably comprising titanium, next the bulk metal layer 254 is electroplated or electroless plated on the seed layer. Alternatively, the seed layer 252*b*, such as copper, can be sputtered, electroless plated or electroplated on the adhesion/barrier layer 2523*a* formed by first sputtering a chromium layer and then sputtering a chromium-copper-alloy layer on the chromium, and then the bulk metal layer 254 is electroplated or electroless plated on the seed layer. The bulk metal layer 254 is formed by electroplating or electroless plating a first metal layer 2543*a* on the seed layer 252*b* and then electroplating or electroless plating a second metal layer 2543*b* on the first metal layer 2543*a*. The first metal layer 2543*a* may have a thickness x greater than 1 μm (1 micrometer), and preferably between 2 μm (2 micrometers) and 30 μm (30 micrometers), wherein the first metal layer 2543*a* may comprise copper with greater than 90 weight percent, and, preferably, greater than 97 weight percent. The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as gold, is sputtered, electroless plated or electroplated on the adhesion/barrier layer 252*a*, preferably comprising a titanium-tungsten alloy, and next the bulk metal layer 254 is electroplated or electroless plated on the seed layer 252*b*. The bulk metal layer 254 is formed by electroplating or electroless plating a first metal layer 2543*a* on the seed layer 252*b* and then electroplating or electroless plating a second metal layer 2543*b* on the first metal layer 2543*a*. The first metal layer 2543*a* may comprise gold with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as silver, is sputtered, electroless plated or electroplated on the adhesion/barrier layer 252*a*, and next the bulk metal layer 254 is electroplated or electroless plated on the seed layer 252*b*. The bulk metal layer 254 is formed by electroplating or electroless plating a first metal layer 2543*a* on the seed layer 252*b* and then electroplating or electroless plating a second metal layer 2543*b* on the first metal layer 2543*a*. The first metal layer 2543*a* may comprise silver with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as platinum, is sputtered, electroless plated or electroplated on the adhesion/barrier layer 252*a*, and next the bulk metal layer 254 is electroplated or electroless plated on the seed layer 252*b*. The bulk metal layer 254 is formed by electroplating or electroless plating a first metal layer 2543*a* on the seed layer 252*b* and then electroplating or electroless plating a second metal layer 2543*b* on the first metal layer 2543*a*. The first metal layer 2543*a* may comprise platinum with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as palladium, is sputtered, electroless plated or electroplated on the adhesion/barrier layer 252*a*, and next the bulk metal layer 254 is electroplated or electroless plated on the seed layer 252*b*. The bulk metal layer 254 is formed by electroplating or electroless plating a first metal layer 2543*a* on the seed layer 252*b* and then electroplating or electroless plating a second metal layer 2543*b* on the first metal layer 2543*a*. The first metal layer 2543*a* may comprise palladium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as rhodium, is sputtered, electroless plated or electroplated on the adhesion/barrier layer 252*a*, and next the bulk metal layer 254 is electroplated or electroless plated on the seed layer 252*b*. The bulk metal layer 254 is formed by electroplating or electroless plating a first metal layer 2543*a* on the seed layer 252*b* and then electroplating or electroless plating a second metal layer 2543*b* on the first metal layer 2543*a*. The first metal layer 2543*a* may comprise rhodium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as ruthenium, is sputtered, electroless plated or electroplated on the adhesion/barrier layer 252*a*, and next the bulk metal layer 254 is electroplated or electroless plated on the seed layer 252*b*. The bulk metal layer 254 is formed by electroplating or electroless plating a first metal layer 2543*a* on the seed layer 252*b* and then electroplating or electroless plating a second metal layer 2543*b* on the first metal layer 2543*a*. The first metal layer 2543*a* may comprise ruthenium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2543*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first metal layer 2543*a* or the second metal layer 2543*b* is greater than 1 μm, an electroplating process is preferably used to form the first metal layer 2543*a* or the second metal layer 2543*b*.

D. Fourth Type of Metallization Structure in Circuits/Metal Traces

Figure 70:
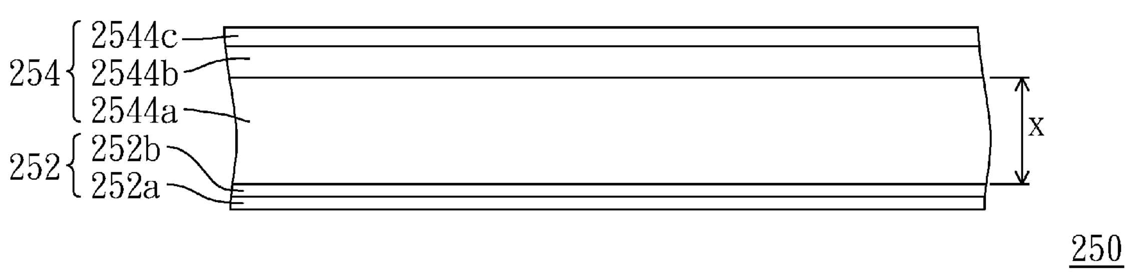

Referring now to FIG. 70, a schematic cross-sectional view of the fourth type of metallization structure in the circuit/metal trace 250 and pad 251 according to the second embodiment is shown. For this embodiment, during the formation of the bottom metal layer 252, a sputtering process can be first used to form an adhesive/barrier layer 252*a*. Then, another sputtering process or an electroless plating or electroplating process may be used to form a seed layer 252*b* on the adhesive/barrier layer 252*a*. An electroplating or electroless plating process may be used to form a bulk metal layer 254 on the seed layer 252*b*. The adhesion/barrier layer 252*a* may comprise chromium, a chromium-copper alloy, titanium, a titanium-tungsten alloy, titanium nitride, tantalum or tantalum nitride, for example. The seed layer 252*b*, such as copper, can be sputtered, electroless plated or electroplated on the adhesion/barrier layer 252*a*, preferably comprising titanium, and next the bulk metal layer 254 is electroplated or electroless plated on the seed layer 252*b*. Alternatively, the seed layer 252*b*, such as copper, can be sputtered, electroless plated or electroplated on the adhesion/barrier layer 252*a* formed by first sputtering a chromium layer and then sputtering a chromium-copper-alloy layer on the chromium, and then the bulk metal layer 254 is electroplated or electroless plated on the seed layer 252*b*. The bulk metal layer 254 is formed by electroplating or electroless plating a first metal layer 2544*a* on the seed layer 252*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise copper with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm.

In another case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as gold, can be sputtered, electroless plated or electroplated on the adhesion/barrier layer 252*a*, preferably comprising a titanium-tungsten alloy, and next the bulk metal layer 254 is electroplated or electroless plated on the seed layer 252*b*. The bulk metal layer 254 is formed by electroplating or electroless plating a first metal layer 2544*a* on the seed layer 252*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise gold with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as silver, can be sputtered, electroless plated or electroplated on the adhesion/barrier layer 252*a* and next the bulk metal layer 254 is electroplated or electroless plated on the seed layer 252*b*. The bulk metal layer 254 is formed by electroplating or electroless plating a first metal layer 2544*a* on the seed layer 252*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise silver with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as platinum, can be sputtered, electroless plated or electroplated on the adhesion/barrier layer 252*a* and next the bulk metal layer 254 is electroplated or electroless plated on the seed layer 252*b*. The bulk metal layer 254 is formed by electroplating or electroless plating a first metal layer 2544*a* on the seed layer 252*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise platinum with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as palladium, can be sputtered, electroless plated or electroplated on the adhesion/barrier layer 252*a* and next the bulk metal layer 254 is electroplated or electroless plated on the seed layer 252*b*. The bulk metal layer 254 is formed by electroplating or electroless plating a first metal layer 2544*a* on the seed layer 252*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise palladium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as rhodium, can be sputtered, electroless plated or electroplated on the adhesion/barrier layer 252*a* and next the bulk metal layer 254 is electroplated or electroless plated on the seed layer 252*b*. The bulk metal layer 254 is formed by electroplating or electroless plating a first metal layer 2544*a* on the seed layer 252*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise rhodium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

In another case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as ruthenium, can be sputtered, electroless plated or electroplated on the adhesion/barrier layer 252*a* and next the bulk metal layer 254 is electroplated or electroless plated on the seed layer 252*b*. The bulk metal layer 254 is formed by electroplating or electroless plating a first metal layer 2544*a* on the seed layer 252*b*, next electroplating or electroless plating a second metal layer 2544*b* on the first metal layer 2544*a*, and then electroplating or electroless plating a third metal layer 2544*c* on the second metal layer 2544*b*. The first metal layer 2544*a* may comprise ruthenium with greater than 90 weight percent, and, preferably, greater than 97 weight percent and may have a thickness x greater than 1 μm (1 micrometer), and preferably between 2 μm (2 micrometers) and 30 μm (30 micrometers). The second metal layer 2544*b* may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer 2544*c* may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer 2544*c* may comprise silver with greater than 90 weight percent, and, preferably, greater than 97 weight percent and may have a thickness greater than 100 angstroms, and preferably between 1000 angstroms and 10 μm. Alternatively, the third metal layer 2544*c* may comprise copper with greater than 90 weight percent, and, preferably, greater than 97 weight percent and may have a thickness greater than 100 angstroms, and preferably between 1000 angstroms and 10 μm. Alternatively, the third metal layer 2544*c* may comprise platinum with greater than 90 weight percent, and, preferably, greater than 97 weight percent and may have a thickness greater than 100 angstroms, and preferably between 1000 angstroms and 1 μm. Alternatively, the third metal layer 2544*c* may comprise palladium with greater than 90 weight percent, and, preferably, greater than 97 weight percent and may have a thickness greater than 100 angstroms, and preferably between 1000 angstroms and 10 μm. Alternatively, the third metal layer 2544*c* may comprise rhodium with greater than 90 weight percent, and, preferably, greater than 97 weight percent and may have a thickness greater than 100 angstroms, and preferably between 1000 angstroms and 10 μm. Alternatively, the third metal layer 2544*c* may comprise ruthenium with greater than 90 weight percent, and, preferably, greater than 97 weight percent and may have a thickness greater than 100 angstroms, and preferably between 1000 angstroms and 10 μm. If the thickness of the first metal layer 2544*a*, the second metal layer 2544*b* or the third metal layer 2544*c* is greater than 1 μm, an electroplating process is preferably used to form the first metal layer 2544*a*, the second metal layer 2543*b* or the third metal layer 2544*c*.

3. Metallization Structure in Bumps or Pads

Figure 66:
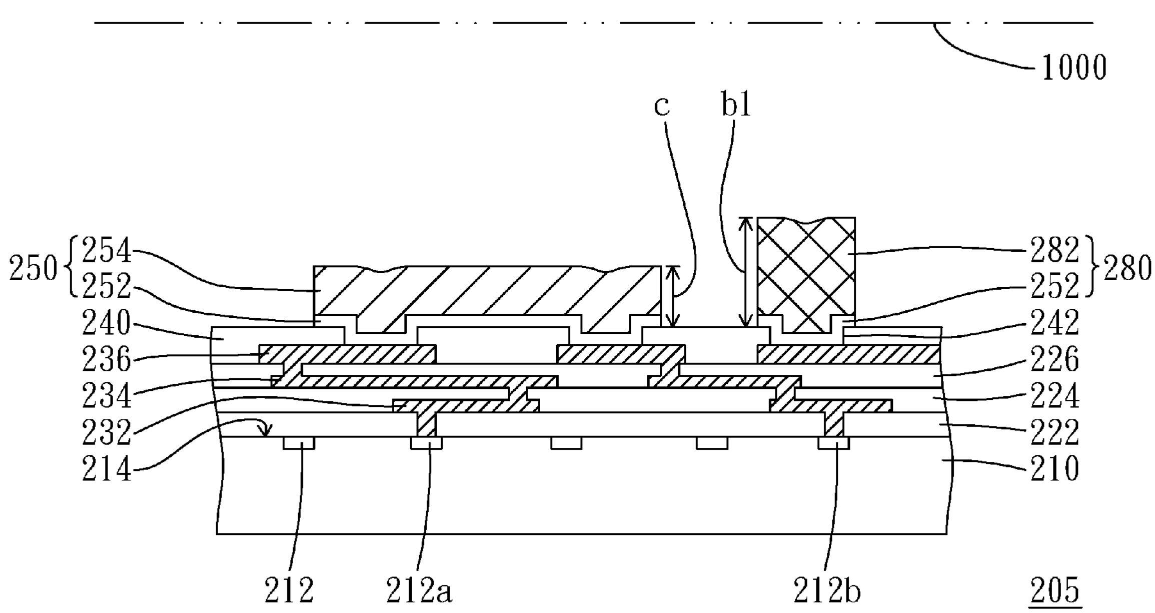
Figure 66A:
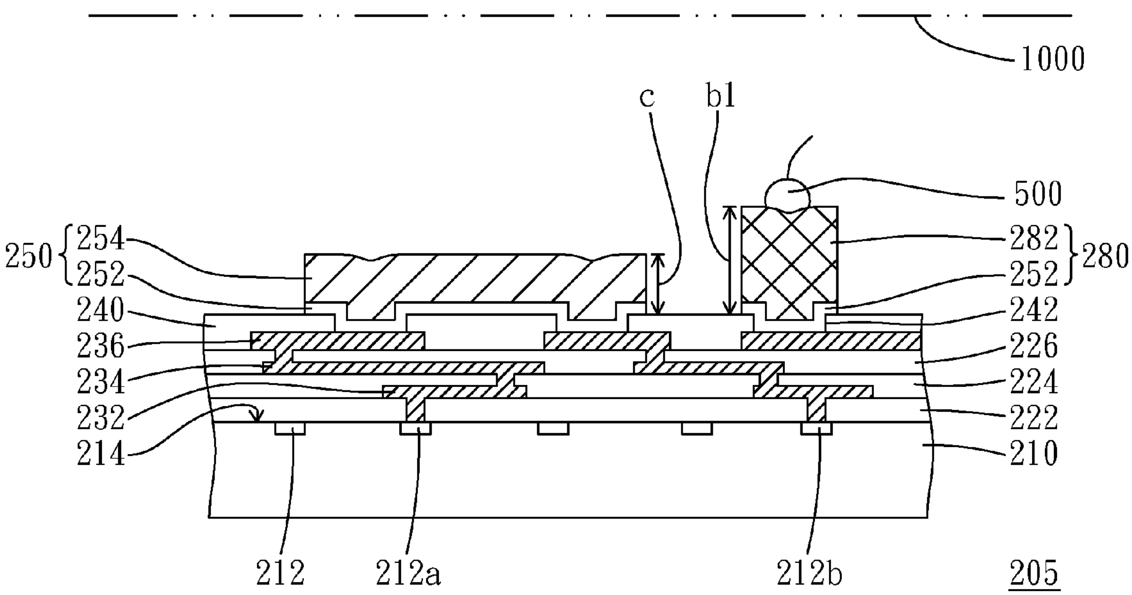

Referring now to FIG. 66, the bump or pad 280 comprises a bottom layer 252 formed by a sputtering process and a bulk metal layer 282 formed by an electroplating process or an electroless plating process. A detailed description the metallization structure of the bumps or pads 280 is as follows.

The bump or pad 280 formed on the thin-film circuit layer 236 exposed by an opening 242 in the passivation layer 240 may be divided into two groups. One group is the bump or pad 280 comprising a reflowable or solderable material that is usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The soldable bump or pad 280 starts to reflow when temperature reaches the melting temperature of solder, or reflowable metal, or reflowable metal alloys (i.e. is roughly the peak temperature) for over 20 seconds. The peak-temperature period of the whole temperature profile takes over 2 minutes and typically 5 to 45 minutes. In summary, the soldable bump or pad 280 is reflowed at the temperature of between 150 and 350 centigrade degrees for more than 20 seconds or for more than 2 minutes. The solderable bump or pad 280 comprises solder or other metals or alloys with melting point between 150 and 350 centigrade degrees. The solderable bump or pad 280 comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 centigrade degrees, or greater than 200 centigrade degrees, or greater than 250 centigrade degrees.

The other group is that the bump or pad 280 is non-reflowable or non-solderable and can not be reflowed at the temperature of greater than 350 centigrade degrees for more than 20 seconds or for more than 2 minutes. Each component of the non-reflowable or the non-solder bump or pad 280 may not reflow at the temperature of more than 350 centigrade degrees for more than 20 seconds or for more than 2 minutes. The non-reflowable bump or pad 280 comprises metals or metal alloys with a melting point greater than 350 centigrade degrees or greater than 400 centigrade degrees, or greater than 600 centigrade degrees. Moreover, the non-reflowable bump or pad 280 does not comprise any metals or metal alloys with melting temperature lower than 350 centigrade degrees.

The non-reflowable bump or pad 280 may have a topmost metal layer comprising gold with greater than 90 weight percent and, preferably, greater than 97 weight percent. Alternatively, the non-reflowable bump or pad 280 may have a topmost metal layer with gold ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising copper with greater than 90 weight percent and, preferably, greater than 97 weight percent. Alternatively, the non-reflowable bump or pad 280 may have a topmost metal layer with copper ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising nickel with greater than 90 weight percent and, preferably, greater than 97 weight percent. Alternatively, the non-reflowable bump or pad 280 may have a topmost metal layer with nickel ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising silver with greater than 90 weight percent and, preferably, greater than 97 weight percent. Alternatively, the non-reflowable bump or pad 280 may have a topmost metal layer with silver ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising platinum with greater than 90 weight percent and, preferably, greater than 97 weight percent. Alternatively, the non-reflowable bump or pad 280 may have a topmost metal layer with platinum ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising palladium with greater than 90 weight percent and, preferably, greater than 97 weight percent. Alternatively, the non-reflowable bump or pad 280 may have a topmost metal layer with palladium ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising rhodium with greater than 90 weight percent and, preferably, greater than 97 weight percent. Alternatively, the non-reflowable bump or pad 280 may have a topmost metal layer with rhodium ranging from 0 weight percent to 90 weight percent, or ranging from 0 weight percent to 50 weight percent, or ranging from 0 weight percent to 10 weight percent.

The non-reflowable bump or pad 280 may have a topmost metal layer comprising ruthenium with greater than 90 weight percent and, preferably, greater than 97 weight percent. Alternatively, the non-reflowable bump or pad 280 may have a topmost metal layer with ruthenium ranging from 0 weight percent to 90 weight percent, or ranging from 0 weight percent to 50 weight percent, or ranging from 0 weight percent to 10 weight percent.

A. First Type of Metallization Structure in Bumps or Pads

Figure 71:
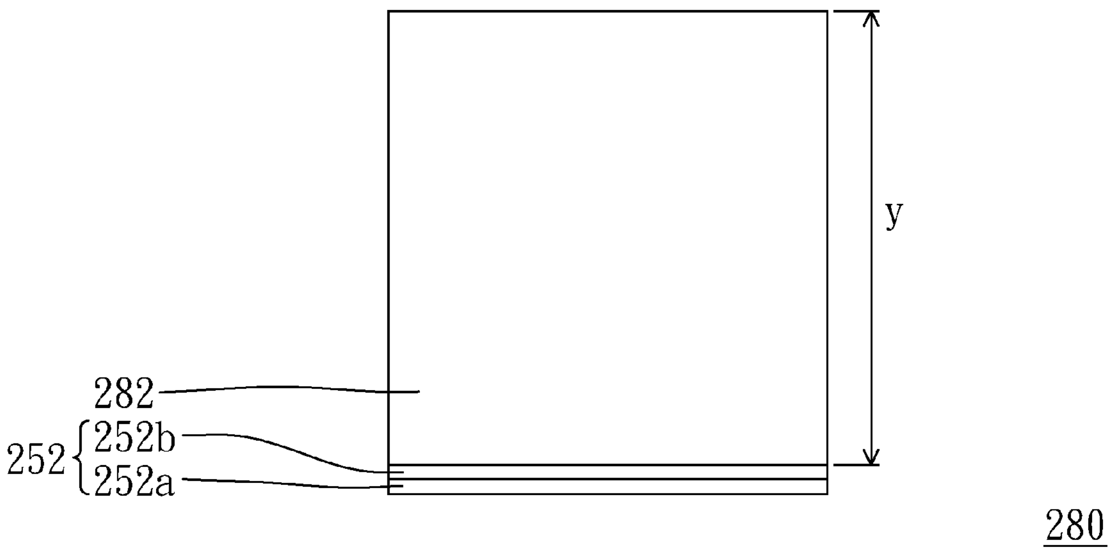
FIGS. 71 and 72 are schematic cross-sectional views illustrating the metallization structure of a bump or pad according to the present invention.

Referring now to FIG. 71, a schematic cross-sectional view of the first type of metallization structure in bumps or pads according to the second embodiment is shown. For this embodiment, during the formation of bottom metal layer 252, a sputtering process can be first used to form an adhesive/barrier layer 252*a*. Then, another sputtering process or an electroless plating process may be used to form a seed layer 252*b* on the adhesive/barrier layer 252*a*. An electroplating process or electroless plating process may be used to form a metal layer 282 on the seed layer 252*b*. The metal layer 282 for a bump may be a single metal layer having a thickness y greater than 5 μm, and preferably between 7 μm and 300 μm, for example, and formed by an electroplating process or an electroless plating process, for example. The metal layer 282 used for a pad may be a single metal layer having a thickness y greater than 0.01 μm, and preferably between 1 μm and 30 μm, for example, and formed by an electroplating process or an electroless plating process, for example. If the thickness of the metal layer 282 is greater than 1 μm, an electroplating process is preferably used to form the metal layer 282.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as gold, can be sputtered, electroless plated or electroplated on the adhesion/barrier layer 252*a*, preferably comprising a titanium-tungsten alloy, and then the single metal layer 282 comprising gold is electroplated or electroless plated on the seed layer 252*b*. The single metal layer 282 for a bump may comprise gold with greater than 90 weight percent, and, preferably, greater than 97 weight percent and may have a thickness between 7 μm and 30 μm, for example. The single metal layer 282 for a pad may comprise gold with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as copper, can be sputtered, electroless plated or electroplated on the adhesion/barrier layer 252*a*, preferably comprising titanium, and next the single metal layer 282 is electroplated or electroless plated on the seed layer 252*b*. Alternatively, the seed layer 252*b*, such as copper, can be sputtered, electroless plated or electroplated on the adhesion/barrier layer 252*a* formed by first sputtering a chromium layer and then sputtering a chromium-copper-alloy layer on the chromium layer, and then the single metal layer 282 comprising copper is electroplated or electroless plated on the seed layer 252*b*. The single metal layer 282 for a bump may comprise copper with greater than 90 weight percent, and, preferably, greater than 97 weight percent and may have a thickness between 7 μm and 30 μm, for example. The single metal layer 282 for a pad may comprise copper with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as silver, can be sputtered, electroless plated or electroplated on the adhesion/barrier layer 252*a*, and next the single metal layer 282 is electroplated or electroless plated on the seed layer 252*b*. The single metal layer 282 for a bump may comprise silver with greater than 90 weight percent, and, preferably, greater than 97 weight percent and may have a thickness between 7 μm and 30 μm, for example. The single metal layer 282 for a pad may comprise silver with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as platinum, can be sputtered, electroless plated or electroplated on the adhesion/barrier layer 252*a*, and next the single metal layer 282 is electroplated or electroless plated on the seed layer 252*b*. The single metal layer 282 for a bump may comprise platinum with greater than 90 weight percent, and, preferably, greater than 97 weight percent and may have a thickness between 7 μm and 30 μm, for example. The single metal layer 282 for a pad may comprise platinum with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as palladium, can be sputtered, electroless plated or electroplated on the adhesion/barrier layer 252*a*, and next the single metal layer 282 is electroplated or electroless plated on the seed layer 252*b*. The single metal layer 282 for a bump may comprise palladium with greater than 90 weight percent, and, preferably, greater than 97 weight percent and may have a thickness between 7 μm and 30 μm, for example. The single metal layer 282 for a pad may comprise palladium with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as rhodium, can be sputtered, electroless plated or electroplated on the adhesion/barrier layer 252*a*, and next the single metal layer 282 is electroplated or electroless plated on the seed layer 252*b*. The single metal layer 282 for a bump may comprise rhodium with greater than 90 weight percent, and, preferably, greater than 97 weight percent and may have a thickness between 7 μm and 30 μm, for example. The single metal layer 282 for a pad may comprise rhodium with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as ruthenium, can be sputtered, electroless plated or electroplated on the adhesion/barrier layer 252*a*, and next the single metal layer 282 is electroplated or electroless plated on the seed layer 252*b*. The single metal layer 282 for a bump may comprise ruthenium with greater than 90 weight percent, and, preferably, greater than 97 weight percent and may have a thickness between 7 μm and 30 μm, for example. The single metal layer 282 for a pad may comprise ruthenium with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b*, such as nickel, can be sputtered, electroless plated or electroplated on the adhesion/barrier layer 252*a*, and next the single metal layer 282 is electroplated or electroless plated on the seed layer 252*b*. The single metal layer 282 for a bump may comprise nickel with greater than 90 weight percent, and, preferably, greater than 97 weight percent and may have a thickness between 7 μm and 30 μm, for example. The single metal layer 282 for a pad may comprise nickel with greater than 90 weight percent, and, preferably, greater than 97 weight percent and may have a thickness between 0.5 μm and 10 μm, for example.

Alternatively, the adhesion/barrier layer 252*a* may comprise chromium, a chromium-copper alloy, titanium, a titanium-tungsten alloy, titanium nitride, tantalum or tantalum nitride, for example. The seed layer 252*b* can be sputtered, electroless plated or electroplated on the adhesion/barrier layer 252*a*, and next the single metal layer 282 is electroplated or electroless plated on the seed layer 252*b*. The single metal layer 282 for a bump may be a lead-containing solder material, such as a tin-lead alloy, or a lead-free solder material, such as a tin-silver alloy or a tin-silver-copper alloy and may have a thickness between 25 μm and 300 μm, for example. The single metal layer 282 for a pad may be a lead-containing solder material, such as a tin-lead alloy, or a lead-free solder material, such as a tin-silver alloy or a tin-silver-copper alloy and may have a thickness between 25 μm and 100 μm, for example.

As long as the bump or pad 280 has the same adhesion/barrier layer and seed layer as the circuit/metal trace 250, the bump or pad 280 and the circuit/metal trace 250 having any one of the above-mentioned metallization structures in the second embodiment can be formed on a same chip.

A wirebonding wire can be bonded on the pad 280 having any one of the above-mentioned metallization structure. Alternatively, the bump or pad 280 having any one of the above-mentioned metallization structure may be bonded to a bump or pad preformed on another semiconductor chip or wafer. Alternatively, the bump 280 having any one of the above-mentioned metallization structure may be bonded to a pad of a printed circuit board or a flexible substrate. Alternatively, the bump 280 having any one of the above-mentioned metallization structure may be connected to a pad of a glass substrate through multiple metal particles in ACF or ACP.

B. Second Type of Metallization Structure in Bumps or Pads

Figure 72:
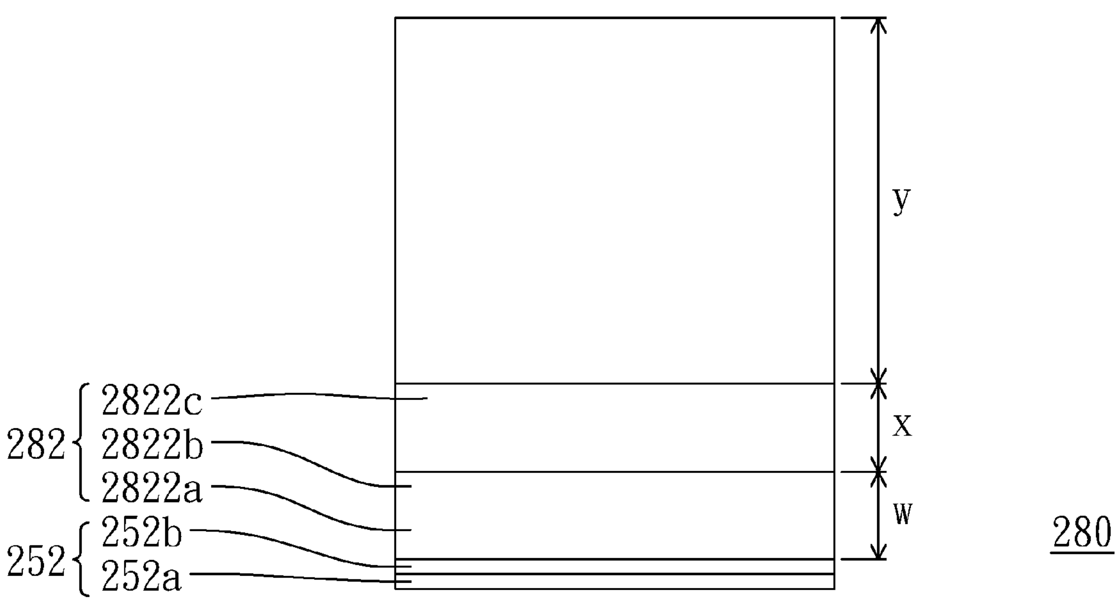

Referring now to FIG. 72, a schematic cross-sectional view of the second type of metallization structure in bumps or pads according to the second embodiment is shown. For this embodiment, during the formation of bottom metal layer 252, a sputtering process can be first used to form an adhesive/barrier layer 252*a*. Then, another sputtering process or an electroless plating process may be used to form a seed layer 252*b* on the adhesive/barrier layer 252*a*. An electroplating process or electroless plating process may be used to form a metal layer 282 on the seed layer 252*b*. The metal layer 282 may be deposited by electroplating or electroless plating a first metal layer 2822*a* on the seed layer 252*b*, next electroplating or electroless plating a second metal layer 2822*b* on the first metal layer 2822*a*, and then electroplating or electroless plating a third metal layer 2822*c* on the second metal layer 2822*b*. The metal layer 282 used for a bump may have a thickness w+x+y greater than 5 μm, and preferably between 7 μm and 300 μm, for example. The metal layer 282 used for a pad may have a thickness w+x+y greater than 0.01 μm, and preferably between 1 μm and 30 μm, for example, and formed by an electroplating process or an electroless plating process, for example.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as gold, can be sputtered, electroless plated or electroplated on the adhesion/barrier layer 252*a*, preferably comprising a titanium-tungsten alloy, and then the metal layer 282 is electroplated or electroless plated on the seed layer 252*b*. The first metal layer 2822*a* may comprise gold with greater than 90 weight percent, and, preferably, greater than 97 weight percent and may have a thickness between 0.01 μm and 20 μm, for example. The second metal layer 2822*b* may comprise nickel with greater than 90 weight percent, and, preferably, greater than 97 weight percent and may have a thickness between 0.01 μm and 20 μm, for example. The third metal layer 2822*c* may comprise gold with greater than 90 weight percent, and, preferably, greater than 97 weight percent and may have a thickness between 0.01 μm and 30 μm, for example. Alternatively, the third metal layer 2822*c* may comprise copper with greater than 90 weight percent, and, preferably, greater than 97 weight percent and may have a thickness between 0.01 μm and 30 μm, for example. Alternatively, the third metal layer 2822*c* may comprise silver with greater than 90 weight percent, and, preferably, greater than 97 weight percent and may have a thickness between 0.01 μm and 30 μm, for example. Alternatively, the third metal layer 2822*c* may comprise platinum with greater than 90 weight percent, and, preferably, greater than 97 weight percent and may have a thickness between 0.01 μm and 30 μm, for example. Alternatively, the third metal layer 2822*c* may comprise palladium with greater than 90 weight percent, and, preferably, greater than 97 weight percent and may have a thickness between 0.01 μm and 30 μm, for example. Alternatively, the third metal layer 2822*c* may comprise rhodium with greater than 90 weight percent, and, preferably, greater than 97 weight percent and may have a thickness between 0.01 μm and 30 μm, for example. Alternatively, the third metal layer 2822*c* may comprise ruthenium with greater than 90 weight percent, and, preferably, greater than 97 weight percent and may have a thickness between 0.01 μm and 30 μm, for example. Alternatively, the third metal layer 2822*c* may be a lead-containing solder material, such as a tin-lead alloy, or a lead-free solder material, such as a tin-silver alloy or a tin-silver-copper alloy and may have a thickness between 10 μm and 300 μm, for example. If the thickness of the first metal layer 2822*a*, the second metal layer 2822*b* or the third metal layer 2822*c* is greater than 1 μm, an electroplating process is preferably used to form the first metal layer 2822*a*, the second metal layer 2822*b* or the third metal layer 2822*c*.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as copper, can be sputtered, electroless plated or electroplated on the adhesion/barrier layer 252*a*, preferably comprising titanium, and then the metal layer 282 is electroplated or electroless plated on the seed layer 252*b*. Alternatively, the seed layer 252*b*, such as copper, can be sputtered, electroless plated or electroplated on the adhesion/barrier layer 252*a* formed by first sputtering a chromium layer and then sputtering a chromium-copper-alloy layer on the chromium layer, and then the metal layer 282 is electroplated or electroless plated on the seed layer 252*b*. The first metal layer 2822*a* may comprise copper with greater than 90 weight percent, and, preferably, greater than 97 weight percent and may have a thickness between 0.01 μm and 20 μm, for example. The second metal layer 2822*b* may comprise nickel with greater than 90 weight percent, and, preferably, greater than 97 weight percent and may have a thickness between 0.01 μm and 20 μm, for example. The third metal layer 2822*c* may comprise gold with greater than 90 weight percent, and, preferably, greater than 97 weight percent and may have a thickness between 0.01 μm and 30 μm, for example. Alternatively, the third metal layer 2822*c* may comprise copper with greater than 90 weight percent, and, preferably, greater than 97 weight percent and may have a thickness between 0.01 μm and 30 μm, for example. Alternatively, the third metal layer 2822*c* may comprise silver with greater than 90 weight percent, and, preferably, greater than 97 weight percent and may have a thickness between 0.01 μm and 30 μm, for example. Alternatively, the third metal layer 2822*c* may comprise platinum with greater than 90 weight percent, and, preferably, greater than 97 weight percent and may have a thickness between 0.01 μm and 30 μm, for example. Alternatively, the third metal layer 2822*c* may comprise palladium with greater than 90 weight percent, and, preferably, greater than 97 weight percent and may have a thickness between 0.01 μm and 30 μm, for example. Alternatively, the third metal layer 2822*c* may comprise rhodium with greater than 90 weight percent, and, preferably, greater than 97 weight percent and may have a thickness between 0.01 μm and 30 μm, for example. Alternatively, the third metal layer 2822*c* may comprise ruthenium with greater than 90 weight percent, and, preferably, greater than 97 weight percent and may have a thickness between 0.01 μm and 30 μm, for example. Alternatively, the third metal layer 2822*c* may be a lead-containing solder material, such as a tin-lead alloy, or a lead-free solder material, such as a tin-silver alloy or a tin-silver-copper alloy and may have a thickness between 10 μm and 300 μm, for example. If the thickness of the first metal layer 2822*a*, the second metal layer 2822*b* or the third metal layer 2822*c* is greater than 1 μm, an electroplating process is preferably used to form the first metal layer 2822*a*, the second metal layer 2822*b* or the third metal layer 2822*c*.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as silver, can be sputtered, electroless plated or electroplated on the adhesion/barrier layer 252*a* and then the metal layer 282 is electroplated or electroless plated on the seed layer 252*b*. The first metal layer 2822*a* may comprise silver with greater than 90 weight percent, and, preferably, greater than 97 weight percent and may have a thickness between 0.01 μm and 20 μm, for example. The second metal layer 2822*b* may comprise nickel with greater than 90 weight percent, and, preferably, greater than 97 weight percent and may have a thickness between 0.01 μm and 20 μm, for example. The third metal layer 2822*c* may comprise gold with greater than 90 weight percent, and, preferably, greater than 97 weight percent and may have a thickness between 0.01 μm and 30 μm, for example. Alternatively, the third metal layer 2822*c* may comprise copper with greater than 90 weight percent, and, preferably, greater than 97 weight percent and may have a thickness between 0.01 μm and 30 μm, for example. Alternatively, the third metal layer 2822*c* may comprise silver with greater than 90 weight percent, and, preferably, greater than 97 weight percent and may have a thickness between 0.01 μm and 30 μm, for example. Alternatively, the third metal layer 2822*c* may comprise platinum with greater than 90 weight percent, and, preferably, greater than 97 weight percent and may have a thickness between 0.01 μm and 30 μm, for example. Alternatively, the third metal layer 2822*c* may comprise palladium with greater than 90 weight percent, and, preferably, greater than 97 weight percent and may have a thickness between 0.01 μm and 30 μm, for example. Alternatively, the third metal layer 2822*c* may comprise rhodium with greater than 90 weight percent, and, preferably, greater than 97 weight percent and may have a thickness between 0.01 μm and 30 μm, for example. Alternatively, the third metal layer 2822*c* may comprise ruthenium with greater than 90 weight percent, and, preferably, greater than 97 weight percent and may have a thickness between 0.01 μm and 30 μm, for example. Alternatively, the third metal layer 2822*c* may be a lead-containing solder material, such as a tin-lead alloy, or a lead-free solder material, such as a tin-silver alloy or a tin-silver-copper alloy and may have a thickness between 10 μm and 300 μm, for example. If the thickness of the first metal layer 2822*a*, the second metal layer 2822*b* or the third metal layer 2822*c* is greater than 1 μm, an electroplating process is preferably used to form the first metal layer 2822*a*, the second metal layer 2822*b* or the third metal layer 2822*c*.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as platinum, can be sputtered, electroless plated or electroplated on the adhesion/barrier layer 252*a* and then the metal layer 282 is electroplated or electroless plated on the seed layer 252*b*. The first metal layer 2822*a* may comprise platinum with greater than 90 weight percent, and, preferably, greater than 97 weight percent and may have a thickness between 0.01 μm and 20 μm, for example. The second metal layer 2822*b* may comprise nickel with greater than 90 weight percent, and, preferably, greater than 97 weight percent and may have a thickness between 0.01 μm and 20 μm, for example. The third metal layer 2822*c* may comprise gold with greater than 90 weight percent, and, preferably, greater than 97 weight percent and may have a thickness between 0.01 μm and 30 μm, for example. Alternatively, the third metal layer 2822*c* may comprise copper with greater than 90 weight percent, and, preferably, greater than 97 weight percent and may have a thickness between 0.01 μm and 30 μm, for example. Alternatively, the third metal layer 2822*c* may comprise silver with greater than 90 weight percent, and, preferably, greater than 97 weight percent and may have a thickness between 0.01 μm and 30 μm, for example. Alternatively, the third metal layer 2822*c* may comprise platinum with greater than 90 weight percent, and, preferably, greater than 97 weight percent and may have a thickness between 0.01 μm and 30 μm, for example. Alternatively, the third metal layer 2822*c* may comprise palladium with greater than 90 weight percent, and, preferably, greater than 97 weight percent and may have a thickness between 0.01 μm and 30 μm, for example. Alternatively, the third metal layer 2822*c* may comprise rhodium with greater than 90 weight percent, and, preferably, greater than 97 weight percent and may have a thickness between 0.01 μm and 30 μm, for example. Alternatively, the third metal layer 2822*c* may comprise ruthenium with greater than 90 weight percent, and, preferably, greater than 97 weight percent and may have a thickness between 0.01 μm and 30 μm, for example. Alternatively, the third metal layer 2822*c* may be a lead-containing solder material, such as a tin-lead alloy, or a lead-free solder material, such as a tin-silver alloy or a tin-silver-copper alloy and may have a thickness between 10 μm and 300 μm, for example. If the thickness of the first metal layer 2822*a*, the second metal layer 2822*b* or the third metal layer 2822*c* is greater than 1 μm, an electroplating process is preferably used to form the first metal layer 2822*a*, the second metal layer 2822*b* or the third metal layer 2822*c*.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as palladium, can be sputtered, electroless plated or electroplated on the adhesion/barrier layer 252*a* and then the metal layer 282 is electroplated or electroless plated on the seed layer 252*b*. The first metal layer 2822*a* may comprise palladium with greater than 90 weight percent, and, preferably, greater than 97 weight percent and may have a thickness between 0.01 μm and 20 μm, for example. The second metal layer 2822*b* may comprise nickel with greater than 90 weight percent, and, preferably, greater than 97 weight percent and may have a thickness between 0.01 μm and 20 μm, for example. The third metal layer 2822*c* may comprise gold with greater than 90 weight percent, and, preferably, greater than 97 weight percent and may have a thickness between 0.01 μm and 30 μm, for example. Alternatively, the third metal layer 2822*c* may comprise copper with greater than 90 weight percent, and, preferably, greater than 97 weight percent and may have a thickness between 0.01 μm and 30 μm, for example. Alternatively, the third metal layer 2822*c* may comprise silver with greater than 90 weight percent, and, preferably, greater than 97 weight percent and may have a thickness between 0.01 μm and 30 μm, for example. Alternatively, the third metal layer 2822*c* may comprise platinum with greater than 90 weight percent, and, preferably, greater than 97 weight percent and may have a thickness between 0.01 μm and 30 μm, for example. Alternatively, the third metal layer 2822*c* may comprise palladium with greater than 90 weight percent, and, preferably, greater than 97 weight percent and may have a thickness between 0.01 μm and 30 μm, for example. Alternatively, the third metal layer 2822*c* may comprise rhodium with greater than 90 weight percent, and, preferably, greater than 97 weight percent and may have a thickness between 0.01 μm and 30 μm, for example. Alternatively, the third metal layer 2822*c* may comprise ruthenium with greater than 90 weight percent, and, preferably, greater than 97 weight percent and may have a thickness between 0.01 μm and 30 μm, for example. Alternatively, the third metal layer 2822*c* may be a lead-containing solder material, such as a tin-lead alloy, or a lead-free solder material, such as a tin-silver alloy or a tin-silver-copper alloy and may have a thickness between 10 μm and 300 μm, for example. If the thickness of the first metal layer 2822*a*, the second metal layer 2822*b* or the third metal layer 2822*c* is greater than 1 μm, an electroplating process is preferably used to form the first metal layer 2822*a*, the second metal layer 2822*b* or the third metal layer 2822*c*.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as rhodium, can be sputtered, electroless plated or electroplated on the adhesion/barrier layer 252*a* and then the metal layer 282 is electroplated or electroless plated on the seed layer 252*b*. The first metal layer 2822*a* may comprise rhodium with greater than 90 weight percent, and, preferably, greater than 97 weight percent and may have a thickness between 0.01 μm and 20 μm, for example. The second metal layer 2822*b* may comprise nickel with greater than 90 weight percent, and, preferably, greater than 97 weight percent and may have a thickness between 0.01 μm and 20 μm, for example. The third metal layer 2822*c* may comprise gold with greater than 90 weight percent, and, preferably, greater than 97 weight percent and may have a thickness between 0.01 μm and 30 μm, for example. Alternatively, the third metal layer 2822*c* may comprise copper with greater than 90 weight percent, and, preferably, greater than 97 weight percent and may have a thickness between 0.01 μm and 30 μm, for example. Alternatively, the third metal layer 2822*c* may comprise silver with greater than 90 weight percent, and, preferably, greater than 97 weight percent and may have a thickness between 0.01 μm and 30 μm, for example. Alternatively, the third metal layer 2822*c* may comprise platinum with greater than 90 weight percent, and, preferably, greater than 97 weight percent and may have a thickness between 0.01 μm and 30 μm, for example. Alternatively, the third metal layer 2822*c* may comprise palladium with greater than 90 weight percent, and, preferably, greater than 97 weight percent and may have a thickness between 0.01 μm and 30 μm, for example. Alternatively, the third metal layer 2822*c* may comprise rhodium with greater than 90 weight percent, and, preferably, greater than 97 weight percent and may have a thickness between 0.01 μm and 30 μm, for example. Alternatively, the third metal layer 2822*c* may comprise ruthenium with greater than 90 weight percent, and, preferably, greater than 97 weight percent and may have a thickness between 0.01 μm and 30 μm, for example. Alternatively, the third metal layer 2822*c* may be a lead-containing solder material, such as a tin-lead alloy, or a lead-free solder material, such as a tin-silver alloy or a tin-silver-copper alloy and may have a thickness between 10 μm and 300 μm, for example. If the thickness of the first metal layer 2822*a*, the second metal layer 2822*b* or the third metal layer 2822*c* is greater than 1 μm, an electroplating process is preferably used to form the first metal layer 2822*a*, the second metal layer 2822*b* or the third metal layer 2822*c*.

In a case, the adhesion/barrier layer 252*a* may comprise chromium, a chromium-copper alloy, titanium, a titanium-tungsten alloy, titanium nitride, tantalum or tantalum nitride, for example. The seed layer 252*b*, such as ruthenium, can be sputtered, electroless plated or electroplated on the adhesion/barrier layer 252*a* and then the metal layer 282 is electroplated or electroless plated on the seed layer 252*b*. The first metal layer 2822*a* may comprise ruthenium with greater than 90 weight percent, and, preferably, greater than 97 weight percent and may have a thickness between 0.01 μm and 20 μm, for example. The second metal layer 2822*b* may comprise nickel with greater than 90 weight percent, and, preferably, greater than 97 weight percent and may have a thickness between 0.01 μm and 20 μm, for example. The third metal layer 2822*c* may comprise gold with greater than 90 weight percent, and, preferably, greater than 97 weight percent and may have a thickness between 0.01 μm and 30 μm, for example. Alternatively, the third metal layer 2822*c* may comprise copper with greater than 90 weight percent, and, preferably, greater than 97 weight percent and may have a thickness between 0.01 μm and 30 μm, for example. Alternatively, the third metal layer 2822*c* may comprise silver with greater than 90 weight percent, and, preferably, greater than 97 weight percent and may have a thickness between 0.01 μm and 30 μm, for example. Alternatively, the third metal layer 2822*c* may comprise platinum with greater than 90 weight percent, and, preferably, greater than 97 weight percent and may have a thickness between 0.01 μm and 30 μm, for example. Alternatively, the third metal layer 2822*c* may comprise palladium with greater than 90 weight percent, and, preferably, greater than 97 weight percent and may have a thickness between 0.01 μm and 30 μm, for example. Alternatively, the third metal layer 2822*c* may comprise rhodium with greater than 90 weight percent, and, preferably, greater than 97 weight percent and may have a thickness between 0.01 μm and 30 μm, for example. Alternatively, the third metal layer 2822*c* may comprise ruthenium with greater than 90 weight percent, and, preferably, greater than 97 weight percent and may have a thickness between 0.01 μm and 30 μm, for example. Alternatively, the third metal layer 2822*c* may be a lead-containing solder material, such as a tin-lead alloy, or a lead-free solder material, such as a tin-silver alloy or a tin-silver-copper alloy and may have a thickness between 10 μm and 300 μm, for example. If the thickness of the first metal layer 2822*a*, the second metal layer 2822*b* or the third metal layer 2822*c* is greater than 1 μm, an electroplating process is preferably used to form the first metal layer 2822*a*, the second metal layer 2822*b* or the third metal layer 2822*c*.

As long as the bump or pad 280 has the same adhesion/barrier layer and seed layer as the circuit/metal trace 250, the bump or pad 280 and the circuit/metal trace 250 having any one of the above-mentioned metallization structures in the second embodiment can be formed on a same chip.

A wirebonding wire can be bonded on the pad 280 having any one of the above-mentioned metallization structure. Alternatively, the bump or pad 280 having any one of the above-mentioned metallization structure may be bonded to a bump or pad preformed on another semiconductor chip or wafer. Alternatively, the bump 280 having any one of the above-mentioned metallization structure may be bonded to a pad of a printed circuit board or a flexible substrate. Alternatively, the bump 280 having any one of the above-mentioned metallization structure may be connected to a pad of a glass substrate through multiple metal particles in ACF or ACP.

4. First Type for Forming Circuit/Metal Traces and Pillar-Shaped Bumps

Additionally, the above process may be performed to deposit pillar-shaped bumps on a pad of the thin-film metal layer 236 exposed by the opening 242 in the passivation layer 240. FIGS. 73-77 are schematic cross-sectional views of the first type for forming circuit/metal traces and pillar-shaped bumps. The steps in FIGS. 73-77 follows the step in FIG. 62.

Figure 73:
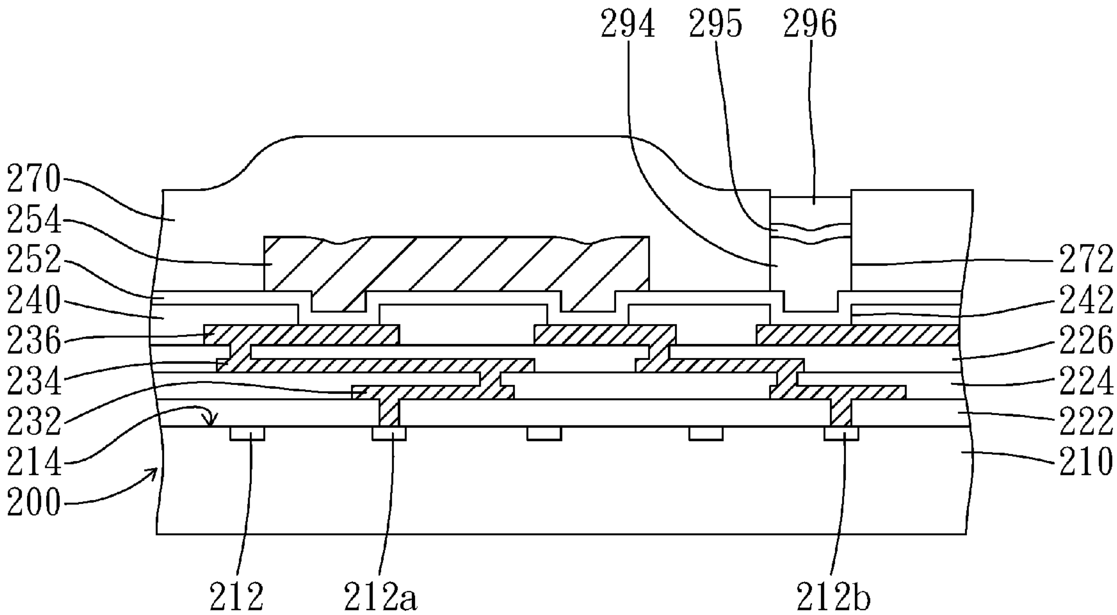
FIGS. 73-77 are schematic cross-sectional views illustrating another preferred embodiment of the second method for forming circuits/metal traces and pillar-shaped bumps according to the present invention.

After the patterned circuit metal layer 254 is produced as shown in FIG. 62, a photoresist layer 270 is formed on the bottom metal layer 252 and on the metal layer 254, as shown in FIG. 73. An opening 272 in the photoresist layer 270 exposes the bottom metal layer 252 on the thin-film circuit layer 236 exposed by the opening 242 in the passivation layer 240. The metallization structure of the bottom metal layer 252 and the metal layer 254 can refer to that illustrated in FIGS. 67-70.

Referring to FIG. 73, an electroplating method or an electroless plating method can be used to form a pillar-shaped metal layer 294 on the bottom metal layer 252 exposed by the opening 272, next to form an anti-collapse metal layer 295 on the pillar-shaped metal layer 294, and then to form a solder layer 296 on the anti-collapse metal layer 295.

The bottom metal layer 252 may comprises an adhesion/barrier layer and a seed layer, the metallization structure of which can refers to the illustration in FIGS. 67-70. The pillar-shaped metal layer 294 electroplated on the seed layer, such as gold, may comprise gold with greater than 90 weight percent, and, preferably, greater than 97 weight percent and may have a thickness greater than 8 μm, and preferably between 50 μm and 200 μm, for example. Alternatively, the pillar-shaped metal layer 294 electroplated on the seed layer, such as copper, may comprise copper with greater than 90 weight percent, and, preferably, greater than 97 weight percent and may have a thickness greater than 8 μm, and preferably between 50 μm and 200 μm, for example. Alternatively, the pillar-shaped metal layer 294 electroplated on the seed layer, such as silver, may comprise silver with greater than 90 weight percent, and, preferably, greater than 97 weight percent and may have a thickness greater than 8 μm, and preferably between 50 μm and 200 μm, for example. Alternatively, the pillar-shaped metal layer 294 electroplated on the seed layer, such as platinum, may comprise platinum with greater than 90 weight percent, and, preferably, greater than 97 weight percent and may have a thickness greater than 8 μm, and preferably between 50 μm and 200 μm, for example. Alternatively, the pillar-shaped metal layer 294 electroplated on the seed layer, such as palladium, may comprise palladium with greater than 90 weight percent, and, preferably, greater than 97 weight percent and may have a thickness greater than 8 μm, and preferably between 50 μm and 200 μm, for example. Alternatively, the pillar-shaped metal layer 294 electroplated on the seed layer, such as rhodium, may comprise rhodium with greater than 90 weight percent, and, preferably, greater than 97 weight percent and may have a thickness greater than 8 μm, and preferably between 50 μm and 200 μm, for example. Alternatively, the pillar-shaped metal layer 294 electroplated on the seed layer, such as ruthenium, may comprise ruthenium with greater than 90 weight percent, and, preferably, greater than 97 weight percent and may have a thickness greater than 8 μm, and preferably between 50 μm and 200 μm, for example. Alternatively, the pillar-shaped metal layer 294 may comprise a lead-containing solder material, such as tin-lead alloy with Pb greater than 90 weight percent, or a lead-free solder material, such as tin-silver alloy or tin-silver-copper alloy and may have a thickness t greater than 8 μm, and preferably between 50 μm and 200 μm. The pillar-shaped metal layer 294 having any one of the above-mentioned metallization structures can be formed using an electroplating process, for example.

The anti-collapse metal layer 295 may comprise nickel with greater than 90 weight percent, and, preferably, greater than 97 weight percent and may have a thickness d greater than 5000 angstroms, and preferably between 1 μm and 30 μm. The anti-collapse metal layer 295 may be formed using an electroplating or an electroless plating process. If the anti-collapse metal layer 295 has a thickness greater than 1 μm, an electroplating process is preferably used to form the anti-collapse metal layer 295.

After forming the anti-collapse metal layer 295, a solder layer 296 is formed on the anti-collapse metal layer 295 and in the opening 272. The solder layer 296 may comprises a lead-containing solder material, such as tin-lead alloy with Pb greater than 90 weight percent, or a lead-free solder material, such as tin-silver alloy or tin-silver-copper alloy. The solder layer 296 has a melting point less than that of any metal layer in the metal pillars 292. The solder layer 296 may have a thickness greater than 5 μm, and preferably between 20 μm and 200 μm.

The bump may comprise the pillar-shaped metal layer 294 having any one of the above-mentioned metallization structure, the anti-collapse metal layer 295 and the solder layer 296 having any one of the above-mentioned metallization structure. Any one of the above-mentioned metallization structures for the pillar-shaped metal layer 294 can be arranged for any one of the above-mentioned metallization structures for the solder layer 296 due to the anti-collapse metal layer 295 located between the pillar-shaped metal layer 294 and the solder layer 296. Alternatively, the anti-collapse metal layer 295 can be saved, that is, the solder layer 296 can be formed on and in touch with the pillar-shaped metal layer 294.

Preferably, the pillar-shaped metal layer 294 of the bump may have the same metal material as the seed layer of the bottom metal layer 252. Alternatively, an adhesion/barrier layer can be electroplated or electroless plated on the seed layer of the bottom metal layer 252 exposed by the opening 272 and then the pillar-shaped metal layer 294 having any one of the above-mentioned metallization structures can be electroplated on the adhesion/barrier layer. The adhesion/barrier layer may comprise nickel with greater than 90 weight percent, and, preferably, greater than 97 weight percent and may have a thickness greater than 100 angstroms, and preferably between 1000 angstroms and 10 μm. The adhesion/barrier layer may be formed using an electroplating or an electroless plating process. If the adhesion/barrier layer has a thickness greater than 1 μm, an electroplating process is preferably used to form the adhesion/barrier layer.

Figure 74:
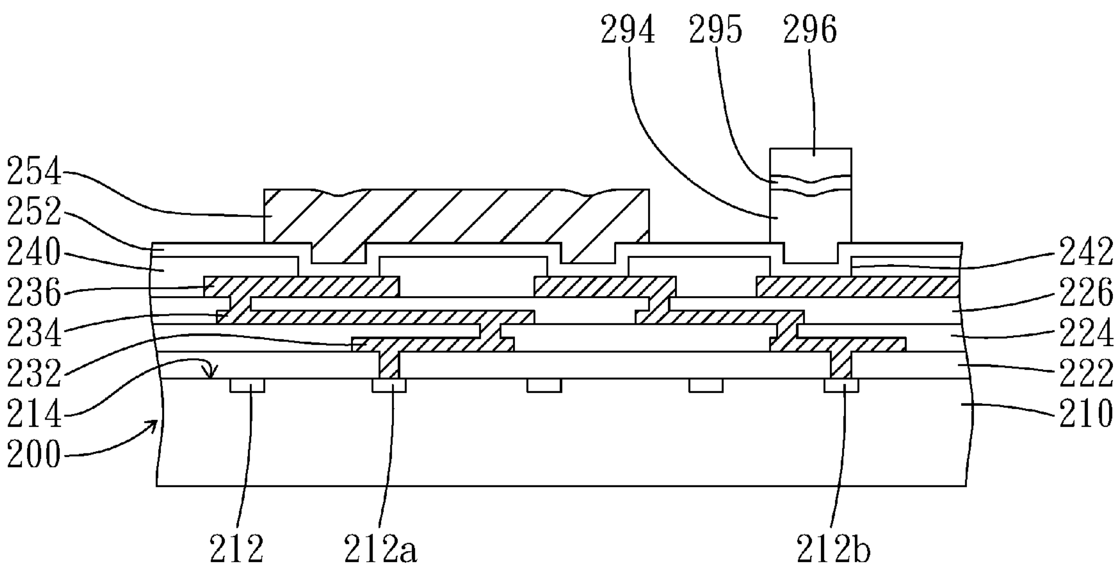
Figure 75:
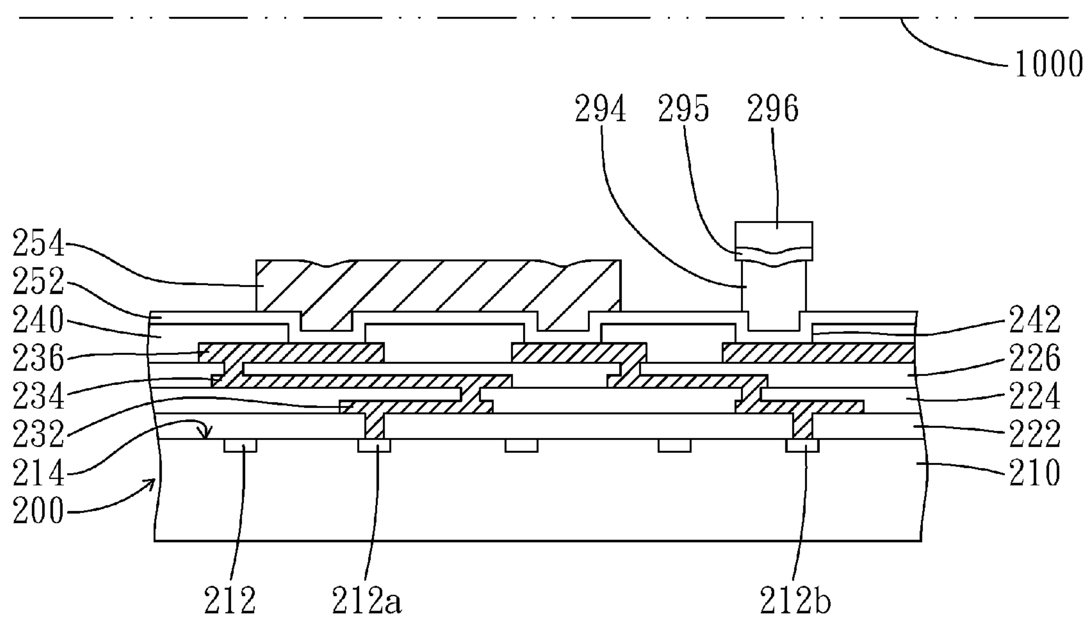
Figure 76:
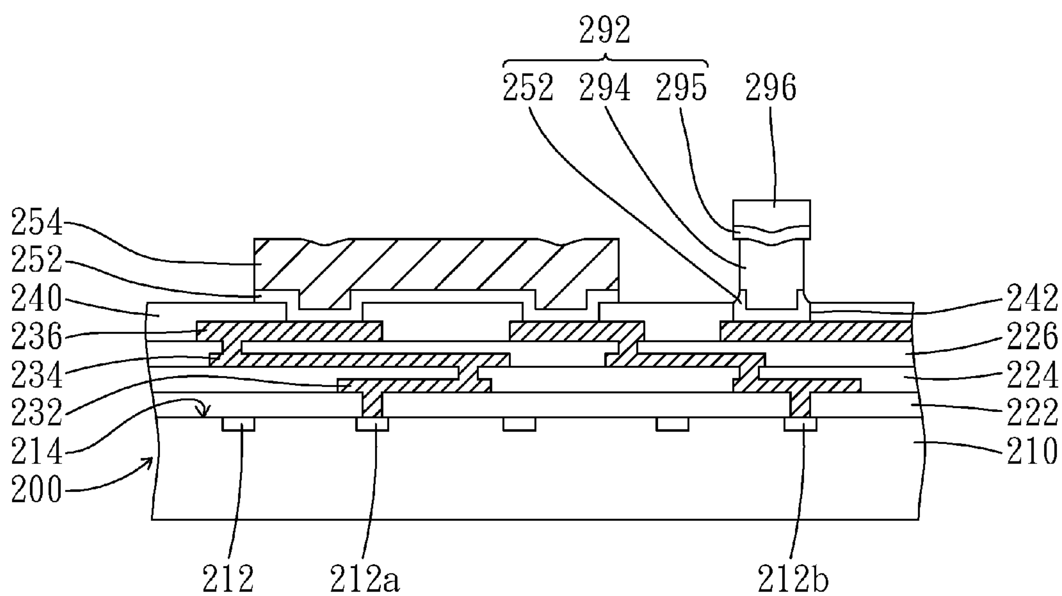
Figure 77:
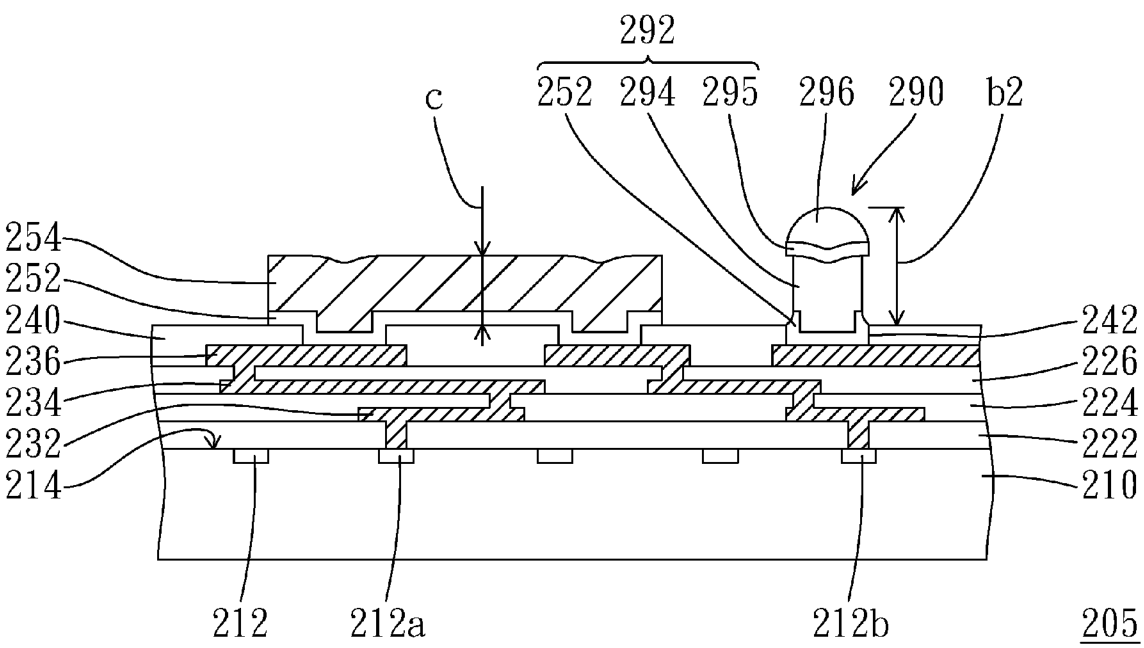

Next, the photoresist layer 270 is removed, and the bottom metal layer 252 is exposed, as shown in FIG. 74. Subsequently, the pillar-shaped metal layer 294 can be etched from the side wall thereof such that the projection profile of the metal pillars 294 projecting to the plane 1000 can be smaller than that of the anti-collapse metal layer 295 projecting to the plane 1000 or smaller than that of the solder layer 296 projecting to the plane 1000, as shown in FIG. 75. The bottom surface of the anti-collapse metal layer 295 has an exposed peripheral region. With the patterned metal layer 254 and 294 as an etching mask, the seed layer and the adhesive/barrier layers of the bottom metal layer 252 not covered by the patterned metal layer 254 and 294 are removed using an etching process, shown in FIG. 76. Thereafter, a reflowing process may be used to round the upper surface of solder layer 296, as shown in FIG. 77. In this case, the bumps 290 comprise the pillar-shaped metal layer 294, anti-collapse metal layer 295 and solder layer 296.

Referring now to FIG. 77, it can be seen that the bottom surface of the anti-collapse metal layer 295 has an exposed peripheral region. As a result, the melting solder layer 296 does not flow down the side wall of the pillar-shaped metal layer 294 during the reflowing process. This provision thus prevents the solder layer 296 from being collapsed.

Next, die sawing process is performed. In the die sawing process, a cutting blade cuts along the scribe-line of semiconductor wafer 200 to split the wafer into many individual IC chips 205. The bump 290 may be used to connect the individual IC chip 205 to an external circuitry, such as another semiconductor chip or wafer, printed circuitry board, flexible substrate or glass substrate. The bump 290 may be connected to a pad of a glass substrate through multiple metal particles in an anisotropic conductive film (ACF) or anisotropic conductive paste (ACP). The bump 290 may be connected to a solder material preformed on another semiconductor chip or wafer, a printed circuitry board or a flexible substrate. The bump 290 may be connected to a bump preformed on another semiconductor chip or wafer.

5. Second Type for Forming Circuit/Metal Traces and Pillar-Shaped Bumps

FIGS. 78-82 are schematic cross-sectional views of the third type for forming circuit/metal traces and pillar-shaped bumps. The steps in FIGS. 78-82 follow the step in FIG. 62.

Figure 78:
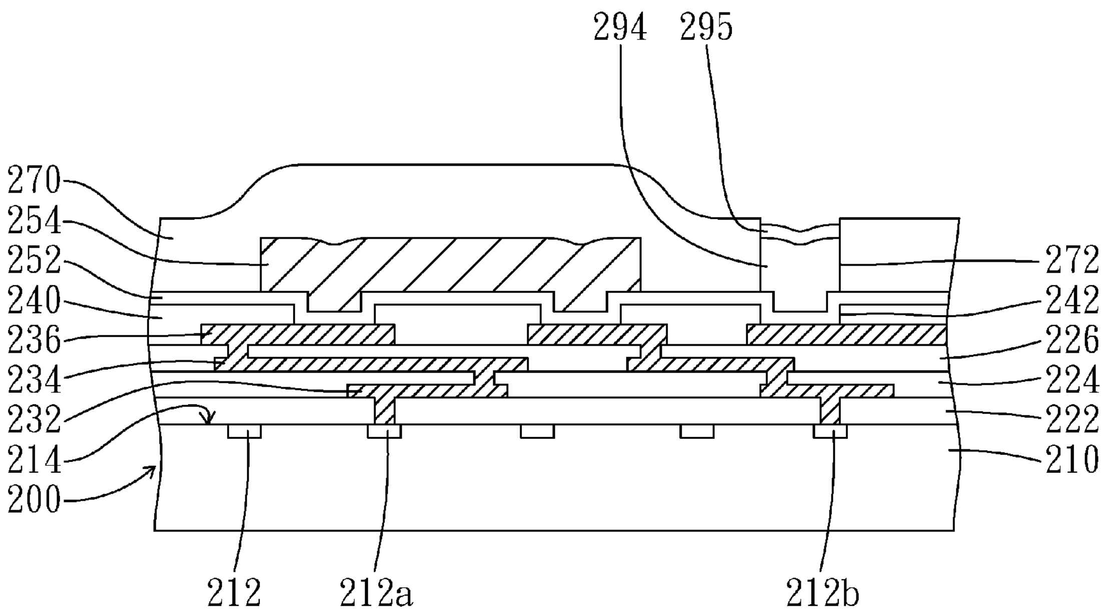
FIGS. 78-82 are schematic cross-sectional views illustrating another preferred embodiment of the second method for forming circuits/metal traces and pillar-shaped bumps according to the present invention.

After the metal layer 254 is formed, as shown in FIG. 62, a photoresist layer 270 is formed on the metal layer 254 and bottom metal layer 252, as shown in FIG. 78. An opening 272 in the photoresist layer 270 exposes the bottom metal layer 252 on the thin-film metal layer 236 exposed by the opening 242 in the passivation layer 240.

Referring to FIG. 78, an electroplating method or an electroless plating method can be used to form a pillar-shaped metal layer 294 on the bottom metal layer 252 exposed by the opening 272 and then to form an anti-collapse metal layer 295 on the pillar-shaped metal layer 294. The metallization structure of the pillar-shaped metal layer 294 and anti-collapse metal layer 295 can refer to those above illustrated in FIGS. 73-77.

Figure 79:
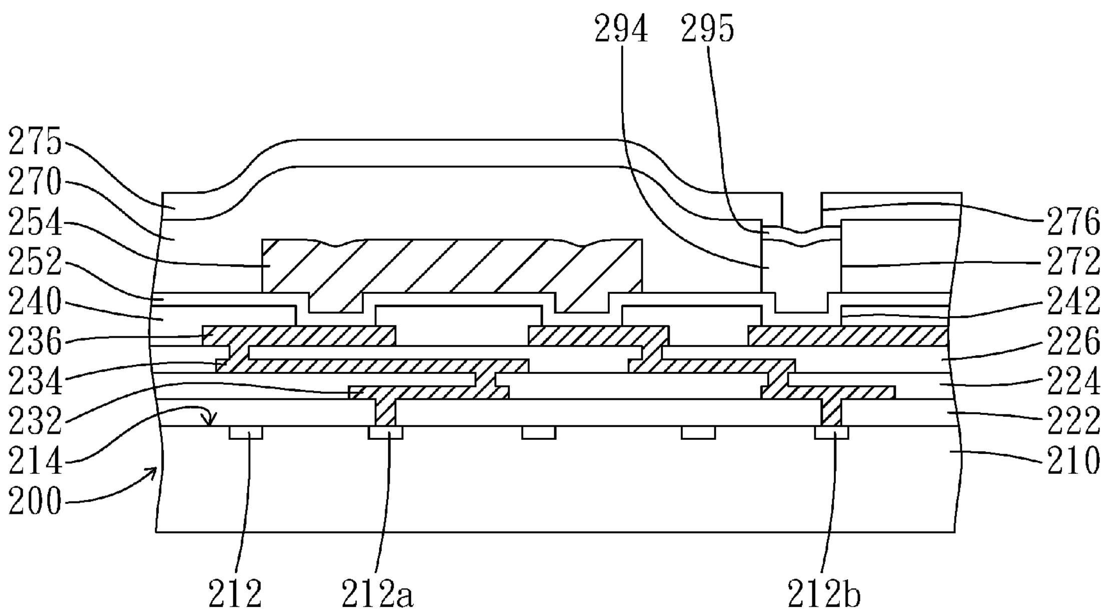
Figure 80:
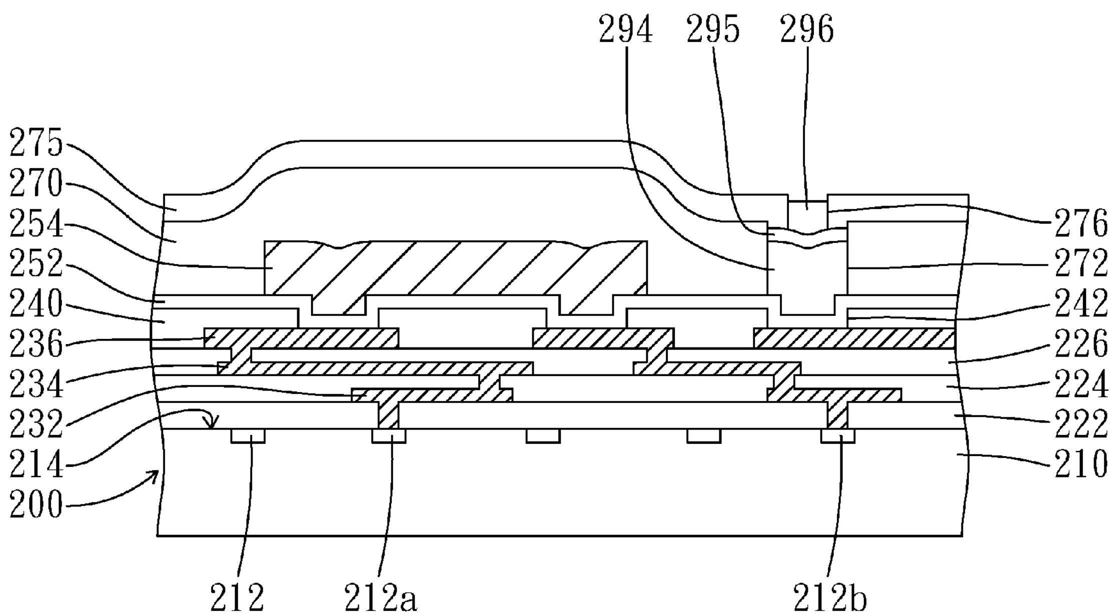

Next, a photoresist layer 275 is formed on the photoresist layer 270 and on the anti-collapse layer 295, as shown in FIG. 79. An opening 276 in the photoresist layer 275 exposes the anti-collapse metal layer 295. The opening 276 has a largest transverse dimension smaller than that of the metal pillar comprising the pillar-shaped metal layer 294 and the anti-collapse metal layer 295. Subsequently, a solder layer 296 is formed on the anti-collapse metal layer 295 exposed by the opening 276 in the photoresist layer 275, as shown in FIG. 80. The metallization structure of the solder layer 296 can refer to those above illustrated in FIGS. 73-77.

Figure 81:
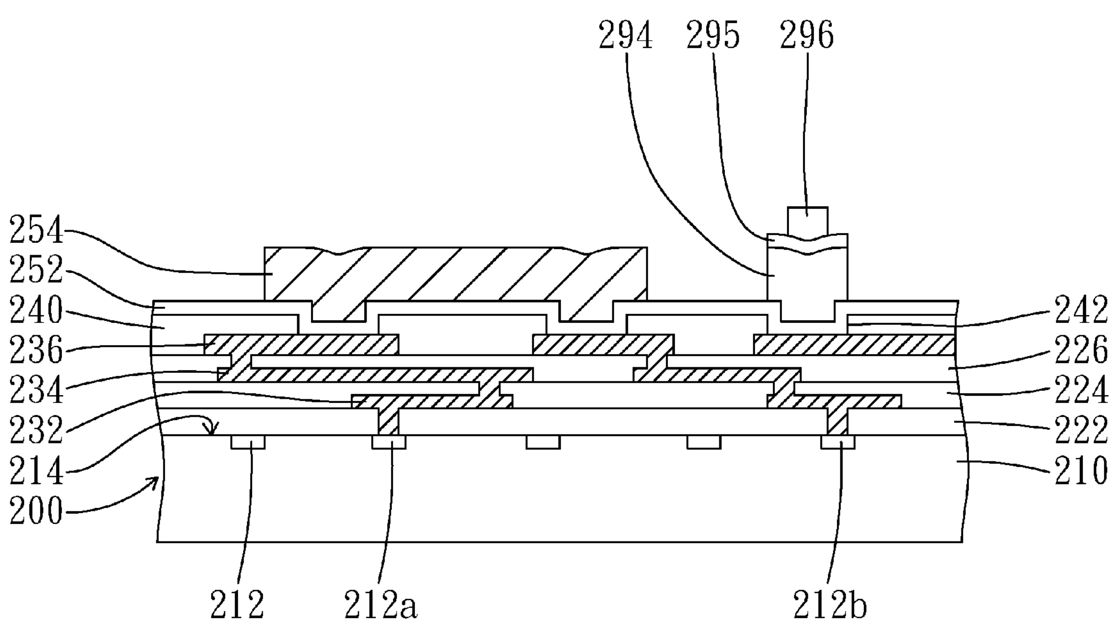

Next, the photoresist layers 275 and 270 are sequentially removed and the bottom metal layer 252 is exposed, as shown in FIG. 81. With the patterned metal layer 254 and 294 as an etching mask, the seed layer and the adhesive/barrier layer of the bottom metal layer 252 not covered by the metal layer 254 and 294 are removed using an etching process, shown in FIG. 82. In this case, the bumps 291 comprise the pillar-shaped metal layer 294, anti-collapse metal layer 295 and solder layer 296.

Next, die sawing process is performed. In the die sawing process, a cutting blade cuts along the scribe-line of semiconductor wafer 200 to split the wafer into many individual IC chips 205. The bump 291 may be used to connect the individual IC chip 205 to an external circuitry, such as another semiconductor chip or wafer, printed circuitry board, flexible substrate or glass substrate. The bump 291 may be connected to a pad of a glass substrate through multiple metal particles in an anisotropic conductive film (ACF) or anisotropic conductive paste (ACP). The bump 291 may be connected to a solder material preformed on another semiconductor chip or wafer, a printed circuitry board or a flexible substrate. The bump 291 may be connected to a bump preformed on another semiconductor chip or wafer.

Figure 82:
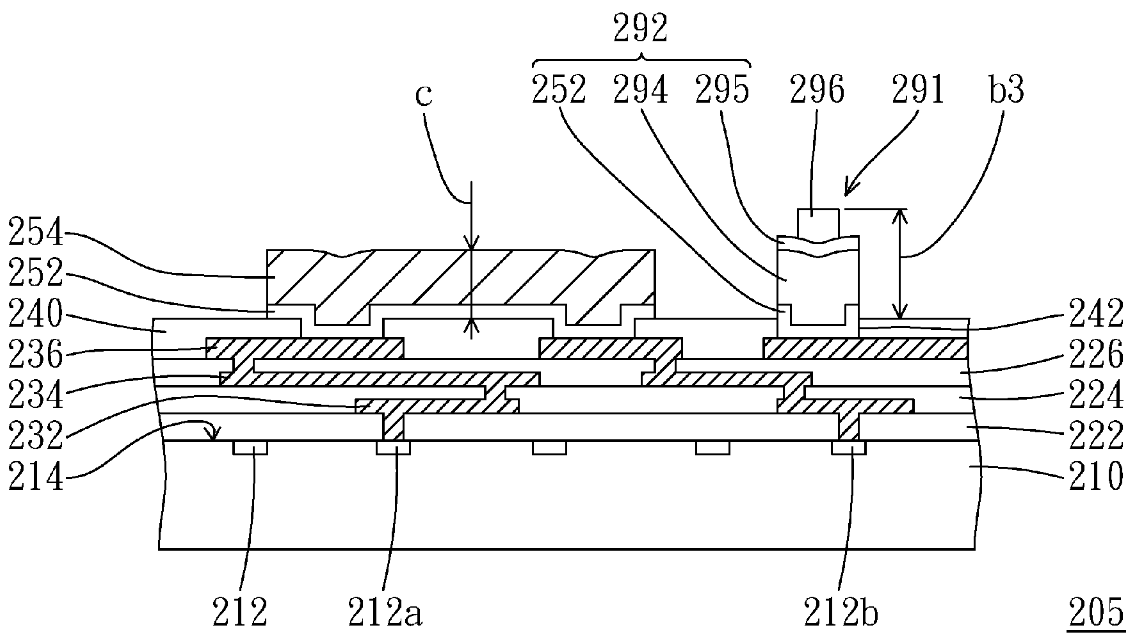

Referring now to FIG. 82, the transverse dimension of the solder layer 296 is relatively small. Even though a small opening in a polymer layer is formed exposing a pad for a circuitry substrate, such as chip or printed circuit board, the bump 291 can be easily inserted into the small opening in the polymer layer and bonded to the pad exposed by the small opening in the polymer layer. Moreover, even though a small opening in a passivation layer made of CVD nitride and CVD oxide is formed exposing a pad for a chip or wafer, the bump 291 can be easily inserted into the small opening in the passivation layer and bonded to the pad exposed by the small opening in the passivation layer.

Alternatively, the anti-collapse metal layer 295 can be saved, that is, the solder layer 296 can be formed on and in touch with the pillar-shaped metal layer 294 exposed by the opening 276 in the photoresist layer 275.

Alternatively, an adhesion/barrier layer can be electroplated or electroless plated on the seed layer of the bottom metal layer 252 exposed by the opening 272 and then the pillar-shaped metal layer 294 having any one of the abovementioned metallization structures illustrated in FIGS. 73-77 can be electroplated on the adhesion/barrier layer. The adhesion/barrier layer may comprise nickel with greater than 90 weight percent, and, preferably, greater than 97 weight percent and may have a thickness greater than 100 angstroms, and preferably between 1000 angstroms and 10 μm. The adhesion/barrier layer may be formed using an electroplating or an electroless plating process. If the adhesion/barrier layer has a thickness greater than 1 μm, an electroplating process is preferably used to form the adhesion/barrier layer.

Figure 83:
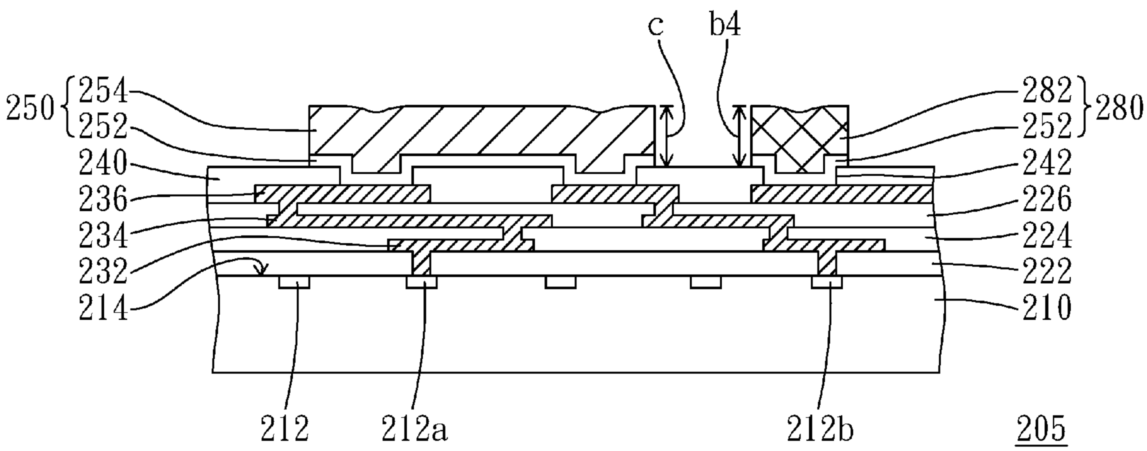
FIGS. 83-86 are schematic cross-sectional views illustrating another preferred embodiment of the second method for forming circuits/metal traces and bumps according to the present invention.

6. Relationships among the Thickness of Bumps, Circuit/Metal Traces, and Polymer Layers Referring to FIGS. 66, 77 and 82, the circuit/metal trace 250 is formed on the passivation layer 240. The bump or pad 280, 290, and 291 is formed on the thin-film circuit layer 236 exposed by the opening 242 in the passivation layer 240. The bumps or pads 280, 290, and 291 have respective thicknesses b1, b2, and b3 greater than the thickness c of the circuit/metal trace 250. Alternatively, as shown in FIG. 83, the thickness b4 of the bump or pad 280 can be substantially equivalent to the thickness c of the circuit/metal trace 250.

Figure 84:
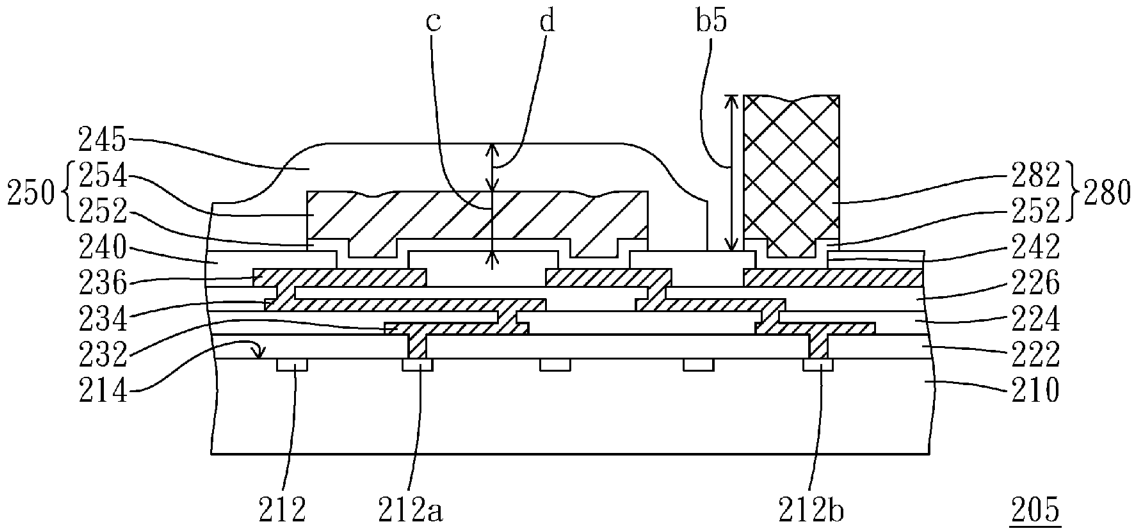
Figure 85:
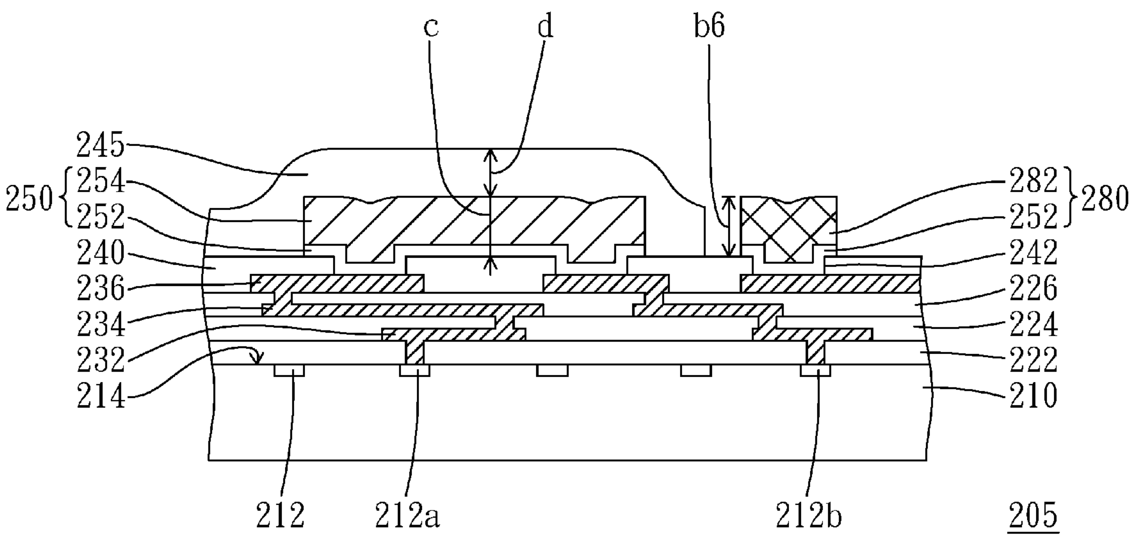

As shown in FIGS. 84 and 85, a polymer layer 245 is formed on the circuit/metal trace 250 to protect the circuit/metal layer 250. The circuit/metal trace 250 is formed on the passivation layer 240 and connected to the thin-film metal layer 236 via the opening 242 in the passivation layer 240. The bump or pad 280 is formed on the thin-film circuit layer 236 exposed by the opening 242 in the passivation layer 240. The thickness b5 of the bump or pad 280 can be greater than the thickness (c+d) of the circuit/metal trace 250 plus the polymer layer 245, as shown in FIG. 84. Alternatively, the thickness b6 of the bump or pad 280 can be substantially equal to the thickness c of the circuit/metal layer 250 and less than the thickness (c+d) of the circuit/metal trace 250 plus the polymer layer 245, as shown in FIG. 85.

Figure 86:
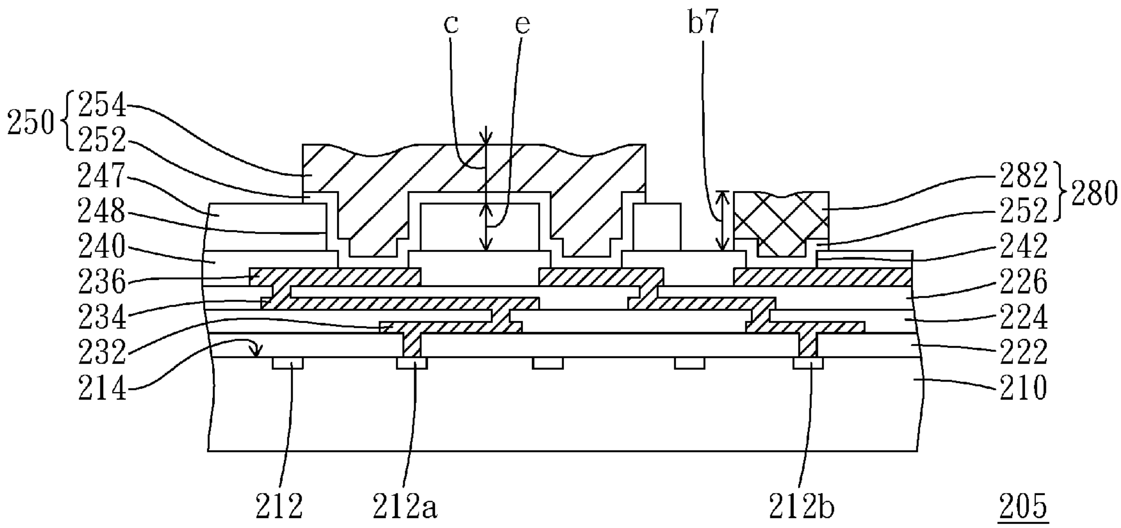
Figure 87:
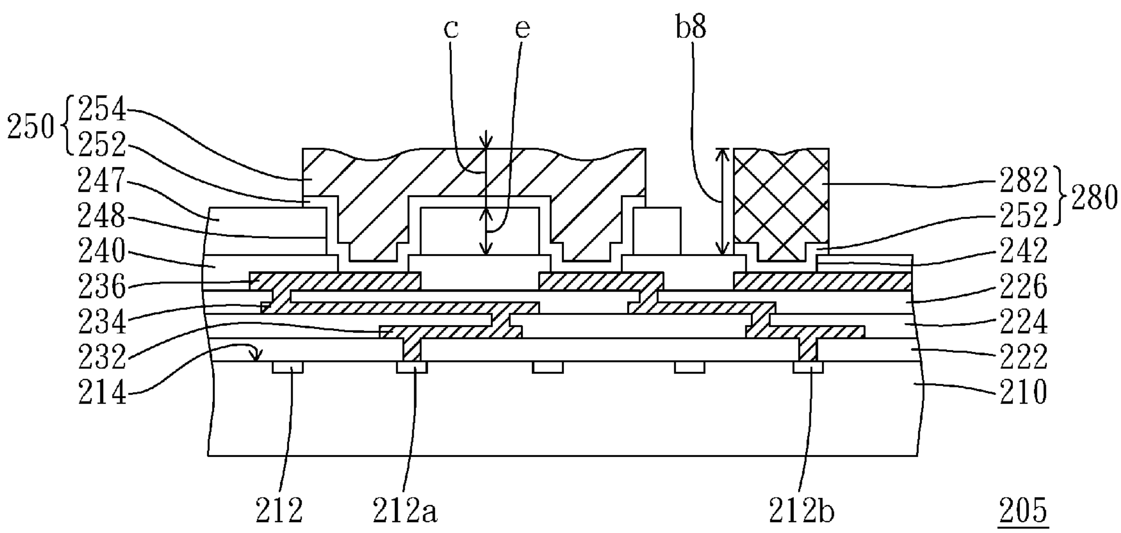
FIGS. 87-134 are schematic cross-sectional views illustrating various semiconductor chips according to the present invention.
Figure 88:
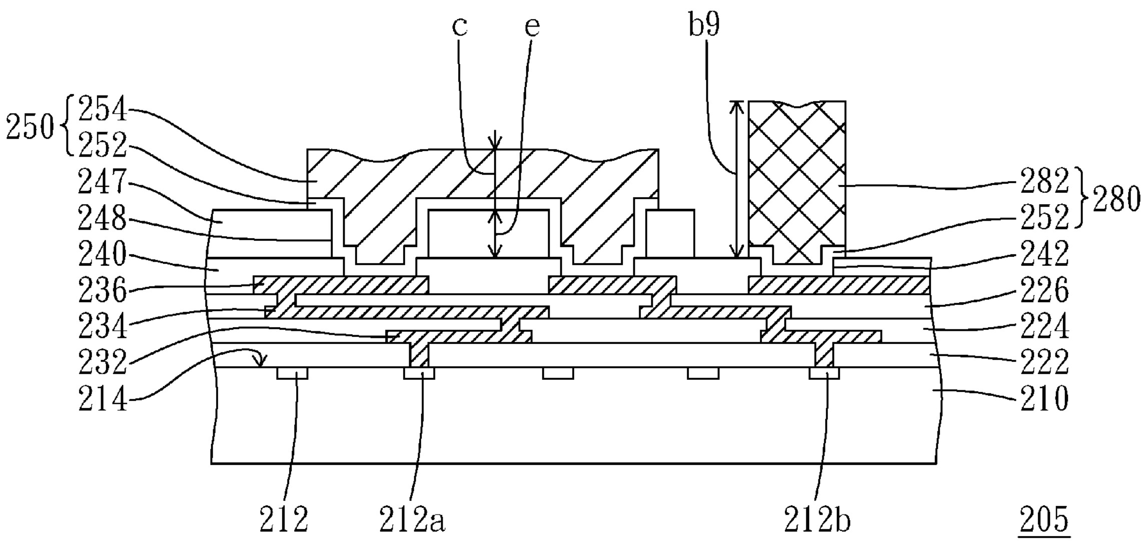

In FIGS. 86, 87, and 88, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/metal trace 250 is formed on the polymer layer 247 and connected to the thin-film metal layer 236 via the openings 248 and 242. The bump or pad 280 is formed on the thin-film circuit layer 236 exposed by the opening 242 in the passivation layer 240. The thickness b7 of the bump or pad 280 can be substantially equal to the thickness c of the circuit/metal layer 250 and less than the thickness (c+e) of the circuit/metal trace 250 plus the polymer layer 247, as shown in FIG. 86. Alternatively, the thickness b8 of the bump or pad 280 can be substantially equivalent to the thickness (c+e) of the circuit/metal trace 250 plus the polymer layer 247, as shown in FIG. 87. Alternatively, the thickness b9 of the bump or pad 280 can be greater than the thickness (c+e) of the circuit/metal trace 250 plus the polymer layer 247, as shown in FIG. 88.

Figure 89:
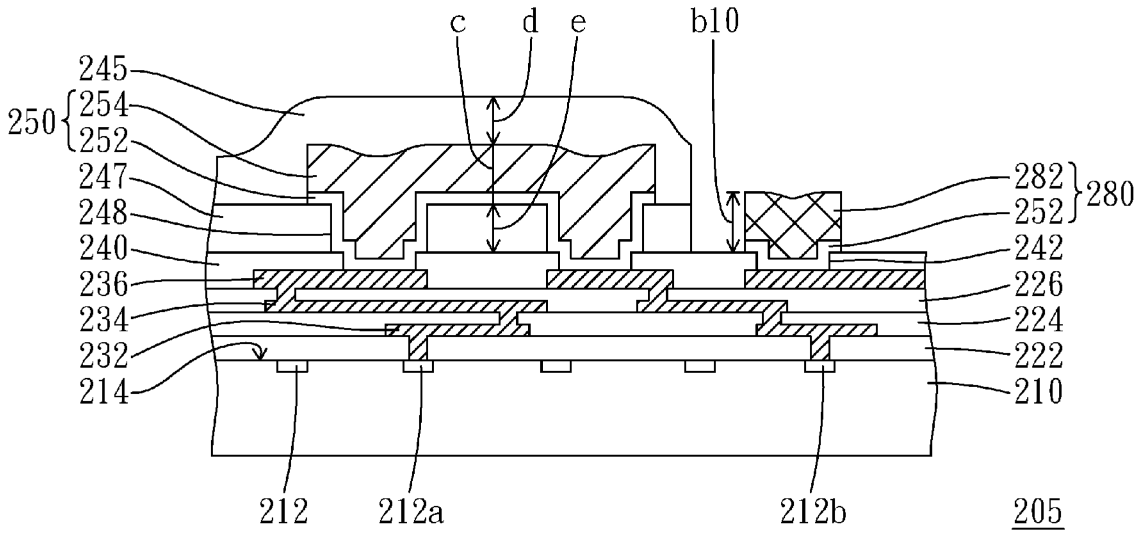
Figure 90:
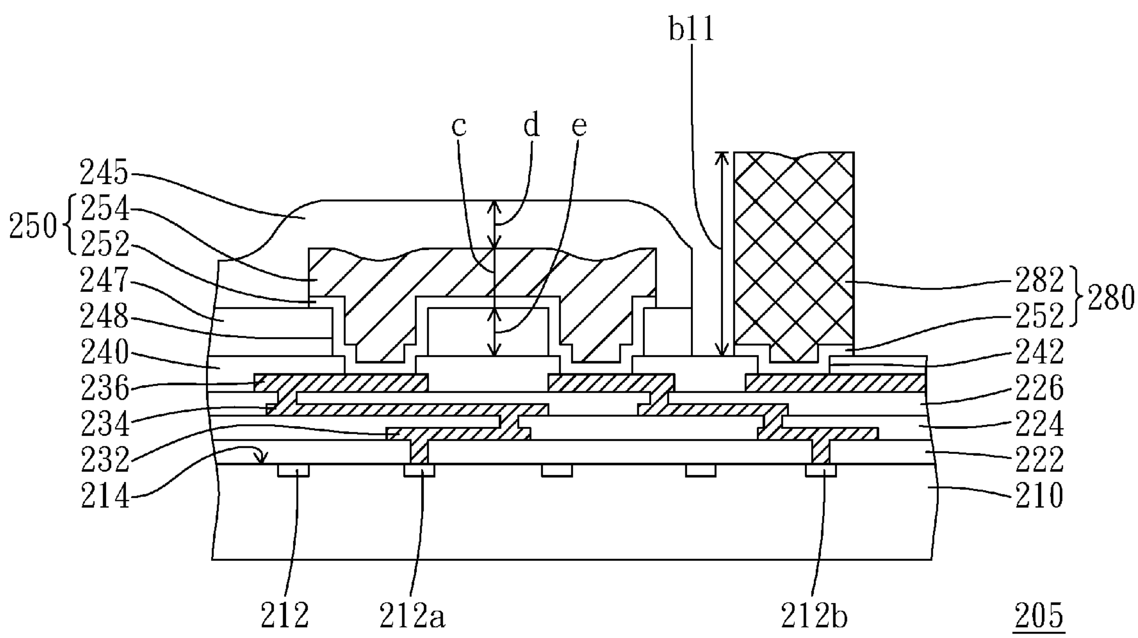

In FIGS. 89 and 90, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/metal trace 250 is formed on the polymer layer 247 and connected to the thin-film metal layer 236 via the openings 248 and 242. A polymer layer 245 is formed on the circuit/metal trace 250 to protect the circuit/metal layer 250. The bump or pad 280 is formed on the thin-film circuit layer 236 exposed by the opening 242 in the passivation layer 240. The thickness b10 of the bump or pad 280 can be substantially equal to the thickness c of the circuit/metal layer 250 and less than the thickness (c+d+e) of the circuit/metal trace 250 plus the polymer layers 245 and 247, as shown in FIG. 89. Alternatively, the thickness b11 of the bump or pad 280 can be greater than the thickness (c+d+e) of the circuit/metal trace 250 plus the polymer layers 245 and 247, as shown in FIG. 90.

Figure 91:
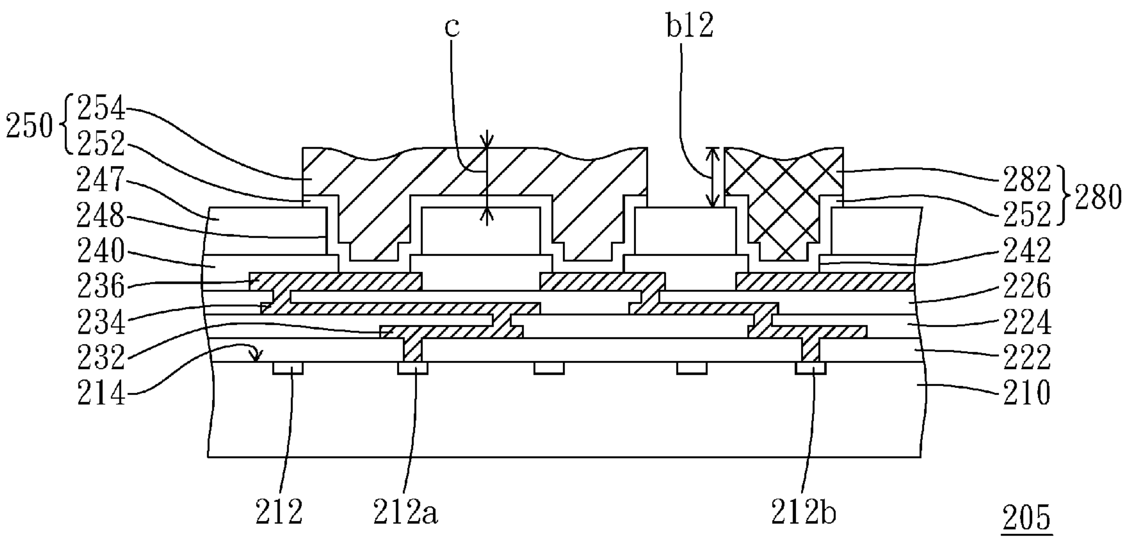
Figure 92:
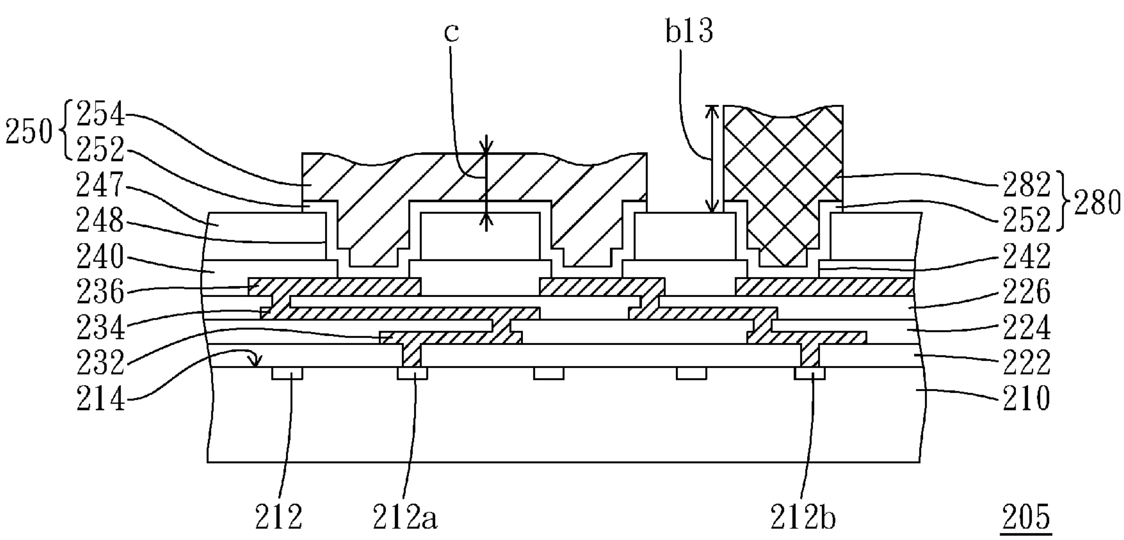

In FIGS. 91 and 92, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. The bump or pad 280 is formed on the thin-film circuit layer 236 exposed by the openings 248 and 242. The thickness b12 of the bump or pad 280 projecting from the opening 248 can be substantially equal to the thickness c of the circuit/metal trace 250, as shown in FIG. 91. Alternatively, the thickness b13 of the bump or pad 280 projecting from the opening 248 can be greater than the thickness c of the circuit/metal trace 250, as shown in FIG. 92.

Figure 93:
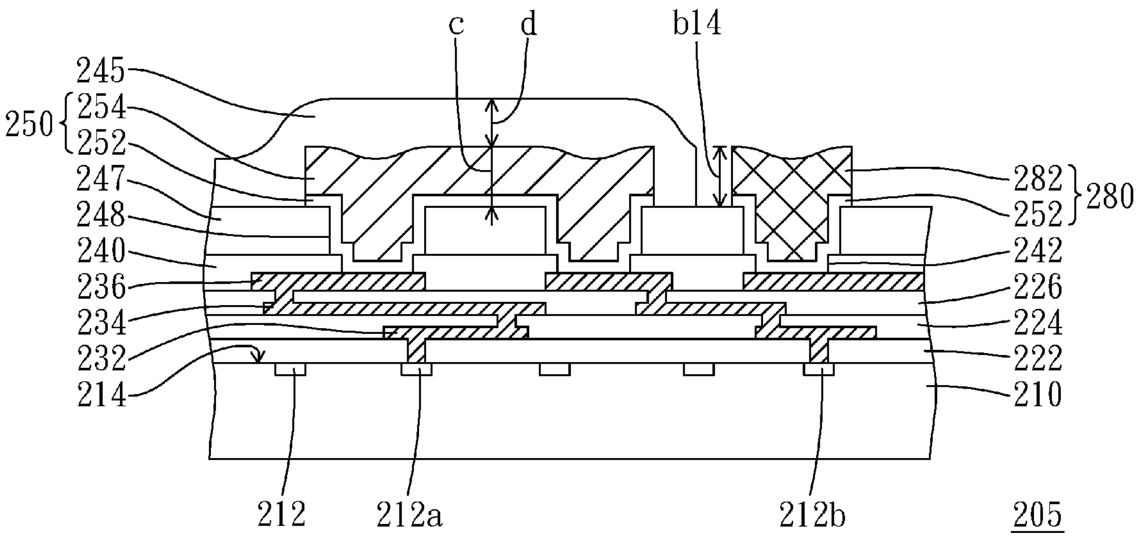
Figure 94:
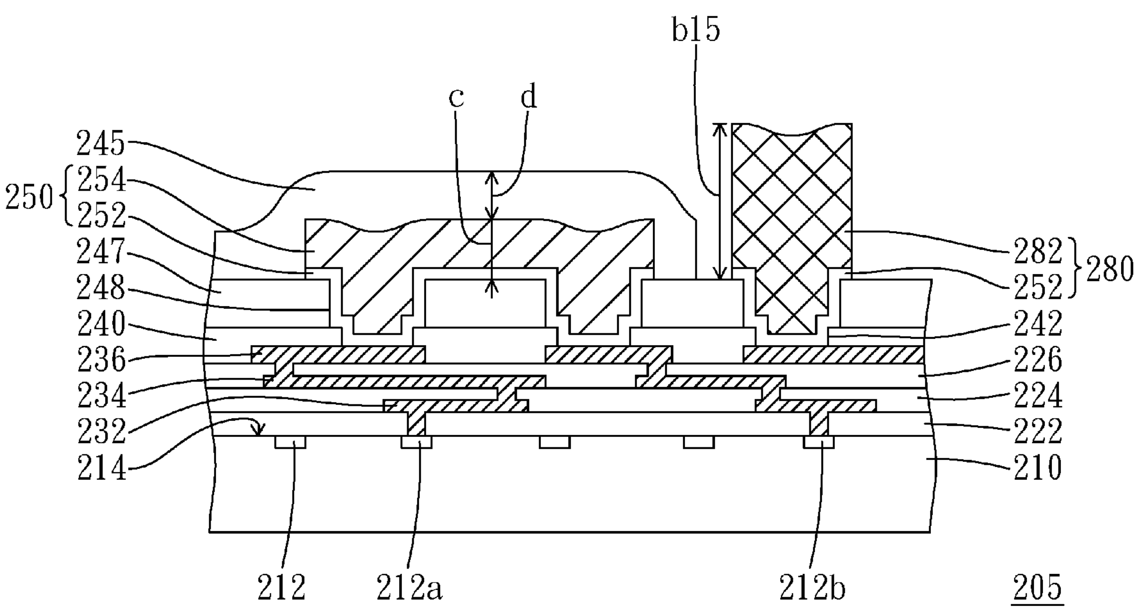

In FIGS. 93 and 94, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. A polymer layer 245 is deposited on the circuit/metal trace 250 to protect the circuit/metal trace 250. The bump or pad 280 is formed on the thin-film circuit layer 236 exposed by the opening 242 in the passivation layer 240 and the opening 248 in the polymer layer 247. The thickness b14 of the bump or pad 280 projecting from the opening 248 in the polymer layer 247 can be substantially equal to the thickness c of the circuit/metal trace 250 and less than the thickness (c+d) of the circuit/metal trace 250 plus the polymer layer 245, as shown in FIG. 93. Alternatively, the thickness b15 of the bump or pad 280 projecting from the opening 248 in the polymer layer 247 can be greater than the thickness (c+d) of the circuit/metal trace 250 plus the polymer layer 245, as shown in FIG. 94.

In the embodiments of the present invention illustrated in FIGS. 84-94, the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 84-94 can be deposited following the above-mentioned process as illustrated in FIGS. 60-66.

7. Functions of Circuits/Metal Traces

A. Used for Intra-Chip Signal Transmission

Referring now to FIGS. 66, 77, 82 and 83 through 94, the circuit/metal trace 250 can function intra-chip signal transmission. A signal can be transmitted from an electronic device, such as 212*a*, to the circuit/metal trace 250 sequentially via the thin-film circuit layers 232, 234, and 236, and then via the opening 242 in the passivation layer 240. Thereafter, the signal can be transmitted from circuit/metal trace 250 to the other electronic device, such as 212*b*, via the opening 242 in the passivation layer 240 and then sequentially via the thin-film circuit layers 236, 234, and 232.

B. Used for Power Bus or Plane or Ground Bus or Plane

FIGS. 95 to 107 are schematic cross-sectional views of the semiconductor chip in the second embodiment of the present invention. In FIGS. 95-107, the circuit/metal trace 250 acting as a power bus or plane can be electrically connected to the thin-film power bus or plane 235 under the passivation layer 240 or to the power supply. Alternatively, the circuit/metal trace 250 acting as a ground bus or plane can be electrically connected to the thin-film ground bus or plane 235 under the passivation layer 240 or to a ground reference.

Figure 95:
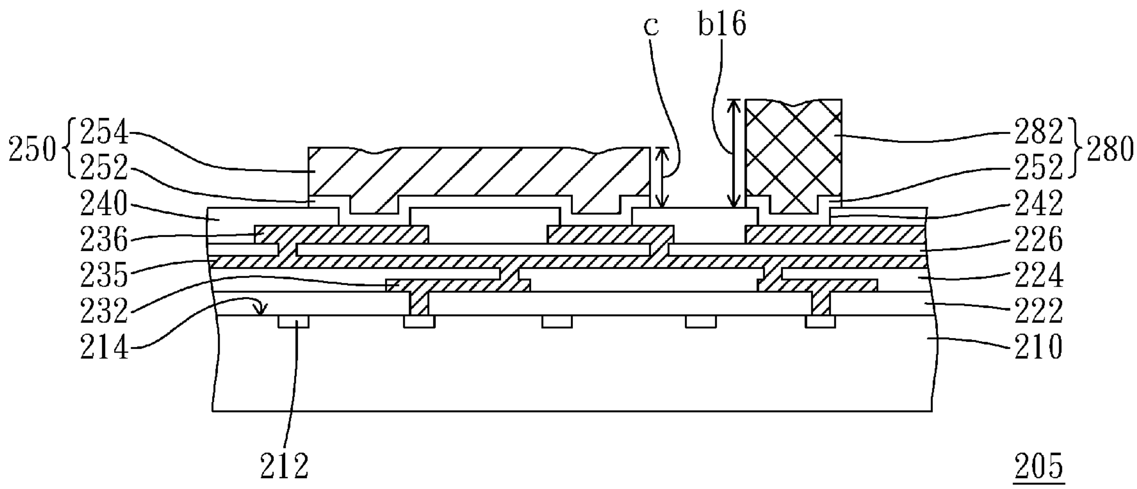
Figure 96:
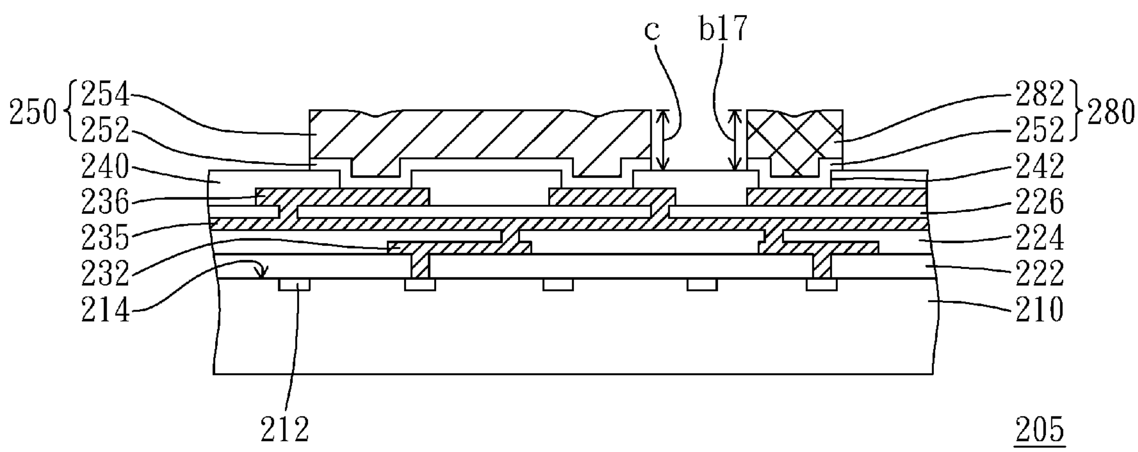

Referring now to FIGS. 95 and 96, the power bus or plane or ground bus or plane 250 is formed on the passivation layer 240 and connected to the thin-film circuit layer 236 exposed by the opening 242 in the passivation layer 240. The bump or pad 280 is formed on the thin-film circuit layer 236 exposed by the opening 242 in the passivation layer 240. The bump or pad 280 may have a thickness b16 greater than the thickness c of the power bus or plane or ground bus or plane 250, as shown in FIG. 95. Alternatively, the thickness b17 of the bump or pad 280 can be substantially equivalent to the thickness c of the power bus or plane or ground bus or plane 250, as shown in FIG. 96.

Figure 97:
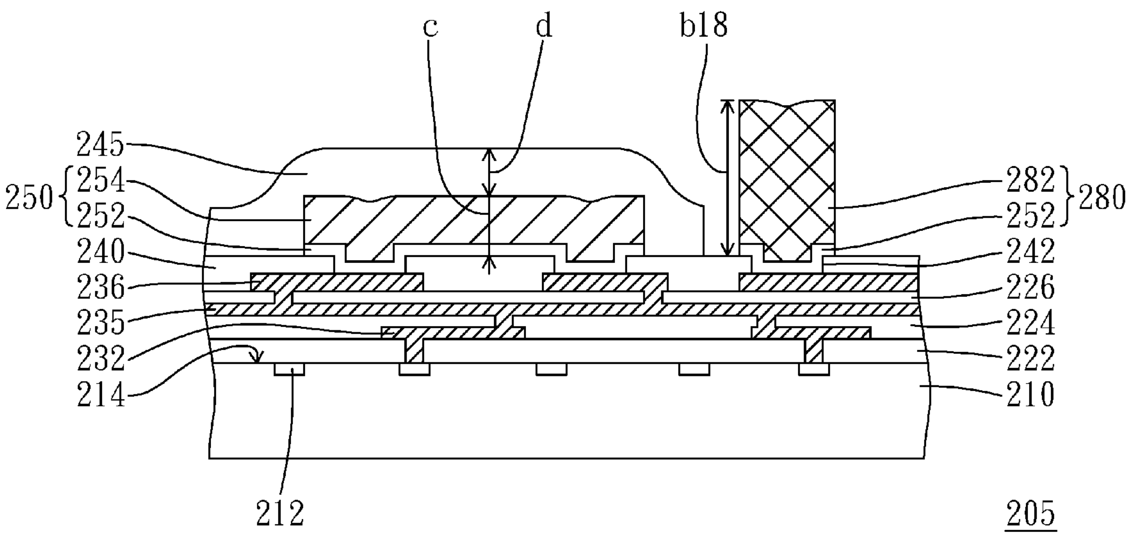
Figure 98:
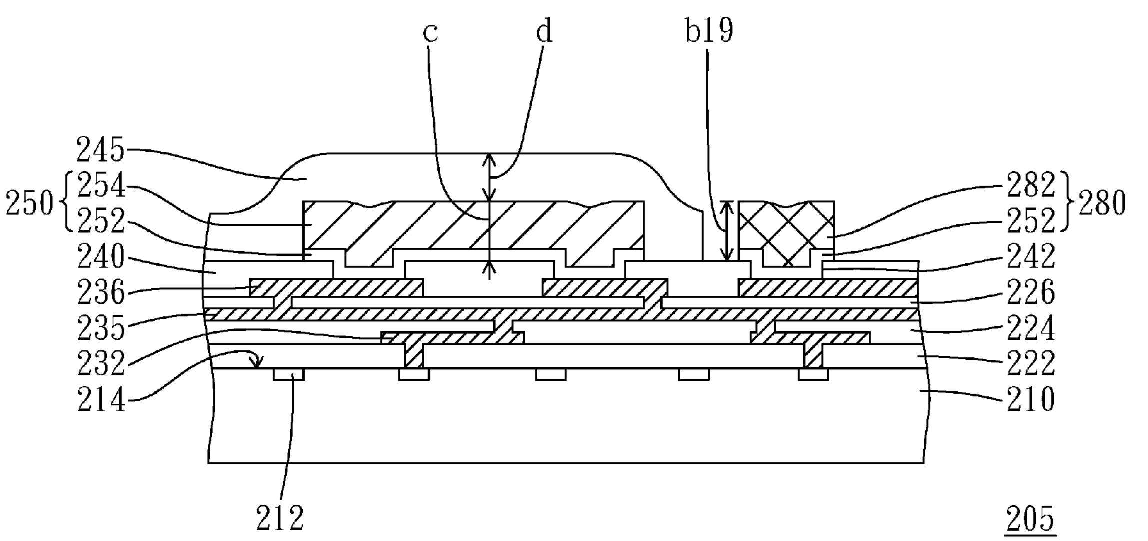

Referring now to FIGS. 97 and 98, a polymer layer 245 is formed on the power bus or plane or ground bus or plane 250 to protect the power bus or plane or ground bus or plane 250. The power bus or plane or ground bus or plane 250 is formed on the passivation layer 240 and connected to the thin-film metal layer 236 via the opening 242 in the passivation layer 240. The bump or pad 280 is formed on the thin-film circuit layer 236 exposed by the opening 242 in the passivation layer 240. The thickness b18 of the bump or pad 280 can be greater than the thickness (c+d) of the power bus or plane or ground bus or plane 250 plus the polymer layer 245, as shown in FIG. 97. Alternatively, the thickness b19 of the bump or pad 280 can be substantially equal to the thickness c of the power bus or plane or ground bus or plane 250 and less than the thickness (c+d) of the power bus or plane or ground bus or plane 250 plus the polymer layer 245, as shown in FIG. 98.

Figure 99:
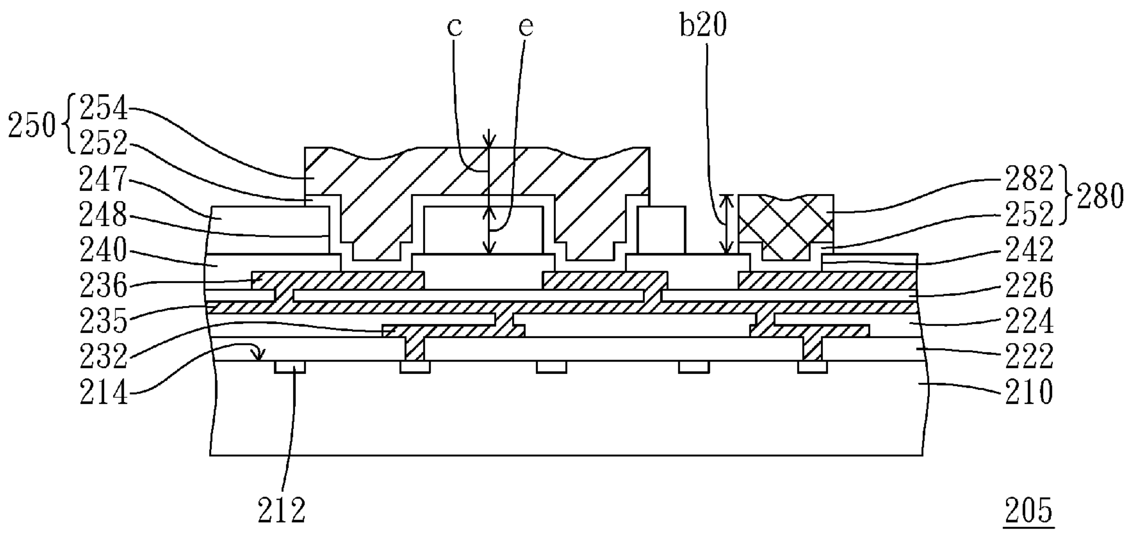
Figure 100:
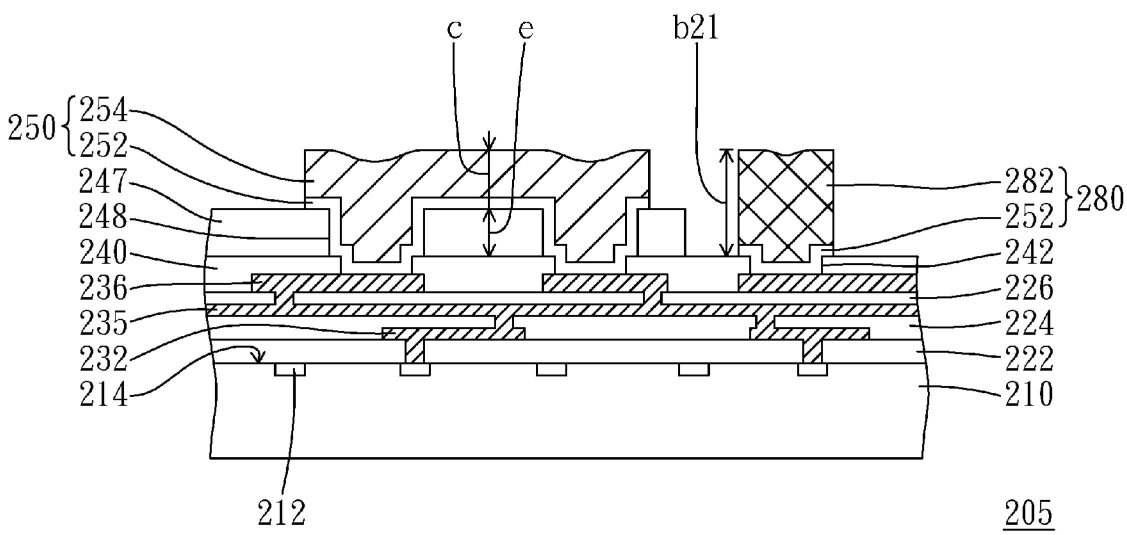
Figure 101:
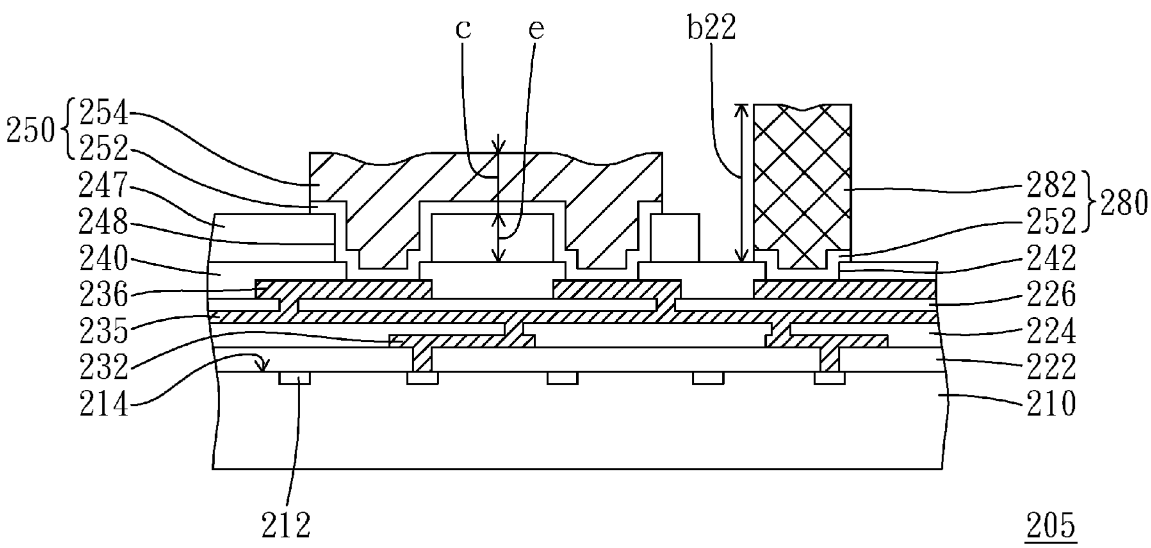

Referring now to FIGS. 99, 100 and 101, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The power bus or plane or ground bus or plane 250 is formed on the polymer layer 247 and connected to the thin-film metal layer 236 via the openings 248 and 242. The bump or pad 280 is formed on the thin-film circuit layer 236 exposed by the opening 242 in the passivation layer 240. The thickness b20 of the bump or pad 280 can be substantially equal to the thickness c of the power bus or plane or ground bus or plane 250 and less than the thickness (c+e) of the power bus or plane or ground bus or plane 250 plus the polymer layer 247, as shown in FIG. 99. Alternatively, the thickness b21 of the bump or pad 280 can be substantially equivalent to the thickness (c+e) of the power bus or plane or ground bus or plane 250 plus the polymer layer 247, as shown in FIG. 100. Alternatively, the thickness b22 of the bump or pad 280 can be greater than the thickness (c+e) of the power bus or plane or ground bus or plane 250 plus the polymer layer 247, as shown in FIG. 101.

Figure 102:
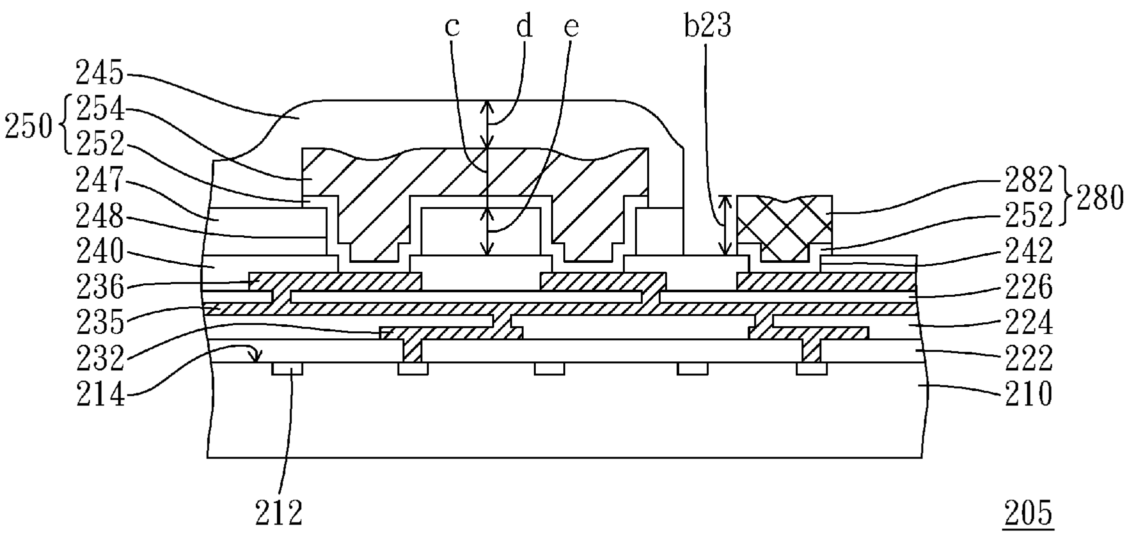
Figure 103:
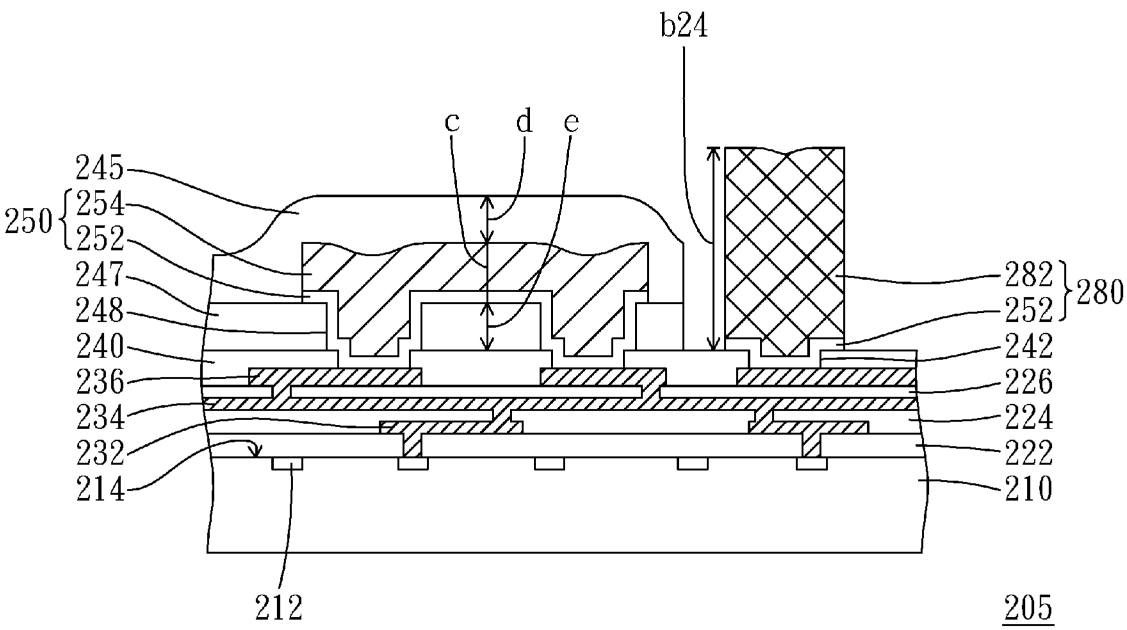

Referring now to FIGS. 102 and 103, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The power bus or plane or ground bus or plane 250 is formed on the polymer layer 247 and connected to the thin-film metal layer 236 via the openings 248 and 242. A polymer layer 245 is formed on the circuit/metal trace 250 to protect the power bus or plane or ground bus or plane 250. The bump or pad 280 is formed on the thin-film circuit layer 236 exposed by the opening 242 in the passivation layer 240. The thickness b23 of the bump or pad 280 can be substantially equal to the thickness c of the power bus or plane or ground bus or plane 250 and less than the thickness (c+d+e) of the power bus or plane or ground bus or plane 250 plus the polymer layers 245 and 247, as shown in FIG. 102. Alternatively, the thickness b24 of the bump or pad 280 can be greater than the thickness (c+d+e) of the power bus or plane or ground bus or plane 250 plus the polymer layers 245 and 247, as shown in FIG. 103.

Figure 104:
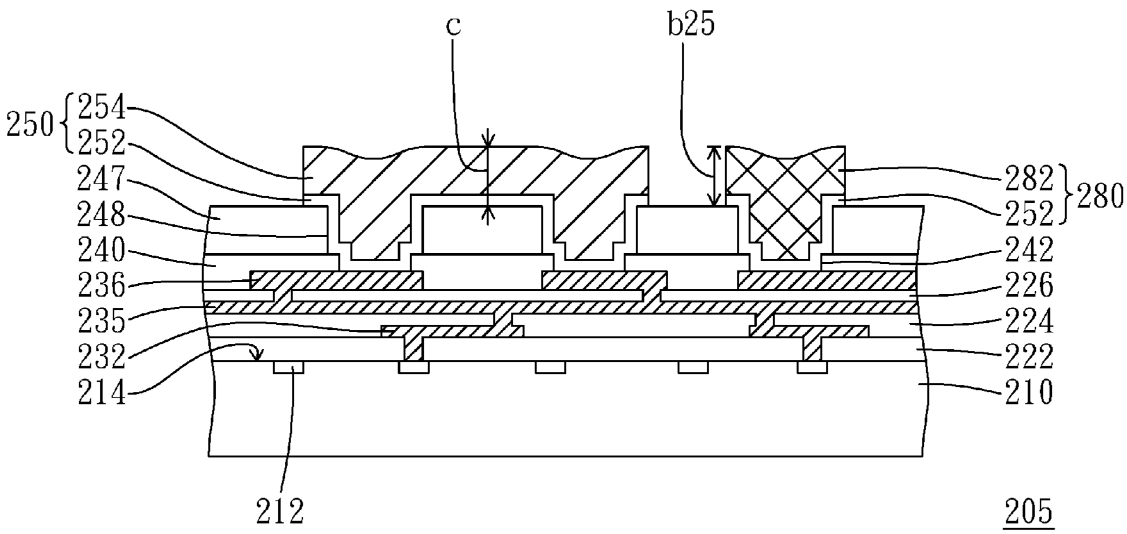
Figure 105:
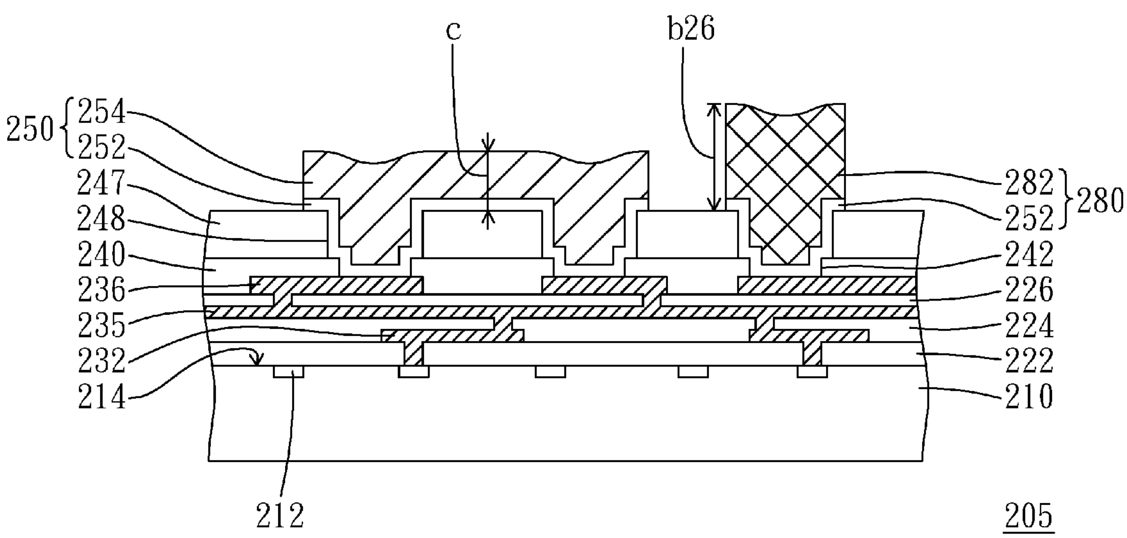

Referring now to FIGS. 104 and 105, a polymer layer 247 is deposited on the passivation layer 240. Multiple openings 248 in the polymer layer 247 expose the thin-film circuit layer 236. The power bus or plane or ground bus or plane 250 is formed on the polymer layer 247 and is connected to the thin-film circuit layer 236 exposed by the openings 248 and 242. The bump or pad 280 is formed on the thin-film circuit layer 236 exposed by the opening 242 in the passivation layer 240 and the opening 248 in the polymer layer 247. The thickness b25 of the bump or pad 280 projecting from the opening 248 in the polymer layer 247 can be substantially equal to the thickness c of the power bus or plane or ground bus or plane 250, as shown in FIG. 104. Alternatively, the thickness b26 of the bump or pad 280 projecting from the opening 248 in the polymer layer 247 can be greater than the thickness c of the power bus or plane or ground bus or plane 250, as shown in FIG. 105.

Figure 106:
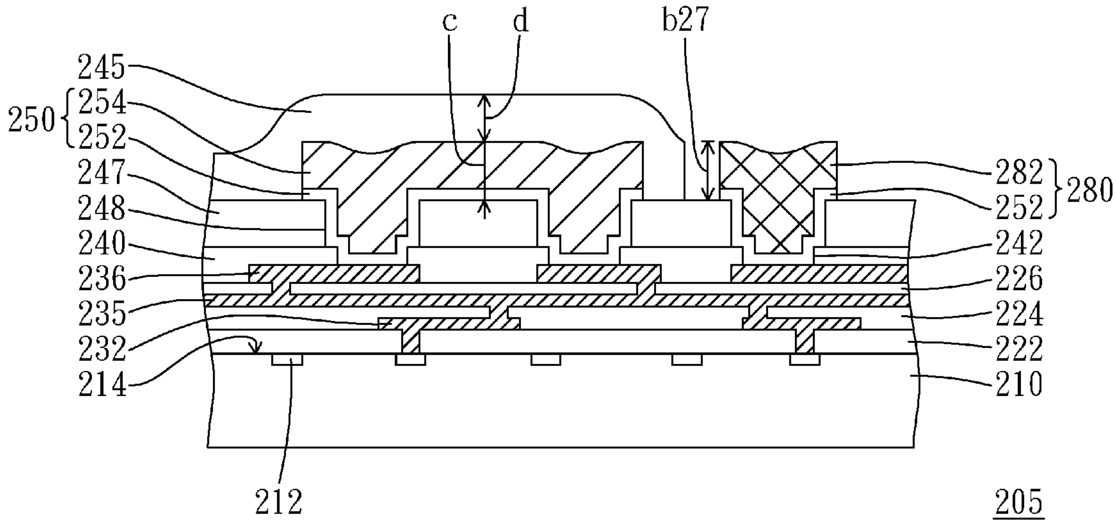
Figure 107:
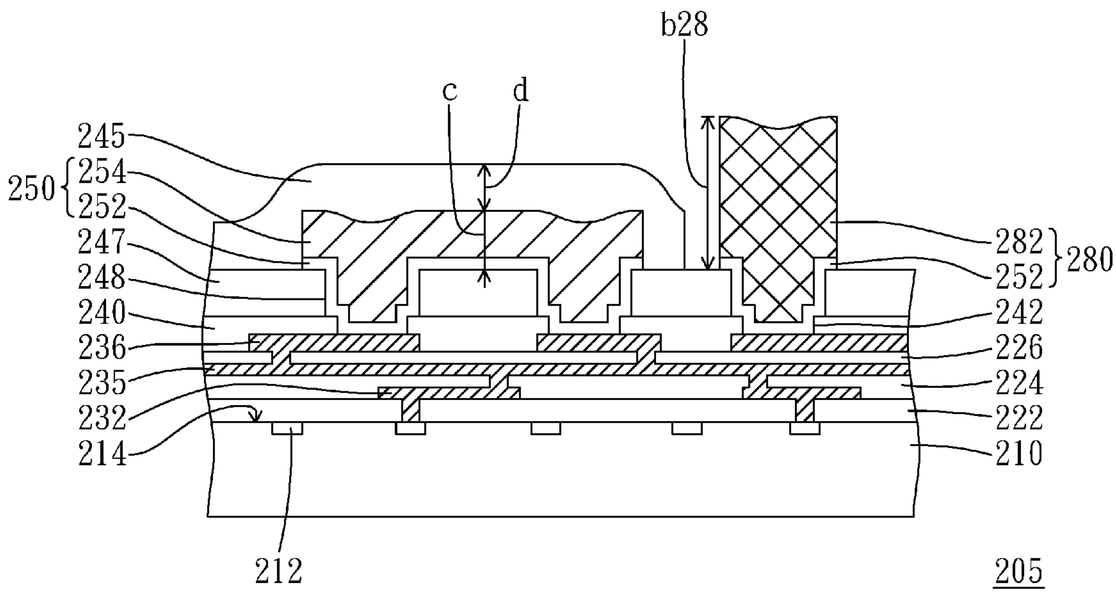

Referring now to FIGS. 106 and 107, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. A polymer layer 247 is deposited on the circuit/metal trace 250 to protect the circuit/metal trace 250. The bump or pad 280 is formed on the thin-film circuit layer 236 exposed by the opening 242 in the passivation layer 240 and the opening 248 in the polymer layer 247. The thickness b27 of the bump or pad 280 projecting from the opening 248 in the polymer layer 247 can be substantially equal to the thickness c of the circuit/metal trace 250 and less than the thickness (c+d) of the circuit/metal trace 250 plus the polymer layer 245, as shown in FIG. 106. Alternatively, the thickness b28 of the bump or pad 280 projecting from the opening 248 in the polymer layer 247 can be greater than the thickness (c+d) of the circuit/metal trace 250 plus the polymer layer 245, as shown in FIG. 107.

In the embodiments of the present invention depicted in FIGS. 95-107, the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 95-107 can be deposited following the above-mentioned process as illustrated in FIGS. 60-66.

C. Metal/Circuit Trace Connected to Bump or Pad via Thin-Film Metal Layer under Passivation Layer FIG. 108 to 121 are schematic cross-sectional views of the semiconductor chip in the second embodiment of the present invention. The circuit/metal trace 250 is connected to the bump 280 via the thin-film circuit layer 236 under the passivation layer 240, wherein the circuit/metal trace 250 can be used for signal transmission or can act as a power bus or plane or a ground bus or plane. The thin-film circuit layer 236 has a connecting line 237 and two connection points 237*a* and 237*b*, wherein the connecting line 237 connects the connection points 237*a* and 237*b*. The circuit/metal trace 250 is formed over the passivation layer 240 and is electrically connected to the connection point 237*a* exposed by the opening 242 in the passivation layer 240. The bump or pad 280 is formed on the connection point 237*b* exposed by the opening 242. Referring now to FIG. 109, a top view of the connection line 237 and connection points 237*a* and 237*b* is shown. The length s of the connecting lines 237 is less than 5000 μm and, preferably, less than 500 μm.

Referring to FIGS. 108 to 121, when the circuit/metal trace 250 is used for signal transmission, a signal can be transmitted from one of the electronic devices, such as 212*a*, to the circuit/metal trace 250 via the thin-film circuit layers 232, 234 and 236 and then through the opening 242 in the passivation layer 240. Thereafter, the signal is transmitted from the circuit/metal trace 250 to the bump or pad 280 through the connecting line 237 under the passivation layer 240.

Alternatively, a signal can be transmitted from the bump or pad 280 to the circuit/metal trace 250 through the connecting line 237 under the passivation layer 240. Thereafter, the signal is transmitted from the circuit/metal trace 250 to one of the electronic devices, such as 212*a*, through the opening 242 in the passivation layer 240 and then via the thin-film circuit layers 236, 234 and 232.

When the circuit/metal trace 250 acts as a power bus or plane, the circuit/metal trace 250 can be connected to a power bus or plane of a glass substrate, a film substrate, a tape or a printed circuit substrate through the bump or pad 280 and the connection line 237.

When the circuit/metal trace 250 acts as a ground bus or plane, the circuit/metal trace 250 can be connected to a ground bus or plane of a glass substrate, a film substrate, a tape or a printed circuit substrate through the bump or pad 280 and the connection line 237.

Figure 108:
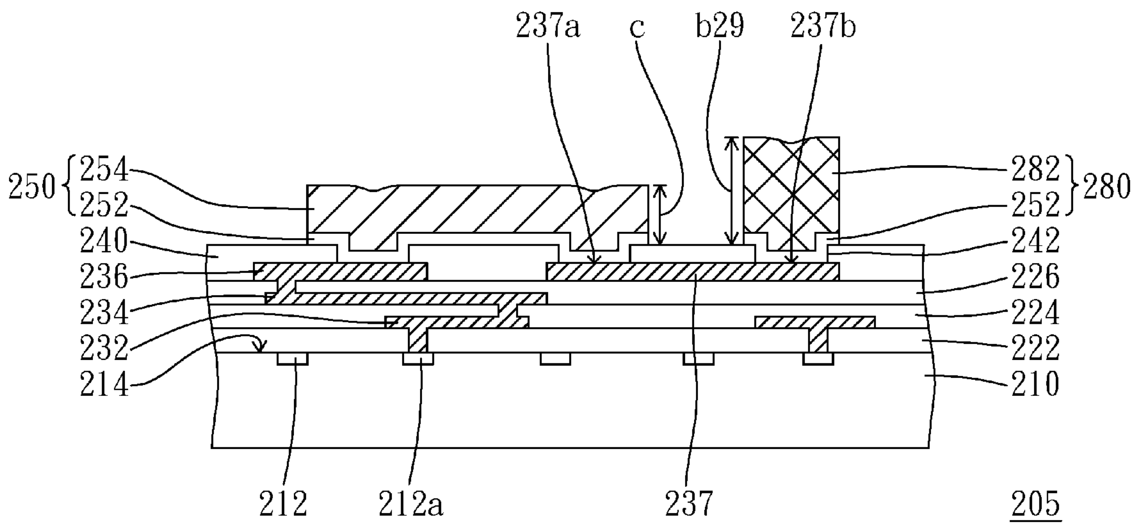
Figure 109:
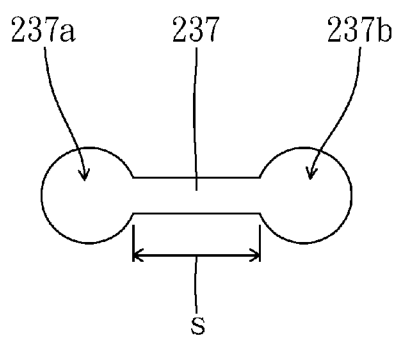
Figure 110:
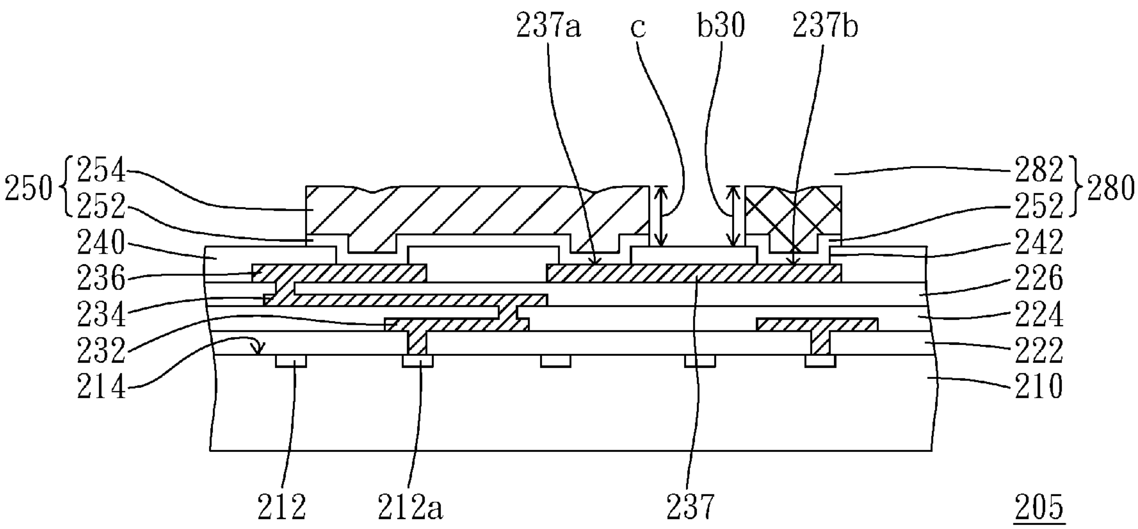

Referring now to FIGS. 108 and 110, the circuit/metal trace 250 is formed on the passivation layer 240 and connected to the thin-film circuit layer 236 exposed by the opening 242 in the passivation layer 240. The bump or pad 280 is formed on the thin-film circuit layer 236 exposed by the opening 242 in the passivation layer 240. The bump or pad 280 may have a thickness b29 greater than the thickness c of the circuit/metal trace 250, as shown in FIG. 108. Alternatively, the thickness b30 of the bump or pad 280 can be substantially equivalent to the thickness c of the circuit/metal trace 250, as shown in FIG. 110.

Figure 111:
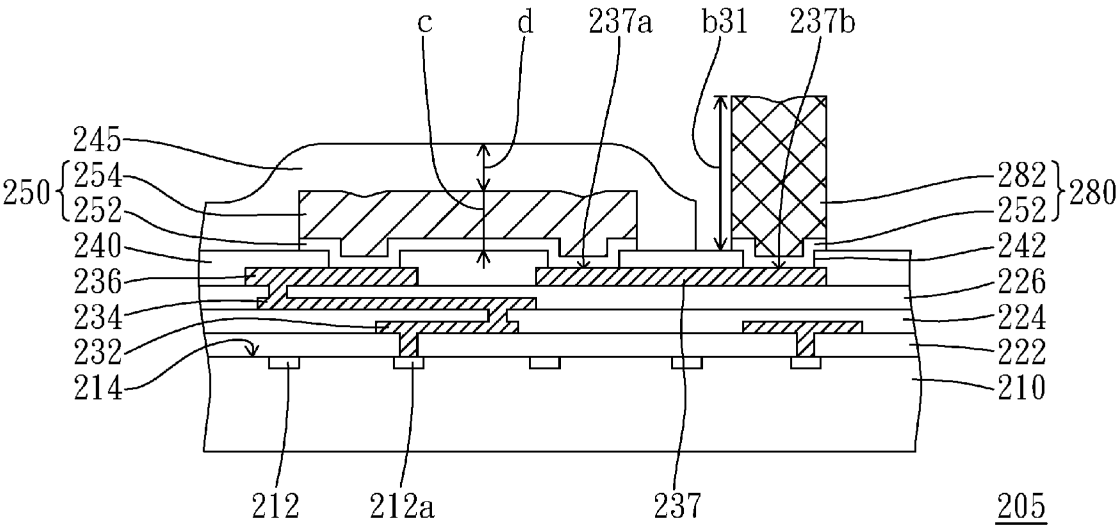
Figure 112:
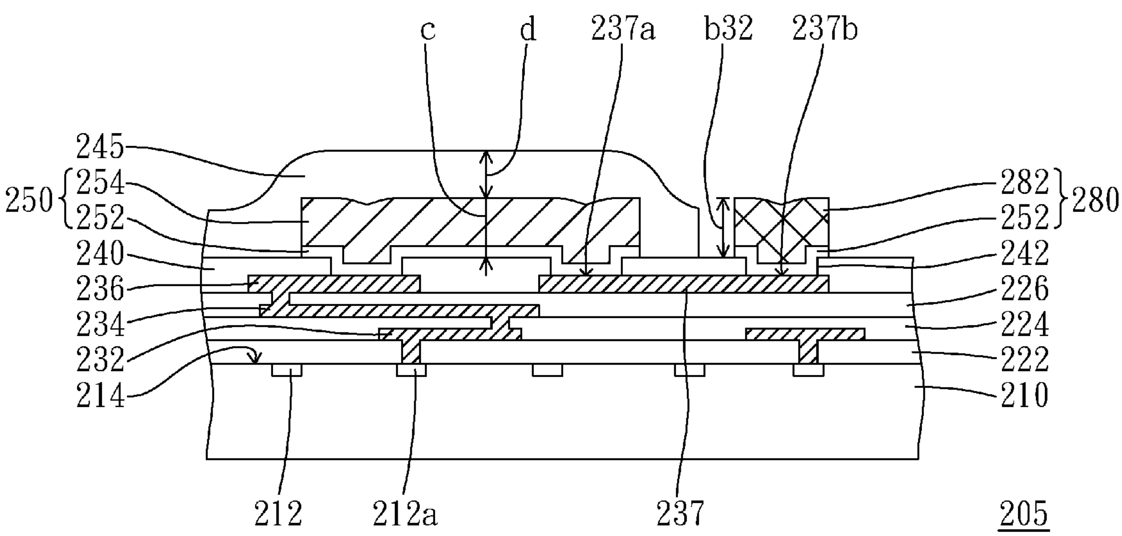

In FIGS. 111 and 112, a polymer layer 245 is formed on the circuit/metal trace 250 to protect the circuit/metal trace 250. The circuit/metal trace 250 is formed on the passivation layer 240 and connected to the thin-film metal layer 236 via the opening 242 in the passivation layer 240. The bump or pad 280 is formed on the thin-film circuit layer 236 exposed by the opening 242 in the passivation layer 240. The thickness b31 of the bump or pad 280 can be greater than the thickness (c+d) of the circuit/metal trace 250 plus the polymer layer 245, as shown in FIG. 111. Alternatively, the thickness b32 of the bump or pad 280 can be substantially equal to the thickness c of the circuit/metal trace 250 and less than the thickness (c+d) of the circuit/metal trace 250 plus the polymer layer 245, as shown in FIG. 112.

Figure 113:
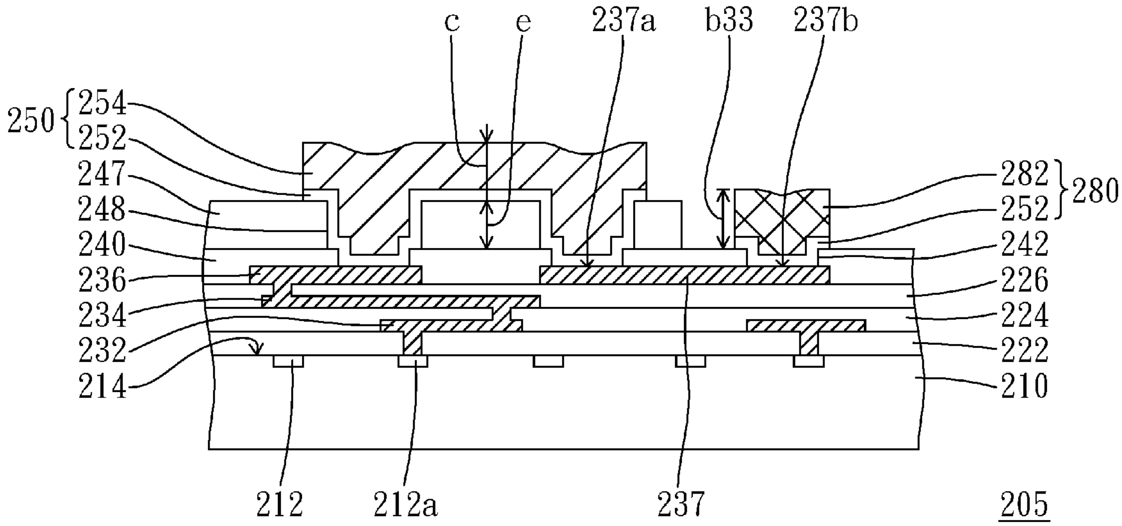
Figure 114:
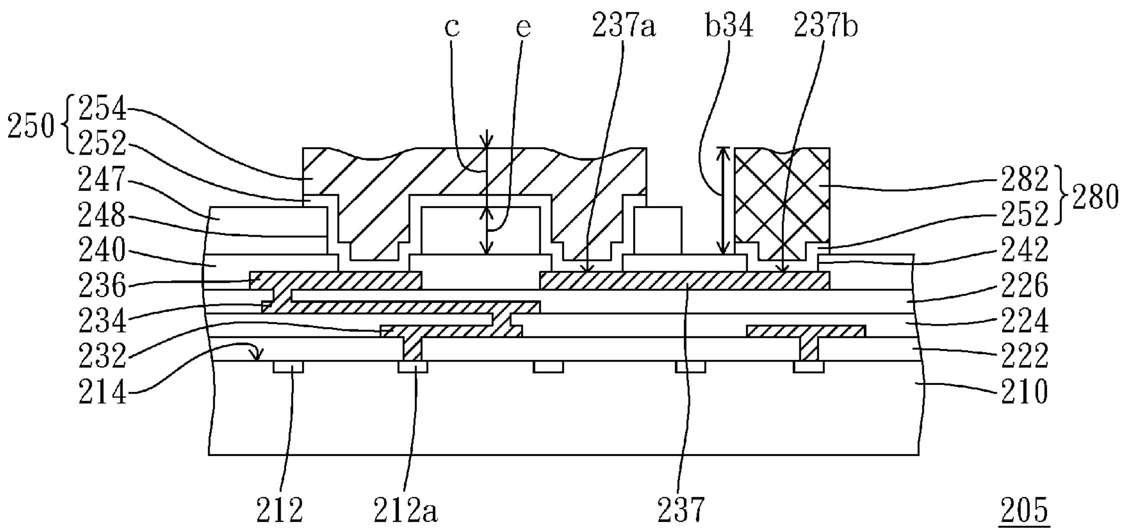
Figure 115:
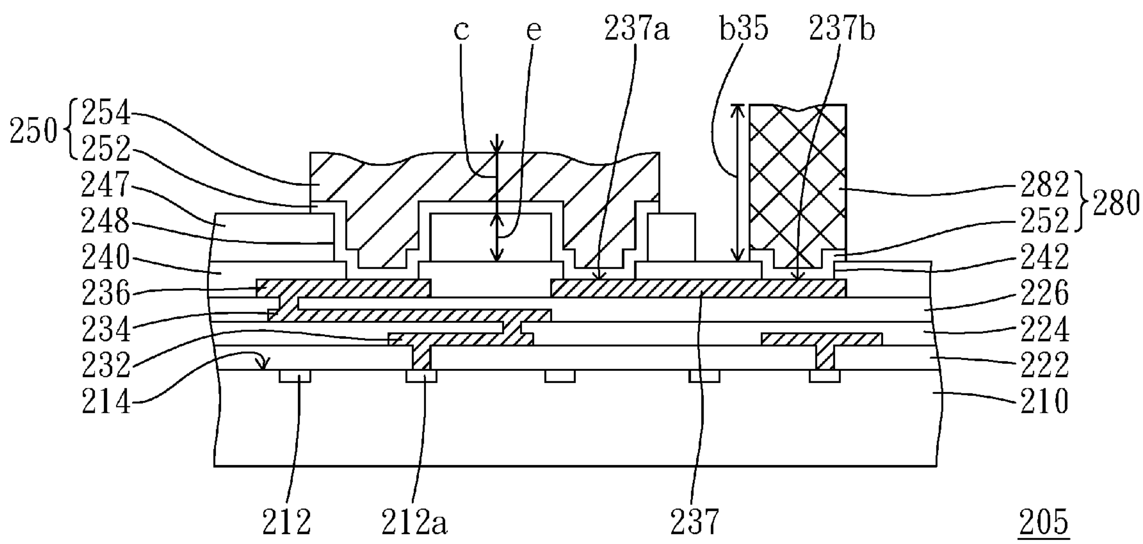

In FIGS. 113, 114 and 115, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/metal layer 250 is formed on the polymer layer 247 and connected to the thin-film metal layer 236 via the openings 248 and 242. The bump or pad 280 is formed on the thin-film circuit layer 236 exposed by the opening 242 in the passivation layer 240. The thickness b33 of the bump or pad 280 can be substantially equal to the thickness c of the circuit/metal layer 250 and less than the thickness (c+e) of the circuit/metal trace 250 plus the polymer layer 247, as shown in FIG. 113. Alternatively, the thickness b34 of the bump or pad 280 can be substantially equivalent to the thickness (c+e) of the circuit/metal trace 250 plus the polymer layer 247, as shown in FIG. 114. Alternatively, the thickness b35 of the bump or pad 280 can be greater than the thickness (c+e) of the circuit/metal trace 250 plus the polymer layer 247, as shown in FIG. 115.

Figure 116:
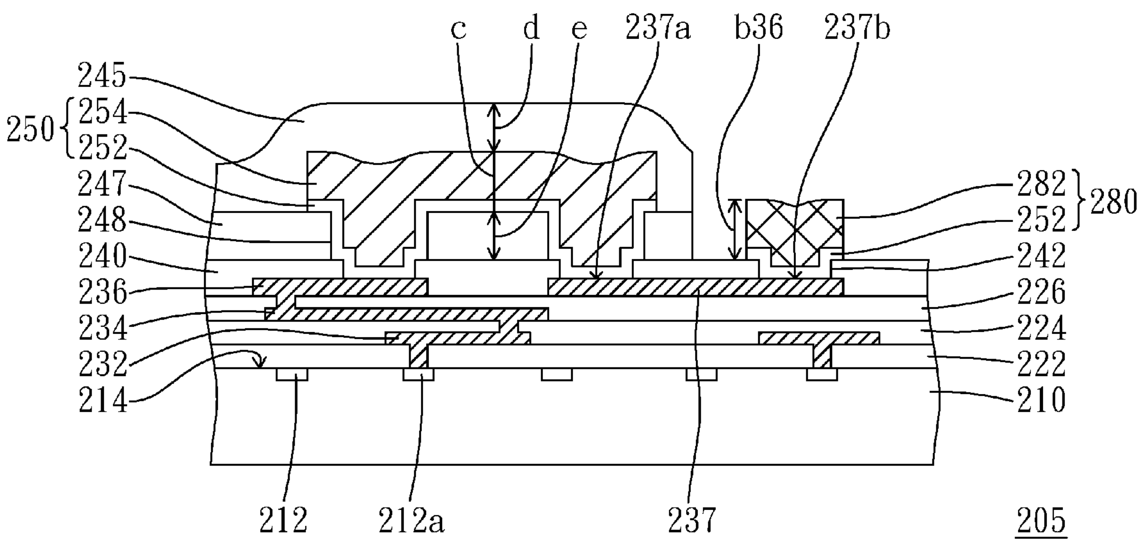
Figure 117:
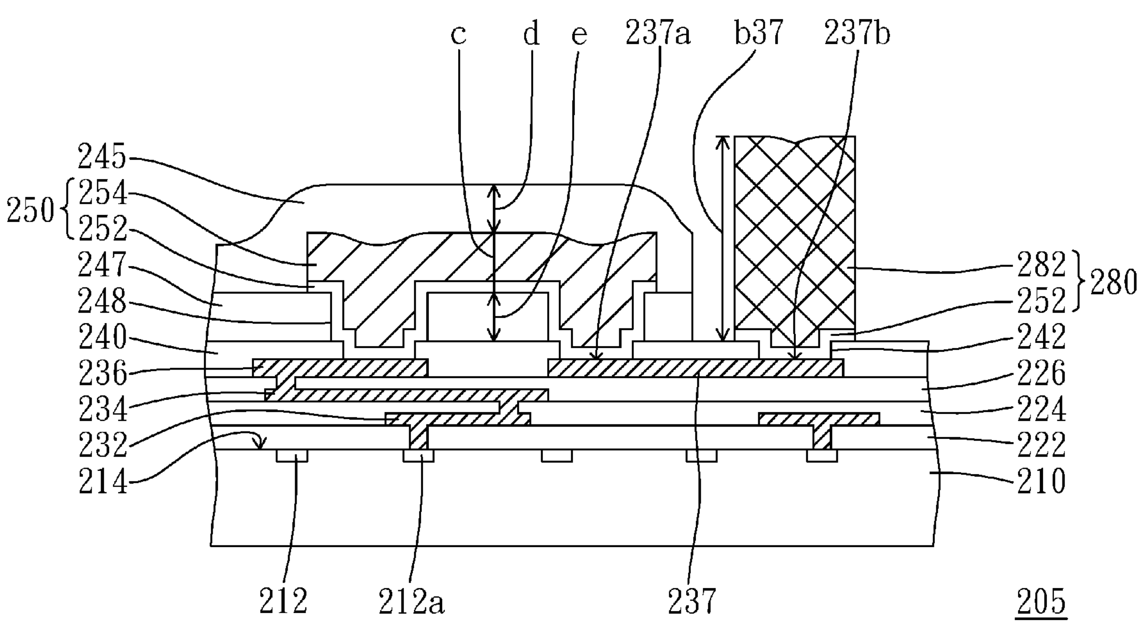

In FIGS. 116 and 117, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/metal layer 250 is formed on the polymer layer 247 and connected to the thin-film metal layer 236 via the openings 248 and 242. A polymer layer 245 is formed on the circuit/metal trace 250 to protect the circuit/metal layer 250. The bump or pad 280 is formed on the thin-film circuit layer 236 exposed by the opening 242 in the passivation layer 240. The thickness b36 of the bump or pad 280 can be substantially equal to the thickness c of the circuit/metal layer 250 and less than the thickness (c+d+e) of the circuit/metal trace 250 plus the polymer layers 245 and 247, as shown in FIG. 116. Alternatively, the thickness b37 of the bump or pad 280 can be greater than the thickness (c+d+e) of the circuit/metal trace 250 plus the polymer layers 245 and 247, as shown in FIG. 117.

Figure 118:
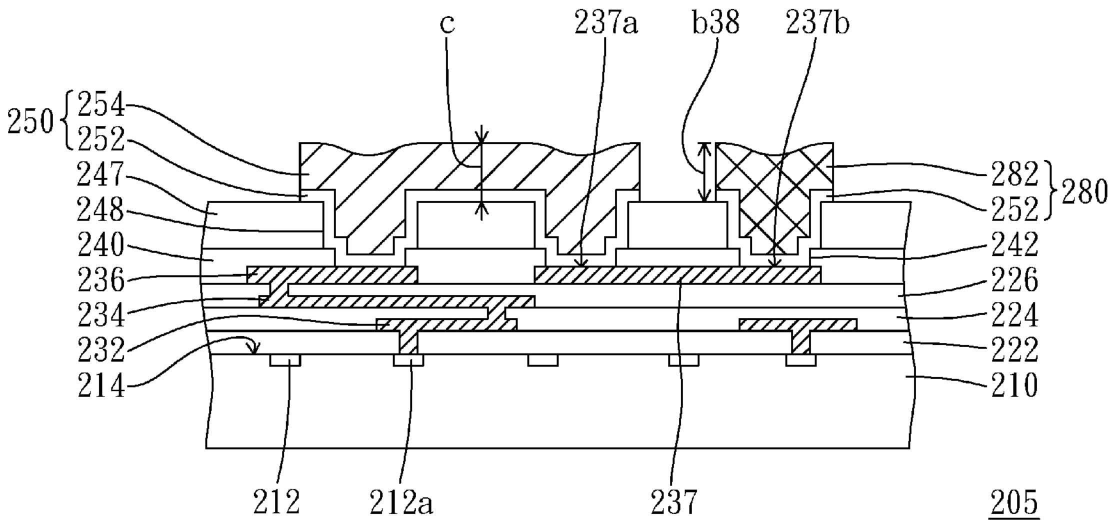
Figure 119:
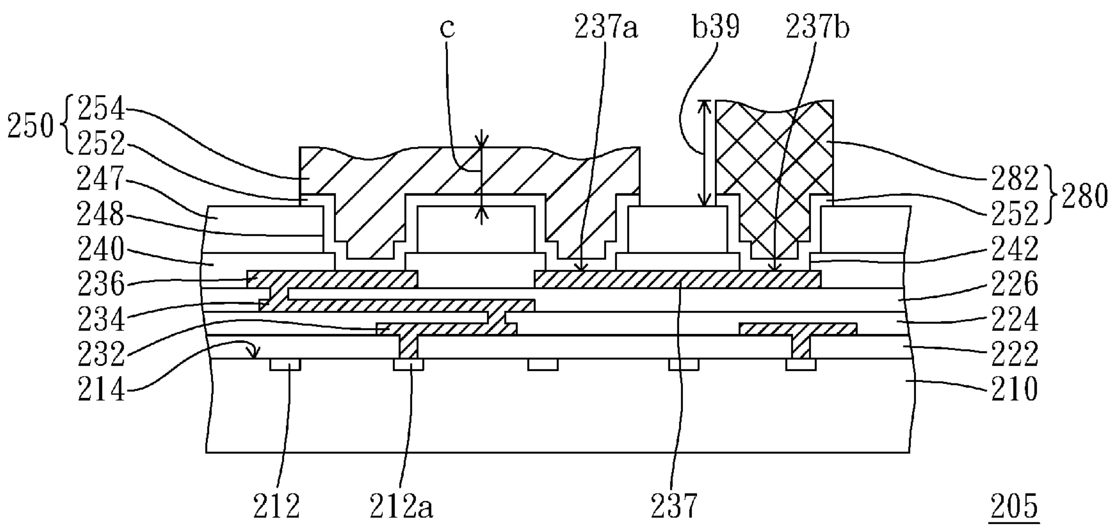

In FIGS. 118 and 119, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. The bump or pad 280 is formed on the thin-film circuit layer 236 exposed by the opening 242 in the passivation layer 240 and the opening 248 in the polymer layer 247. The thickness b38 of the bump or pad 280 projecting from the opening 248 in the polymer layer 247 can be substantially equal to the thickness c of the circuit/metal trace 250, as shown in FIG. 118. Alternatively, the thickness b39 of the bump or pad 280 projecting from the opening 248 in the polymer layer 247 can be greater than the thickness c of the circuit/metal trace 250, as shown in FIG. 119.

Figure 120:
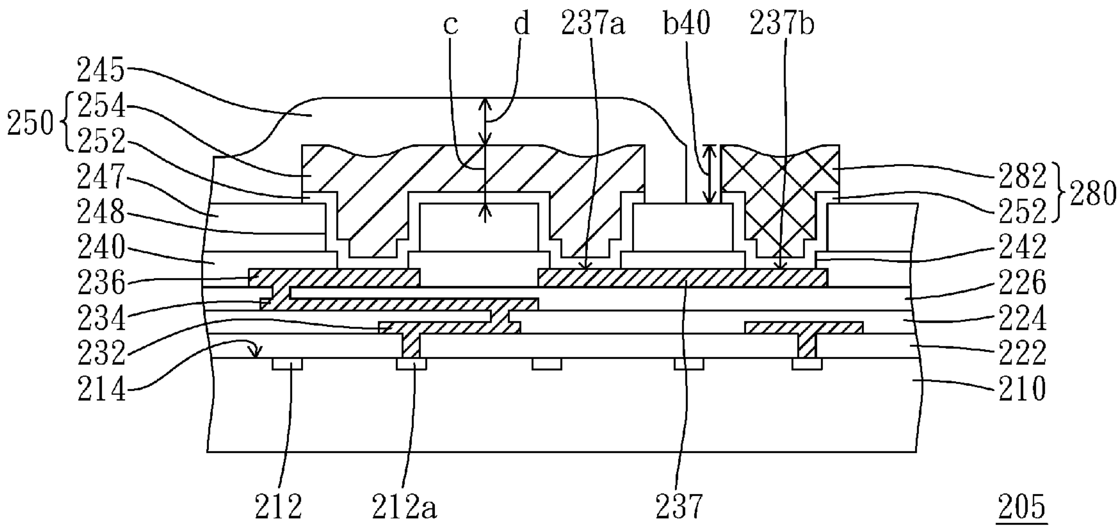
Figure 121:
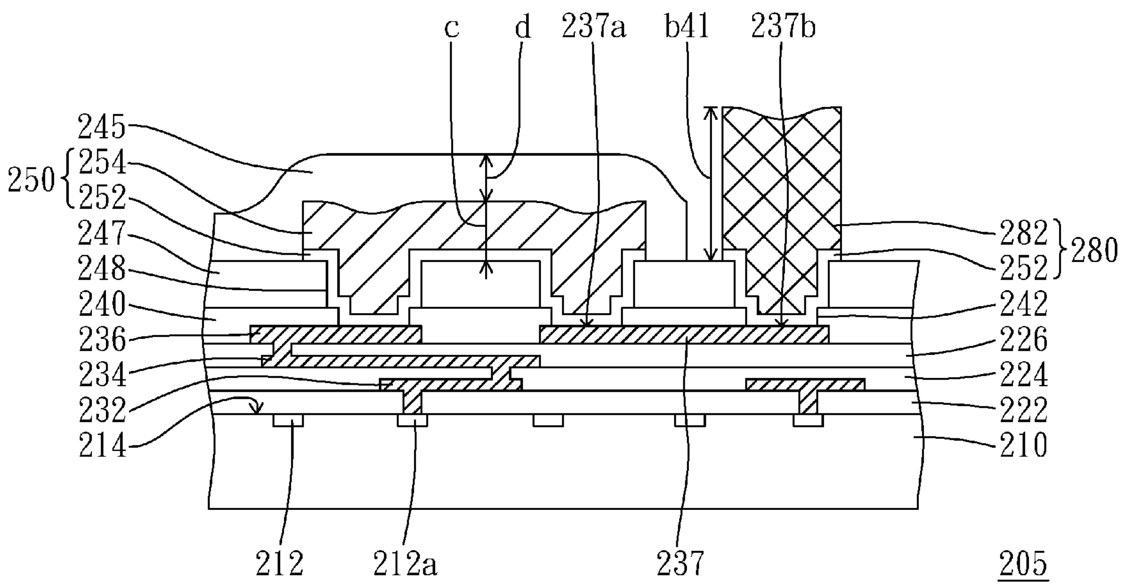

In FIGS. 120 and 121, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. A polymer layer 245 is deposited on the circuit/metal trace 250 to protect the circuit/metal trace 250. The bump or pad 280 is formed on the thin-film circuit layer 236 exposed by the opening 242 in the passivation layer 240 and the opening 248 in the polymer layer 247. The thickness b40 of the bump or pad 280 projecting from the opening 248 in the polymer layer 247 can be substantially equal to the thickness c of the circuit/metal trace 250 and less than the thickness (c+d) of the circuit/metal trace 250 plus the polymer layer 245, as shown in FIG. 120. Alternatively, the thickness b41 of the bump or pad 280 projecting from the opening 248 in the polymer layer 247 can be greater than the thickness (c+d) of the circuit/metal trace 250 plus the polymer layer 245, as shown in FIG. 121.

In the embodiments of the present invention depicted in FIG. 108-121, the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 108-121 can be deposited following the above-mentioned process as illustrated in FIGS. 60-66.

D. Circuit/Metal Trace Used for Signal Transmission or Acting as Power Bus or Plane or Ground Bus or Plane for External Circuitry FIGS. 122-134 are schematic cross-sectional views of the semiconductor chip in the second embodiment of the present invention. In FIGS. 122-134, the circuit/metal trace 250 is disconnected from the thin-film circuit layers 232, 234 and 236. The circuit/metal trace 250 may be used for signal transmission for an external circuitry, such as a glass substrate, film substrate, or printed circuit board, or may act as a power bus or plane or a ground bus or plane for the external circuitry. A wire-bonding process can be used to electrically connect the circuit/metal trace 250 to the external circuitry. Alternatively, bumps or solder balls can be formed to connect the external circuitry to the circuit/metal trace 250.

In a case that the circuit/metal trace 250 is used for signal transmission for the external circuitry, a signal can be transmitted from an electrical point of the external circuitry to another one through the circuit/metal trace 250. In another case that the circuit/metal trace 250 may act as a power bus or plane or ground bus or plane, the circuit/metal trace 250 may be connected to a power bus or plane or ground bus or plane in the external circuitry.

Figure 122:
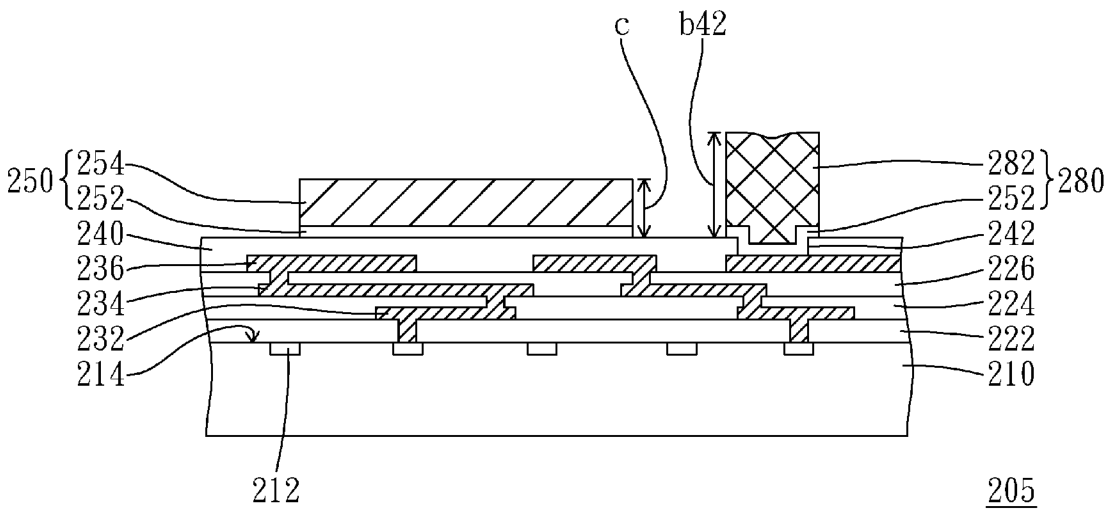
Figure 123:
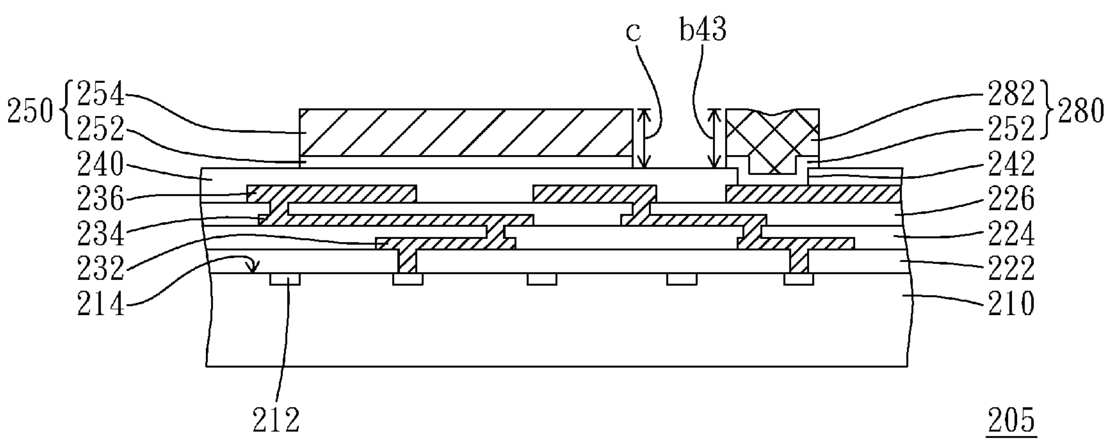

Referring now to FIGS. 122 and 123, the circuit/metal trace 250 is formed on the passivation layer 240 and disconnected from the thin-film circuit layers 232, 234, and 236 under the passivation layer 240. The bump or pad 280 is formed on the thin-film circuit layer 236 exposed by the opening 242 in the passivation layer 240. The bump or pad 280 may have a thickness b42 greater than the thickness c of the circuit/metal trace 250, as shown in FIG. 122. Alternatively, the thickness b43 of the bump or pad 280 can be substantially equivalent to the thickness c of the circuit/metal trace 250, as shown in FIG. 123.

Figure 124:
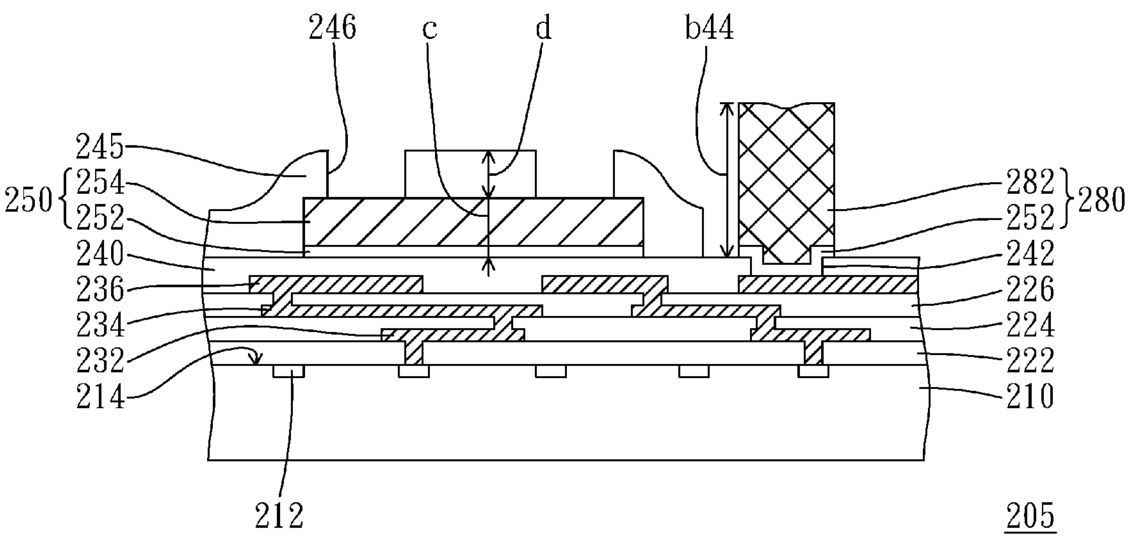
Figure 125:
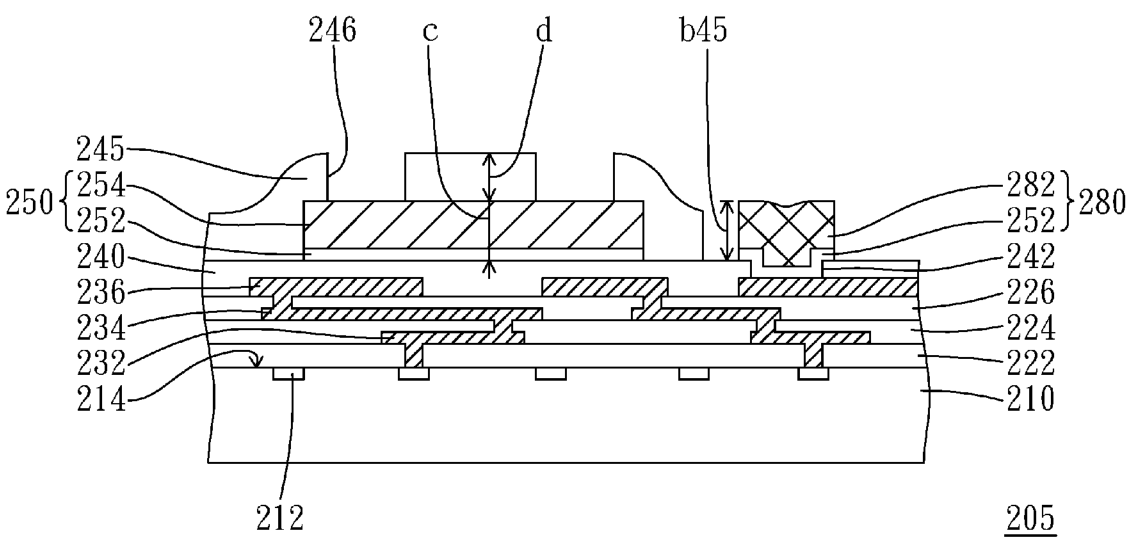

In FIGS. 124 and 125, a polymer layer 245 is formed on the circuit/metal trace 250 to protect the circuit/metal trace 250. Multiple openings 246 are formed in the polymer layer 245 and expose the circuit/metal trace 250. Wire-bonding wires or bumps can be bonded to the circuit/metal trace 250 through the openings 246. The circuit/metal trace 250 is formed on the passivation layer 240 and disconnected from the thin-film circuit layers 232, 234, and 236 under the passivation layer 240. The bump or pad 280 is formed on the thin-film circuit layer 236 exposed by the opening 242 in the passivation layer 240. The thickness b44 of the bump or pad 280 can be greater than the thickness (c+d) of the circuit/metal trace 250 plus the polymer layer 245, as shown in FIG. 124. Alternatively, the thickness b45 of the bump or pad 280 can be substantially equal to the thickness c of the circuit/metal trace 250 and less than the thickness (c+d) of the circuit/metal trace 250 plus the polymer layer 245, as shown in FIG. 125.

Figure 126:
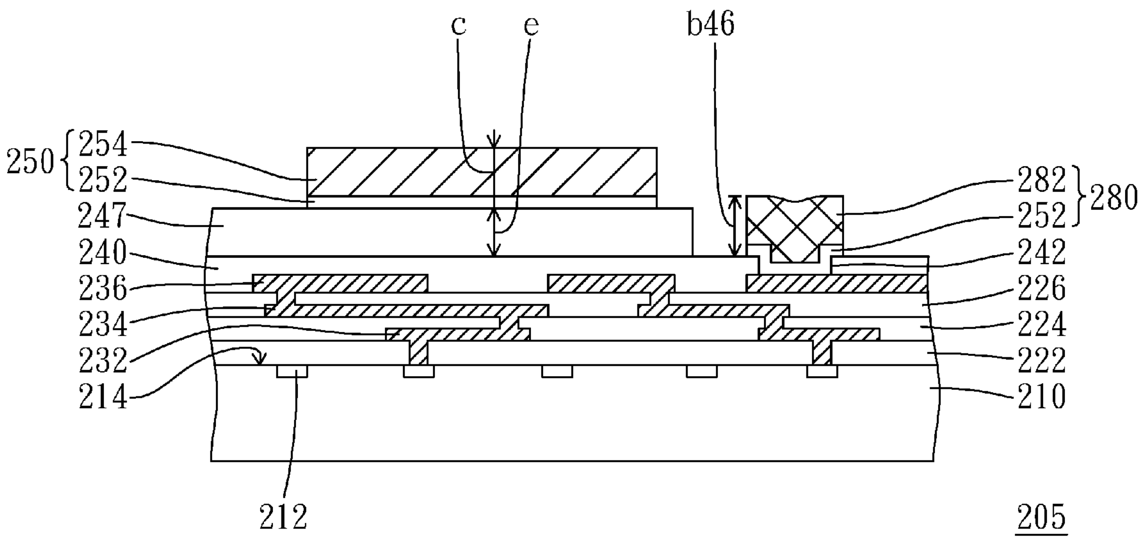
Figure 127:
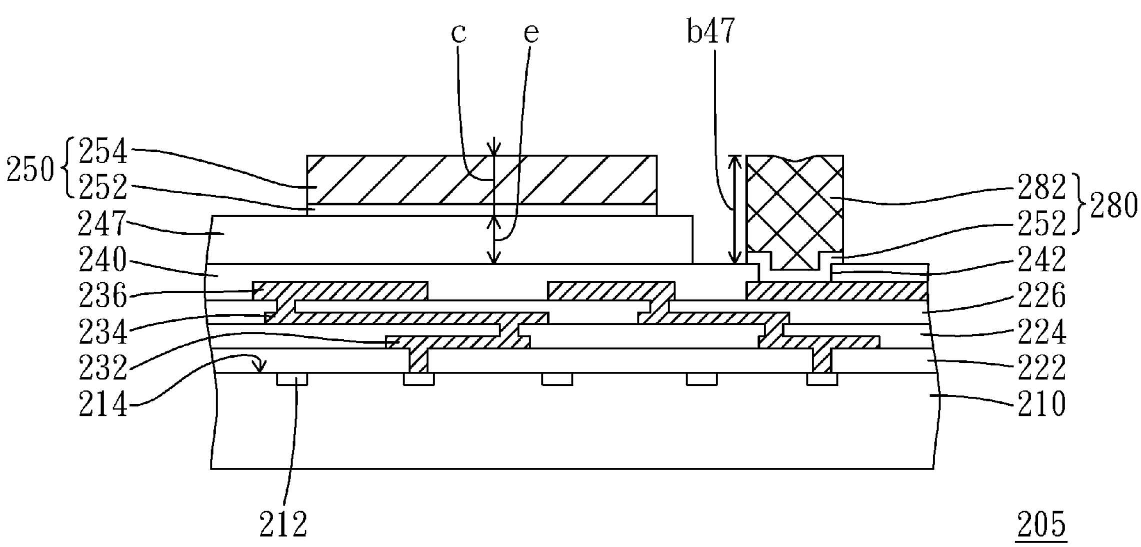
Figure 128:
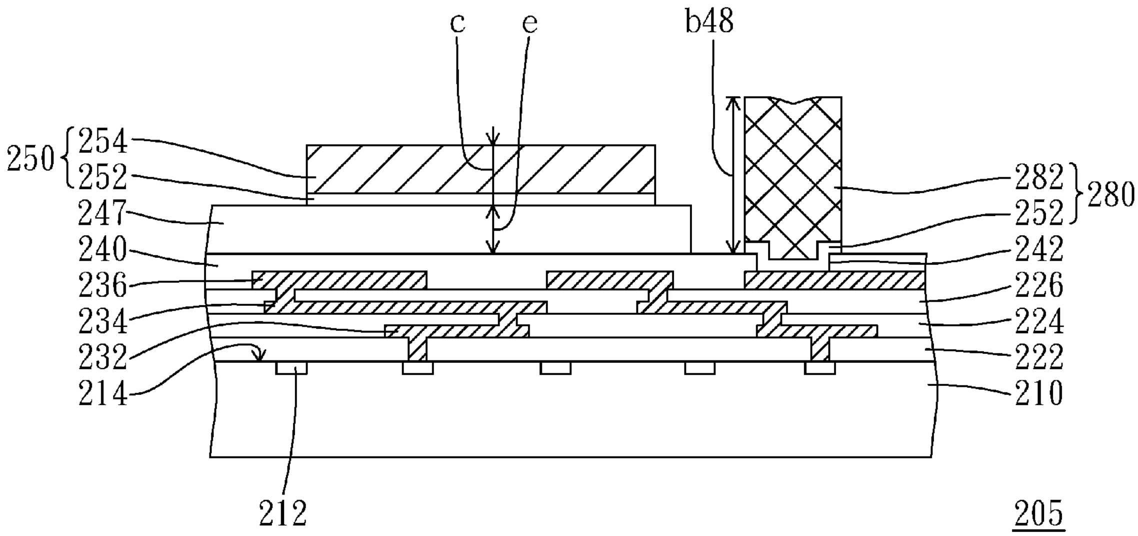

In FIGS. 126, 127, and 128, a polymer layer 247 is deposited on the passivation layer 240. The circuit/metal layer 250 is formed on the polymer layer 247 and disconnected from the thin-film circuit layers 232, 234, and 236 under the passivation layer 240. The bump or pad 280 is formed on the thin-film circuit layer 236 exposed by the opening 242 in the passivation layer 240. The thickness b46 of the bump or pad 280 can be substantially equal to the thickness c of the circuit/metal layer 250 and less than the thickness (c+e) of the circuit/metal trace 250 plus the polymer layer 247, as shown in FIG. 126. Alternatively, the thickness b47 of the bump or pad 280 can be substantially equivalent to the thickness (c+e) of the circuit/metal trace 250 plus the polymer layer 247, as shown in FIG.

127. Alternatively, the thickness b48 of the bump or pad 280 can be greater than the thickness (c+e) of the circuit/metal trace 250 plus the polymer layer 247, as shown in FIG. 128.

Figure 129:
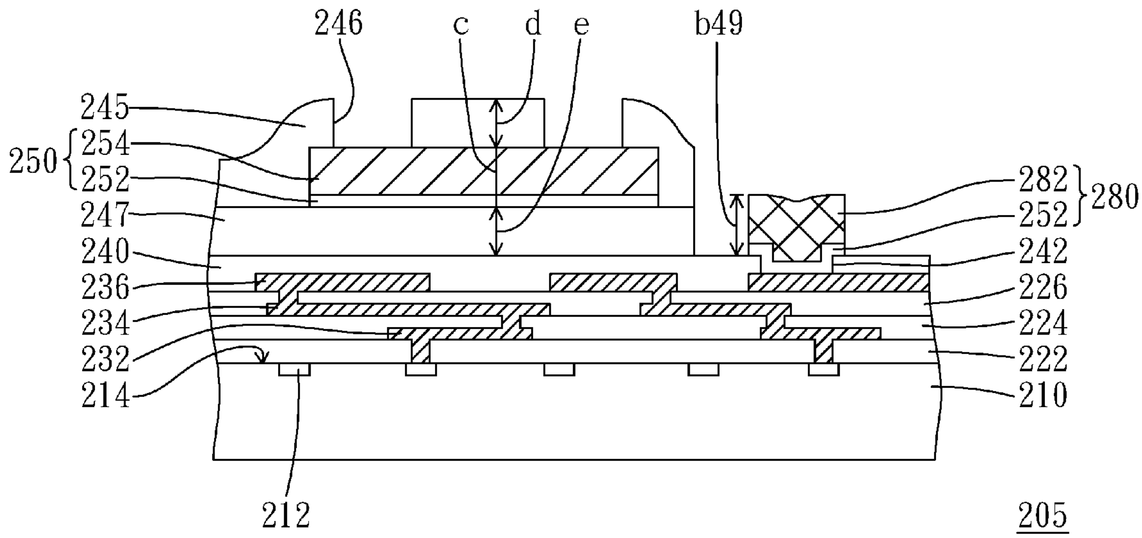
Figure 130:
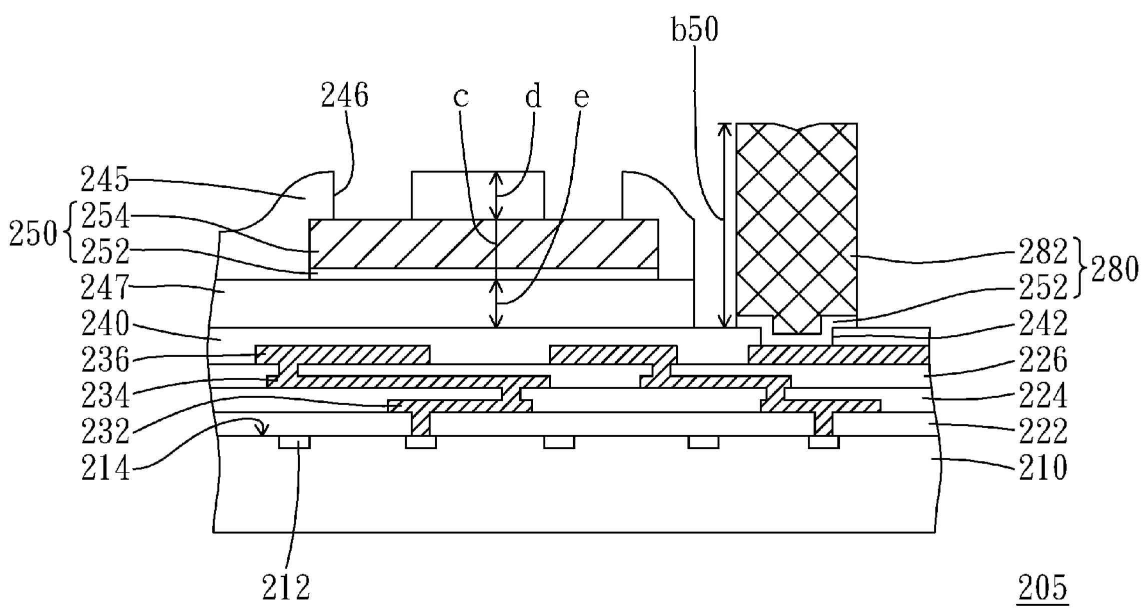

In FIGS. 129 and 130, a polymer layer 247 is deposited on the passivation layer 240. The circuit/metal layer 250 is formed on the polymer layer 247 and disconnected from the thin-film metal layers 232, 234 and 236 under the passivation layer 240. A polymer layer 245 is formed on the circuit/metal trace 250 to protect the circuit/metal layer 250. Multiple openings 246 are formed in the polymer layer 245 and expose the circuit/metal layer 250. Wire-bonding wires or bumps can be bonded to the circuit/metal trace 250 through the openings 246. The bump or pad 280 is formed on the thin-film circuit layer 236 exposed by the opening 242 in the passivation layer 240. The thickness b49 of the bump or pad 280 can be substantially equal to the thickness c of the circuit/metal layer 250 and less than the thickness (c+d+e) of the circuit/metal trace 250 plus the polymer layers 245 and 247, as shown in FIG. 129. Alternatively, the thickness b50 of the bump or pad 280 can be greater than the thickness (c+d+e) of the circuit/metal trace 250 plus the polymer layers 245 and 247, as shown in FIG. 130.

Figure 131:
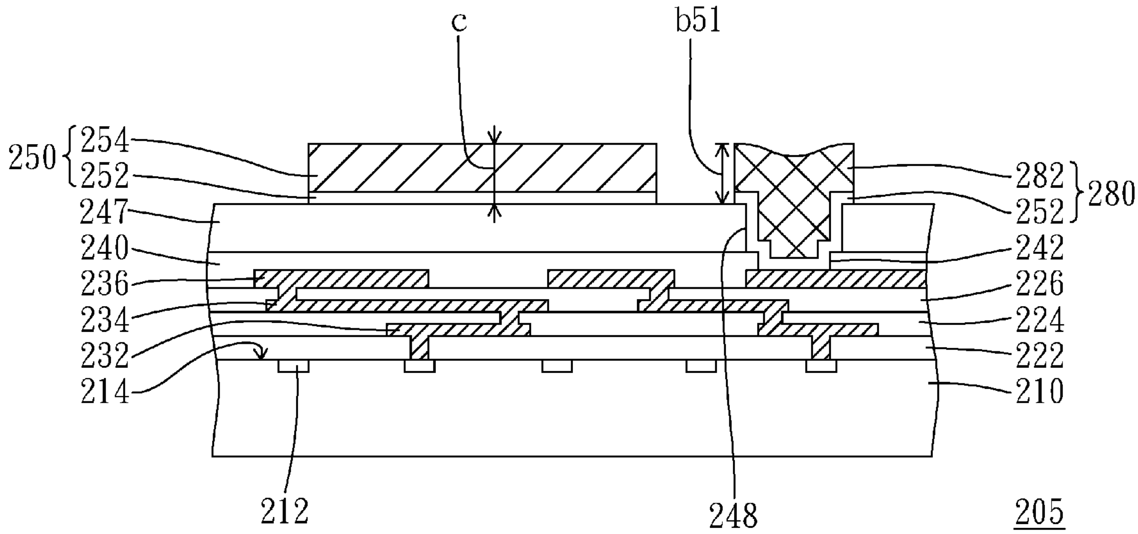
Figure 132:
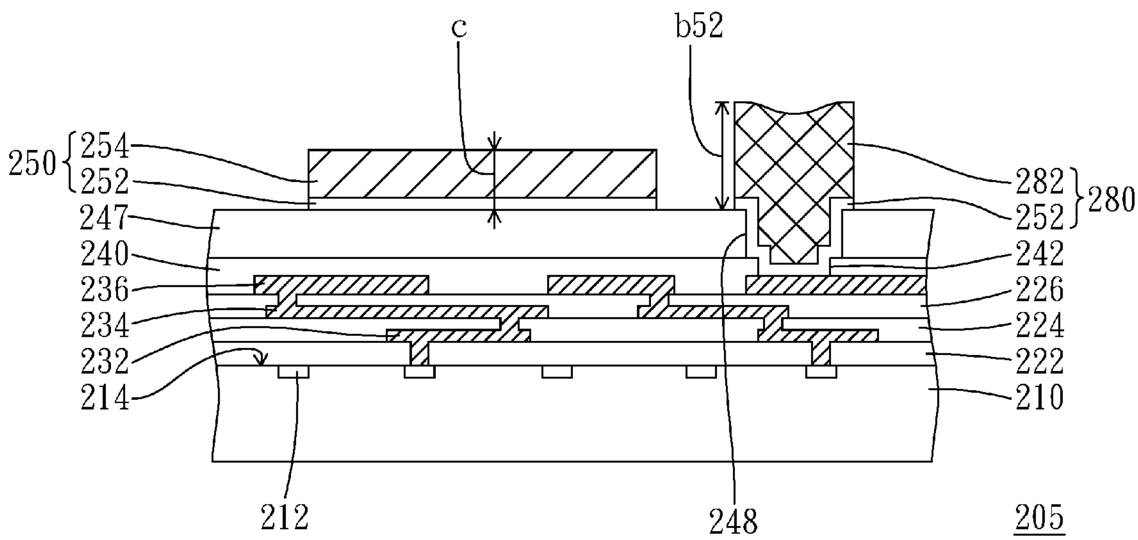

In FIGS. 131 and 132, a polymer layer 247 is deposited on the passivation layer 240. The circuit/metal trace 250 is formed on the polymer layer 247 and is disconnected from the thin-film circuit layers 232, 234, and 236 under the passivation layer 240. The bump or pad 280 is formed on the thin-film circuit layer 236 exposed by the opening 242 in the passivation layer 240 and the opening 248 in the polymer layer 247. The thickness b51 of the bump or pad 280 projecting from the opening 248 in the polymer layer 247 can be substantially equal to the thickness c of the circuit/metal trace 250, as shown in FIG. 131. Alternatively, the thickness b52 of the bump or pad 280 projecting from the opening 248 in the polymer layer 247 can be greater than the thickness c of the circuit/metal trace 250, as shown in FIG. 132.

Figure 133:
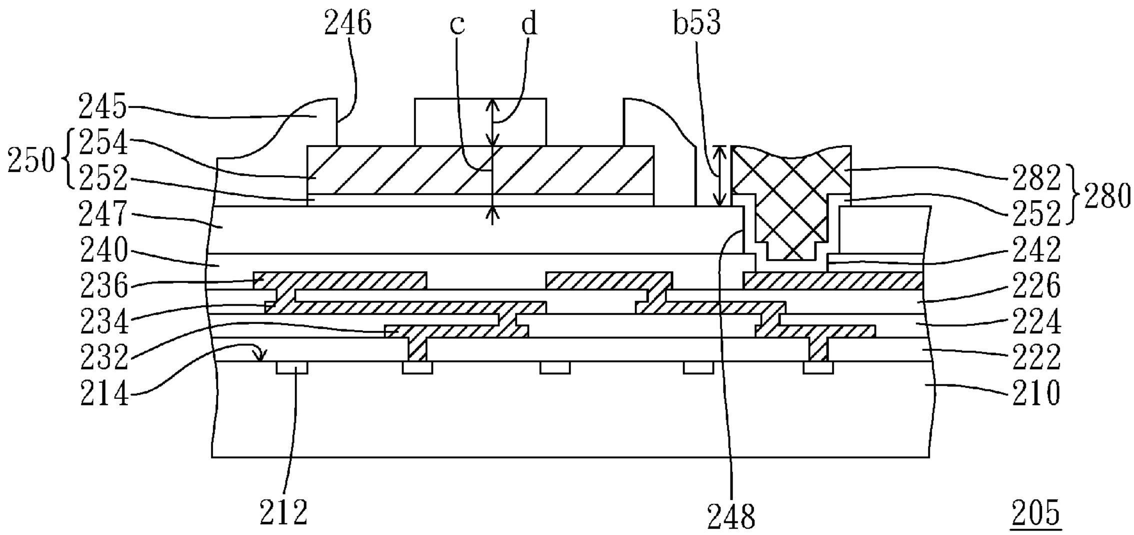
Figure 134:
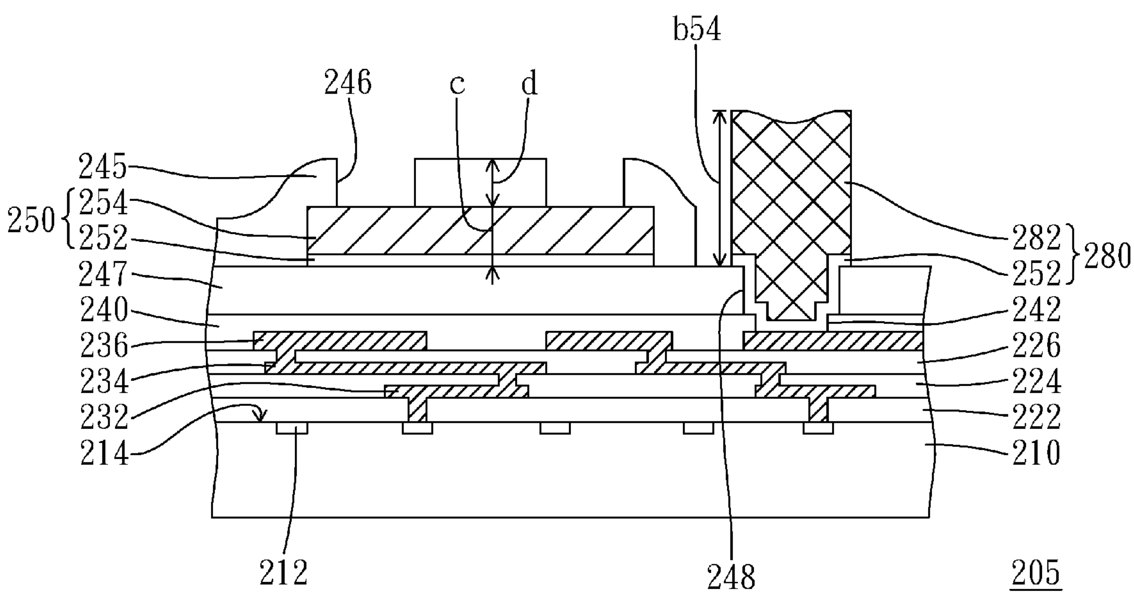
Figure 144:
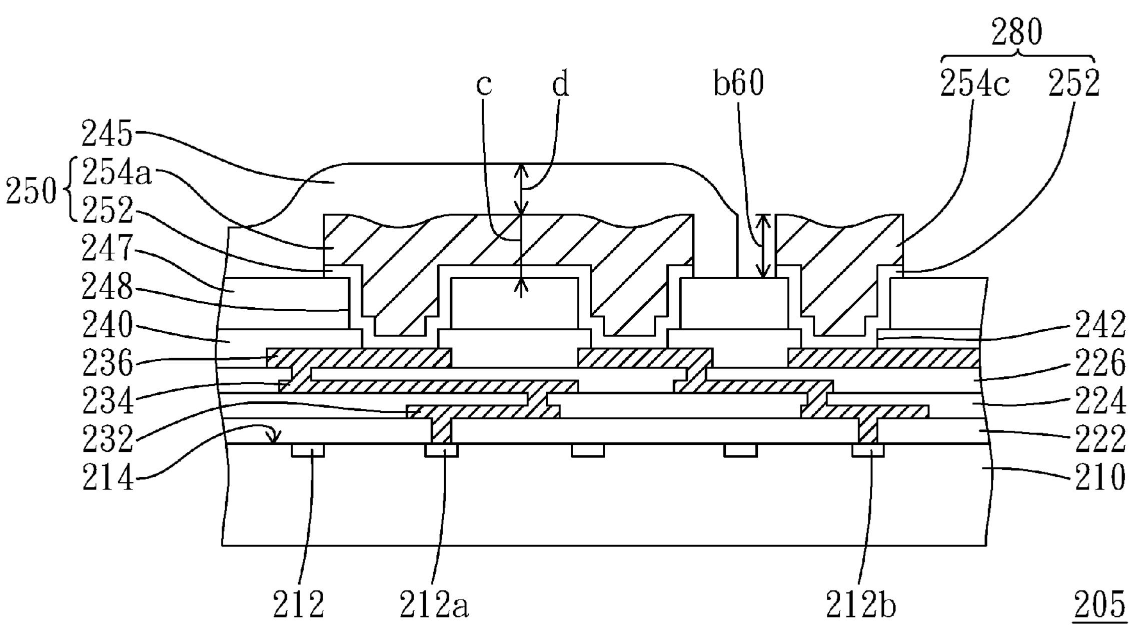

In FIGS. 133 and 134, a polymer layer 247 is deposited on the passivation layer 240. The circuit/metal trace 250 is formed on the polymer layer 247 and is disconnected from the thin-film circuit layers 232, 234, and 236 under the passivation layer 240. A polymer layer 245 is deposited on the circuit/metal trace 250 to protect the circuit/metal trace 250. Multiple openings 246 are formed in the polymer layer 245 and expose the circuit/metal layer 250. Wire-bonding wires or bumps can be bonded to the circuit/metal trace 250 through the openings 246. The bump or pad 280 is formed on the thin-film circuit layer 236 exposed by the opening 242 in the passivation layer 240 and the opening 248 in the polymer layer 247. The thickness b53 of the bump or pad 280 projecting from the opening 248 in the polymer layer 247 can be substantially equal to the thickness c of the circuit/metal trace 250 and less than the thickness (c+d) of the circuit/metal trace 250 plus the polymer layer 245, as shown in FIG. 133. Alternatively, the thickness b54 of the bump or pad 280 projecting from the opening 248 in the polymer layer 247 can be greater than the thickness (c+d) of the circuit/metal trace 250 plus the polymer layer 245, as shown in FIG. 144.

In the embodiments of the present invention depicted in FIGS. 122-134, the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 122-134 can be deposited following the above-mentioned process as illustrated in FIGS. 60-66.

Third Embodiment

1. Method for Manufacturing Circuit/Metal Traces and Bumps

Figure 135:
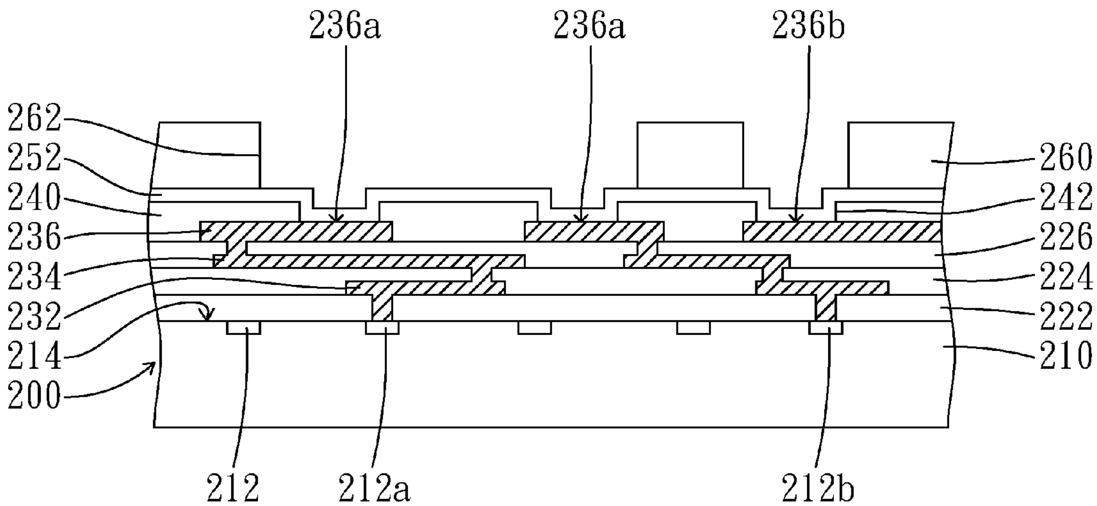
FIGS. 135-138 are schematic cross-sectional views illustrating the preferred embodiment of the third method for forming circuits/metal traces and bumps or pads according to the present invention.

FIGS. 135-138 are schematic cross-sectional views illustrating the preferred embodiment of the method for forming circuits/metal traces and bumps according to the present invention. Referring now to FIG. 135, a semiconductor wafer 200 comprising a semiconductor substrate 210 multiple thin-film dielectric layers 222, 224 and 226, multiple thin-film circuit layers 232, 234 and 236 and a passivation layer 240 is shown. These elements of the semiconductor wafer 200 having the same reference numbers as those in the first embodiment can refer to the illustration in FIG. 13 in the first embodiment.

Referring now to FIG. 135, after the semiconductor wafer 200 is produced, a sputtering process may be used to form a bottom metal layer 252 on the passivation layer 240 and the thin-film circuit layer 236 exposed by the opening 242 in the passivation layer 240.

The bottom metal layer 252 may be formed by first sputtering an adhesive/barrier layer on the passivation layer 240 and on the connection point of thin-film circuit layer 236 exposed by the opening 242 in the passivation layer 240 and next sputtering, electroless plating or electroplating a seed layer on the adhesive/barrier layer. The detailed cross-sectional structure of the adhesive/barrier layer and the seed layer can refer to the illustrations in FIG. 139.

Next, as shown in FIG. 135, a photoresist layer 260 is formed on the bottom metal layer 252. Multiple openings 262 in the photoresist layer 260 expose the bottom metal layer 252. The opening for a trace may have a largest transverse dimension greater than 300 μm, and the opening for a pad or bump may have a largest transverse dimension less than 300 μm. Alternatively, the opening for a trace may have a largest transverse dimension greater than 200 μm, and the opening for a pad or bump may have a largest transverse dimension less than 200 μm. Alternatively, the opening for a trace may have a largest transverse dimension greater than 100 μm, and the opening for a pad or bump may have a largest transverse dimension less than 100 μm. Alternatively, the opening for a trace may have a largest transverse dimension greater than 50 μm, and the opening for a pad or bump may have a largest transverse dimension less than 50 μm.

Figure 136:
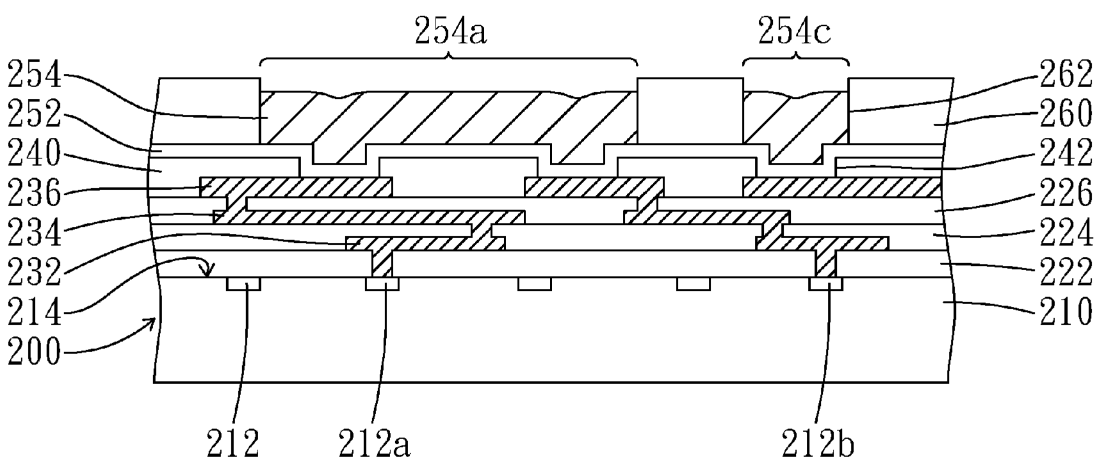

Subsequently, an electroplating method or electroless plating is used to form a metal layer 254 on the bottom metal layer 252 exposed by the opening 262 in the photoresist layer 260, as shown in FIG. 136. The metal layer 254 may includes a trace-shaped or plane-shaped portion **254*a* for forming a trace or plane and a bump-shaped or pad-shaped portion 254*c* for forming a bump or pad. The detailed cross-sectional metallization structure of the metal layer 254 can refer to the illustrations in FIG. 139**.

Figure 137:
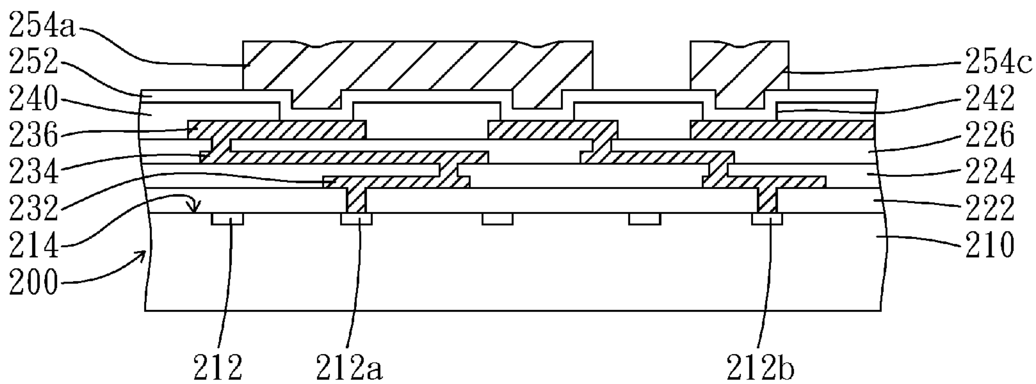

Next, the photoresist layer 260 is removed and the bottom layer 252 is exposed, as shown in FIG. 137. Subsequently, an etching process is performed to remove the bottom metal layers 252 not covered by the metal layer 254. The bottom metal layer 252 under the metal layer 254 is left, as shown FIG. 138. When a topmost metal layer of the metal layer 254 comprises solder, such as a tin-lead alloy, a tin-silver alloy, a tin-silver-copper alloy or tin, a reflowing process can be performed to round the upper surface of the metal layer 254. So far, forming a metal trace or plane 250 and a pad or bump 280 are completed. The metal trace or plane 250 is composed of the bottom metal layer 252 and the trace-shaped or plane-shaped metal layer 254. The bump or pad 280 is composed of the bottom metal layer 252 and the bump-shaped or pad-shaped metal layer 282. The projection profile of the metal trace 250 projecting to the plane 1000 has an area of larger than 30,000 $\mu m^2$, 80,000 $\mu m^2$, or 150,000 $\mu m^2$, for example. The projection profile of the bump or pad 280 projecting to the plane 1000 has an area of less than 30,000 $\mu m^2$, 20,000 $\mu m^2$, or 15,000 $\mu m^2$, for example.

Next, die sawing process is performed. In the die sawing process, a cutting blade cuts along the scribe-line of semiconductor wafer 200 to split the wafer into many individual IC chips 205.

The metal structure 280 may act as a bump used to connect the individual IC chip 205 to an external circuitry, such as another semiconductor chip or wafer, printed circuitry board, flexible substrate or glass substrate. The bump 280 may be connected to a pad of a glass substrate through multiple metal particles in an anisotropic conductive film (ACF) or anisotropic conductive paste (ACP). The bump 280 may be connected to a solder material preformed on another semiconductor chip or wafer, a printed circuitry board or a flexible substrate. The bump 280 may be connected to a bump preformed on another semiconductor chip or wafer. The projection profile of each bump 280 projecting to the plane 1000 has an area of smaller than 30,000 $m^2$, 20,000 $\mu m^2$, or 15,000 $\mu m^2$, for example.

Figure 138:
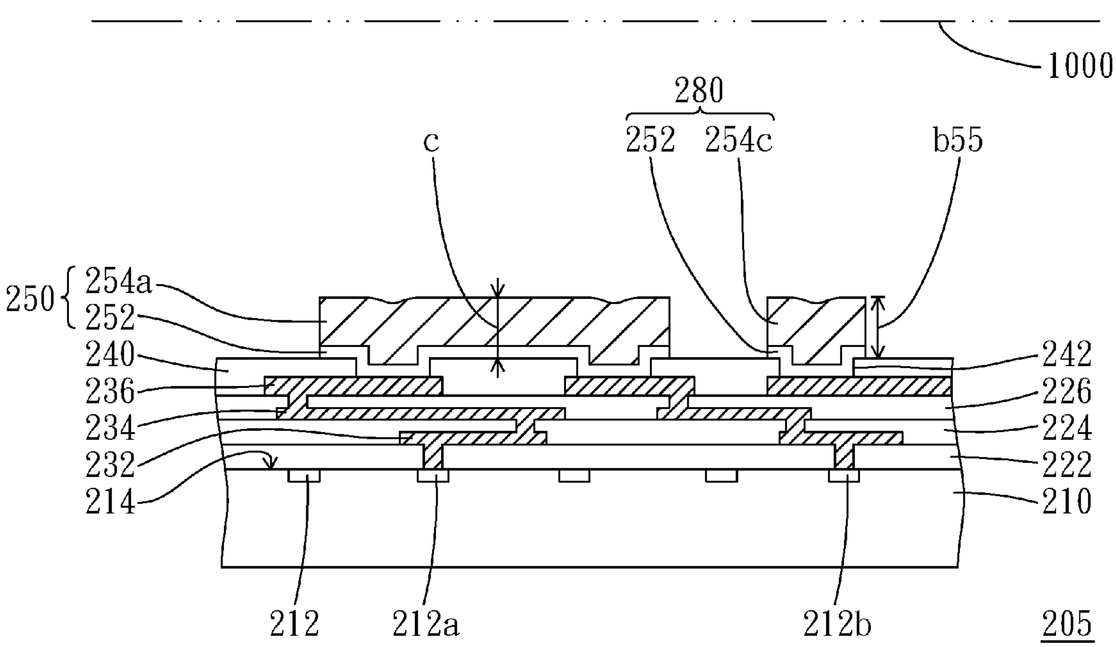
Figure 138A:
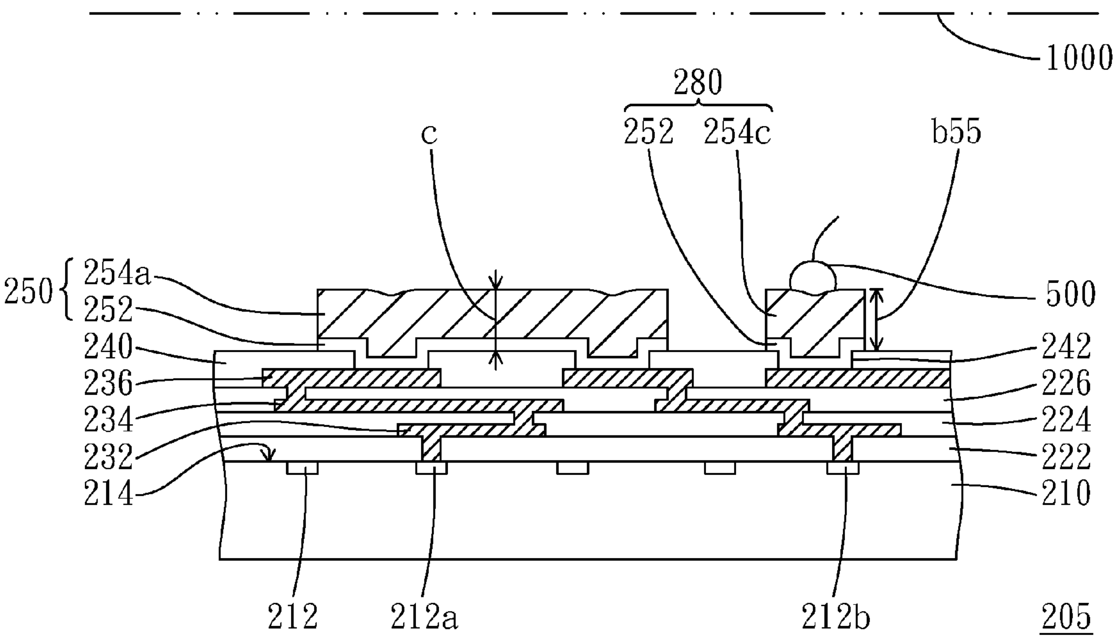

Alternatively, the metal structure 280 may serve as a pad used to be wirebonded thereto. As shown in FIG. 138A, wirebonding wires 500 can be deposited on the pads 280. Alternatively, the metal layer 280 may serve as a pad used to be bonded with a solder material deposited on another circuitry component. The projection profile of each pad 280 projecting to the plane 1000 has an area of smaller than 30,000 $\mu m^2$, 20,000 $\mu m^2$, or 15,000 $\mu m^2$, for example.

2. Metallization Structure of Circuit/Metal Traces

Figure 139:
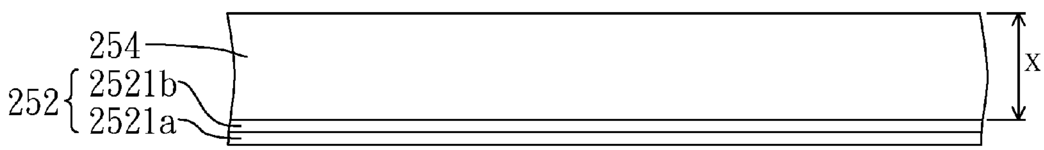
FIG. 139 is a schematic cross-sectional view illustrating the metallization structure of a metal trace, bump or pad according to the present invention.

Referring now to FIG. 139, a schematic cross-sectional view of the metallization structure for a circuit/metal trace or plane and a bump or pad according to the third embodiment of the present invention is shown. In this embodiment, the circuit/metal trace or plane 250 and the bump or pad 280 have the same metallization structure as depicted below. During the formation of bottom metal layer 252, a sputtering process can be first used to form an adhesive/barrier layer 2521*a*. Then, another sputtering process or an electroless plating or electroplating process may be used to form a seed layer 2521*b* on the adhesive/barrier layer 2521*a*. An electroplating process or electroless plating process may be used to form a bulk metal layer 254 on the seed layer 2521*b*.

In a case, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as gold, can be sputtered, electroless plated or electroplated on the adhesion/barrier layer 2521*a*, preferably comprising a titanium-tungsten alloy, and then the bulk metal layer 254 comprising gold is electroplated or electroless plated on the seed layer 2521*b*. The bulk metal layer 254 may be a single metal layer and may comprise gold with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as copper, can be sputtered, electroless plated or electroplated on the adhesion/barrier layer 2521*a*, preferably comprising titanium, and next the bulk metal layer 254 is electroplated or electroless plated on the seed layer 2521*b*. Alternatively, the seed layer 2521*b*, such as copper, can be sputtered, electroless plated or electroplated on the adhesion/barrier layer 2521*a* formed by first sputtering a chromium layer and then sputtering a chromium-copper-alloy layer on the chromium layer, and then the bulk metal layer 254 comprising copper is electroplated or electroless plated on the seed layer 2521*b*. The bulk metal layer 254 may be a single metal layer and may comprise copper with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as silver, can be sputtered, electroless plated or electroplated on the adhesion/barrier layer 2521*a* and then the bulk metal layer 254 comprising silver is electroplated or electroless plated on the seed layer. The bulk metal layer 254 may be a single metal layer and may comprise silver with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as platinum, can be sputtered, electroless plated or electroplated on the adhesion/barrier layer 2521*a* and then the bulk metal layer 254 comprising platinum is electroplated or electroless plated on the seed layer. The bulk metal layer 254 may be a single metal layer and may comprise platinum with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as palladium, can be sputtered, electroless plated or electroplated on the adhesion/barrier layer 2521*a* and then the bulk metal layer 254 comprising palladium is electroplated or electroless plated on the seed layer. The bulk metal layer 254 may be a single metal layer and may comprise palladium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as rhodium, can be sputtered, electroless plated or electroplated on the adhesion/barrier layer 2521*a* and then the bulk metal layer 254 comprising rhodium is electroplated or electroless plated on the seed layer. The bulk metal layer 254 may be a single metal layer and may comprise rhodium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as ruthenium, can be sputtered, electroless plated or electroplated on the adhesion/barrier layer 2521*a* and then the bulk metal layer 254 comprising ruthenium is electroplated or electroless plated on the seed layer. The bulk metal layer 254 may be a single metal layer and may comprise ruthenium with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as nickel, can be sputtered, electroless plated or electroplated on the adhesion/barrier layer 2521*a* and then the bulk metal layer 254 comprising ruthenium is electroplated or electroless plated on the seed layer. The bulk metal layer 254 may be a single metal layer and may comprise a lead-containing solder material, such as tin-lead alloy, or a lead-free solder material, such as tin-silver alloy or tin-silver-copper alloy and may have a thickness x greater than 1 μm and, preferably, between 5 μm and 300 μm.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as nickel, can be sputtered, electroless plated or electroplated on the adhesion/barrier layer 2521*a* and then the bulk metal layer 254 comprising nickel is electroplated or electroless plated on the seed layer. The bulk metal layer 254 may be a single metal layer and may comprise nickel with greater than 90 weight percent, and, preferably, greater than 97 weight percent, wherein the bulk metal layer 254 may have a thickness x greater than 1 μm (1 micrometer), and preferably between 2 μm (2 micrometers) and 30 μm (30 micrometers). If the thickness of the bulk metal layer 254 is greater than 1 μm, an electroplating process is preferably used to form the bulk metal layer 254.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as copper, is sputtered, electroless plated or electroplated on the adhesion/barrier layer 2521*a*, preferably comprising titanium, and next the bulk metal layer 254 is electroplated or electroless plated on the seed layer 2521*b*. Alternatively, the seed layer 2521*b*, such as copper, is sputtered, electroless plated or electroplated on the adhesion/barrier layer 2521*a* formed by first sputtering a chromium layer and then sputtering a chromium-copper-alloy layer on the chromium, and then the bulk metal layer 254 is electroplated or electroless plated on the seed layer 2521*b*. The bulk metal layer 254 may be formed by electroplating or electroless plating a first metal layer on the seed layer and then electroplating or electroless plating a second metal layer on the first metal layer. The first metal layer may comprise copper with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as gold, is sputtered, electroless plated or electroplated on the adhesion/barrier layer 2521*a*, preferably comprising a titanium-tungsten alloy, and next the bulk metal layer 254 is electroplated or electroless plated on the seed layer 2521*b*. The bulk metal layer 254 is formed by electroplating or electroless plating a first metal layer on the seed layer 2521*b* and then electroplating or electroless plating a second metal layer on the first metal layer. The first metal layer may comprise gold with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as silver, is sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 2521*b* and then electroplating or electroless plating a second metal layer on the first metal layer. The first metal layer may comprise silver with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as platinum, is sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 2521*b* and then electroplating or electroless plating a second metal layer on the first metal layer. The first metal layer may comprise platinum with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as palladium, is sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 2521*b* and then electroplating or electroless plating a second metal layer on the first metal layer. The first metal layer may comprise palladium with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as rhodium, is sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 2521*b* and then electroplating or electroless plating a second metal layer on the first metal layer. The first metal layer may comprise rhodium with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as ruthenium, is sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 2521*b* and then electroplating or electroless plating a second metal layer on the first metal layer. The first metal layer may comprise ruthenium with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as nickel, is sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 2521*b* and then electroplating or electroless plating a second metal layer on the first metal layer. The first metal layer may comprise nickel with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first or second metal layer is greater than 1 μm, an electroplating process is preferably used to form the first or second metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as copper, can be sputtered, electroless plated or electroplated on the adhesion/barrier layer 2521*a*, preferably comprising titanium, and next the bulk metal layer 254 is electroplated or electroless plated on the seed layer 2521*b*. Alternatively, the seed layer 2521*b*, such as copper, can be sputtered, electroless plated or electroplated on the adhesion/barrier layer 2521*a* formed by first sputtering a chromium layer and then sputtering a chromium-copper-alloy layer on the chromium, and then the bulk metal layer 254 is electroplated or electroless plated on the seed layer 2521*b*. The bulk metal layer 254 is formed by electroplating or electroless plating a first metal layer on the seed layer 252*b*, next electroplating or electroless plating a second metal layer on the first metal layer, and then electroplating or electroless plating a third metal layer on the second metal layer. The first metal layer may comprise copper with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer may comprise silver with greater than 90 weight percent, and, preferably, greater than 97 weight percent and may have a thickness greater than 100 angstroms, and preferably between 1000 angstroms and 10 μm. Alternatively, the third metal layer may comprise copper with greater than 90 weight percent, and, preferably, greater than 97 weight percent and may have a thickness greater than 100 angstroms, and preferably between 1000 angstroms and 10 μm. Alternatively, the third metal layer may comprise platinum with greater than 90 weight percent, and, preferably, greater than 97 weight percent and may have a thickness greater than 100 angstroms, and preferably between 1000 angstroms and 1 μm. Alternatively, the third metal layer may comprise palladium with greater than 90 weight percent, and, preferably, greater than 97 weight percent and may have a thickness greater than 100 angstroms, and preferably between 1000 angstroms and 10 μm. Alternatively, the third metal layer may comprise rhodium with greater than 90 weight percent, and, preferably, greater than 97 weight percent and may have a thickness greater than 100 angstroms, and preferably between 1000 angstroms and 10 μm. Alternatively, the third metal layer may comprise ruthenium with greater than 90 weight percent, and, preferably, greater than 97 weight percent and may have a thickness greater than 100 angstroms, and preferably between 1000 angstroms and 10 μm. Alternatively, the third metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first, second or third metal layer is greater than 1 μm, an electroplating process is preferably used to form the first, second or third metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as gold, can be sputtered, electroless plated or electroplated on the adhesion/barrier layer 2521*a*, preferably comprising a titanium-tungsten alloy, and next the bulk metal layer 254 is electroplated or electroless plated on the seed layer 2521*b*. The bulk metal layer 254 is formed by electroplating or electroless plating a first metal layer on the seed layer 252*b*, next electroplating or electroless plating a second metal layer on the first metal layer, and then electroplating or electroless plating a third metal layer on the second metal layer. The first metal layer may comprise gold with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer may comprise silver with greater than 90 weight percent, and, preferably, greater than 97 weight percent and may have a thickness greater than 100 angstroms, and preferably between 1000 angstroms and 10 μm. Alternatively, the third metal layer may comprise copper with greater than 90 weight percent, and, preferably, greater than 97 weight percent and may have a thickness greater than 100 angstroms, and preferably between 1000 angstroms and 10 μm. Alternatively, the third metal layer may comprise platinum with greater than 90 weight percent, and, preferably, greater than 97 weight percent and may have a thickness greater than 100 angstroms, and preferably between 1000 angstroms and 1 μm. Alternatively, the third metal layer may comprise palladium with greater than 90 weight percent, and, preferably, greater than 97 weight percent and may have a thickness greater than 100 angstroms, and preferably between 1000 angstroms and 10 μm. Alternatively, the third metal layer may comprise rhodium with greater than 90 weight percent, and, preferably, greater than 97 weight percent and may have a thickness greater than 100 angstroms, and preferably between 1000 angstroms and 10 μm. Alternatively, the third metal layer may comprise ruthenium with greater than 90 weight percent, and, preferably, greater than 97 weight percent and may have a thickness greater than 100 angstroms, and preferably between 1000 angstroms and 10 μm. Alternatively, the third metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first, second or third metal layer is greater than 1 μm, an electroplating process is preferably used to form the first, second or third metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as silver, can be sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 252*b*, next electroplating or electroless plating a second metal layer on the first metal layer, and then electroplating or electroless plating a third metal layer on the second metal layer. The first metal layer may comprise silver with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer may comprise silver with greater than 90 weight percent, and, preferably, greater than 97 weight percent and may have a thickness greater than 100 angstroms, and preferably between 1000 angstroms and 10 μm. Alternatively, the third metal layer may comprise copper with greater than 90 weight percent, and, preferably, greater than 97 weight percent and may have a thickness greater than 100 angstroms, and preferably between 1000 angstroms and 10 μm. Alternatively, the third metal layer may comprise platinum with greater than 90 weight percent, and, preferably, greater than 97 weight percent and may have a thickness greater than 100 angstroms, and preferably between 1000 angstroms and 1 μm. Alternatively, the third metal layer may comprise palladium with greater than 90 weight percent, and, preferably, greater than 97 weight percent and may have a thickness greater than 100 angstroms, and preferably between 1000 angstroms and 10 μm. Alternatively, the third metal layer may comprise rhodium with greater than 90 weight percent, and, preferably, greater than 97 weight percent and may have a thickness greater than 100 angstroms, and preferably between 1000 angstroms and 10 μm. Alternatively, the third metal layer may comprise ruthenium with greater than 90 weight percent, and, preferably, greater than 97 weight percent and may have a thickness greater than 100 angstroms, and preferably between 1000 angstroms and 10 μm. Alternatively, the third metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first, second or third metal layer is greater than 1 μm, an electroplating process is preferably used to form the first, second or third metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as platinum, can be sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 252*b*, next electroplating or electroless plating a second metal layer on the first metal layer, and then electroplating or electroless plating a third metal layer on the second metal layer. The first metal layer may comprise platinum with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer may comprise silver with greater than 90 weight percent, and, preferably, greater than 97 weight percent and may have a thickness greater than 100 angstroms, and preferably between 1000 angstroms and 10 μm. Alternatively, the third metal layer may comprise copper with greater than 90 weight percent, and, preferably, greater than 97 weight percent and may have a thickness greater than 100 angstroms, and preferably between 1000 angstroms and 10 μm. Alternatively, the third metal layer may comprise platinum with greater than 90 weight percent, and, preferably, greater than 97 weight percent and may have a thickness greater than 100 angstroms, and preferably between 1000 angstroms and 1 μm. Alternatively, the third metal layer may comprise palladium with greater than 90 weight percent, and, preferably, greater than 97 weight percent and may have a thickness greater than 100 angstroms, and preferably between 1000 angstroms and 10 μm. Alternatively, the third metal layer may comprise rhodium with greater than 90 weight percent, and, preferably, greater than 97 weight percent and may have a thickness greater than 100 angstroms, and preferably between 1000 angstroms and 10 μm. Alternatively, the third metal layer may comprise ruthenium with greater than 90 weight percent, and, preferably, greater than 97 weight percent and may have a thickness greater than 100 angstroms, and preferably between 1000 angstroms and 10 μm. Alternatively, the third metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first, second or third metal layer is greater than 1 μm, an electroplating process is preferably used to form the first, second or third metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as palladium, can be sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 252*b*, next electroplating or electroless plating a second metal layer on the first metal layer, and then electroplating or electroless plating a third metal layer on the second metal layer. The first metal layer may comprise palladium with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer may comprise gold with greater than 90 weight percent, and, preferably, greater than 97 weight percent, for example, and may have a thickness greater than 0.01 μm (0.01 micrometer), and preferably between 0.1 m (0.1 micrometer) and 10 μm (10 micrometers). Alternatively, the third metal layer may comprise silver with greater than 90 weight percent, and, preferably, greater than 97 weight percent and may have a thickness greater than 100 angstroms, and preferably between 1000 angstroms and 10 μm. Alternatively, the third metal layer may comprise copper with greater than 90 weight percent, and, preferably, greater than 97 weight percent and may have a thickness greater than 100 angstroms, and preferably between 1000 angstroms and 10 μm. Alternatively, the third metal layer may comprise platinum with greater than 90 weight percent, and, preferably, greater than 97 weight percent and may have a thickness greater than 100 angstroms, and preferably between 1000 angstroms and 1 μm. Alternatively, the third metal layer may comprise palladium with greater than 90 weight percent, and, preferably, greater than 97 weight percent and may have a thickness greater than 100 angstroms, and preferably between 1000 angstroms and 10 μm. Alternatively, the third metal layer may comprise rhodium with greater than 90 weight percent, and, preferably, greater than 97 weight percent and may have a thickness greater than 100 angstroms, and preferably between 1000 angstroms and 10 μm. Alternatively, the third metal layer may comprise ruthenium with greater than 90 weight percent, and, preferably, greater than 97 weight percent and may have a thickness greater than 100 angstroms, and preferably between 1000 angstroms and 10 μm. Alternatively, the third metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first, second or third metal layer is greater than 1 μm, an electroplating process is preferably used to form the first, second or third metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as rhodium, can be sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 252*b*, next electroplating or electroless plating a second metal layer on the first metal layer, and then electroplating or electroless plating a third metal layer on the second metal layer. The first metal layer may comprise rhodium with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer may comprise silver with greater than 90 weight percent, and, preferably, greater than 97 weight percent and may have a thickness greater than 100 angstroms, and preferably between 1000 angstroms and 10 μm. Alternatively, the third metal layer may comprise copper with greater than 90 weight percent, and, preferably, greater than 97 weight percent and may have a thickness greater than 100 angstroms, and preferably between 1000 angstroms and 10 μm. Alternatively, the third metal layer may comprise platinum with greater than 90 weight percent, and, preferably, greater than 97 weight percent and may have a thickness greater than 100 angstroms, and preferably between 1000 angstroms and 1 μm. Alternatively, the third metal layer may comprise palladium with greater than 90 weight percent, and, preferably, greater than 97 weight percent and may have a thickness greater than 100 angstroms, and preferably between 1000 angstroms and 10 μm. Alternatively, the third metal layer may comprise rhodium with greater than 90 weight percent, and, preferably, greater than 97 weight percent and may have a thickness greater than 100 angstroms, and preferably between 1000 angstroms and 10 μm. Alternatively, the third metal layer may comprise ruthenium with greater than 90 weight percent, and, preferably, greater than 97 weight percent and may have a thickness greater than 100 angstroms, and preferably between 1000 angstroms and 10 μm. Alternatively, the third metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first, second or third metal layer is greater than 1 μm, an electroplating process is preferably used to form the first, second or third metal layer.

Alternatively, the adhesion/barrier layer 2521*a* may comprise chromium, a chromium-copper alloy, titanium, a titanium-tungsten alloy, titanium nitride, tantalum or tantalum nitride, for example. The seed layer 2521*b*, such as ruthenium, can be sputtered, electroless plated or electroplated on the adhesion/barrier layer 2521*a* and next the bulk metal layer 254 is electroplated or electroless plated on the seed layer 2521*b*. The bulk metal layer 254 is formed by electroplating or electroless plating a first metal layer on the seed layer 252*b*, next electroplating or electroless plating a second metal layer on the first metal layer, and then electroplating or electroless plating a third metal layer on the second metal layer. The first metal layer may comprise ruthenium with greater than 90 weight percent, and, preferably, greater than 97 weight percent and may have a thickness greater than 1 μm (1 micrometer), and preferably between 2 μm (2 micrometers) and 30 μm (30 micrometers). The second metal layer may comprise nickel with greater than 90 weight percent, and, preferably, greater than 97 weight percent, for example, and may have a thickness greater than 0.5 μm (0.5 micrometer), and preferably between 1 μm (1 micrometer) and 10 μm (10 micrometers). The third metal layer may comprise gold with greater than 90 weight percent, and, preferably, greater than 97 weight percent, for example, and may have a thickness greater than 0.01 μm (0.01 micrometer), and preferably between 0.1 μm (0.1 micrometer) and 10 μm (10 micrometers). Alternatively, the third metal layer may comprise silver with greater than 90 weight percent, and, preferably, greater than 97 weight percent and may have a thickness greater than 100 angstroms, and preferably between 1000 angstroms and 10 μm. Alternatively, the third metal layer may comprise copper with greater than 90 weight percent, and, preferably, greater than 97 weight percent and may have a thickness greater than 100 angstroms, and preferably between 1000 angstroms and 10 μm. Alternatively, the third metal layer may comprise platinum with greater than 90 weight percent, and, preferably, greater than 97 weight percent and may have a thickness greater than 100 angstroms, and preferably between 1000 angstroms and 1 μm. Alternatively, the third metal layer may comprise palladium with greater than 90 weight percent, and, preferably, greater than 97 weight percent and may have a thickness greater than 100 angstroms, and preferably between 1000 angstroms and 10 μm. Alternatively, the third metal layer may comprise rhodium with greater than 90 weight percent, and, preferably, greater than 97 weight percent and may have a thickness greater than 100 angstroms, and preferably between 1000 angstroms and 10 μm. Alternatively, the third metal layer may comprise ruthenium with greater than 90 weight percent, and, preferably, greater than 97 weight percent and may have a thickness greater than 100 angstroms, and preferably between 1000 angstroms and 10 μm. Alternatively, the third metal layer may comprise a lead-containing solder material, such as tin-lead alloy, or a lead-free solder material, such as tin-silver alloy or tin-silver-copper alloy and may have a thickness greater than 1 μm and, preferably, between 5 μm and 300 μm. If the thickness of the first, second or third metal layer is greater than 1 μm, an electroplating process is preferably used to form the first, second or third metal layer.

3. Relationships among the Thickness of Bumps, Circuit/Metal Traces, and Polymer Layers As shown in FIG. 138, the circuit/metal trace 250 is formed on the passivation layer 240. The bump or pad 280 is formed on the thin-film circuit layer 236 exposed by the opening 242 in the passivation layer 240. The bump or pad 280 has a thicknesses b55 substantially equal to the thickness c of the circuit/metal trace 250.

Figure 140:
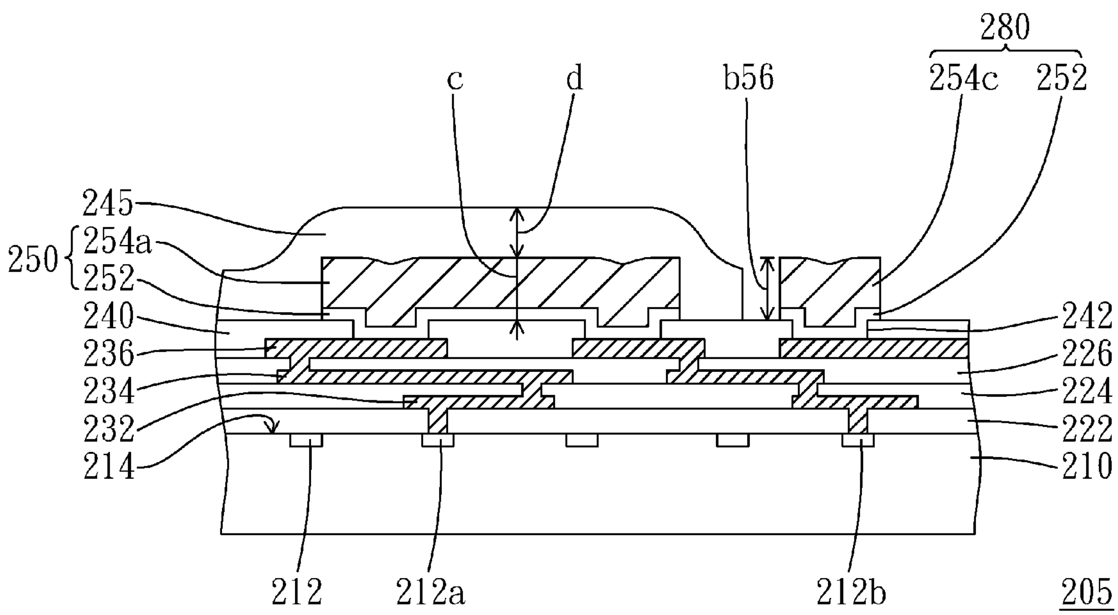
FIGS. 140-163 are schematic cross-sectional views illustrating various semiconductor chips according to the present invention.

As shown in FIG. 140, a polymer layer 245 is formed on the circuit/metal trace 250 to protect the circuit/metal layer 250. The circuit/metal layer 250 is formed on the passivation layer 240 and connected to the thin-film metal layer 236 via the opening 242 in the passivation layer 240. The thickness b56 of the bump or pad 280 can be substantially equal to the thickness c of the circuit/metal layer 250 and less than the thickness (c+d) of the circuit/metal trace 250 plus the polymer layer 245.

Figure 141:
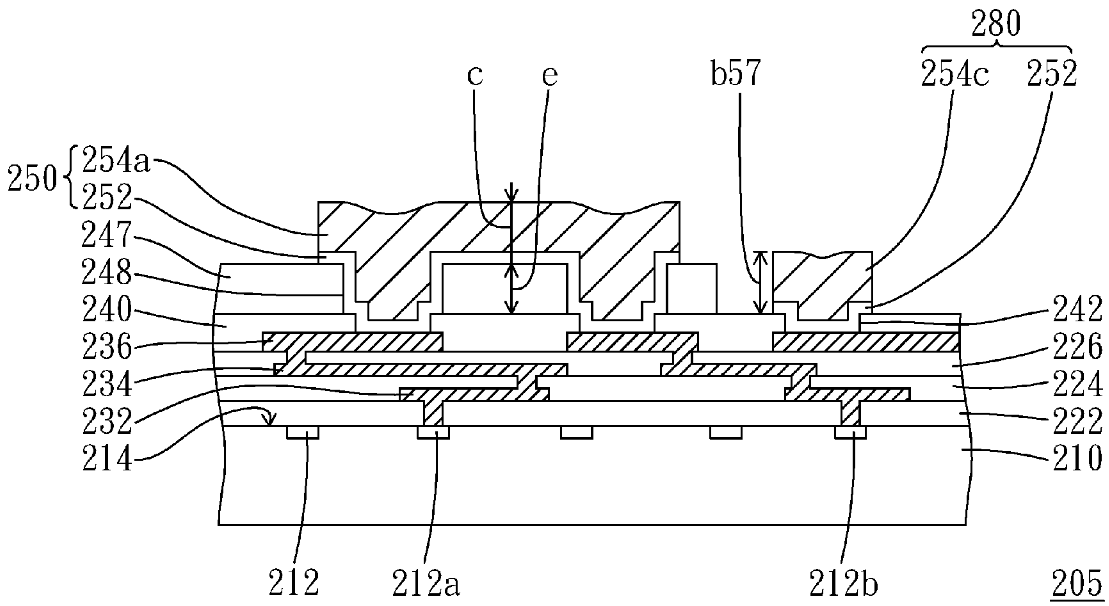

In FIG. 141, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/metal trace 250 is formed on the polymer layer 247 and connected to the thin-film metal layer 236 via the openings 248 and 242. The bump or pad 280 is formed on the thin-film circuit layer 236 exposed by the opening 242 in the passivation layer 240. The thickness b57 of the bump or pad 280 is substantially equal to the thickness c of the circuit/metal layer 250 and less than the thickness (c+e) of the circuit/metal trace 250 plus the polymer layer 247.

Figure 142:
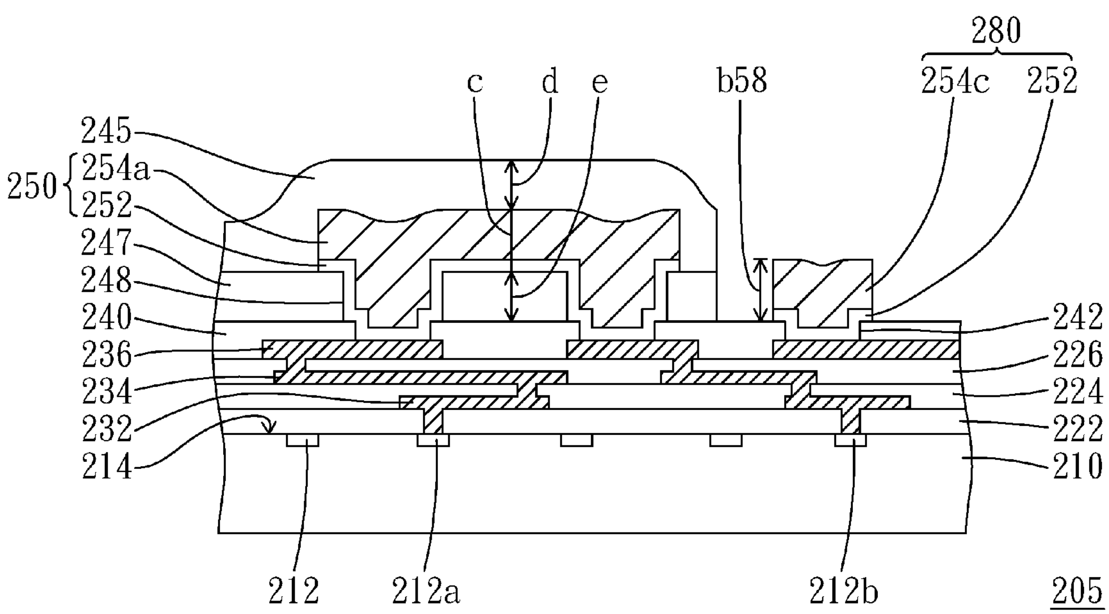

In FIG. 142, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/metal trace 250 is formed on the polymer layer 247 and connected to the thin-film metal layer 236 via the openings 248 and 242. A polymer layer 245 is formed on the circuit/metal trace 250 to protect the circuit/metal layer 250. The bump or pad 280 is formed on the thin-film circuit layer 236 exposed by the opening 242 in the passivation layer 240. The thickness b58 of the bump or pad 280 is substantially equal to the thickness c of the circuit/metal layer 250 and less than the thickness (c+d+e) of the circuit/metal trace 250 plus the polymer layers 245 and 247.

Figure 143:
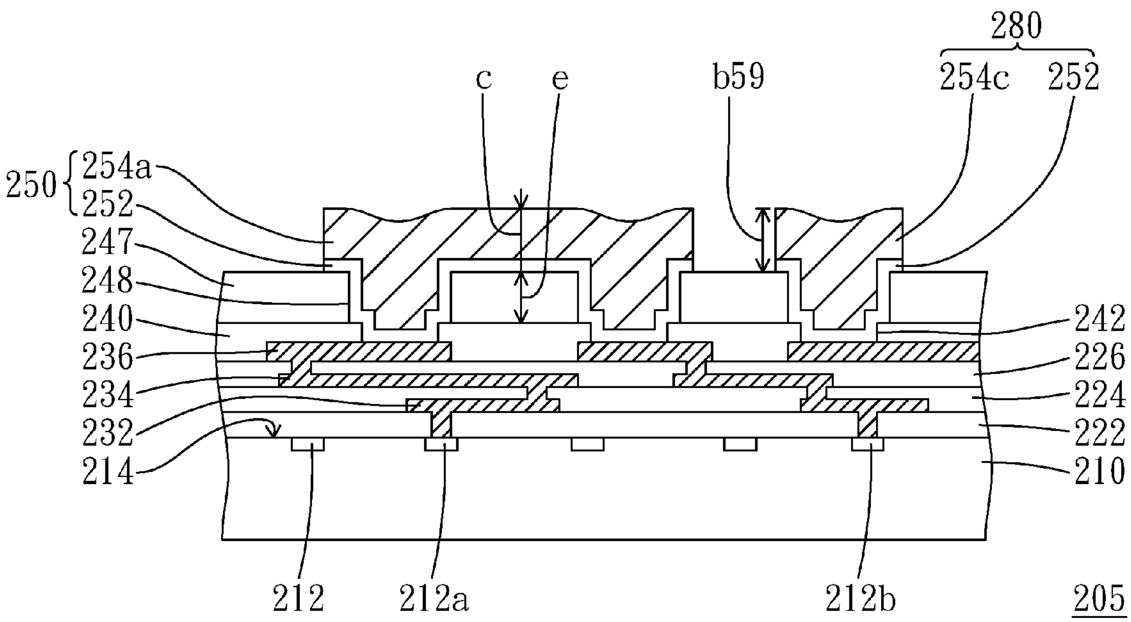

In FIG. 143, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. The bump or pad 280 is formed on the thin-film circuit layer 236 exposed by the openings 248 and 242. The thickness b59 of the bump or pad 280 projecting from the opening 248 in the polymer layer 247 is substantially equal to the thickness c of the circuit/metal trace 250.

In FIG. 144, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. A polymer layer 245 is deposited on the circuit/metal trace 250 to protect the circuit/metal trace 250. The bump or pad 280 is formed on the thin-film circuit layer 236 exposed by the openings 248 and 242. The thickness b60 of the bump or pad 280 projecting from the opening 248 is substantially equal to the thickness c of the circuit/metal trace 250 and less than the thickness (c+d) of the circuit/metal trace 250 plus the polymer layer 245.

In the embodiments of the present invention depicted in FIGS. 140-144, the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 140-144 can be deposited following the above-mentioned process as illustrated in FIGS. 135-138.

4. Functions of Circuit/Metal Traces

A. Used for Intra-Chip Signal Transmission

Referring now to FIGS. 138 and 140-144, the circuit/metal trace 250 can function intra-chip signal transmission. A signal can be transmitted from an electronic device, such as 212*a*, to the circuit/metal trace 250 sequentially via the thin-film circuit layers 232, 234, and 236, and then via the opening 242 in the passivation layer 240. Thereafter, the signal can be transmitted from circuit/metal trace 250 to the other electronic device, such as 212*b*, via the opening 242 in the passivation layer 240 and then sequentially via the thin-film circuit layers 236, 234, and 232.

B. Used for Power Bus or Ground Bus

FIGS. 145-150 are schematic cross-sectional views of the semiconductor chip in the second embodiment of the present invention. In FIGS. 145-150, the circuit/metal trace 250 acting as a power bus or plane can be electrically connected to the thin-film power bus or plane 235 under the passivation layer 240 or to the power supply. Alternatively, the circuit/metal trace 250 acting as a ground bus or plane can be electrically connected to the thin-film ground bus or plane 235 under the passivation layer 240 or to a ground reference.

Figure 145:
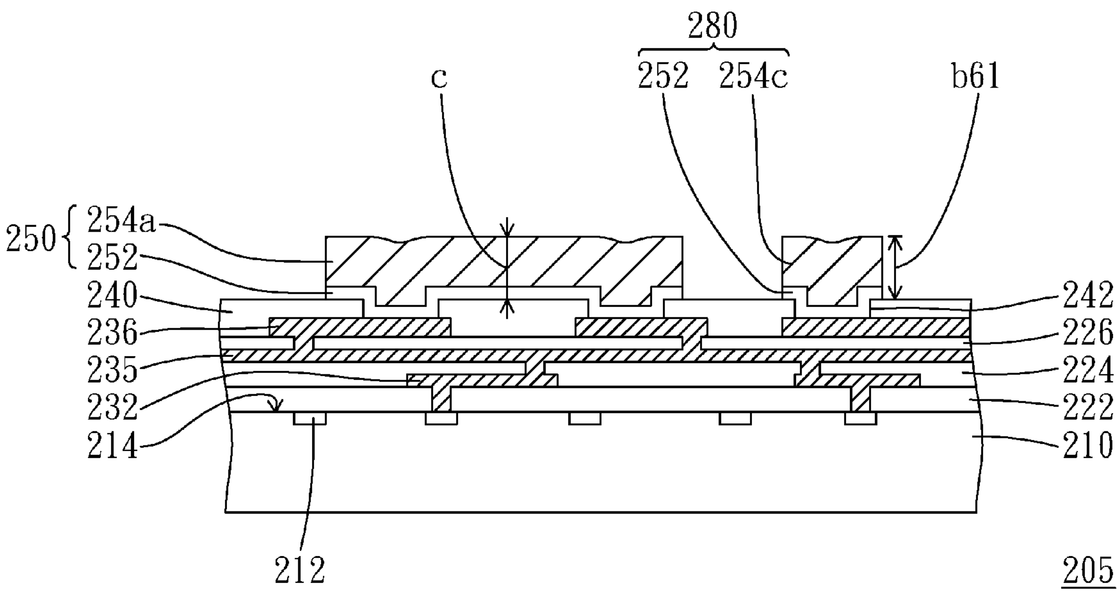

Referring now to FIG. 145, the power bus or plane or ground bus or plane 250 is formed on the passivation layer 240 and connected to the thin-film circuit layer 236 exposed by the opening 242 in the passivation layer 240. The bump or pad 280 is formed on the thin-film circuit layer 236 exposed by the opening 242 in the passivation layer 240. The thickness b61 of the bump or pad 280 is substantially equivalent to the thickness c of the power bus or plane or ground bus or plane 250.

Figure 146:
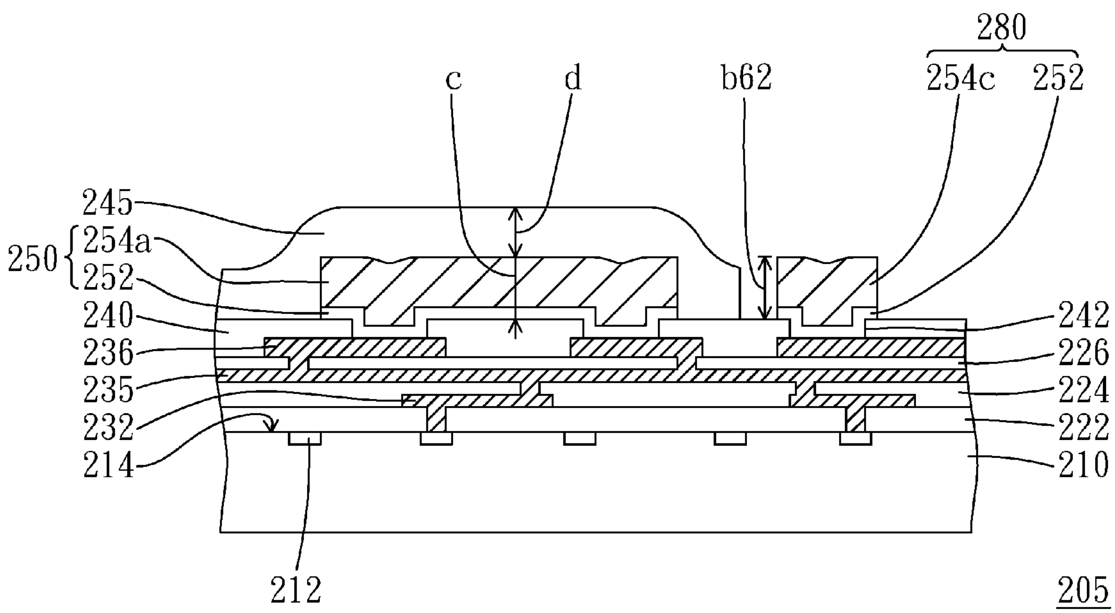

In FIG. 146, a polymer layer 245 is formed on the power bus or plane or ground bus or plane 250 to protect the power bus or plane or ground bus or plane 250. The power bus or plane or ground bus or plane 250 is formed on the passivation layer 240 and connected to the thin-film metal layer 236 via the opening 242 in the passivation layer 240. The bump or pad 280 is formed on the thin-film circuit layer 236 exposed by the opening 242 in the passivation layer 240. The thickness b62 of the bump or pad 280 is substantially equal to the thickness c of the power bus or plane or ground bus or plane 250 and less than the thickness (c+d) of the power bus or plane or ground bus or plane 250 plus the polymer layer 245.

Figure 147:
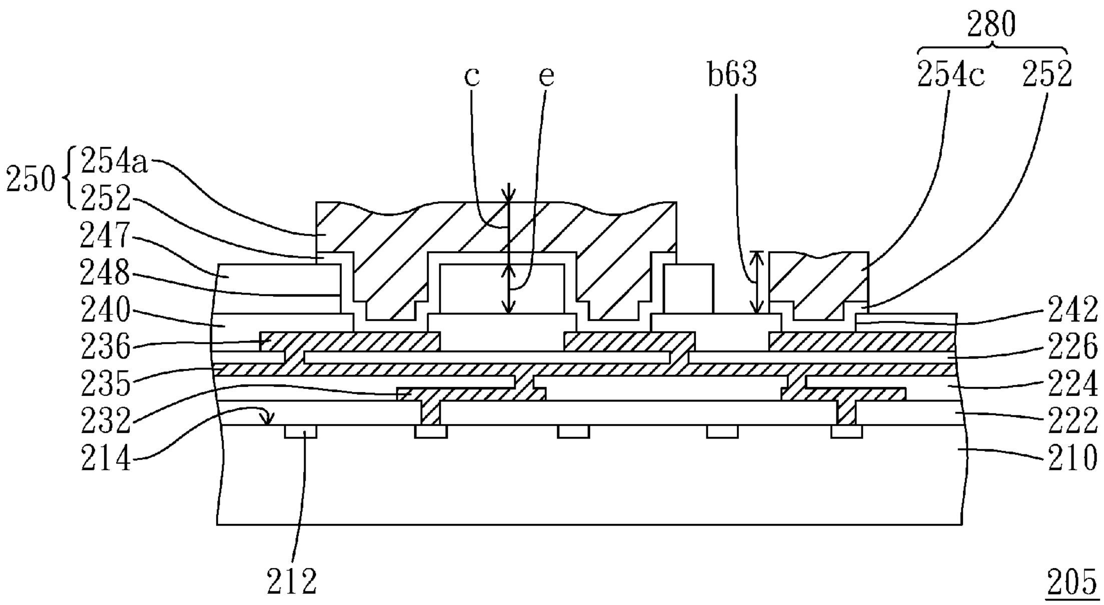

In FIG. 147, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The power bus or plane or ground bus or plane 250 is formed on the polymer layer 247 and connected to the thin-film metal layer 236 via the openings 248 and 242. The bump or pad 280 is formed on the thin-film circuit layer 236 exposed by the opening 242 in the passivation layer 240. The thickness b63 of the bump or pad 280 is substantially equal to the thickness c of the power bus or plane or ground bus or plane 250 and less than the thickness (c+e) of the power bus or plane or ground bus or plane 250 plus the polymer layer 247.

Figure 148:
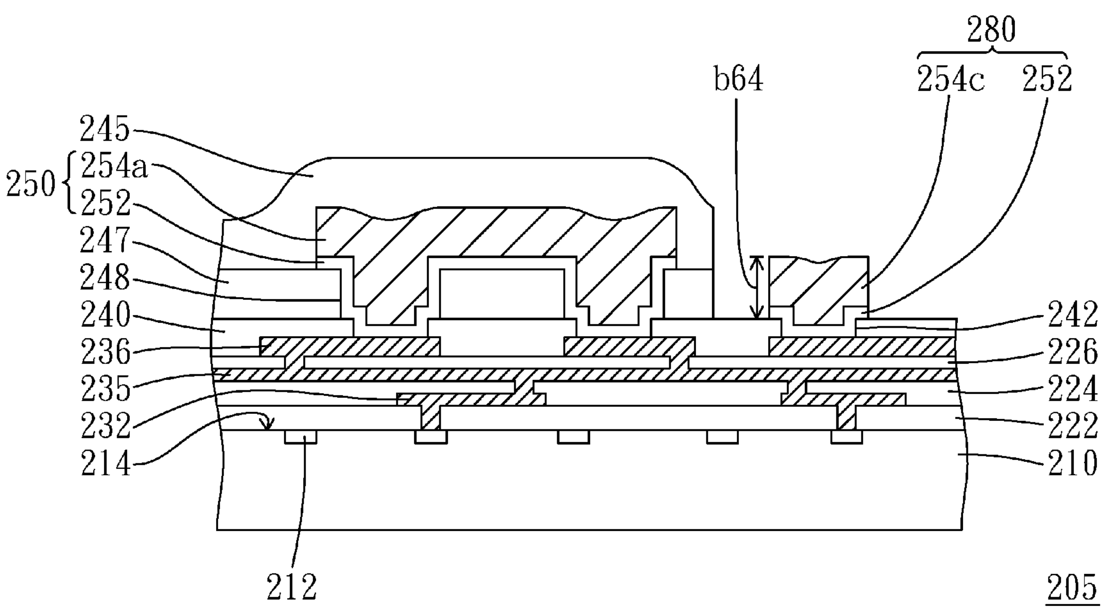

In FIG. 148, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The power bus or plane or ground bus or plane 250 is formed on the polymer layer 247 and connected to the thin-film metal layer 236 via the openings 248 and 242. A polymer layer 245 is formed on the circuit/metal trace 250 to protect the power bus or plane or ground bus or plane 250. The bump or pad 280 is formed on the thin-film circuit layer 236 exposed by the opening 242 in the passivation layer 240. The thickness b64 of the bump or pad 280 is substantially equal to the thickness c of the power bus or plane or ground bus or plane 250 and less than the thickness (c+d+e) of the power bus or plane or ground bus or plane 250 plus the polymer layers 245 and 247.

Figure 149:
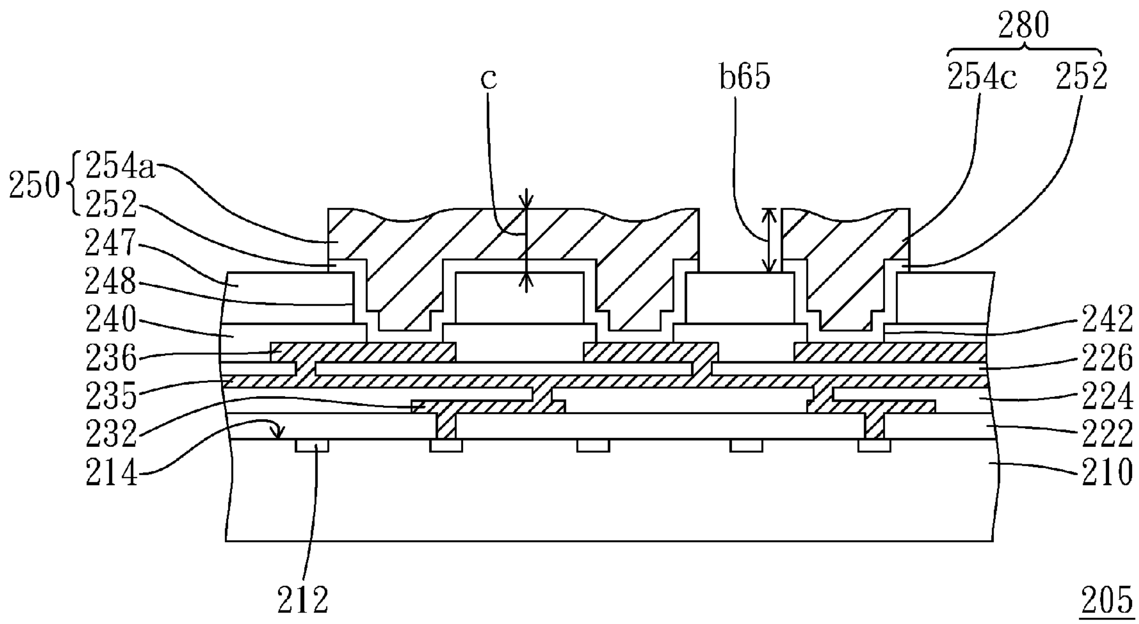

In FIG. 149, a polymer layer 247 is deposited on the passivation layer 240. Multiple openings 248 in the polymer layer 247 expose the thin-film circuit layer 236. The power bus or plane or ground bus or plane 250 is formed on the polymer layer 247 and is connected to the thin-film circuit layer 236 exposed by the openings 248 and 242. The bump or pad 280 is formed on the thin-film circuit layer 236 exposed by the openings 248 and 242. The thickness b65 of the bump or pad 280 projecting from the opening 248 in the polymer layer 247 is substantially equal to the thickness c of the power bus or plane or ground bus or plane 250.

Figure 150:
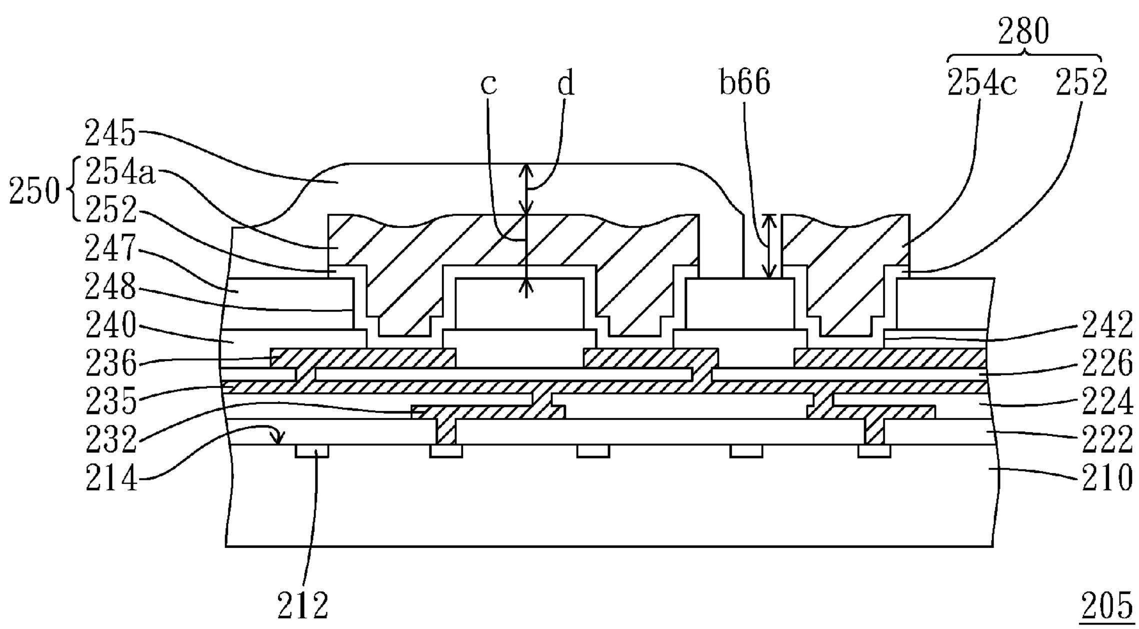

In FIG. 150, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. A polymer layer 245 is deposited on the circuit/metal trace 250 to protect the circuit/metal trace 250. The bump or pad 280 is formed on the thin-film circuit layer 236 exposed by the openings 248 and 242. The thickness b66 of the bump or pad 280 projecting from the opening 248 is substantially equal to the thickness c of the circuit/metal trace 250 and less than the thickness (c+d) of the circuit/metal trace 250 plus the polymer layer 245.

In the embodiments of the present invention depicted in FIGS. 145-150, the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 145-150 can be deposited following the above-mentioned process as illustrated in FIGS. 135-138.

C. Metal/Circuit Trace Connected to Bump or Pad via Thin-Film Metal Layer under Passivation Layer FIGS. 151-157 are schematic cross-sectional views of the semiconductor chip in the third embodiment of the present invention. The circuit/metal trace 250 is connected to the bump 280 via the thin-film circuit layer 236 under the passivation layer 240, wherein the circuit/metal trace 250 can be used for signal transmission or can act as a power bus or plane or a ground bus or plane. The thin-film circuit layer 236 has a connecting line 237 and two connection points 237*a* and 237*b*, wherein the connecting line 237 connects the connection points 237*a* and 237*b*. The circuit/metal trace 250 is formed over the passivation layer 240 and is electrically connected to the connection point 237*a* exposed by the opening 242 in the passivation layer 240. The bump or pad 280 is formed on the connection point 237*b* exposed by the opening 242. Referring now to FIG. 152, a top view of the connection line 237 and connection points 237*a* and 237*b* is shown. The length s of the connecting lines 237 is less than 5000 μm and, preferably, less than 500 μm.

Referring to FIGS. 151 to 157, when the circuit/metal trace 250 is used for signal transmission, a signal can be transmitted from one of the electronic devices, such as 212*a*, to the circuit/metal trace 250 via the thin-film circuit layers 232, 234 and 236 and then through the opening 242 in the passivation layer 240. Thereafter, the signal is transmitted from the circuit/metal trace 250 to the bump or pad 280 through the connecting line 237 under the passivation layer 240.

Alternatively, a signal can be transmitted from the bump or pad 280 to the circuit/metal trace 250 through the connecting line 237 under the passivation layer 240. Thereafter, the signal is transmitted from the circuit/metal trace 250 to one of the electronic devices, such as 212*a*, through the opening 242 in the passivation layer 240 and then via the thin-film circuit layers 236, 234 and 232.

When the circuit/metal trace 250 acts as a power bus or plane, the circuit/metal trace 250 can be connected to a power bus or plane of a glass substrate, a film substrate, a tape or a printed circuit substrate through the bump or pad 280 and the connection line 237.

When the circuit/metal trace 250 acts as a ground bus or plane, the circuit/metal trace 250 can be connected to a ground bus or plane of a glass substrate, a film substrate, a tape or a printed circuit substrate through the bump or pad 280 and the connection line 237.

Figure 151:
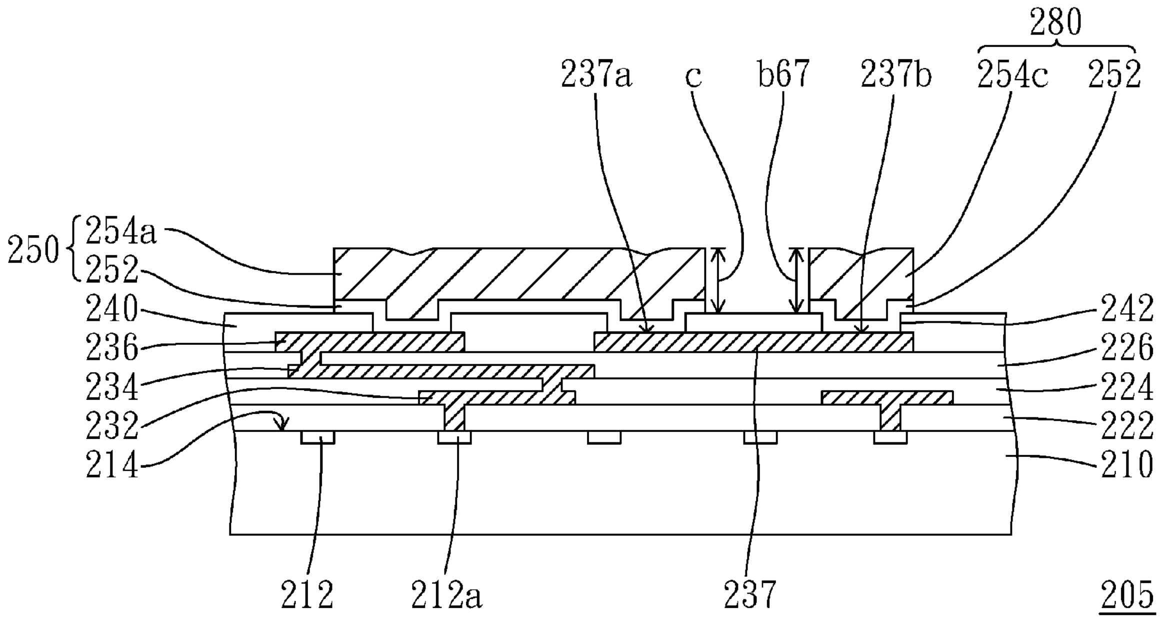
Figure 152:
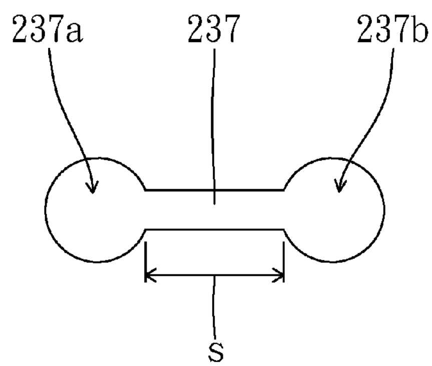

Referring now to FIG. 151, the circuit/metal trace 250 is formed on the passivation layer 240 and connected to the thin-film circuit layer 236 exposed by the opening 242 in the passivation layer 240. The bump or pad 280 is formed on the thin-film circuit layer 236 exposed by the opening 242 in the passivation layer 240. The thickness b67 of the bump or pad 280 is substantially equivalent to the thickness c of the circuit/metal trace 250.

Figure 153:
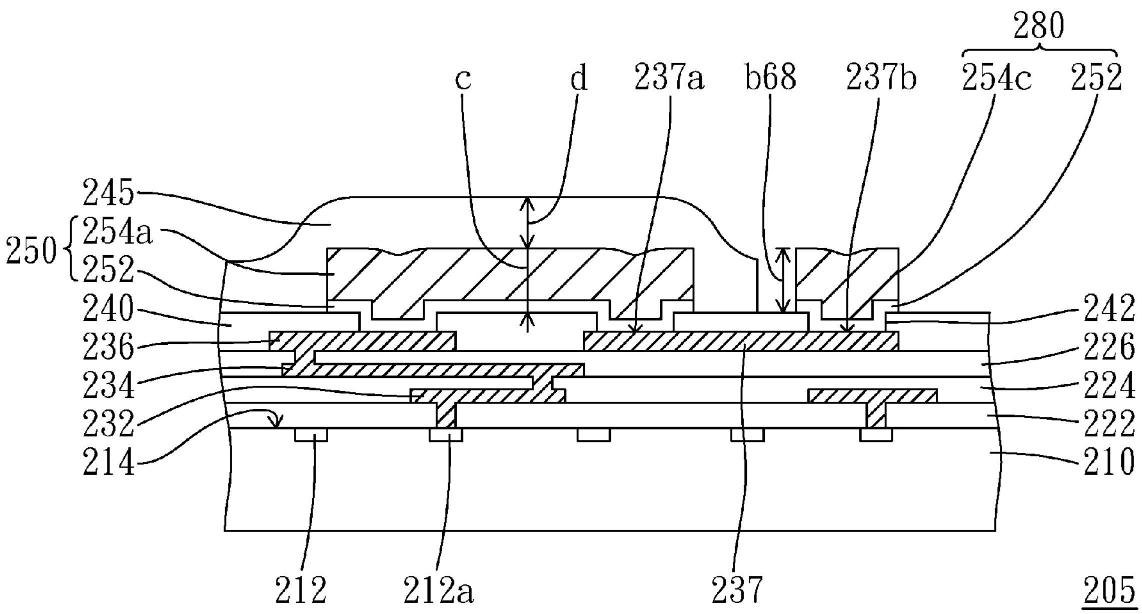

In FIG. 153, a polymer layer 245 is formed on the circuit/metal trace 250 to protect the circuit/metal trace 250. The circuit/metal trace 250 is formed on the passivation layer 240 and connected to the thin-film metal layer 236 via the opening 242 in the passivation layer 240. The bump or pad 280 is formed on the thin-film circuit layer 236 exposed by the opening 242 in the passivation layer 240. The thickness b68 of the bump or pad 280 is substantially equal to the thickness c of the circuit/metal trace 250 and less than the thickness (c+d) of the circuit/metal trace 250 plus the polymer layer 245.

Figure 154:
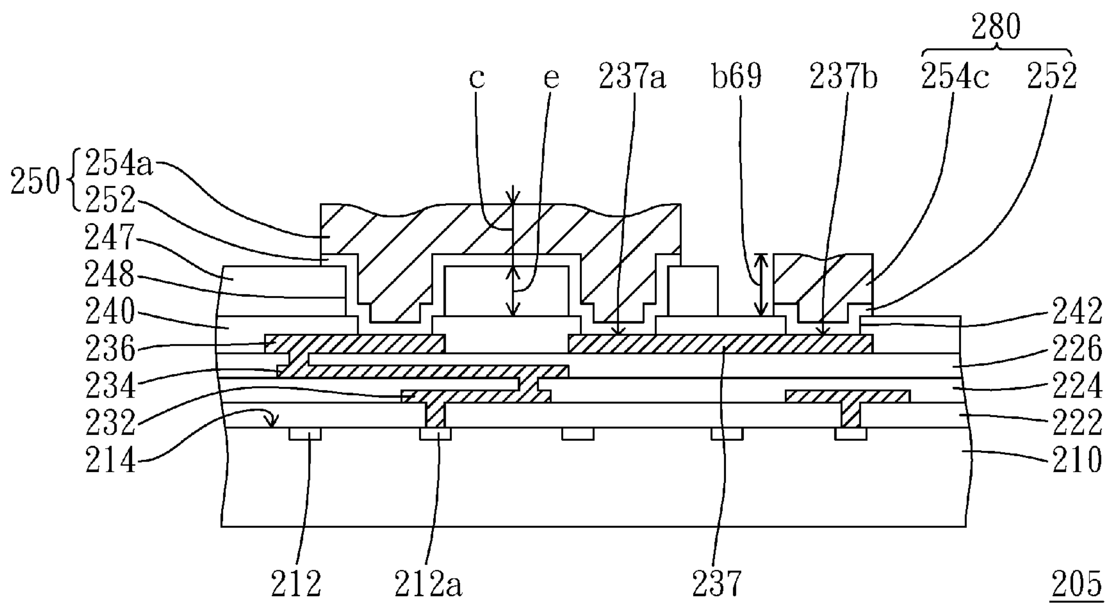

In FIG. 154, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/metal layer 250 is formed on the polymer layer 247 and connected to the thin-film metal layer 236 via the openings 248 and 242. The bump or pad 280 is formed on the thin-film circuit layer 236 exposed by the opening 242 in the passivation layer 240. The thickness b69 of the bump or pad 280 is substantially equal to the thickness c of the circuit/metal layer 250 and less than the thickness (c+e) of the circuit/metal trace 250 plus the polymer layer 247.

Figure 155:
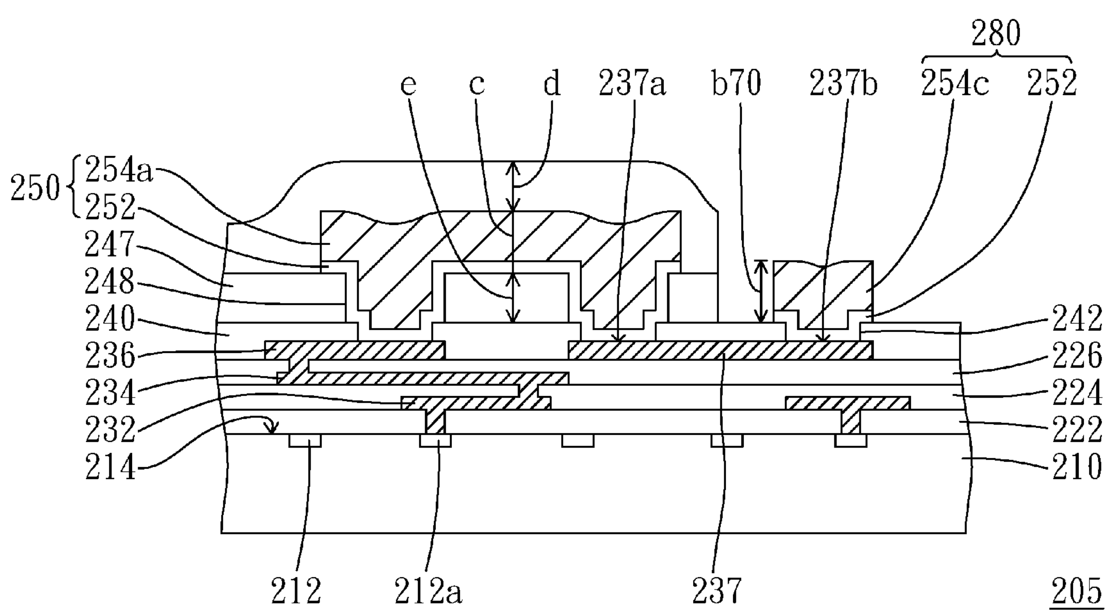

In FIG. 155, a polymer layer 247 is deposited on the passivation layer 240. Multiple openings 248 in the polymer layer 247 is aligned with the openings 242 in the passivation layer 240 and expose the thin-film circuit layer 236 exposed by the openings 242 in the passivation layer 240. The circuit/ metal layer 250 is formed on the polymer layer 247 and connected to the thin-film metal layer 236 via the openings 248 and 242. A polymer layer 245 is formed on the circuit/metal trace 250 to protect the circuit/metal layer 250. The bump or pad 280 is formed on the thin-film circuit layer 236 exposed by the opening 242 in the passivation layer 240. The thickness b70 of the bump or pad 280 is substantially equal to the thickness c of the circuit/metal layer 250 and less than the thickness (c+d+e) of the circuit/metal trace 250 plus the polymer layers 245 and 247.

Figure 156:
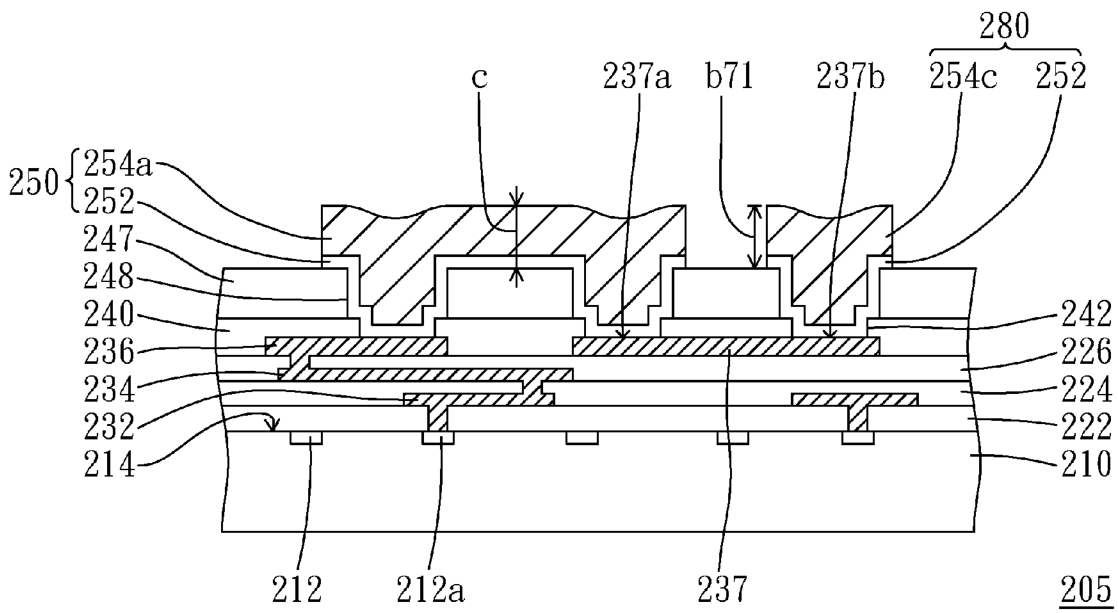

In FIG. 156, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. The bump or pad 280 is formed on the thin-film circuit layer 236 exposed by the openings 248 and 242. The thickness b71 of the bump or pad 280 projecting from the opening 248 is substantially equal to the thickness c of the circuit/metal trace 250.

Figure 157:
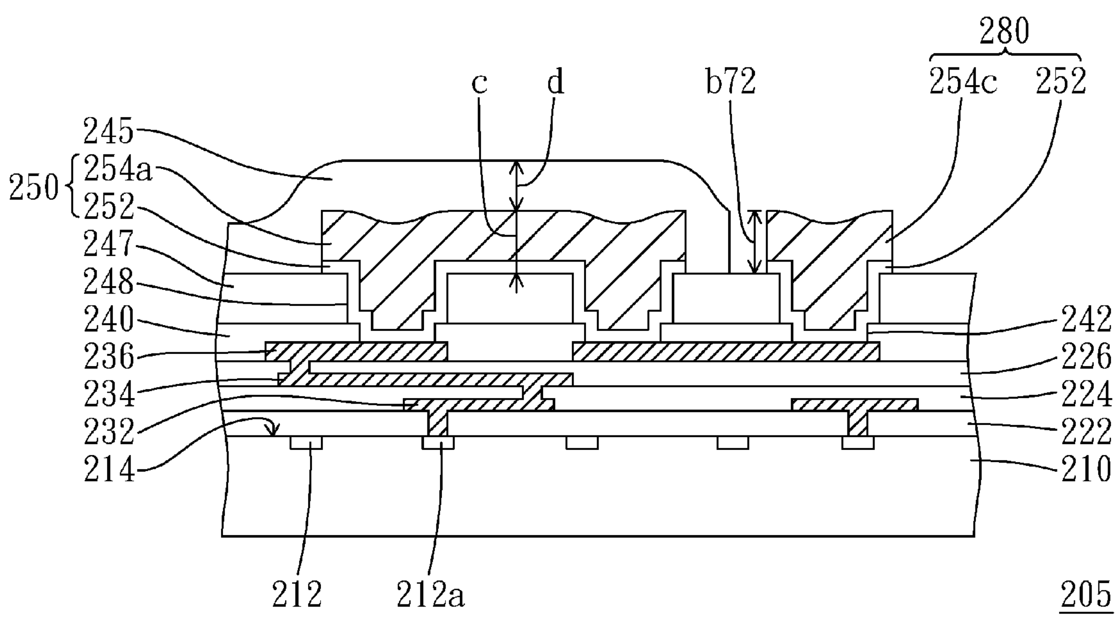

In FIG. 157, a polymer layer 247 is deposited on the passivation layer 240. Multiple openings 248 in the polymer layer 247 expose the thin-film circuit layer 236. The circuit/metal trace 250 is formed on the polymer layer 247 and is connected to the thin-film circuit layer 236 exposed by the openings 248 and 242. A polymer layer 245 is deposited on the circuit/metal trace 250 to protect the circuit/metal trace 250. The bump or pad 280 is formed on the thin-film circuit layer 236 exposed by the openings 248 and 242. The thickness b72 of the bump or pad 280 projecting from the opening 248 is substantially equal to the thickness c of the circuit/metal trace 250 and less than the thickness (c+d) of the circuit/metal trace 250 plus the polymer layer 245.

In the embodiments of the present invention depicted in FIGS. 151-157, the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 151-157 can be deposited following the above-mentioned process as illustrated in FIGS. 135-138.

D. Circuit/Metal Trace Used for Signal Transmission or Acting as Power Bus or Plane or Ground Bus or Plane for External Circuitry FIGS. 158-163 are schematic cross-sectional views of the semiconductor chip in the third embodiment of the present invention. In FIGS. 122-134, the circuit/metal trace 250 is disconnected from the thin-film circuit layers 232, 234 and 236. The circuit/metal trace 250 may be used for signal transmission for an external circuitry, such as a glass substrate, film substrate, or printed circuit board, or may act as a power bus or plane or a ground bus or plane for the external circuitry. A wire-bonding process can be used to electrically connect the circuit/metal trace 250 to the external circuitry. Alternatively, bumps or solder balls can be formed to connect the external circuitry to the circuit/metal trace 250.

In a case that the circuit/metal trace 250 is used for signal transmission for the external circuitry, a signal can be transmitted from an electrical point of the external circuitry to another one through the circuit/metal trace 250. In another case that the circuit/metal trace 250 may act as a power bus or plane or ground bus or plane, the circuit/metal trace 250 may be connected to a power bus or plane or ground bus or plane in the external circuitry.

Figure 158:
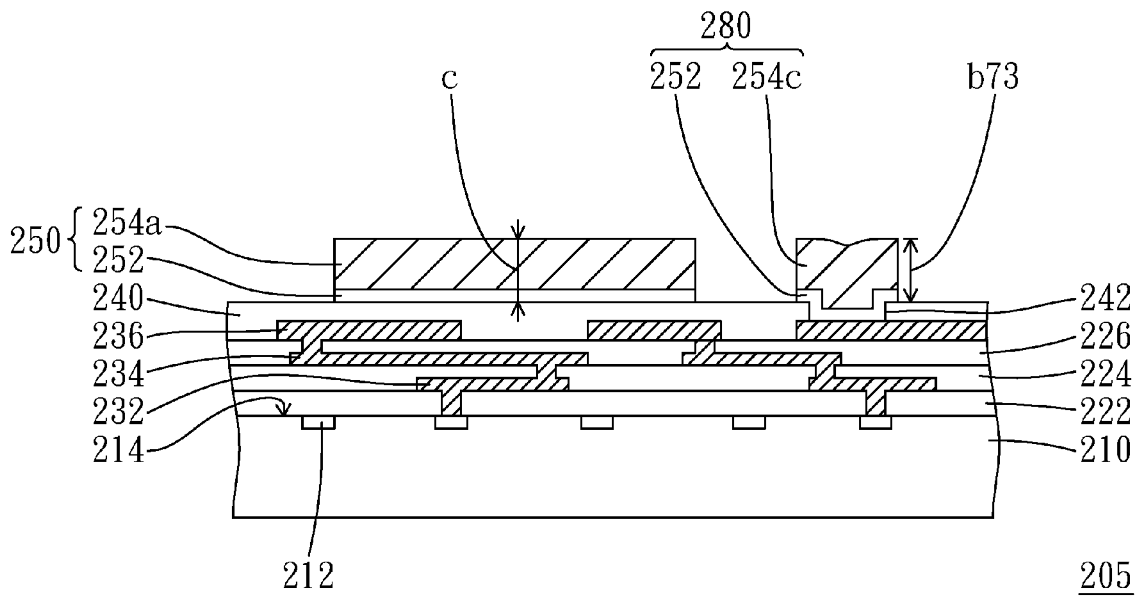

Referring now to FIG. 158, the circuit/metal trace 250 is formed on the passivation layer 240 and disconnected from the thin-film circuit layers 232, 234, and 236 under the passivation layer 240. The bump or pad 280 is formed on the thin-film circuit layer 236 exposed by the opening 242 in the passivation layer 240. The thickness b73 of the bump or pad 280 is substantially equivalent to the thickness c of the circuit/metal trace 250.

Figure 159:
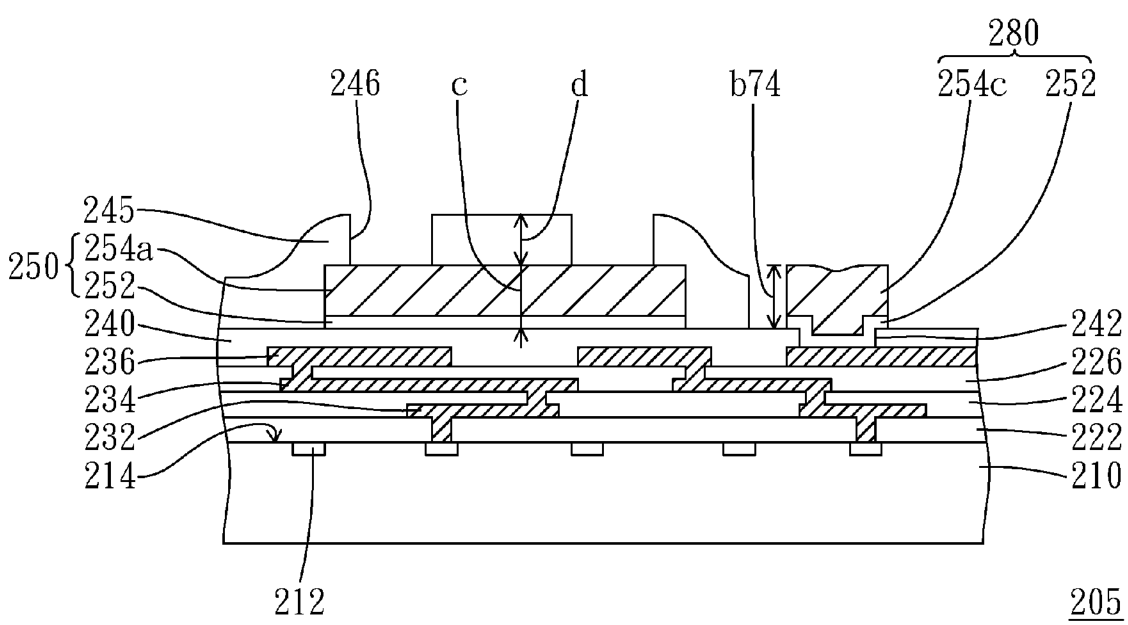

In FIG. 159, a polymer layer 245 is formed on the circuit/metal trace 250 to protect the circuit/metal trace 250. Multiple openings 246 are formed in the polymer layer 245 and expose the circuit/metal trace 250. Wire-bonding wires or bumps can be bonded to the circuit/metal trace 250 through the openings 246. The circuit/metal trace 250 is formed on the passivation layer 240 and disconnected from the thin-film circuit layers 232, 234, and 236 under the passivation layer 240. The bump or pad 280 is formed on the thin-film circuit layer 236 exposed by the opening 242 in the passivation layer 240. The thickness b74 of the bump or pad 280 is substantially equal to the thickness c of the circuit/metal trace 250 and less than the thickness (c+d) of the circuit/metal trace 250 plus the polymer layer 245.

Figure 160:
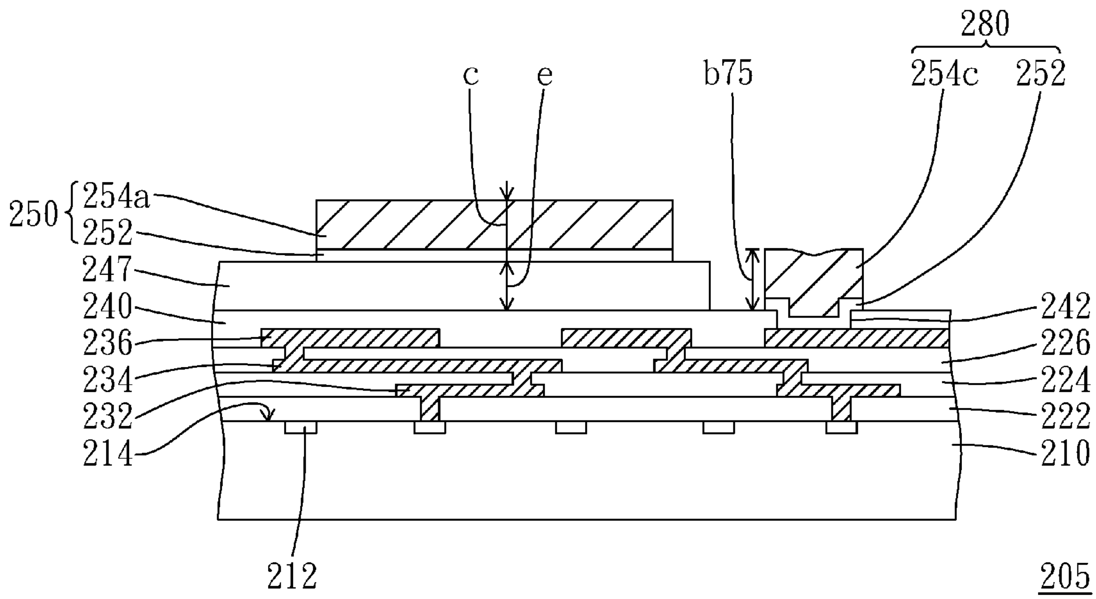

In FIG. 160, a polymer layer 247 is deposited on the passivation layer 240. The circuit/metal layer 250 is formed on the polymer layer 247 and disconnected from the thin-film circuit layers 232, 234, and 236 under the passivation layer 240. The bump or pad 280 is formed on the thin-film circuit layer 236 exposed by the opening 242 in the passivation layer 240. The thickness b75 of the bump or pad 280 is substantially equal to the thickness c of the circuit/metal layer 250 and less than the thickness (c+e) of the circuit/metal trace 250 plus the polymer layer 247.

Figure 161:
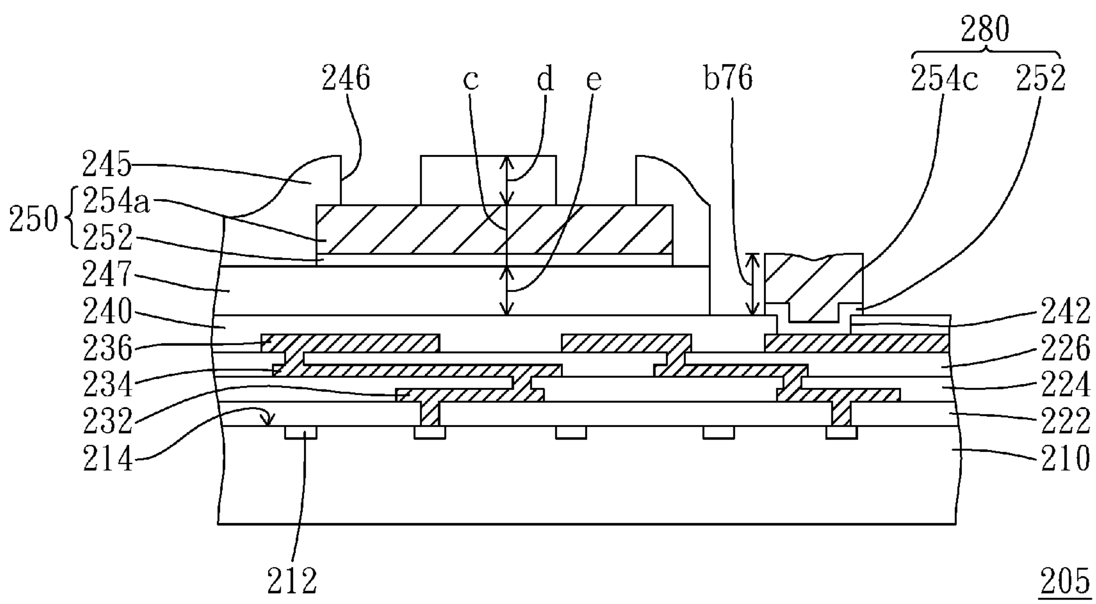

In FIG. 161, a polymer layer 247 is deposited on the passivation layer 240. The circuit/metal layer 250 is formed on the polymer layer 247 and disconnected from the thin-film metal layers 232, 234 and 236 under the passivation layer 240. A polymer layer 245 is formed on the circuit/metal trace 250 to protect the circuit/metal layer 250. Multiple openings 246 are formed in the polymer layer 245 and expose the circuit/metal layer 250. Wire-bonding wires or bumps can be bonded to the circuit/metal trace 250 through the openings 246. The bump or pad 280 is formed on the thin-film circuit layer 236 exposed by the opening 242 in the passivation layer 240. The thickness b76 of the bump or pad 280 is substantially equal to the thickness c of the circuit/metal layer 250 and less than the thickness (c+d+e) of the circuit/metal trace 250 plus the polymer layers 245 and 247.

Figure 162:
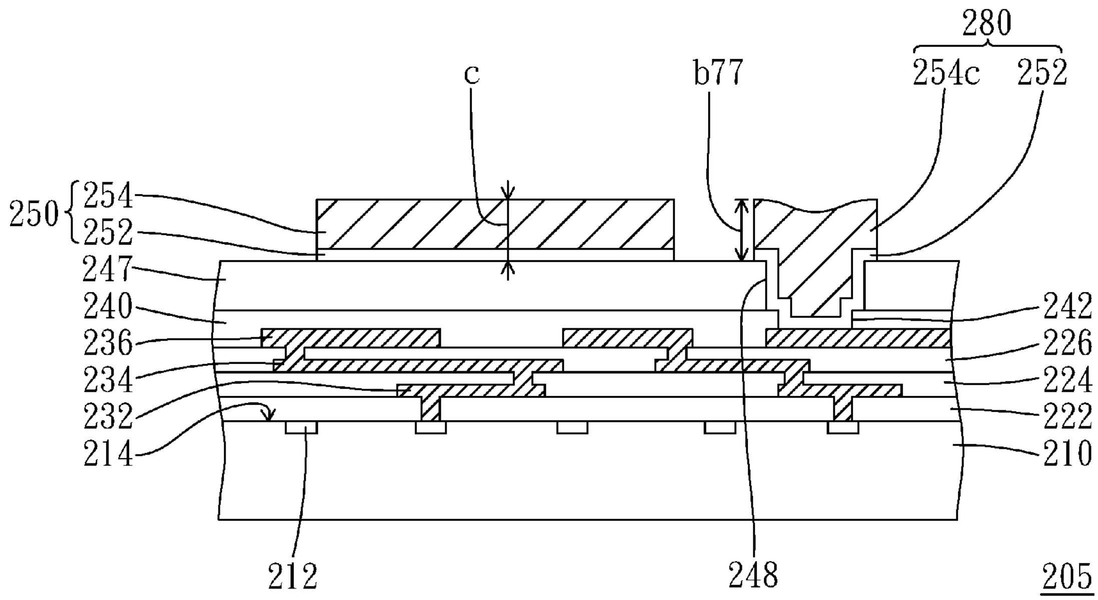

In FIG. 162, a polymer layer 247 is deposited on the passivation layer 240. The circuit/metal trace 250 is formed on the polymer layer 247 and is disconnected from the thin-film circuit layers 232, 234, and 236 under the passivation layer 240. The bump or pad 280 is formed on the thin-film circuit layer 236 exposed by the opening 242 in the passivation layer 240 and the opening 248 in the polymer layer 247. The thickness b77 of the bump or pad 280 projecting from the opening 248 is substantially equal to the thickness c of the circuit/metal trace 250.

Figure 163:
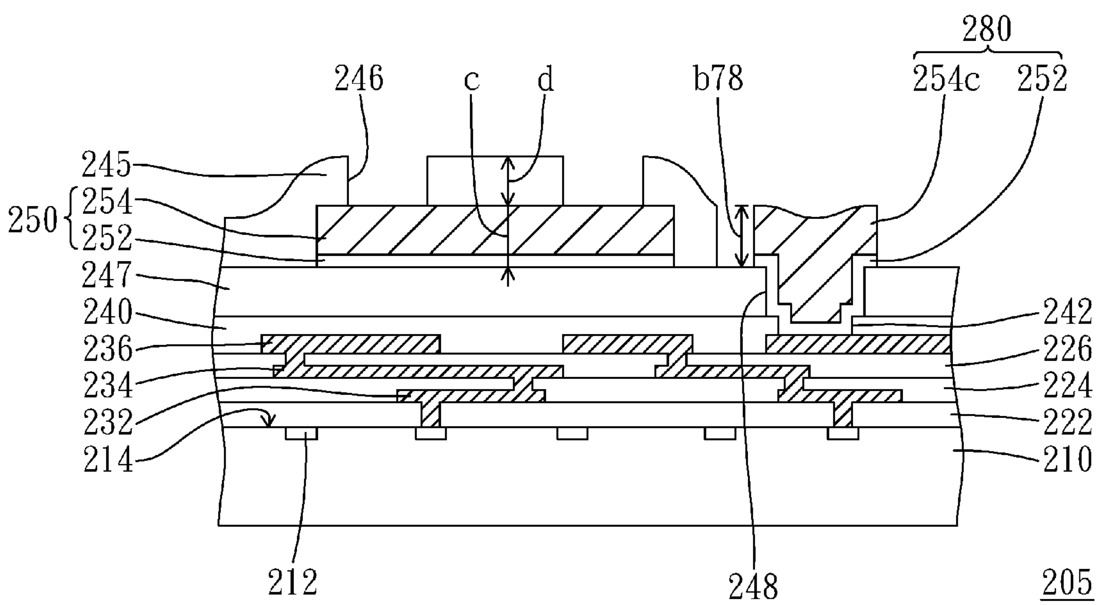

In FIG. 163, a polymer layer 247 is deposited on the passivation layer 240. The circuit/metal trace 250 is formed on the polymer layer 247 and is disconnected from the thin-film circuit layers 232, 234, and 236 under the passivation layer 240. A polymer layer 245 is deposited on the circuit/metal trace 250 to protect the circuit/metal trace 250. Multiple openings 246 are formed in the polymer layer 245 and expose the circuit/metal layer 250. Wire-bonding wires or bumps can be bonded to the circuit/metal trace 250 through the openings 246. The bump or pad 280 is formed on the thin-film circuit layer 236 exposed by the opening 242 in the passivation layer 240 and the opening 248 in the polymer layer 247. The thickness b78 of the bump or pad 280 projecting from the opening 248 is substantially equal to the thickness c of the circuit/metal trace 250 and less than the thickness (c+d) of the circuit/metal trace 250 plus the polymer layer 245.

In the embodiments of the present invention depicted in FIGS. 158-163, p the polymer layers 245 and 247 may be composed of either polyimide (PI), benzocyclobutene (BCB), parylene, porous dielectric material, elastomers or low k dielectric layer (k<2.5). The thicknesses d and e of the polymer layers 245 and 247 can be greater than 1 μm, and preferably between 2 μm and 50 μm. The circuit/metal trace or plane 250 and the bump or pad 280 shown in FIGS. 158-163 can be deposited following the above-mentioned process as illustrated in FIGS. 135-138.

CONCLUSION

The processes for forming traces or plane and for forming pads or bumps are integrated into the above-mentioned processes. The above-mentioned processes are simplified.

It will be apparent to those skilled in the art that various modifications and variations can be made to the structure of the present invention without departing from the scope or spirit of the invention. For example, it is possible that the wire-bonding pad is not electrically connected to the testing pad or to the bump pad. In view of the foregoing, it is intended that the present invention cover modifications and variations of this invention provided they fall within the scope of the following claims and their equivalents.

What is claimed is:

1. A method for fabricating a circuit component, comprising:

providing a wafer comprising a silicon substrate, a MOS transistor in or on said silicon substrate, a metallization structure over said silicon substrate, wherein said metallization structure comprises a first thin-film circuit layer and a second thin-film circuit layer over said first thin-film circuit layer, a dielectric layer between said first and second thin-film circuit layers, and a passivation layer over said metallization structure and over said dielectric layer;

forming a polymer layer on said passivation layer and over said wafer, wherein said polymer layer has a thickness between 2 and 50 micrometers and greater than that of said passivation layer;

sputtering a titanium-containing layer on said polymer layer and over said wafer;

sputtering a first gold layer on said titanium-containing layer and over said wafer;

forming a first photoresist layer on said first gold layer and over said wafer, wherein a first opening in said first photoresist layer exposes said first gold layer;

electroplating a second gold layer over said wafer and on said first gold layer exposed by said first opening;

forming a second photoresist layer on said second gold layer and over said wafer, wherein a second opening in said second photoresist layer exposes said second gold layer;

electroplating a third gold layer over said wafer and on said second gold layer exposed by said second opening;

removing said second photoresist layer;

removing said first photoresist layer; and after said electroplating said third gold layer, removing said first gold layer not under said second gold layer and removing said titanium-containing layer not under said second gold layer.

2. The method of claim 1, wherein said second gold layer has a thickness between 2 and 30 micrometers.

3. The method of claim 1, wherein said titanium-containing layer comprises tungsten.

4. The method of claim 1, wherein said third gold layer has a thickness between 7 and 30 micrometers.

5. The method of claim 1, wherein said passivation layer comprises silicon nitride.

6. The method of claim 1, wherein said polymer layer comprises polyimide.

7. The method of claim 1, wherein said forming said polymer layer comprises a spin-on-coating process and a curing process.

8. A method for fabricating a circuit component, comprising:

providing a wafer comprising a silicon substrate, a MOS transistor in or on said silicon substrate, a metallization structure over said silicon substrate, wherein said metallization structure comprises a first thin-film circuit layer and a second thin-film circuit layer over said first thin-film circuit layer, a dielectric layer between said first and second thin-film circuit layers, and a passivation layer over said metallization structure and over said dielectric layer;

forming a polymer layer on said passivation layer and over said wafer, wherein said polymer layer has a thickness between 2 and 50 micrometers and greater than that of said passivation layer;

sputtering an adhesion/barrier layer on said polymer layer and over said wafer;

sputtering a first gold layer on said adhesion/barrier layer and over said wafer;

forming a first photoresist layer on said first gold layer and over said wafer, wherein a first opening in said first photoresist layer exposes said first gold layer;

electroplating a second gold layer over said wafer and on said first gold layer exposed by said first opening;

forming a second photoresist layer on said second gold layer and over said wafer, wherein a second opening in said second photoresist layer exposes said second gold layer;

electroplating a third gold layer over said wafer and on said second gold layer exposed by said second opening;

removing said second photoresist layer;

removing said first photoresist layer;

after said electroplating said third gold layer, removing said first gold layer not under said second gold layer and removing said adhesion/barrier layer not under said second gold layer; and after said removing said first gold layer and said removing said adhesion/barrier layer, connecting said third gold layer to a glass substrate.

9. The method of claim 8, wherein said second gold layer has a thickness between 2 and 30 micrometers.

10. The method of claim 8, wherein said adhesion/barrier layer comprises titanium.

11. The method of claim 8, wherein said third gold layer has a thickness between 7 and 30 micrometers.

12. The method of claim 8, wherein said passivation layer comprises silicon nitride.

13. The method of claim 8, wherein said polymer layer comprises polyimide.

14. The method of claim 8, wherein said forming said polymer layer comprises a spin-on-coating process and a curing process.

15. A method for fabricating a circuit component, comprising:

providing a wafer comprising a silicon substrate, a MOS transistor in or on said silicon substrate, a metallization structure over said silicon substrate, wherein said metallization structure comprises a first thin-film circuit layer and a second thin-film circuit layer over said first thin-film circuit layer, a dielectric layer between said first and second thin-film circuit layers, and a passivation layer over said metallization structure and over said dielectric layer;

forming a first metal layer over said passivation layer and over said wafer;

forming a first photoresist layer on said first metal layer and over said wafer, wherein a first opening in said first photoresist layer exposes said first metal layer;

electroplating a second metal layer over said wafer and on said first metal layer exposed by said first opening;

forming a second photoresist layer on said second metal layer and over said wafer, wherein a second opening in said second photoresist layer exposes said second metal layer;

electroplating a third metal layer over said wafer and on said second metal layer exposed by said second opening;

removing said second photoresist layer;

removing said first photoresist layer;

after said electroplating said third metal layer, removing said first metal layer not under said second metal layer; and after said removing said first metal layer, connecting said third metal layer to a glass substrate.

16. The method of claim 15, wherein said second metal layer comprises a gold layer having a thickness between 2 and 30 micrometers.

17. The method of claim 15, wherein said second metal layer comprises a copper layer having a thickness between 2 and 30 micrometers.

18. The method of claim 15, wherein said forming said first metal layer comprises forming a titanium-containing layer over said wafer and over said passivation layer, and forming a copper layer on said titanium-containing layer.

19. The method of claim 15, wherein said third metal layer comprises a gold layer having a thickness between 7 and 30 micrometers.

20. The method of claim 15, wherein said third metal layer comprises a copper layer having a thickness between 7 and 30 micrometers.

21. The method of claim 15, wherein said passivation layer comprises silicon nitride.

* * * * *

UNITED STATES PATENT AND TRADEMARK OFFICE

CERTIFICATE OF CORRECTION

PATENT NO. : 7,462,558 B2
APPLICATION NO. : 12/025002
DATED : December 9, 2008
INVENTOR(S) : Mou-Shiung Lin et al.

It is certified that error appears in the above-identified patent and that said Letters Patent is hereby corrected as shown below:

On Title Page, item [63]

In the "Related U.S. Application Data," item (63), line 2, replace "and a continuation-in-part of applica-" with "which is a continuation-in-part of applica-."

Signed and Sealed this

Thirty-first Day of March, 2009

JOHN DOLL

*Acting Director of the United States Patent and Trademark Office*